US010955950B2

(12) United States Patent
Yamazaki

(10) Patent No.: US 10,955,950 B2
(45) Date of Patent: Mar. 23, 2021

(54) DISPLAY DEVICE, DISPLAY MODULE, ELECTRONIC DEVICE, AND METHOD FOR MANUFACTURING THE DISPLAY DEVICE

(71) Applicant: SEMICONDUCTOR ENERGY LABORATORY CO., LTD., Atsugi (JP)

(72) Inventor: Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/345,808

(22) PCT Filed: Nov. 2, 2017

(86) PCT No.: PCT/IB2017/056803
§ 371 (c)(1),
(2) Date: Apr. 29, 2019

(87) PCT Pub. No.: WO2018/087631
PCT Pub. Date: May 17, 2018

(65) Prior Publication Data
US 2019/0265532 A1  Aug. 29, 2019

(30) Foreign Application Priority Data

Nov. 9, 2016 (JP) .................................. 2016-219157
Nov. 9, 2016 (JP) .................................. 2016-219160

(51) Int. Cl.
*G06F 3/041* (2006.01)
*G02F 1/1333* (2006.01)
(Continued)

(52) U.S. Cl.
CPC .......... *G06F 3/0412* (2013.01); *G02F 1/1368* (2013.01); *G02F 1/13338* (2013.01);
(Continued)

(58) Field of Classification Search
CPC .......... G02F 1/13338; G02F 1/136286; G02F 1/1368; G02F 2201/40; G06F 3/041;
(Continued)

(56) References Cited

U.S. PATENT DOCUMENTS 6,127,199 A   10/2000 Inoue et al.
6,372,608 B1   4/2002 Shimoda et al.
(Continued)

FOREIGN PATENT DOCUMENTS

CN   103376942 A   10/2013
CN   106255999 A   12/2016
(Continued)

OTHER PUBLICATIONS

International Search Report (Application No. PCT/IB2017/056803) dated Feb. 27, 2018.
(Continued)

*Primary Examiner* — Nelson M Rosario
(74) *Attorney, Agent, or Firm* — Fish & Richardson P.C.

(57) ABSTRACT

A liquid crystal display device having a high aperture ratio is provided. A liquid crystal display device with low power consumption is provided. A display device includes a liquid crystal element, a transistor, a scan line, and a signal line. The liquid crystal element includes a pixel electrode, a liquid crystal layer, and a common electrode. Each of the scan line and the signal line is electrically connected to the transistor. Each of the scan line and the signal line includes a metal layer. The transistor is electrically connected to the pixel electrode. The transistor includes a first region connected to the pixel electrode. The pixel electrode, the common electrode, and the first region have a function of transmitting visible light. The visible light passes through the first region and the liquid crystal element and is emitted to the outside of the display device.

17 Claims, 57 Drawing Sheets

(51) Int. Cl.
  *G02F 1/1362* (2006.01)
  *G02F 1/1368* (2006.01)
  *H01L 27/12* (2006.01)
  *G06F 3/044* (2006.01)

(52) U.S. Cl.
  CPC ........ *G02F 1/136286* (2013.01); *G06F 3/041* (2013.01); *G06F 3/0443* (2019.05); *G06F 3/0445* (2019.05); *G06F 3/0446* (2019.05); *G06F 3/0448* (2019.05); *G06F 3/04164* (2019.05); *G06F 3/04166* (2019.05); *H01L 27/1225* (2013.01); *G02F 2201/40* (2013.01); *G06F 2203/04103* (2013.01); *G06F 2203/04107* (2013.01); *G06F 2203/04111* (2013.01); *G06F 2203/04112* (2013.01)

(58) Field of Classification Search
  CPC ...... G06F 3/0412; G06F 3/0416; G06F 3/044; G06F 2203/04103; G06F 2203/04107; G06F 2203/04111; G06F 2203/04112; H01L 27/1225
  See application file for complete search history.

(56) References Cited

U.S. PATENT DOCUMENTS

| | | | |
|---|---|---|---|
| 6,645,830 B2 | 11/2003 | Shimoda et al. | |
| RE38,466 E | 3/2004 | Inoue et al. | |
| 6,818,530 B2 | 11/2004 | Shimoda et al. | |
| 7,094,665 B2 | 8/2006 | Shimoda et al. | |
| 7,285,476 B2 | 10/2007 | Shimoda et al. | |
| 7,435,992 B2 | 10/2008 | Choi et al. | |
| RE40,601 E | 12/2008 | Inoue et al. | |
| 7,468,308 B2 | 12/2008 | Shimoda | |
| 7,674,650 B2 | 3/2010 | Akimoto et al. | |
| 8,102,476 B2 | 1/2012 | Son et al. | |
| 8,461,582 B2 | 6/2013 | Kimura | |
| 8,482,004 B2 | 7/2013 | Arasawa et al. | |
| 8,482,690 B2 | 7/2013 | Arasawa et al. | |
| 8,742,422 B2 | 6/2014 | Sakakura et al. | |
| 9,057,918 B2 | 6/2015 | Yamazaki | |
| 9,202,827 B2 | 12/2015 | Koyama et al. | |
| 9,244,573 B2 | 1/2016 | Ryu et al. | |
| 9,443,888 B2 | 9/2016 | Koyama et al. | |
| 9,455,280 B2 | 9/2016 | Yamazaki et al. | |
| 9,559,208 B2 | 1/2017 | Arasawa et al. | |
| 9,601,516 B2 | 3/2017 | Sakakura et al. | |
| 9,612,499 B2 | 4/2017 | Yamazaki et al. | |
| 9,735,282 B2 | 8/2017 | Miyake et al. | |
| 9,748,403 B2 | 8/2017 | Koezuka et al. | |
| 9,806,099 B2 | 10/2017 | Yamazaki et al. | |
| 9,858,028 B2 | 1/2018 | Ikeda et al. | |
| 9,941,310 B2 | 4/2018 | Koyama et al. | |
| 10,002,968 B2 | 6/2018 | Yoneda | |
| 10,236,305 B2 | 3/2019 | Yamazaki et al. | |
| 10,446,584 B2 | 10/2019 | Yamazaki et al. | |
| 2006/0205125 A1 | 9/2006 | Bae et al. | |
| 2007/0072439 A1 | 3/2007 | Akimoto et al. | |
| 2009/0065771 A1 | 3/2009 | Iwasaki et al. | |
| 2009/0101895 A1* | 4/2009 | Kawamura | H01L 29/7869 257/43 |
| 2009/0134399 A1 | 5/2009 | Sakakura et al. | |
| 2011/0242027 A1 | 10/2011 | Chang | |
| 2012/0105424 A1 | 5/2012 | Lee et al. | |
| 2013/0222726 A1* | 8/2013 | Choi | G02F 1/133707 349/43 |
| 2013/0271689 A1 | 10/2013 | Kim et al. | |
| 2014/0078420 A1* | 3/2014 | Liu | G02F 1/33512 349/12 |
| 2014/0204303 A1* | 7/2014 | Koide | G02F 1/1368 349/43 |
| 2016/0299387 A1 | 10/2016 | Yamazaki et al. | |
| 2016/0358950 A1 | 12/2016 | Koyama et al. | |
| 2017/0168333 A1 | 6/2017 | Kubota et al. | |
| 2017/0186774 A1 | 6/2017 | Sakakura et al. | |

FOREIGN PATENT DOCUMENTS

| | | |
|---|---|---|
| DE | 112016000030 | 12/2016 |
| EP | 2650763 A | 10/2013 |
| JP | 2006-072373 A | 3/2006 |
| JP | 2007-096055 A | 4/2007 |
| JP | 2007-123861 A | 5/2007 |
| JP | 2009-099887 A | 5/2009 |
| JP | 2011-053261 A | 3/2011 |
| JP | 2013-222202 A | 10/2013 |
| JP | 2017-037288 A | 2/2017 |
| JP | 2017-111438 A | 6/2017 |
| KR | 2013-0115621 A | 10/2013 |
| TW | 201702712 | 1/2017 |

OTHER PUBLICATIONS

Written Opinion (Application No. PCT/IB2017/056803) dated Feb. 27, 2018.

* cited by examiner

FIG. 3A1
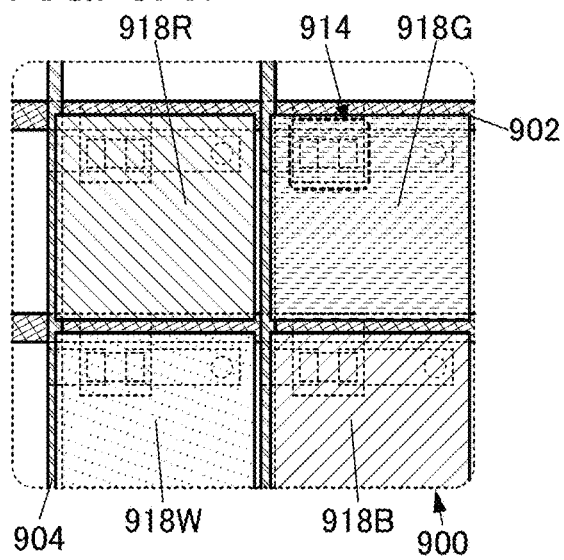
FIG. 3A2
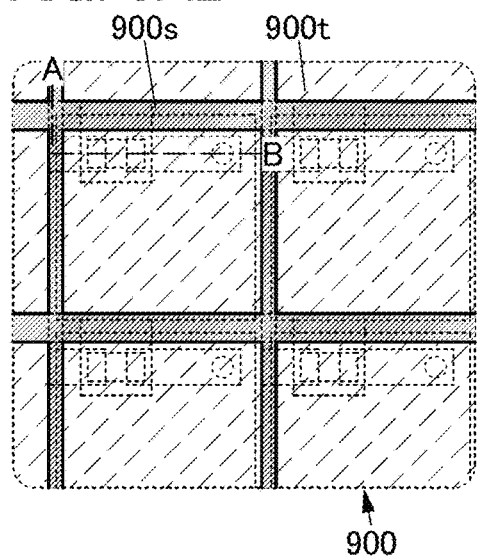
FIG. 3B
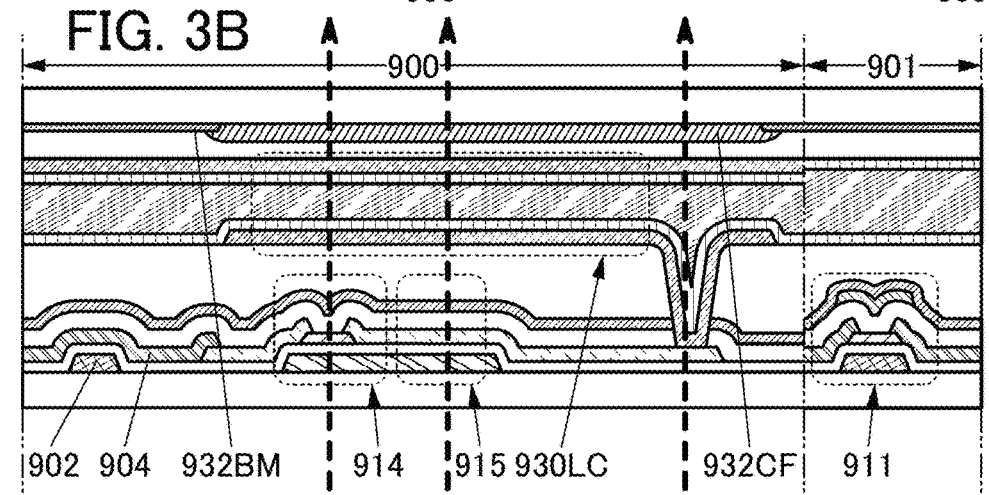
FIG. 3C
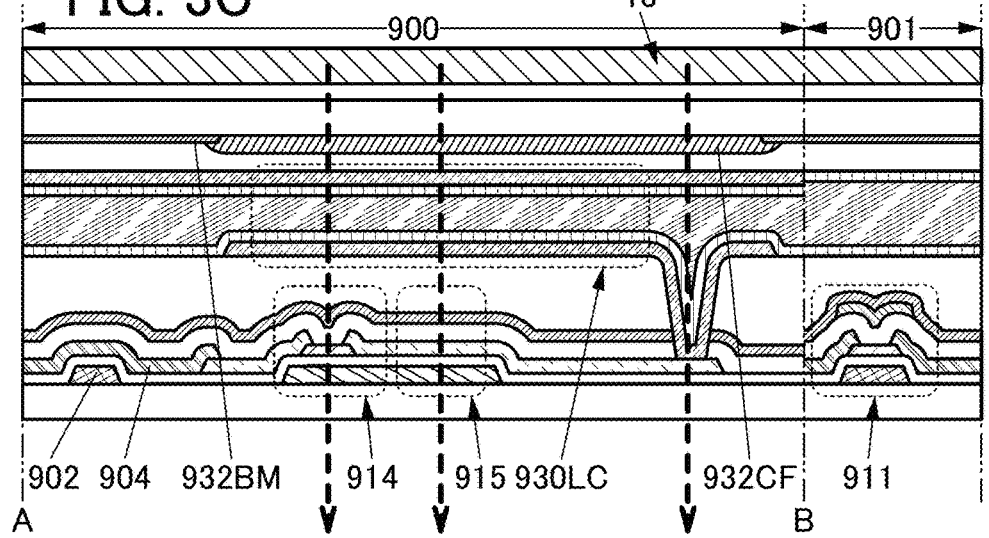

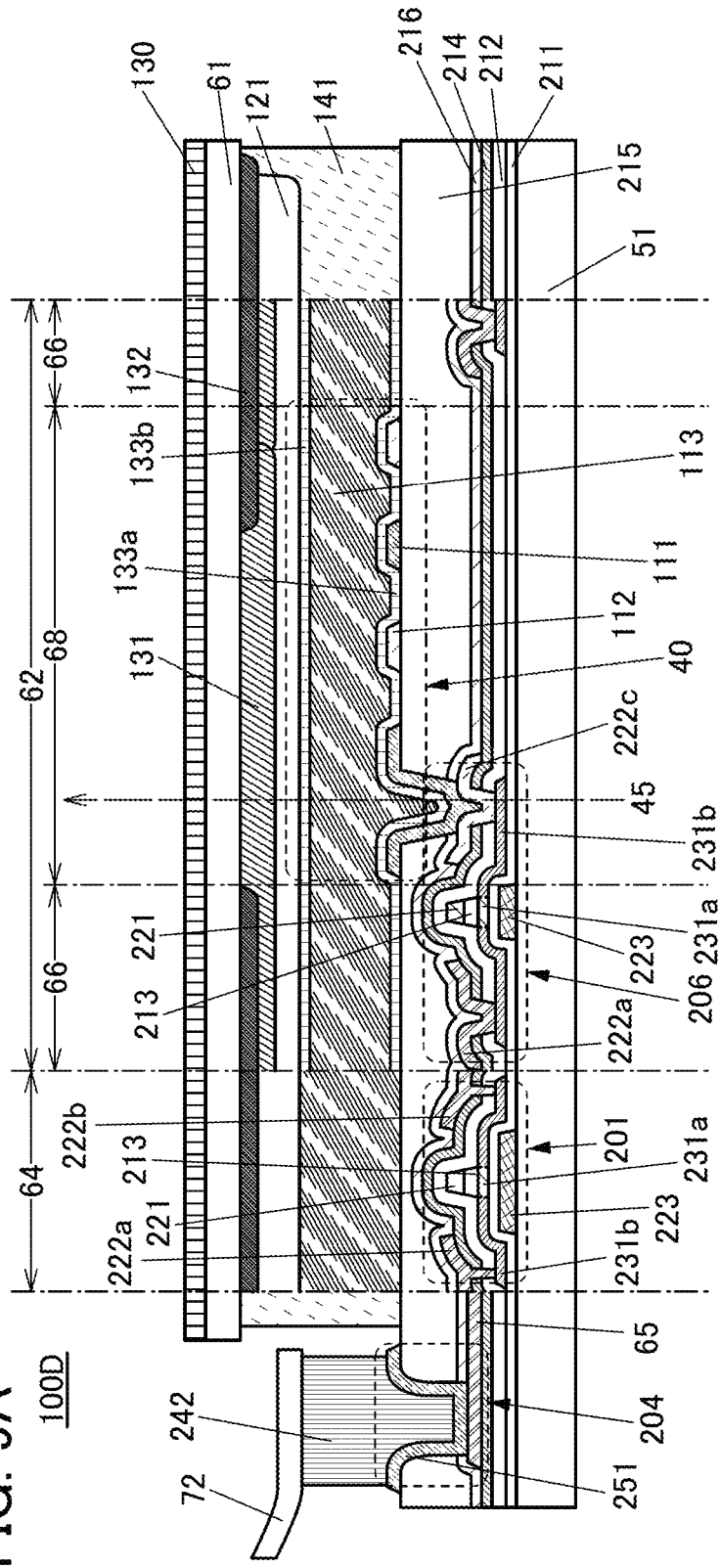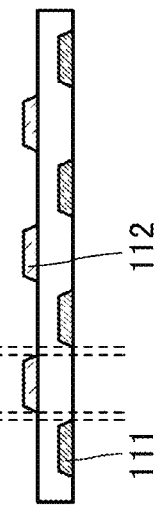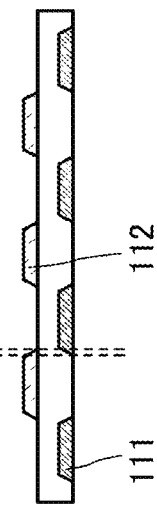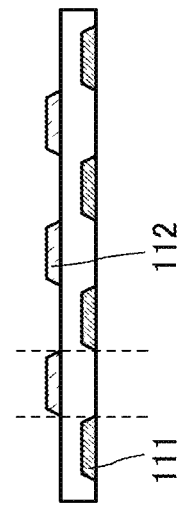

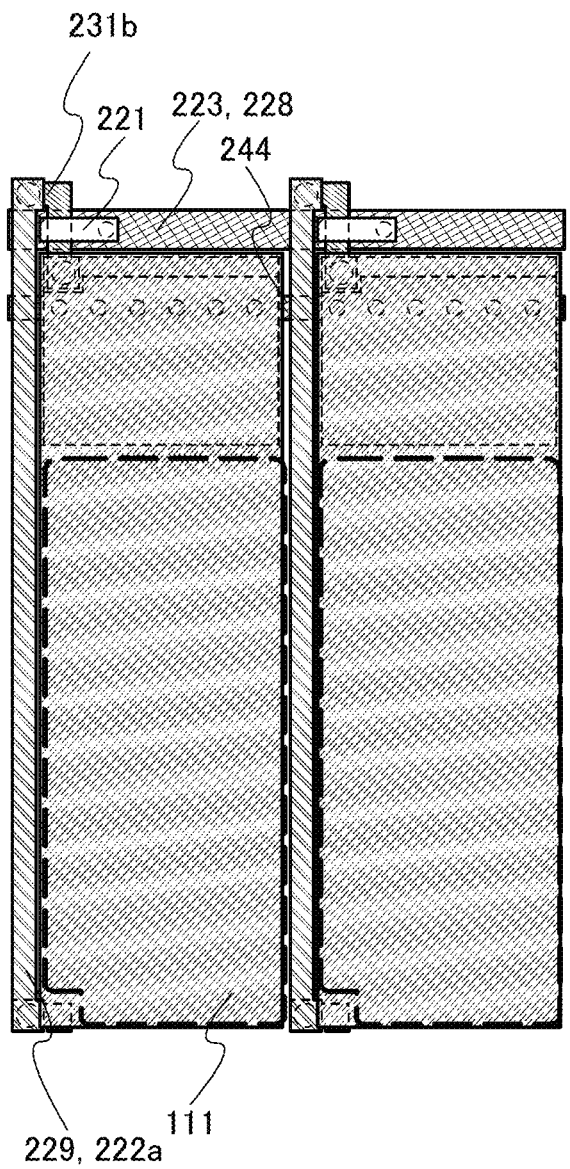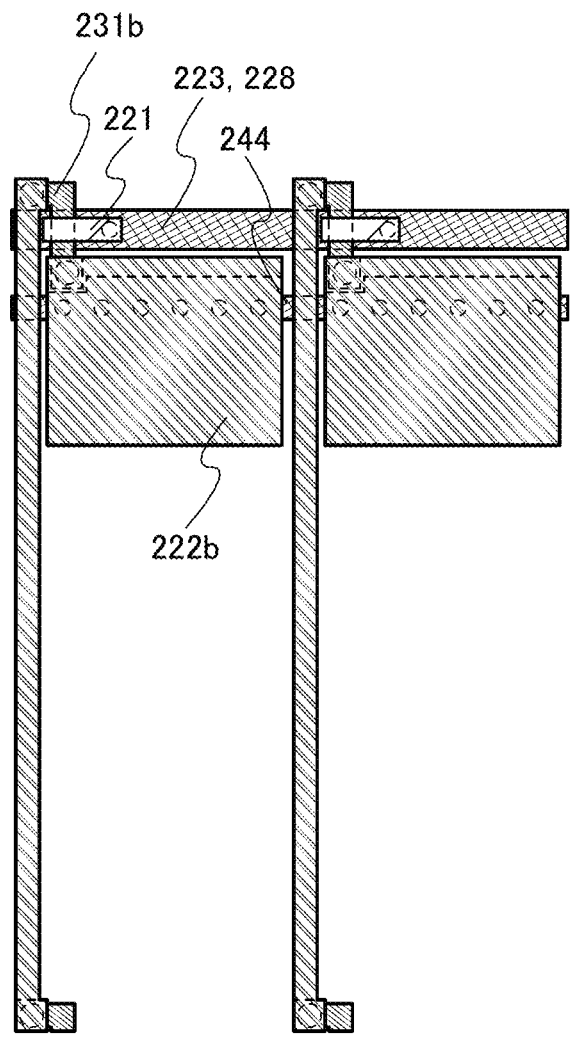

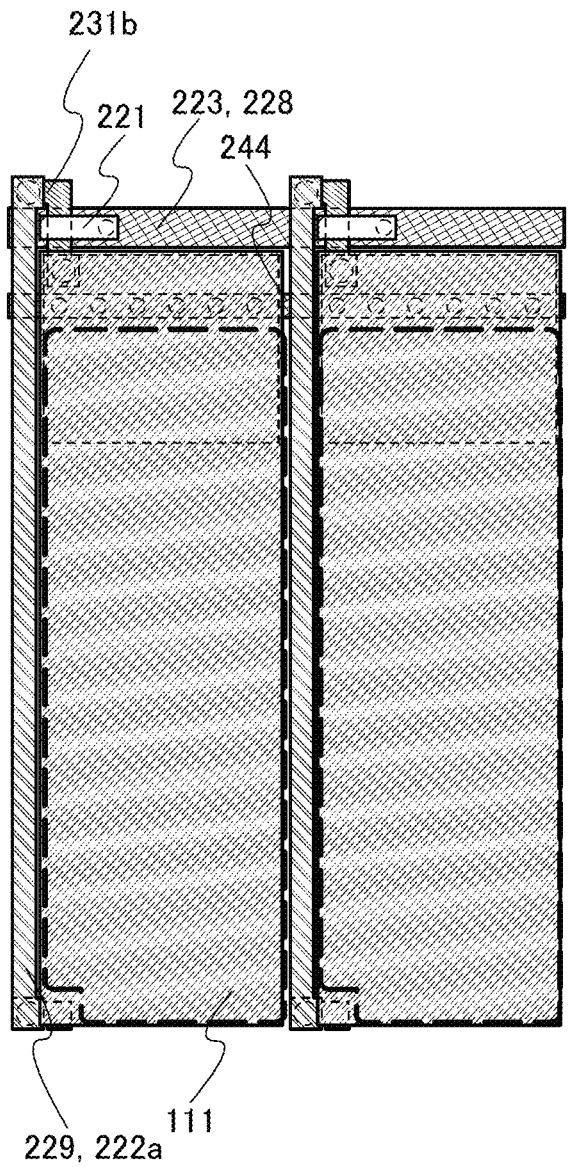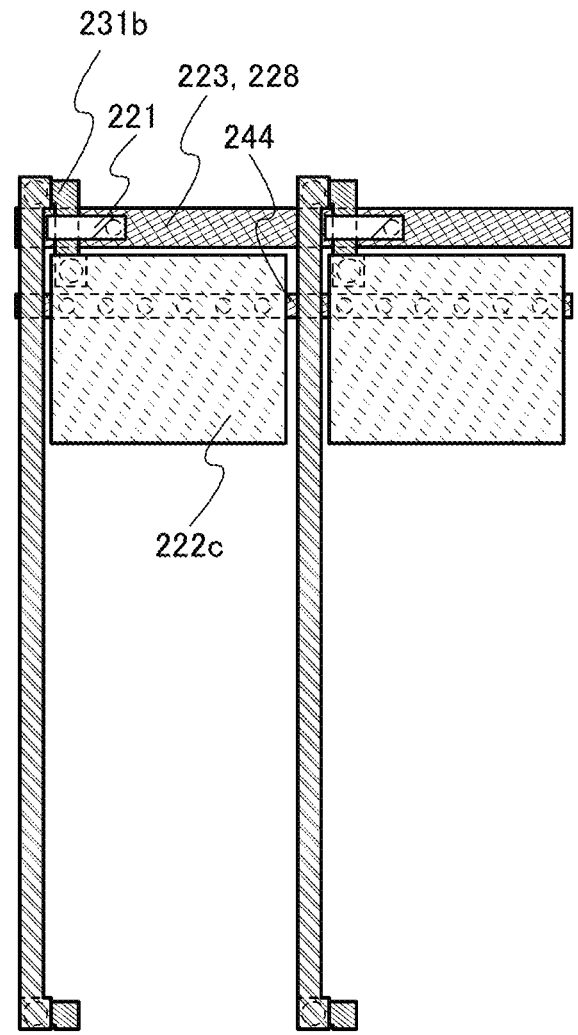

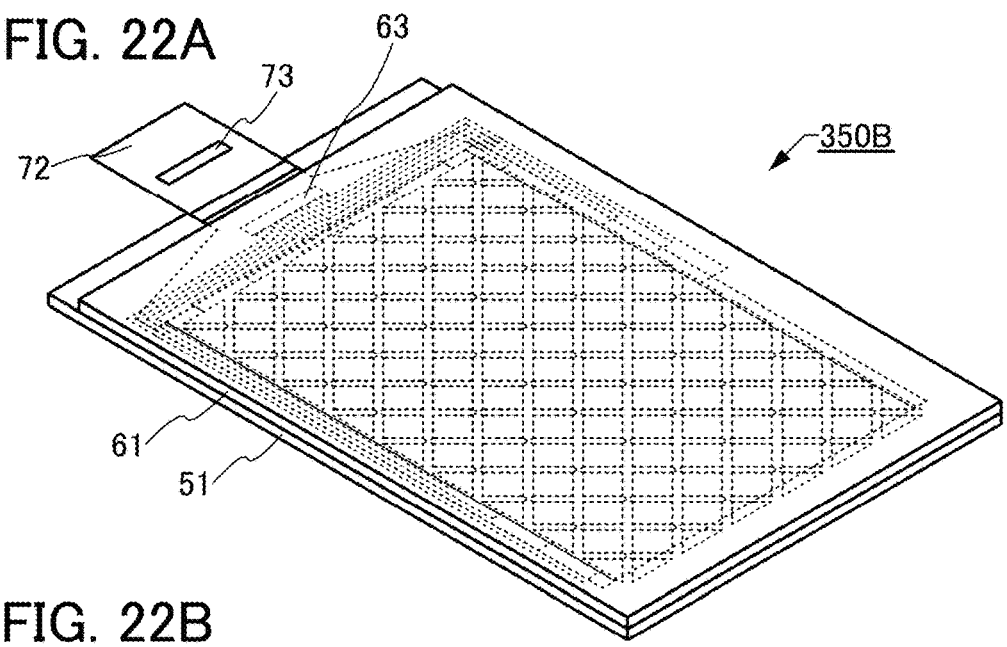
FIG. 22A
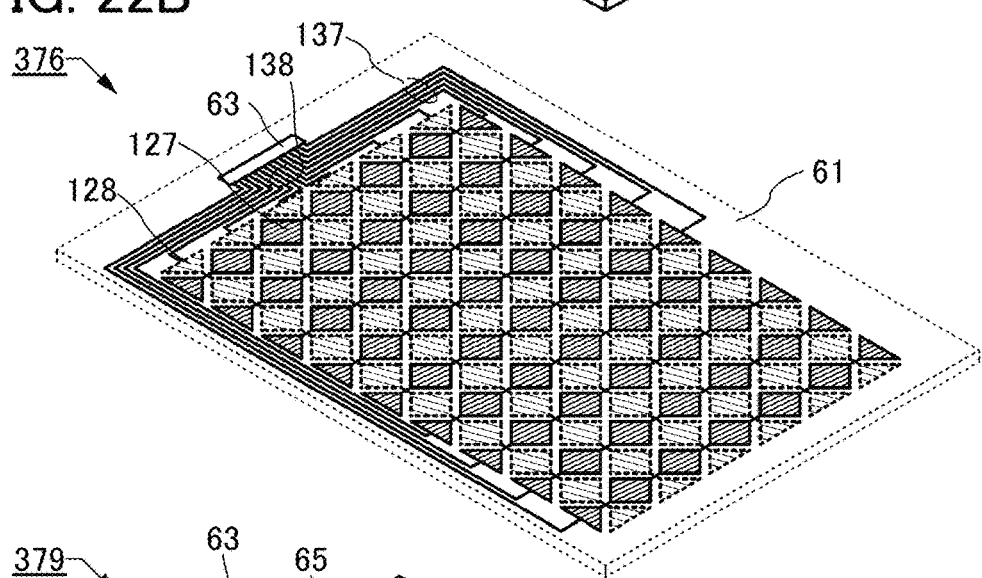
FIG. 22B
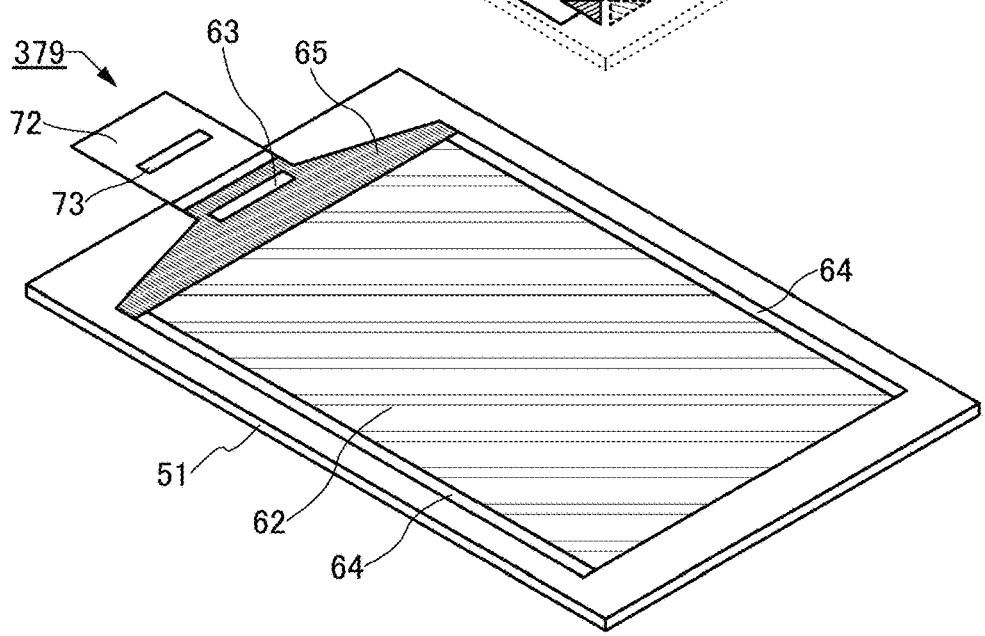

Writing

Sensing

20A

20B

35A

35B

35C

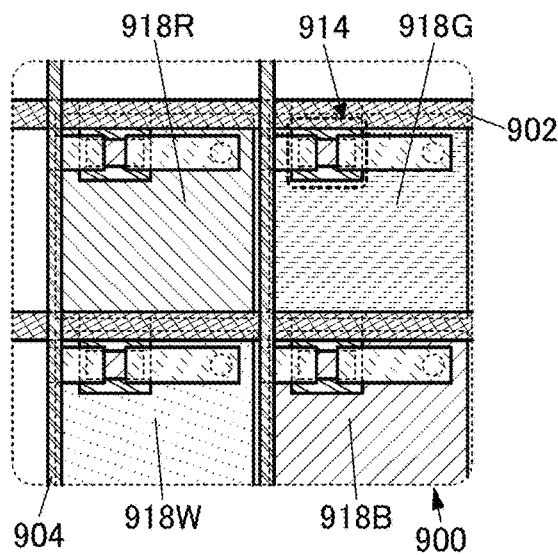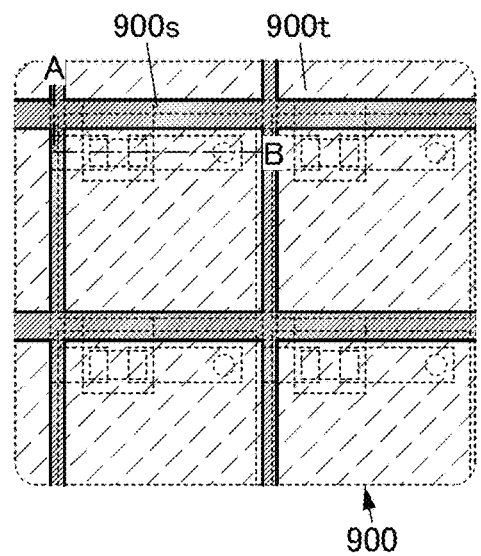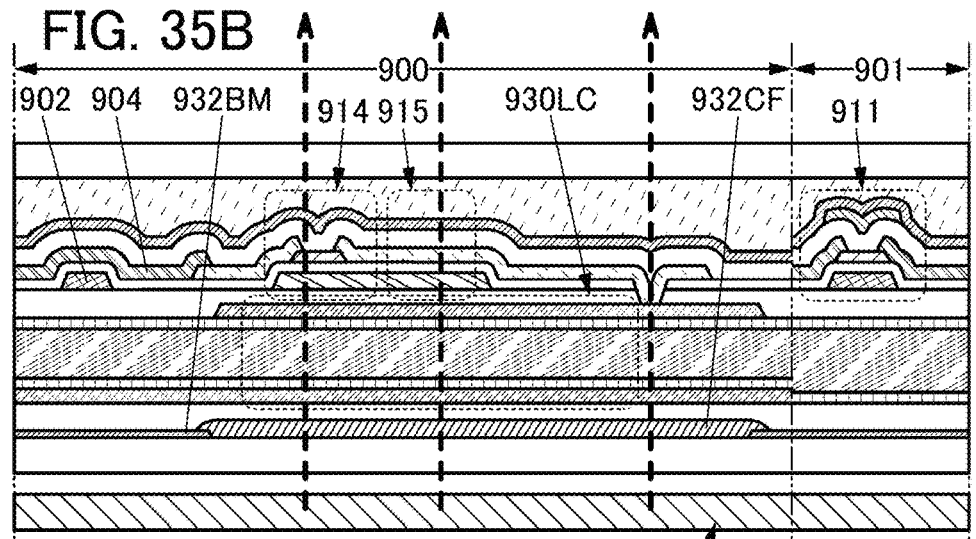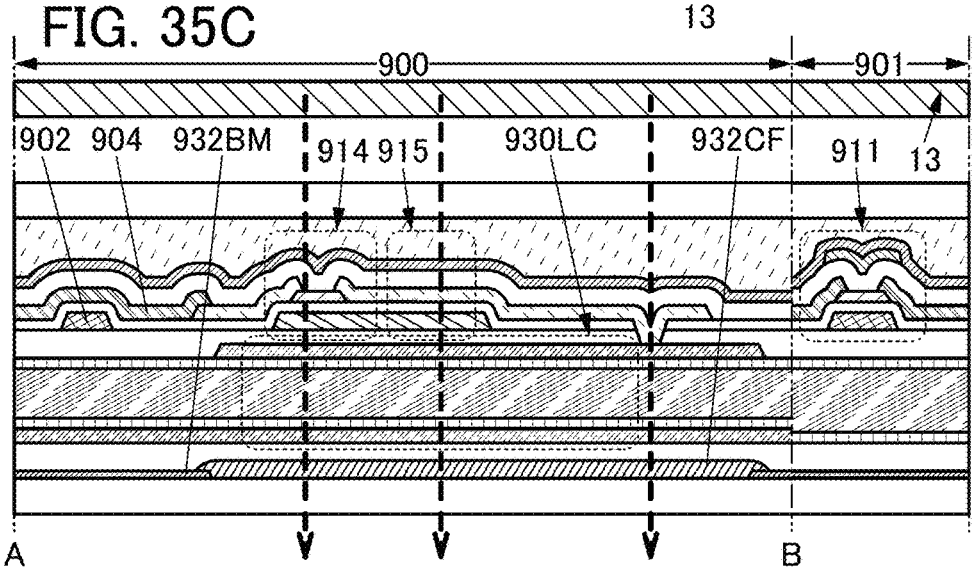

FIG. 39A
FIG. 39B
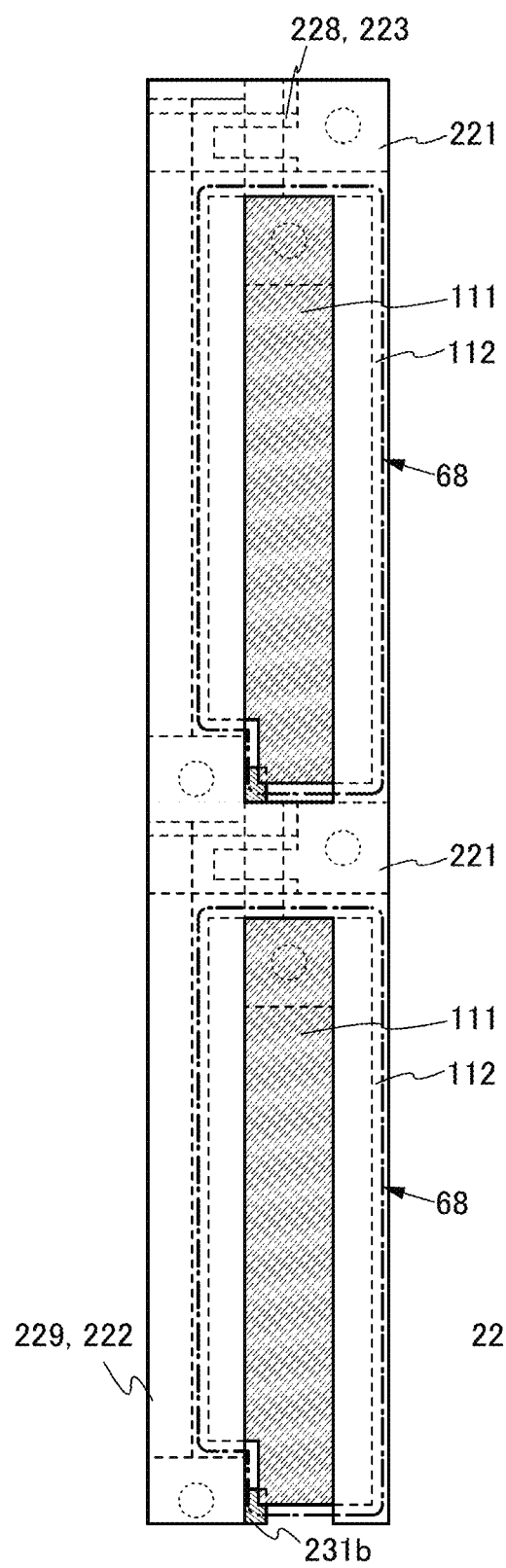
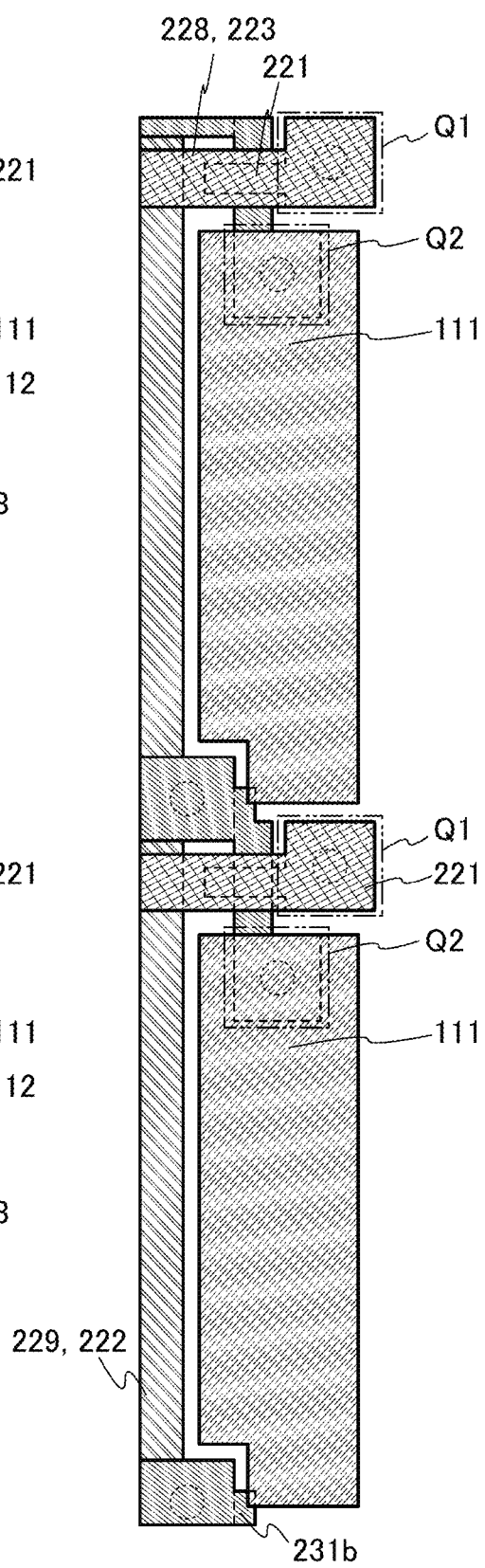

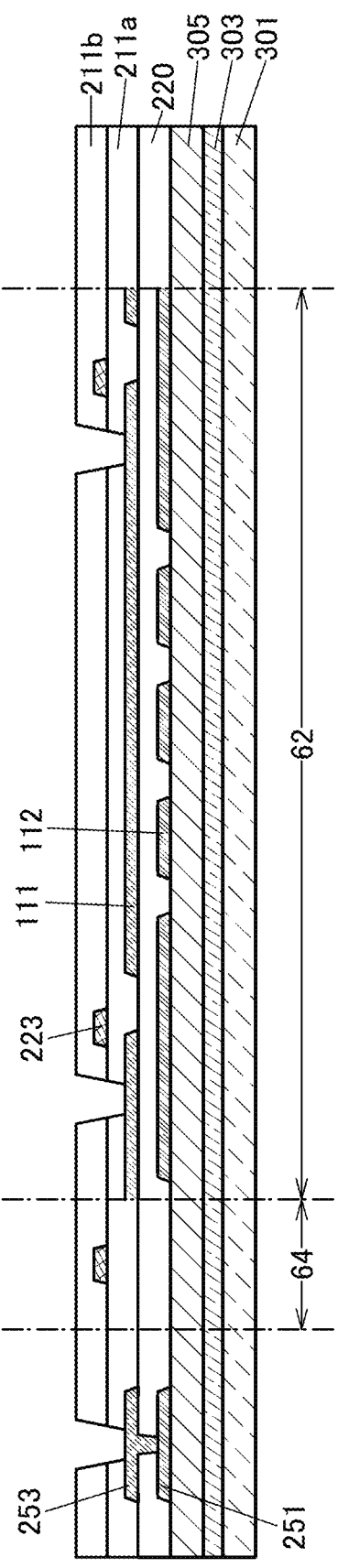
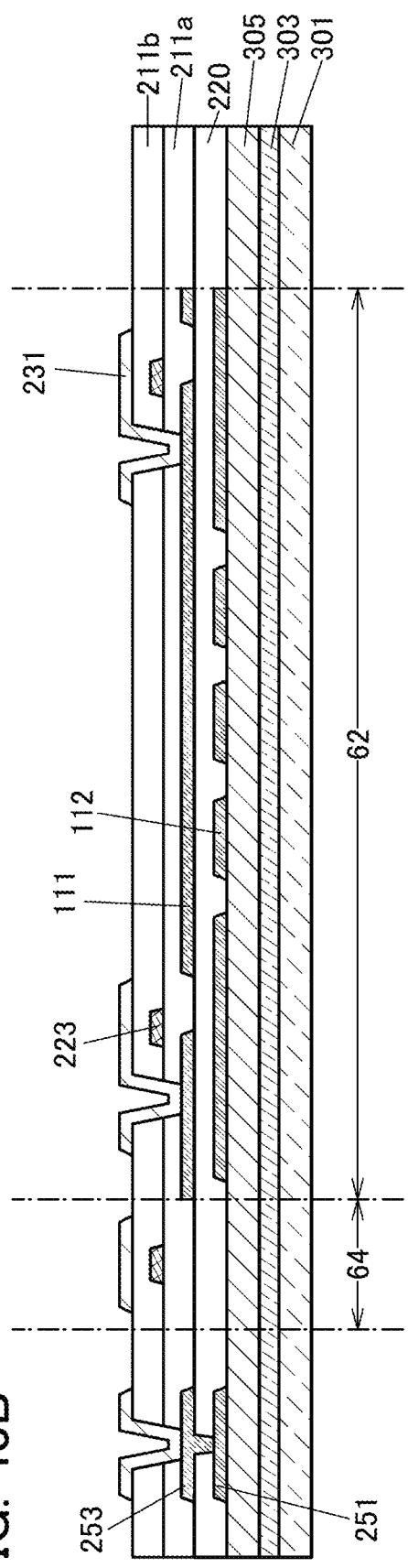
FIG. 43A
FIG. 43B

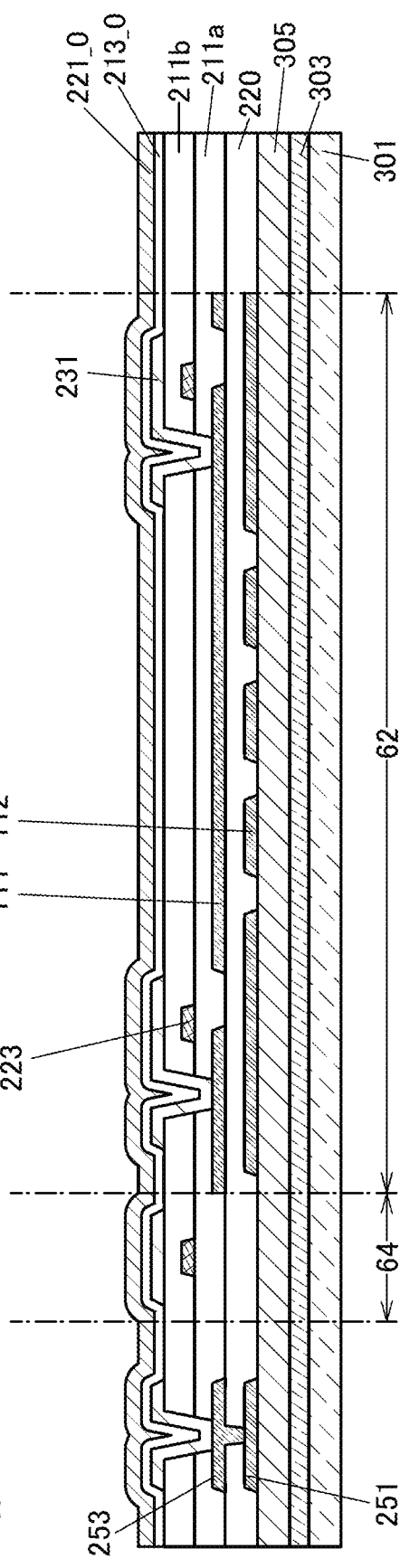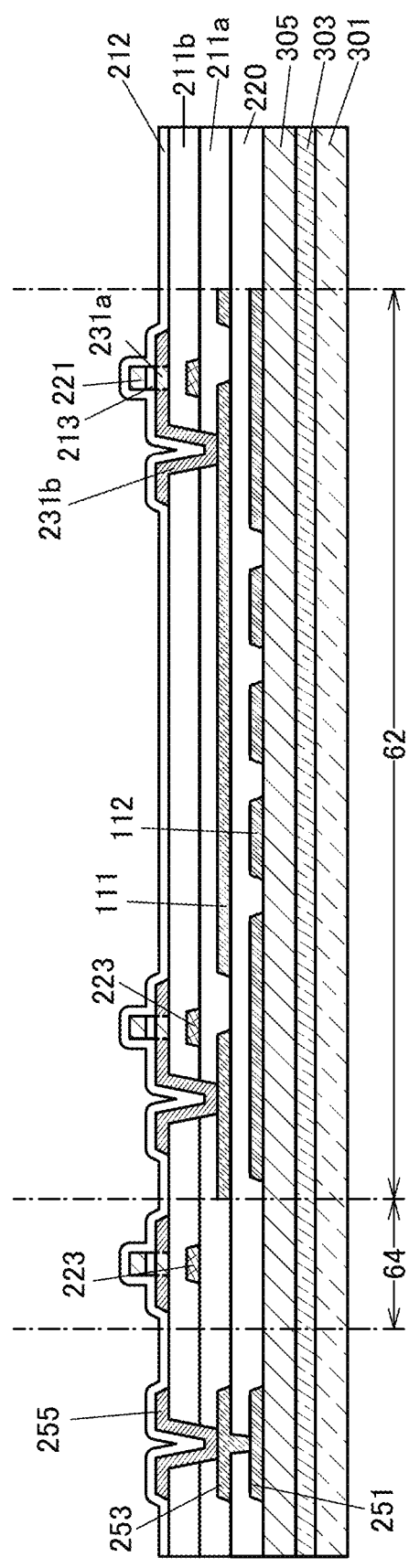

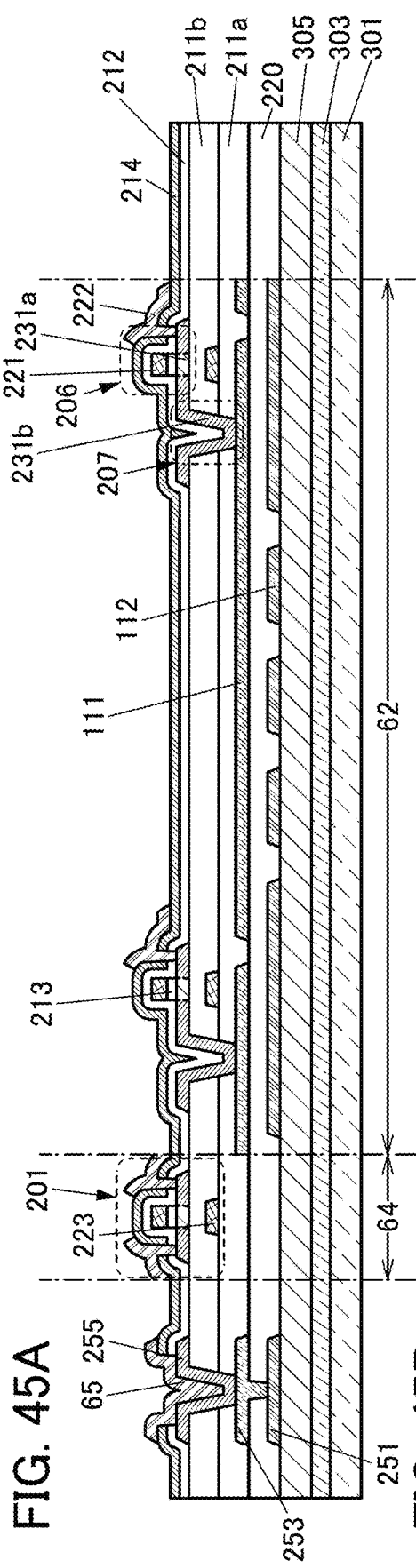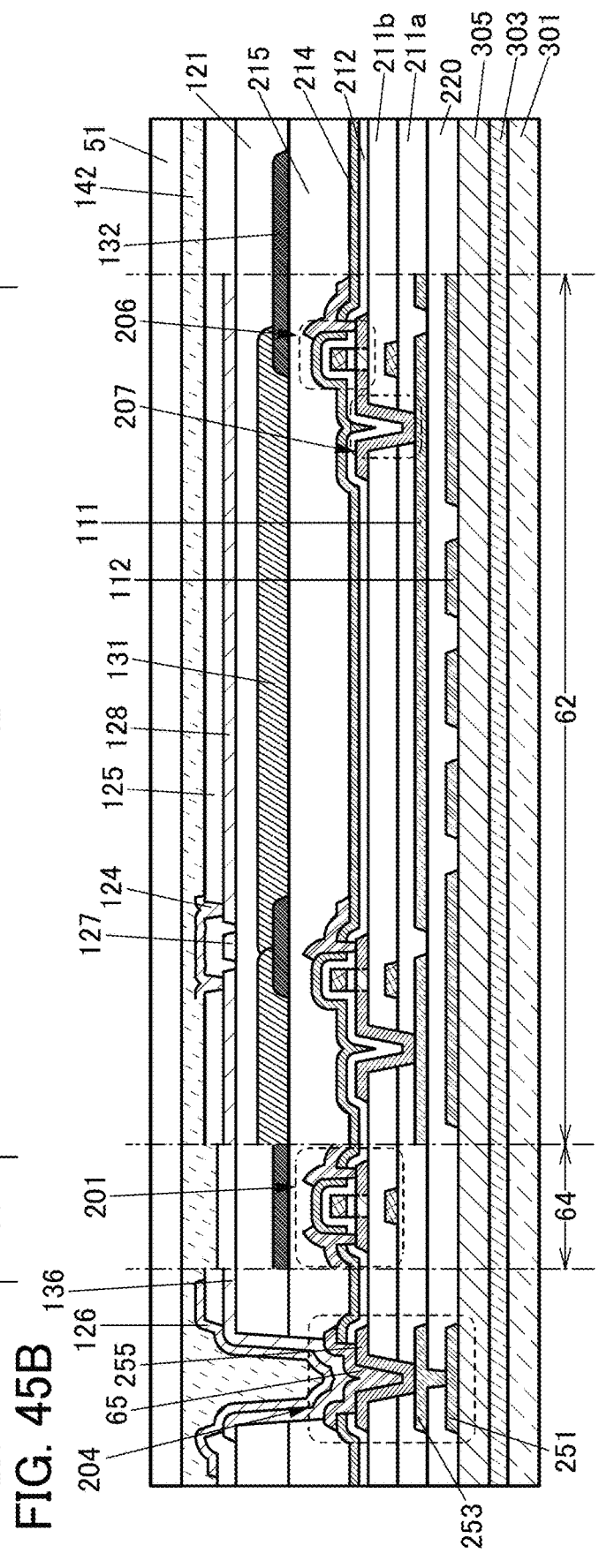

DISPLAY DEVICE, DISPLAY MODULE, ELECTRONIC DEVICE, AND METHOD FOR MANUFACTURING THE DISPLAY DEVICE

TECHNICAL FIELD

One embodiment of the present invention relates to a liquid crystal display device, a display module, and an electronic device. Another embodiment of the present invention relates to a method for manufacturing a liquid crystal display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), an input/output device (such as a touch panel), a method for driving any of them, and a method for manufacturing any of them.

BACKGROUND ART

Transistors used for most flat panel displays typified by a liquid crystal display device and a light-emitting display device are formed using silicon semiconductors such as amorphous silicon, single crystal silicon, and polycrystalline silicon provided over glass substrates. Furthermore, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor. For example, in Patent Documents 1 and 2, a technique is disclosed in which a transistor is manufactured using zinc oxide or an In—Ga—Zn-based oxide as an oxide semiconductor and the transistor is used as a switching element or the like of a pixel of a display device.

REFERENCE

Patent Document

[Patent Document 1] Japanese Published Patent Application No. 2007-123861
[Patent Document 2] Japanese Published Patent Application No. 2007-096055

DISCLOSURE OF INVENTION

An object of one embodiment of the present invention is to provide a liquid crystal display device with a high aperture ratio. Another object of one embodiment of the present invention is to provide a liquid crystal display device with low power consumption. Another object of one embodiment of the present invention is to provide a liquid crystal display device with high definition. Another object of one embodiment of the present invention is to provide a highly reliable liquid crystal display device.

Note that the descriptions of these objects do not disturb the existence of other objects. In one embodiment of the present invention, there is not necessarily a need to achieve all the objects. Other objects can be derived from the description of the specification, the drawings, and the claims.

(1) One embodiment of the present invention is a display device including a liquid crystal element, a transistor, a scan line, and a signal line. The liquid crystal element includes a pixel electrode, a liquid crystal layer, and a common electrode. Each of the scan line and the signal line is electrically connected to the transistor. Each of the scan line and the signal line includes a metal layer. The transistor is electrically connected to the pixel electrode. The transistor includes a first region connected to the pixel electrode. The pixel electrode, the common electrode, and the first region have a function of transmitting visible light. The visible light passes through the first region and the liquid crystal element and is emitted to the outside of the display device.

(2) Another embodiment of the present invention is a display device including a liquid crystal element, a transistor, a scan line, a signal line, and a touch sensor. The liquid crystal element includes a pixel electrode, a liquid crystal layer, and a common electrode. Each of the scan line and the signal line is electrically connected to the transistor. Each of the scan line and the signal line includes a metal layer. The transistor is electrically connected to the pixel electrode. The transistor includes a first region connected to the pixel electrode. The touch sensor is positioned on a display surface side of the liquid crystal element and the transistor. The pixel electrode, the common electrode, and the first region have a function of transmitting visible light. The visible light passes through the first region and the liquid crystal element and emitted to the outside of the display device. The touch sensor includes a pair of electrodes. One or both of the pair of electrodes preferably include a second region that transmits visible light. The visible light which has passed through the first region and the liquid crystal element passes through the second region and emitted to the outside of the display device.

(3) Another embodiment of the present invention is a display device including a liquid crystal element, a transistor, a scan line, a signal line, and a touch sensor. The liquid crystal element includes a pixel electrode, a liquid crystal layer, and a common electrode. Each of the scan line and the signal line is electrically connected to the transistor. Each of the scan line and the signal line includes a metal layer. The transistor includes a first region connected to the pixel electrode. The touch sensor includes a second region that transmits visible light. The pixel electrode, the common electrode, and the first region have a function of transmitting visible light. The visible light passes through the liquid crystal element, the first region, and the second region in this order and emitted to the outside of the display device. The display device preferably further includes a coloring layer. The visible light preferably passes through the coloring layer, the liquid crystal element, the first region, and the second region in this order and is preferably emitted to the outside of the display device. Each of a channel region and the first region of the transistor preferably includes a metal oxide. The metal oxide in the first region preferably includes one or more kinds of metal elements in the metal oxide included in the channel region.

(4) Another embodiment of the present invention is a display device including a liquid crystal element, a first insulating layer, a transistor, a scan line, and a signal line. The liquid crystal element includes a pixel electrode, a liquid crystal layer, and a common electrode. The first insulating layer is positioned between the pixel electrode and the transistor. The first insulating layer includes an opening. Each of the scan line and the signal line is electrically connected to the transistor. Each of the scan line and the signal line includes a metal layer. The transistor is electrically connected to the pixel electrode. The transistor includes a first region connected to the pixel electrode. The first region includes a first portion that is in contact with the pixel electrode, and a second portion that is in contact with a side surface of the opening included in the first insulating layer. The pixel electrode, the common electrode, and the first region have a function of transmitting visible light. The visible light passes through the first region and the liquid crystal element and is emitted to the outside of the display device.

(5) Another embodiment of the present invention is a display device including a liquid crystal element, a first insulating layer, a transistor, a scan line, and a signal line. The liquid crystal element includes a pixel electrode, a liquid crystal layer, and a common electrode. The first insulating layer is positioned between the pixel electrode and the transistor. The first insulating layer includes an opening. Each of the scan line and the signal line is electrically connected to the transistor. Each of the scan line and the signal line includes a metal layer. The transistor is electrically connected to the pixel electrode. The transistor includes a metal oxide layer, a gate, and a gate insulating layer. The metal oxide layer includes a first region and a second region. The first region includes a first portion that is in contact with the pixel electrode, and a second portion that is in contact with a side surface of the opening in the first insulating layer. The second region overlaps with the gate with the gate insulating layer positioned therebetween. The resistivity of the first region is lower than the resistivity of the second region. The pixel electrode, the common electrode, and the first region have a function of transmitting visible light. The visible light passes through the first region and the liquid crystal element and is emitted to the outside of the display device.

In a structure (4) or (5), the display device may further include a coloring layer. The coloring layer is preferably positioned on a side opposite to the first insulating layer with the transistor interposed therebetween.

(6) Another embodiment of the present invention is a display device including a liquid crystal element, a first insulating layer, a transistor, a scan line, a signal line, and a touch sensor. The liquid crystal element includes a pixel electrode, a liquid crystal layer, and a common electrode. The first insulating layer is positioned between the pixel electrode and the transistor. The first insulating layer includes an opening. Each of the scan line and the signal line is electrically connected to the transistor. Each of the scan line and the signal line includes a metal layer. The transistor is electrically connected to the pixel electrode. The transistor includes a first region connected to the pixel electrode. The first region includes a first portion that is in contact with the pixel electrode and a second portion that is in contact with a side surface of the opening in the first insulating layer. The touch sensor is positioned on a display surface side of the liquid crystal element and the transistor. The pixel electrode, the common electrode, and the first region have a function of transmitting visible light. The visible light passes through the first region and the liquid crystal element and is emitted to the outside of the display device.

(7) Another embodiment of the present invention is a display device including a liquid crystal element, a first insulating layer, a transistor, a scan line, a signal line, and a touch sensor. The liquid crystal element includes a pixel electrode, a liquid crystal layer, and a common electrode. The first insulating layer is positioned between the pixel electrode and the transistor. The first insulating layer includes an opening. Each of the scan line and the signal line is electrically connected to the transistor. Each of the scan line and the signal line includes a metal layer. The transistor is electrically connected to the pixel electrode. The transistor includes a metal oxide layer, a gate, and a gate insulating layer. The metal oxide layer includes a first region and a second region. The first region includes a first portion that is in contact with the pixel electrode and a second portion that is in contact with a side surface of the opening included in the first insulating layer. The second region overlaps with the gate with the gate insulating layer positioned therebetween. The resistivity of the first region is lower than the resistivity of the second region. The touch sensor is positioned on a display surface side of the liquid crystal element and the transistor. The pixel electrode, the common electrode, and the first region have a function of transmitting visible light. The visible light passes through the first region and the liquid crystal element and is emitted to the outside of the display device.

In a structure (6) or (7), the display device may further include a coloring layer. The coloring layer is preferably positioned on a side opposite to the first insulating layer with the transistor interposed therebetween. The touch sensor is preferably positioned on the display surface side of the coloring layer.

In the structure (6) or (7), the touch sensor included in the display device preferably includes a pair of electrodes. One or both of the pair of electrodes preferably include a third region that transmits visible light. The visible light which has passed through the first region and the liquid crystal element preferably passes through the third region and is preferably emitted to the outside of the display device.

In the display device having any of the above-described structures (4) to (7), it is preferable that a surface of the pixel electrode on the liquid crystal layer side and a surface of the first insulating layer on the liquid crystal layer side form the same surface.

In the display device having any of the above-described structures (4) to (7), it is preferable that the pixel electrode be positioned between the liquid crystal layer and the first insulating layer.

The display device having any of the above-described structures (4) to (7) preferably includes a second insulating layer positioned between the pixel electrode and the common electrode. Furthermore, it is preferable that a surface of the common electrode on the liquid crystal layer side and a surface of the second insulating layer on the liquid crystal layer side form the same surface.

The scan line preferably includes a portion overlapping with a channel region of the transistor.

The visible light may pass through the first region and the liquid crystal element in this order and be emitted to the outside of the display device. Alternatively, the visible light may pass through the liquid crystal element and the first region in this order and be emitted to the outside of the display device.

A direction in which the scan line extends preferably intersects with a direction in which the signal line extends. A direction in which a plurality of pixels (subpixels) exhibiting the same color are arranged preferably intersects with the direction in which the signal line extends.

The common electrode is preferably positioned between the transistor and the liquid crystal layer.

The pixel electrode, the common electrode, and the metal oxide layer each preferably include indium, zinc and at least one of aluminum, gallium, yttrium and tin.

The transistor preferably includes a back gate. The back gate includes a portion overlapping the gate with the metal oxide layer provided therebetween. The gate and the back gate are electrically connected. The gate or the back gate preferably includes indium, zinc and at least one of aluminum, gallium, yttrium and tin.

Another embodiment of the present invention is a display module that includes a display device with one of the configurations described above. The display module has a connector such as flexible printed circuit (FPC) board or a tape carrier package (TCP) connected thereto, or an IC is implemented on the display module with a method such as a chip on glass (COG) method or a chip on film (COF) method.

Another embodiment of the present invention is an electronic device including the above display module and at least one of an antenna, a battery, a housing, a camera, a speaker, a microphone, and an operation button.

One embodiment of the present invention can provide a liquid crystal display device with high aperture ratio. One embodiment of the present invention can provide a liquid crystal display device with low power consumption. One embodiment of the present invention can provide a liquid crystal display device with high definition. One embodiment of the present invention can provide a highly reliable liquid crystal display device.

Note that the description of these effects does not preclude the existence of other effects. One embodiment of the present invention does not necessarily achieve all the effects listed above. Other effects can be derived from the description of the specification, the drawings, and the claims.

BRIEF DESCRIPTION OF DRAWINGS

FIGS. 3A1 and 3A2 are top views illustrating an example of a display device, and FIGS. 3B and 3C are cross-sectional views thereof.

FIGS. 9A to 9D are cross-sectional views each illustrating an example of a display device.

FIGS. 15A and 15B are top views illustrating an example of a subpixel.

FIGS. 16A and 16B are top views illustrating an example of a subpixel.

FIGS. 22A and 22B are perspective views illustrating an example of a display device.

FIGS. 35A1 and 35A2 are top views illustrating an example of a display device, and FIGS. 35B and 35C are cross-sectional views thereof.

FIGS. 39A and 39B are top views illustrating an example of a subpixel.

FIGS. 43A and 43B are cross-sectional views illustrating an example of a method for manufacturing a display device.

FIGS. 44A and 44B are cross-sectional views illustrating an example of a method for manufacturing a display device.

FIGS. 45A and 45B are cross-sectional views illustrating an example of a method for manufacturing a display device.

BEST MODE FOR CARRYING OUT THE INVENTION

Figure 1A:
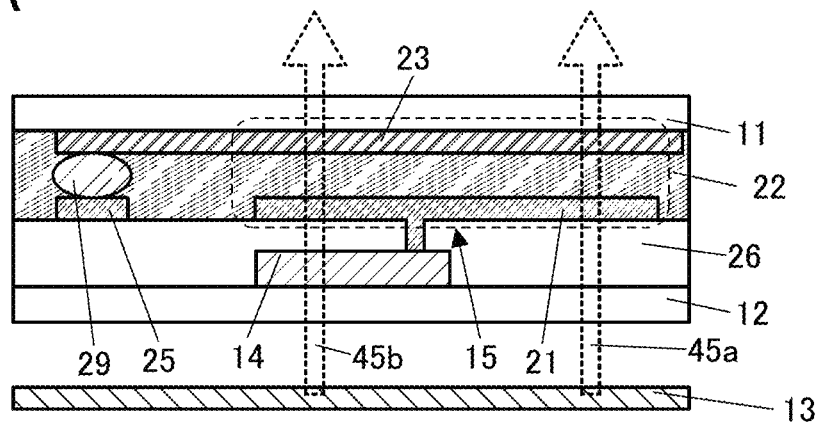
FIGS. 1A and 1B are cross-sectional views each illustrating an example of a display device.

Embodiments will be described in detail with reference to the drawings. Note that one embodiment of the present invention is not limited to the following description. It will be readily appreciated by those skilled in the art that modes and details of the present invention can be modified in various ways without departing from the spirit and scope of the present invention. Therefore, the present invention should not be construed as being limited to the description in the following embodiments.

Note that in structures of the present invention described below, the same portions or portions having similar functions are denoted by the same reference numerals in different drawings, and a description thereof is not repeated. Furthermore, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

Embodiment 1

In this embodiment, display devices each of which is one embodiment of the present invention are described with reference to FIGS. 1A and 1B to FIGS. 31A to 31C.

<1. Structure Example 1 of Display Device>

First, display devices in this embodiment are described with reference to FIGS. 1A and 1B, FIGS. 2A to 2C, and FIGS. 3A1 to 3C.

Each of the display devices in this embodiment includes a liquid crystal element and a transistor. The liquid crystal element includes a pixel electrode, a liquid crystal layer, and a common electrode. The transistor is electrically connected to the pixel electrode. The transistor includes a first region. The pixel electrode, the common electrode, and the first region have a function of transmitting visible light. Visible light passes through the first region and the liquid crystal element and is emitted to the outside of the display device. The first region of the transistor may be a region connected to the pixel electrode, for example.

In the display device of this embodiment, the transistor includes a visible-light-transmitting region. For example, a contact area of the transistor and the pixel electrode transmits visible light; in this case, the contact area can be provided in a display region. As a result, the aperture ratio of the pixel can be increased, and the power consumption of the display device can be reduced. Moreover, the display device can have high definition.

The display device in this embodiment further includes a scan line and a signal line. Each of the scan line and the signal line is electrically connected to the transistor. Each of the scan line and the signal line includes a metal layer. When a metal layer is used for each of the scan line and the signal line, the resistances of the scan line and the signal line can be reduced.

The scan line preferably includes a portion overlapping with a channel region of the transistor. The characteristics of the transistor might vary by light irradiation depending on a material of the channel region of the transistor. When the scan line includes the portion overlapping with the channel region of the transistor, the channel region can be prevented from being irradiated with external light, light of a backlight, or the like. Thus, the reliability of the transistor can be increased.

A display device 10A illustrated in FIG. 1A includes a substrate 11, a substrate 12, a transistor 14, a liquid crystal element 15, and the like. A backlight unit 13 is provided on the substrate 12 side of the display device 10A.

The liquid crystal element 15 includes a pixel electrode 21, a liquid crystal layer 22, and a common electrode 23. The pixel electrode 21 is electrically connected to the transistor 14 through an opening provided in an insulating layer 26. A conductive layer 25 formed using the same step and the same material as those of the pixel electrode 21 is provided over the insulating layer 26. The conductive layer 25 is electrically connected to the common electrode 23 through a connector 29.

Light 45a from the backlight unit 13 is emitted to the outside of the display device 10A through the substrate 12, the insulating layer 26, the pixel electrode 21, the liquid crystal layer 22, the common electrode 23, and the substrate 11. As materials of these layers that transmit the light 45a, visible-light-transmitting materials are used.

Light 45b from the backlight unit 13 is emitted to the outside of the display device 10A through the substrate 12, the transistor 14, the insulating layer 26, the pixel electrode 21, the liquid crystal layer 22, the common electrode 23, and the substrate 11. In this embodiment, the transistor 14 electrically connected to the liquid crystal element 15 has a structure having a visible-light-transmitting region. Accordingly, a region provided with the transistor 14 can also be used as a display region. Thus, the aperture ratio of the pixel can be increased. As the aperture ratio becomes higher, the light extraction efficiency can be increased. Therefore, the power consumption of the display device can be reduced. Moreover, the display device can have high definition.

Figure 1B:
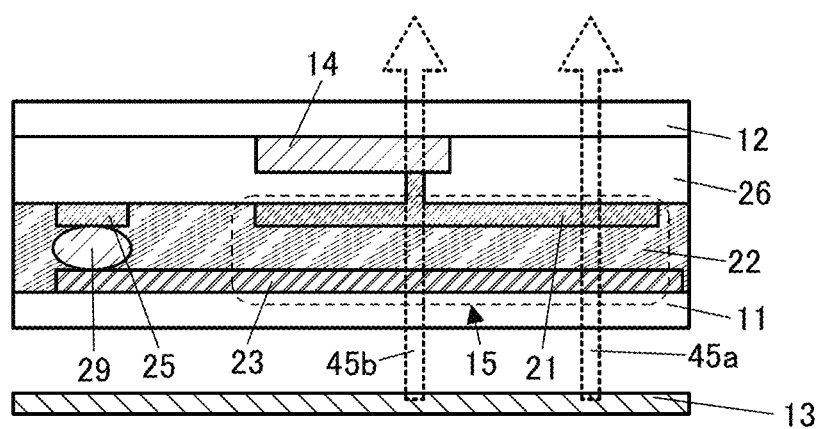

A display device 10B illustrated in FIG. 1B differs from the display device 10A in that the backlight unit 13 is provided on the substrate 11 side. The other structures are similar to those of the display device 10A, and therefore, a description thereof is omitted.

In the display device 10A, the light 45b first enters the visible-light-transmitting region of the transistor 14. Then, the light 45b which has passed through the visible-light-transmitting region enters the liquid crystal element 15. In contrast, in the display device 10B, the light 45b first enters the liquid crystal element 15. Then, the light 45b which has passed through the liquid crystal element 15 enters the visible-light-transmitting region of the transistor 14. As described above, the light from the backlight unit 13 may first enter either the transistor 14 or the liquid crystal element 15.

An example of the display device 10B in which a portion of the transistor 14 that is in contact with the pixel electrode 21 transmits visible light is described. The light 45b passes through the contact area of the transistor 14 and the pixel electrode 21. That is, the contact area of the transistor 14 and the pixel electrode 21 can be used as a display region. Thus, the aperture ratio of the pixel can be increased. Moreover, the power consumption of the display device can be reduced.

The display device of one embodiment of the present invention can be applied to a display device in which a touch sensor is implemented; such a display device is also referred to as an input/output device or a touch panel. The touch sensor is positioned on a display surface side of the liquid crystal element and the transistor.

Figure 2A:
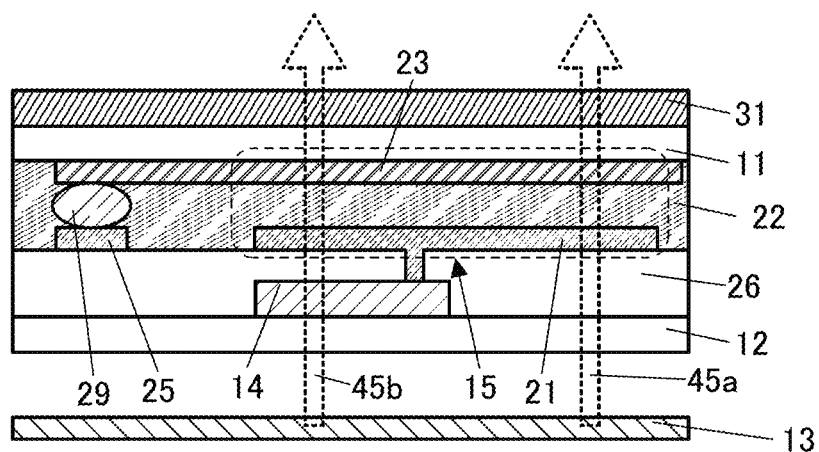
FIGS. 2A to 2C are cross-sectional views each illustrating an example of a display device.

A display device 15A illustrated in FIG. 2A has a structure in which a touch sensor unit 31 is provided on the substrate 11 side of the display device 10A.

Figure 2B:
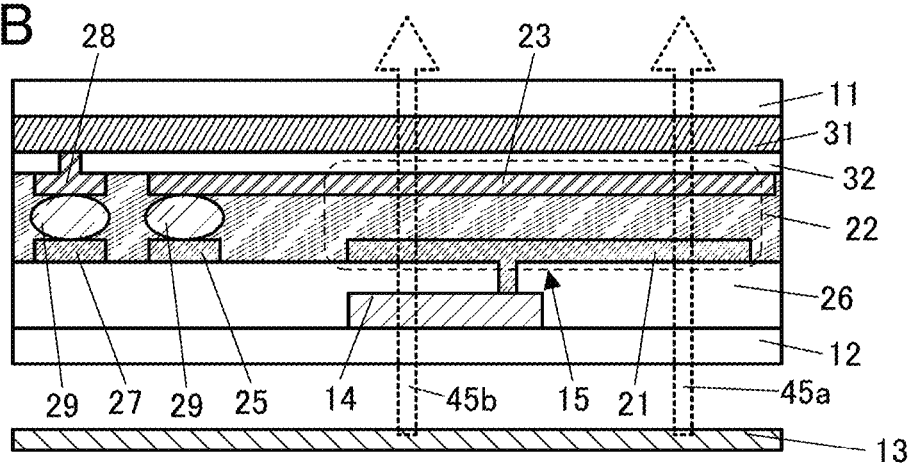

A display device 15B illustrated in FIG. 2B has a structure in which the touch sensor unit 31 and an insulating layer 32 are provided between the substrate 11 and the common electrode 23 of the display device 10A. In addition, the display device 15B includes a conductive layer 27 and a conductive layer 28.

The conductive layer 27 formed using the same process and the same material as the pixel electrode 21 is provided over the insulating layer 26. The conductive layer 28 formed using the same process and the same material as the common electrode 23 is provided in contact with the insulating layer 32. The conductive layer 28 is electrically connected to the touch sensor unit 31. The conductive layer 28 is electrically connected to the conductive layer 27 through the connector 29. Thus, both a signal for driving the liquid crystal element 15 and a signal for driving the touch sensor unit 31 can be supplied to the display device 15B through one or more FPCs connected to the substrate 12 side. There is no need to connect the FPC and the like to the substrate 11 side, and thus the structure of the display device can be more simplified. The display device in FIG. 2B can be incorporated into an electronic device more easily than a display device in which FPCs are connected to both of the substrate 11 side and the substrate 12 side. Furthermore, the number of components can be reduced.

In the display device 15B, the touch sensor unit 31 can be provided between the pair of substrates, so that the number of substrates can be reduced, and the display device can be reduced in weight and thickness.

Figure 2C:
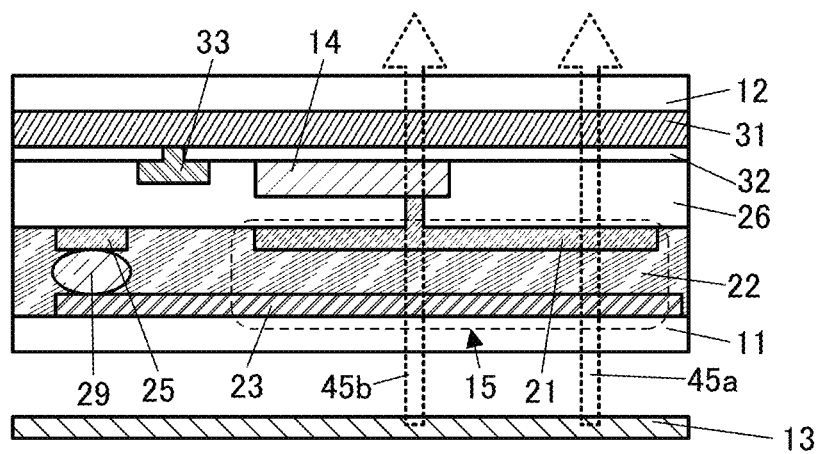

A display device 15C illustrated in FIG. 2C has a structure in which the touch sensor unit 31 and the insulating layer 32 are provided between the substrate 12 and the insulating layer 26 of the display device 10B. In addition, the display device 15C includes a conductive layer 33.

The conductive layer 33 formed using the same process and the same material as one or more conductive layers included in the transistor 14 is provided in contact with the insulating layer 32. The conductive layer 33 is electrically connected to the touch sensor unit 31. In the display device 15C, both a signal for driving the liquid crystal element 15 and a signal for driving the touch sensor unit 31 can be supplied to the display device 15C by one or more FPCs connected to the substrate 11 side. Thus, the display device in FIG. 2C can easily be incorporated into an electronic device and allows a reduction in the number of components.

In the display device 15C, the touch sensor unit 31 can be provided between the pair of substrates, so that the number of substrates can be reduced, and the display device can be reduced in weight and thickness.

[Pixel]

Next, a pixel included in the display device of this embodiment is described with reference to FIGS. 3A1 to 3C.

FIG. 3A1 is a schematic top view illustrating a pixel 900. The pixel 900 illustrated in FIG. 3A1 includes four subpixels. The pixel 900 illustrated in FIG. 3A1 is an example of a pixel including two-by-two subpixels. In each of the subpixels, a transmissive liquid crystal element 930LC (not illustrated in FIGS. 3A1 and 3A2), the transistor 914, and the like are provided. In the pixel 900 in FIG. 3A1, two wirings 902 and two wirings 904 are provided. FIG. 3A1 illustrates display regions (display regions 918R, 918G, 918B, and 918W) of liquid crystal elements included in the subpixels.

The pixel 900 includes the wirings 902 and 904, and the like. The wirings 902 function as scan lines, for example. The wirings 904 function as signal lines, for example. The wirings 902 and 904 intersect with each other at a portion.

The transistor 914 functions as a selection transistor. A gate of the transistor 914 is electrically connected to the wiring 902. One of a source and a drain of the transistor 914 is electrically connected to the wiring 904, and the other of the source and the drain of the transistor 914 is electrically connected to the liquid crystal element 930LC.

Here, the wirings 902 and 904 have a light-blocking property. It is preferable to use a light-transmitting film for layers other than the wirings 902 and 904, i.e., the transistor 914 and layers forming a wiring connected to the transistor 914, a contact area, a capacitor, and the like. FIG. 3A2 distinctively illustrates a visible-light-transmitting region 900t and a visible-light-blocking region 900s included in the pixel 900 in FIG. 3A1. When the transistor is formed using a light-transmitting film as described above, a portion other than the portion provided with the wirings 902 and 904 can be the transmissive region 900t. The transmissive region of the liquid crystal element can overlap with the transistor, the wirings connected to the transistor, the contact area, the capacitor, and the like, so that the aperture ratio of the pixel can be increased.

Note that as the proportion of the area of the transmissive region with respect to the area of the pixel becomes higher, the amount of transmitted light can be increased. The proportion of the area of the transmissive region with respect to the area of the pixel can be higher than or equal to 1% and lower than or equal to 95%, preferably higher than or equal to 10% and lower than or equal to 90%, further preferably higher than or equal to 20% and lower than or equal to 80%, for example. In particular, the proportion is preferably higher than or equal to 40% or higher than or equal to 50%, further preferably higher than or equal to 60% and lower than or equal to 80%.

FIGS. 3B and 3C are each a cross-sectional view taken along dashed-dotted line A-B in FIG. 3A2. Note that cross sections of the liquid crystal element 930LC, a coloring film 932CF, a light-blocking film 932BM, a capacitor 915, a driver circuit portion 901, and the like, which are not illustrated in the top views, are also illustrated in FIGS. 3B and 3C. The driver circuit portion 901 can be used as a scan line driver circuit portion or a signal line driver circuit portion. The driver circuit portion 901 includes a transistor 911.

As illustrated in each of FIGS. 3B and 3C, light is emitted from the backlight unit 13 in a direction shown by an arrow of a broken line. The light from the backlight unit 13 is extracted to the outside through the contact area of the transistor 914 and the liquid crystal element 930LC, the transistor 914, the capacitor 915, and the like. Accordingly, films forming the transistor 914 and the capacitor 915, and the like also preferably have a light-transmitting property. As the area of the light-transmitting region included in the transistor 914, the capacitor 915, and the like becomes larger, light from the backlight unit 13 can be used more efficiently.

As illustrated in each of FIGS. 3B and 3C, the light from the backlight unit 13 may be extracted to the outside through the coloring film 932CF. When the light is extracted through the coloring film 932CF, light having a desired color can be obtained. The color of the coloring film 932CF can be selected from red (R), green (G), blue (B), cyan (C), magenta (M), yellow (Y), and the like.

In FIG. 3B, the light from the backlight unit 13 first enters the transistor 914, the capacitor 915, and the like. Then, the light which has passed through the transistor 914, the capacitor 915, and the like enters the liquid crystal element 930LC. After that, the light which has passed through the liquid crystal element 930LC is extracted to the outside through the coloring film 932CF.

In FIG. 3C, light from the backlight unit 13 first enters the coloring film 932CF. Then, the light which has passed through the coloring film 932CF enters the liquid crystal element 930LC. After that, the light which has passed through the liquid crystal element 930LC is extracted to the outside through the transistor 914, the capacitor 915, and the like.

For the transistor, the wiring, the capacitor, and the like illustrated in FIGS. 3A1 to 3C, the following materials can be used. Note that these materials can also be used for the visible-light-transmitting semiconductor layer and the visible-light-transmitting conductive layer in each structure example described in this embodiment.

The semiconductor film included in the transistor can be formed using a light-transmitting semiconductor material. As a light-transmitting semiconductor material, a metal oxide, an oxide semiconductor, and the like can be given. Note that an oxide semiconductor preferably contains at least indium. In particular, indium and zinc are preferably contained. In addition, one or more kinds of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

The conductive film included in the transistor can be formed using a light-transmitting conductive material. A light-transmitting conductive material preferably includes one or more kinds selected from indium, zinc, and tin. Specifically, an In oxide, an In—Sn oxide (also referred to as an indium tin oxide or ITO), an In—Zn oxide, an In—W oxide, an In—W—Zn oxide, an In—Ti oxide, an In—Sn—Ti oxide, an In—Sn—Si oxide, a Zn oxide, a Ga—Zn oxide, or the like can be used.

The conductive film of the transistor may be an oxide semiconductor that includes an impurity element and has reduced resistance. The oxide semiconductor with the reduced resistance can be regarded as an oxide conductor (OC).

For example, to form an oxide conductor, oxygen vacancies are formed in an oxide semiconductor and then hydrogen is added to the oxygen vacancies, so that a donor level is formed in the vicinity of the conduction band. The oxide semiconductor having the donor level has an increased conductivity and becomes a conductor.

An oxide semiconductor has a large energy gap (e.g., an energy gap of 2.5 eV or larger), and thus has a visible light transmitting property. Moreover, as described above, an oxide conductor is an oxide semiconductor having a donor level in the vicinity of the conduction band. Therefore, the influence of absorption due to the donor level is small in an oxide conductor, and an oxide conductor has a visible light transmitting property comparable to that of an oxide semiconductor.

The oxide conductor preferably includes one or more kinds of metal elements included in the semiconductor film of the transistor. When two or more layers included in the transistor are formed using the oxide semiconductors including the same metal element, the same manufacturing apparatus (e.g., deposition apparatus or processing apparatus) can be used in two or more steps and manufacturing cost can thus be reduced.

The structure of the pixel in the display device described in this embodiment enables efficient use of light emitted from the backlight unit. Thus, the excellent display device with reduced power consumption can be provided.

<2. Structure Example 2 of Display Device>

Figure 4:
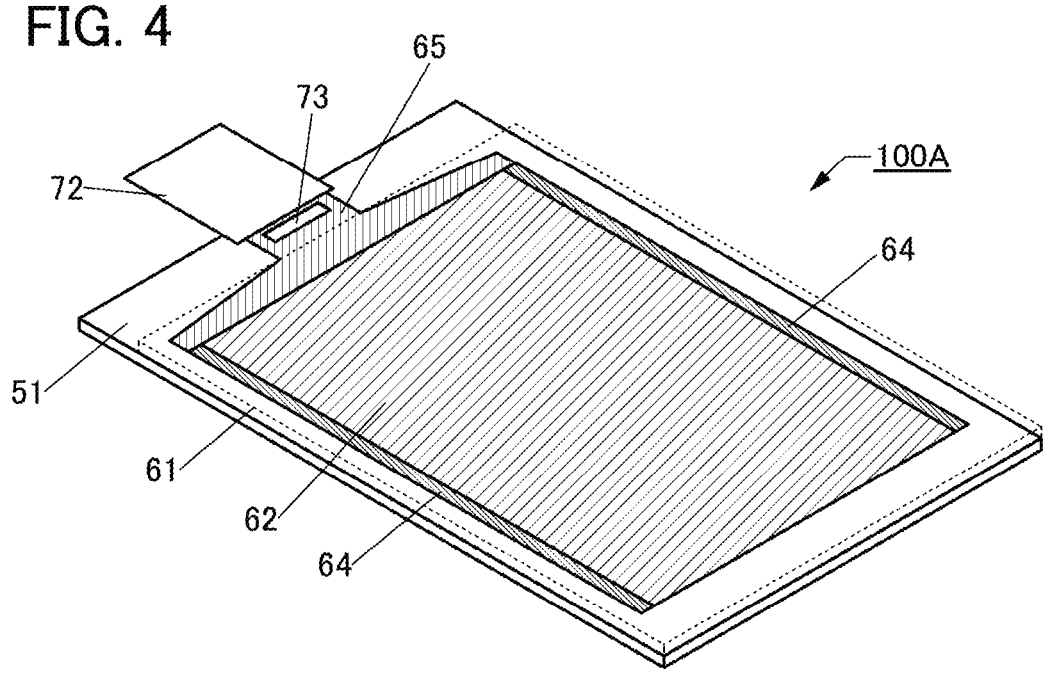
FIG. 4 is a perspective view illustrating an example of a display device.
Figure 5A:
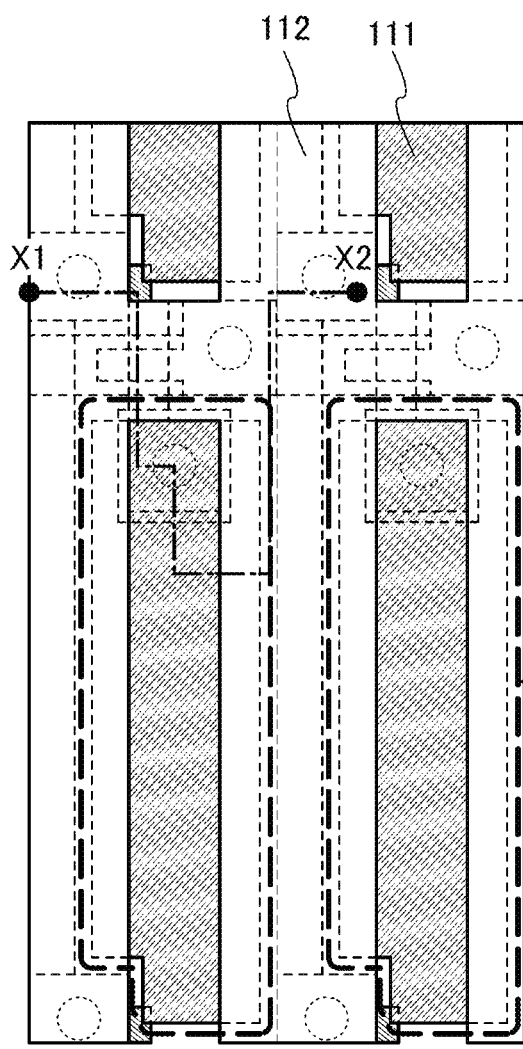
FIGS. 5A and 5B are top views illustrating an example of a subpixel.
Figure 5B:
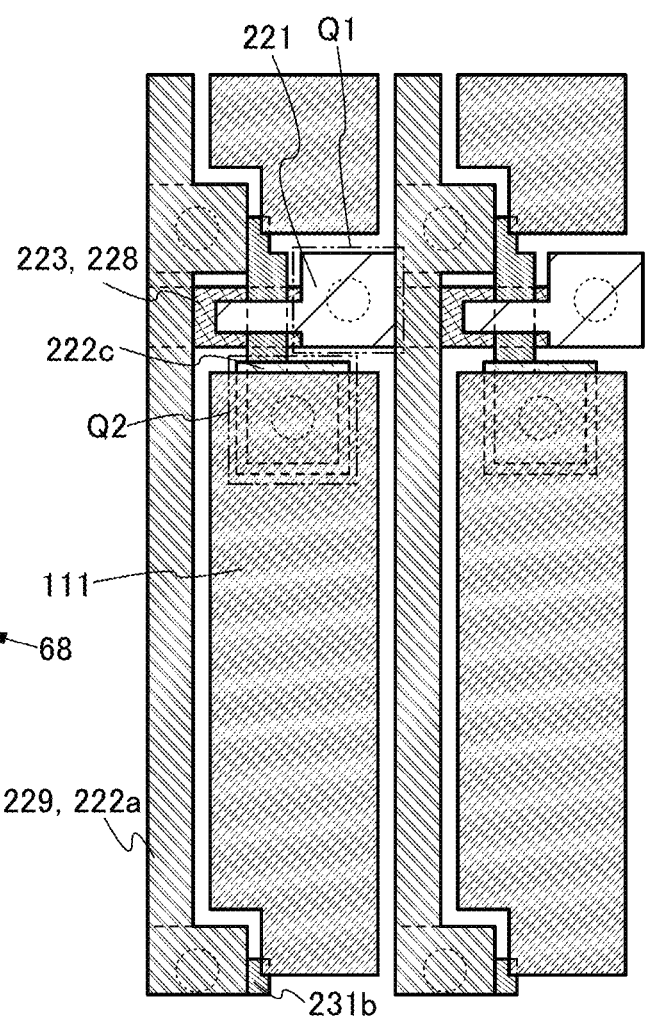
Figure 6:
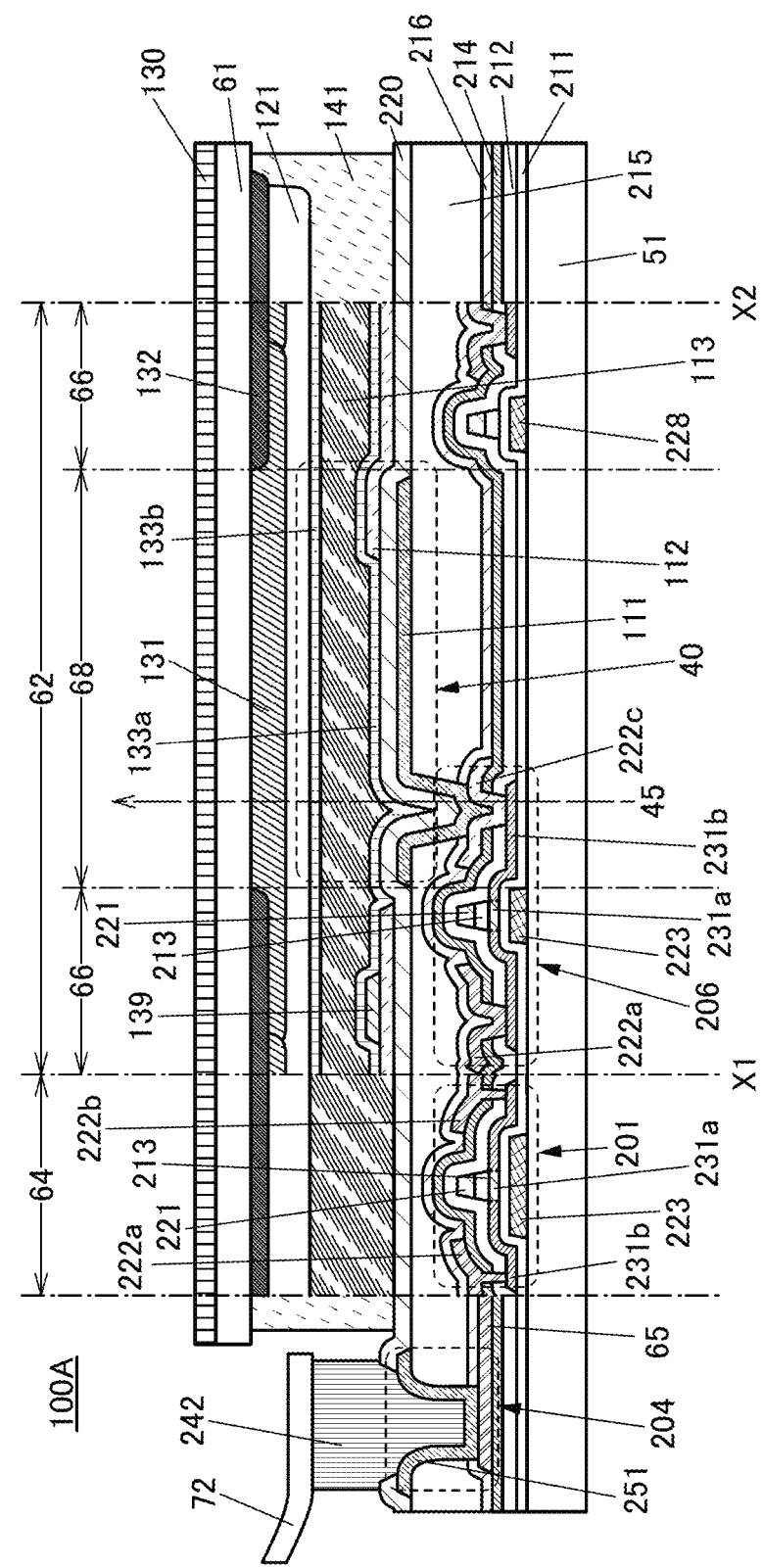
FIG. 6 is a cross-sectional view illustrating an example of a display device.
Figure 7:
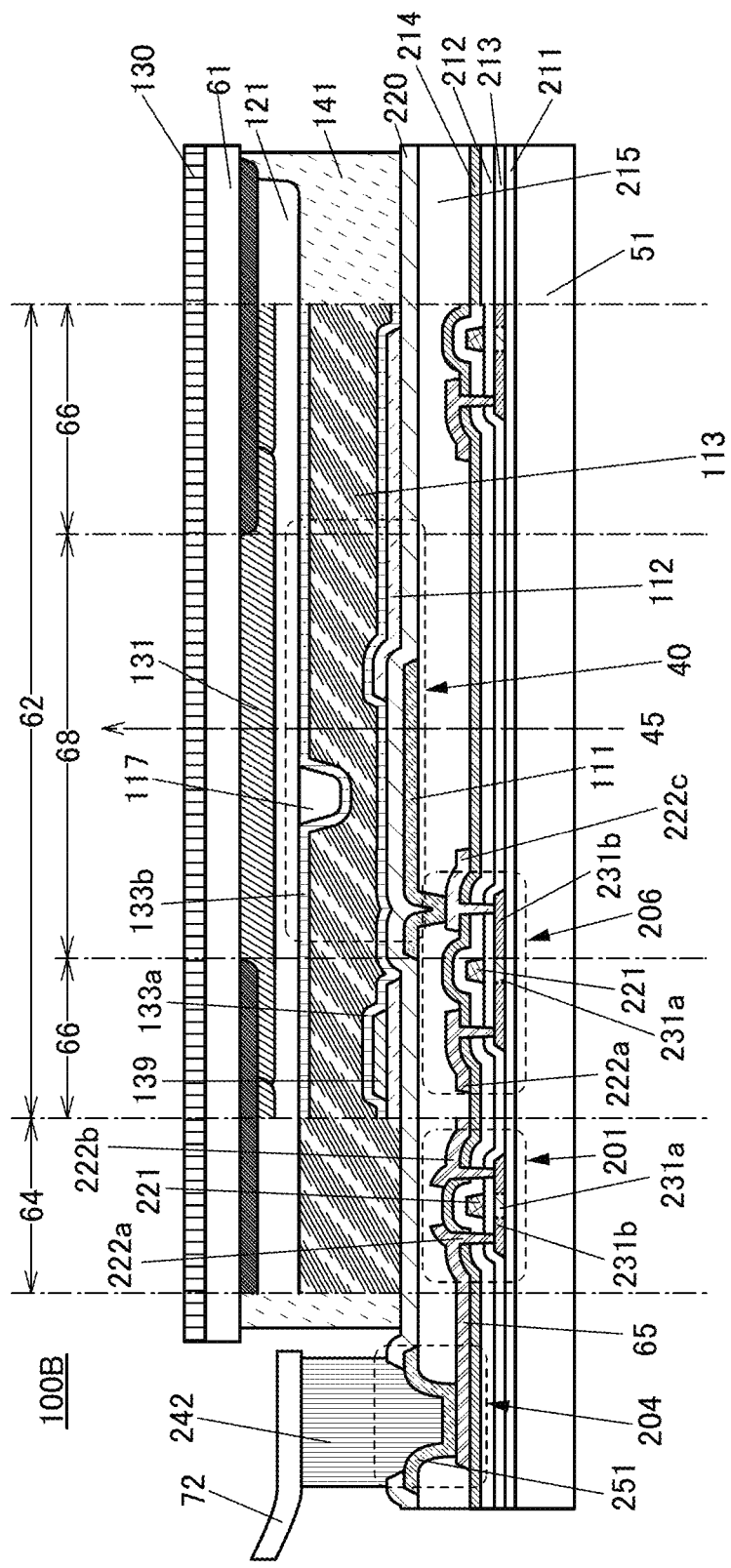
FIG. 7 is a cross-sectional view illustrating an example of a display device.

Next, display devices of this embodiment are described with reference to FIG. 4, FIGS. 5A and 5B, FIG. 6, and FIG. 7. FIG. 4 is a perspective view illustrating a display device 100A. FIGS. 5A and 5B are top views of subpixels included in the display device 100A. FIG. 6 is a cross-sectional view illustrating the display device 100A. FIG. 7 is a cross-sectional view illustrating a display device 100B. For clarity, components such as a polarizer 130 are not drawn in FIG. 4. FIG. 4 illustrates a substrate 61 with a dotted line.

The display device 100A includes a display portion 62 and a driver circuit portion 64. An FPC 72 and an IC 73 are implemented on the display device 100A.

The display portion 62 includes a plurality of pixels and has a function of displaying images.

A pixel includes a plurality of sub-pixels. For example, the display portion 62 can display a full-color image by having one pixel be composed of three subpixels: a subpixel exhibiting a red color, a subpixel exhibiting a green color, and a subpixel exhibiting a blue color. Note that the color exhibited by subpixels is not limited to red, green, and blue. A pixel may be composed of subpixels that exhibit colors of white, yellow, magenta, or cyan, for example. In this specification and the like, a subpixel may be simply described as a pixel.

The display device 100A may include one or both of a scan line driver circuit and a signal line driver circuit. The display device 100A may include none of the scan line driver circuit and the signal line driver circuit. When the display device 100A includes a sensor such as a touch sensor, the display device 100A may include a sensor driver circuit. In this embodiment, the driver circuit portion 64 is exemplified as including the scan line driver circuit. The scan line driver circuit has a function of outputting scan signals to the scan lines included in the display portion 62.

In the display device 100A, the IC 73 is mounted on a substrate 51 by a COG method or the like. The IC 73 includes, for example, any one or more of a signal line driver circuit, a scan line driver circuit, and a sensor driver circuit.

The FPC 72 is electrically connected to the display device 100A. The IC 73 and the driver circuit portion 64 are supplied with signals or power from the outside through the FPC 72. Furthermore, signals can be output to the outside from the IC 73 through the FPC 72.

An IC may be mounted on the FPC 72. For example, an IC including any one or more of a signal line driver circuit, a scan line driver circuit, and a sensor driver circuit may be mounted on the FPC 72.

A wiring 65 supplies signals and power to the display portion 62 and the driver circuit portion 64. The signals and power are input to the wiring 65 from the outside through the FPC 72, or from the IC 73.

FIG. 6 is a cross-sectional view including the display portion 62, the driver circuit portion 64, and the wiring 65. FIG. 6 includes a cross-sectional view along dashed-dotted line X1-X2 in FIG. 5A. In FIG. 6 and the subsequent cross-sectional views of the display device, the display portion 62 includes the display region 68 in a subpixel and the non-display region 66 around the display region 68.

FIG. 5A is a top view seen from the common electrode 112 side and illustrates a layered structure from a gate 223 to the common electrode 112 in the subpixel (see FIG. 6). In FIG. 5A, the display region 68 in the subpixel is outlined in a bold dotted line. FIG. 5B is a top view of the layered structure of FIG. 5A except for the common electrode 112.

The display device 100A is an example of a transmissive liquid crystal display device that includes a liquid crystal element with a horizontal electric field mode.

As illustrated in FIG. 6, the display device 100A includes the substrate 51, a transistor 201, a transistor 206, a liquid crystal element 40, an auxiliary wiring 139, an alignment film 133a, an alignment film 133b, a connection portion 204, an adhesive layer 141, a coloring layer 131, a light-blocking layer 132, an overcoat 121, the substrate 61, the polarizer 130, and the like.

The liquid crystal element 40 is provided in the display region 68. The liquid crystal element 40 is a liquid crystal element with fringe field switching (FFS) mode.

The liquid crystal element 40 includes a pixel electrode 111, the common electrode 112, and the liquid crystal layer 113. The alignment of the liquid crystal layer 113 can be controlled with the electric field generated between the pixel electrode 111 and the common electrode 112. The liquid crystal layer 113 is positioned between the alignment films 133a and 133b.

In FIG. 6, the pixel electrode 111 is electrically connected to a low-resistance region 231b through the conductive layer 222c.

The conductive layer 222c and the low-resistance region 231b are formed using a visible-light-transmitting material. Thus, a connection portion between the pixel electrode 111 and the transistor can be provided in the display region 68. Accordingly, the aperture ratio of the subpixel can be increased. Moreover, power consumption of the display device can be reduced.

The common electrode 112 may have a top-surface shape (also referred to as a planar shape) that has a comb-like shape or a top-surface shape that is provided with a slit. FIGS. 5A and 5B and FIG. 6 illustrate an example where one opening is provided in the common electrode 112 in the display region 68 of one subpixel. One or more openings can be provided in the common electrode 112. As the display device has higher definition, the area of the display region 68 in one subpixel becomes smaller. Thus, the number of openings provided in the common electrode 112 is not limited to more than one; one opening can be provided. That is, in a display device with high definition, the area of the pixel (subpixel) is small; therefore, an adequate electric field for the alignment of liquid crystals over the entire display region of the subpixel can be generated, even when there is only one opening in the common electrode 112.

The insulating layer 220 is provided between the pixel electrode 111 and the common electrode 112. The pixel electrode 111 includes a portion that overlaps with the common electrode 112 with the insulating layer 220 provided therebetween. Furthermore, the common electrode 112 is not placed above the pixel electrode 111 in some areas of a region where the pixel electrode 111 and the coloring layer 131 overlap. The auxiliary wiring 139 is provided over the common electrode 112. The resistivity of the auxiliary wiring 139 is preferably lower than that of the common electrode 112. By providing an auxiliary wiring that is electrically connected to the common electrode, a drop in voltage due to the resistance of the common electrode can be inhibited. In addition, when a layered structure of a conductive layer including a metal oxide and a conductive layer including a metal is used, these conductive layers are formed preferably by a patterning technique using a half tone mask, thereby simplifying the fabrication process.

The auxiliary wiring 139 may be a film with smaller resistance than the common electrode 112. For example, the auxiliary wiring 139 can be formed to have a single-layer structure or a layered structure using any of metal materials such as molybdenum, titanium, chromium, tantalum, tungsten, aluminum, copper, silver, neodymium, and scandium, and an alloy material containing any of these elements.

The auxiliary wiring 139 is preferably provided in a position that overlaps with the light-blocking layer 132 and the like, so that the auxiliary wiring 139 is not seen by the user of the display device.

An alignment film is preferably provided in contact with the liquid crystal layer 113. The alignment film can control the alignment of the liquid crystal layer 113. In the display device 100A, the alignment film 133a is positioned between the common electrode 112 (or the insulating layer 220) and the liquid crystal layer 113, and the alignment film 133b is positioned between the overcoat 121 and the liquid crystal layer 113.

The liquid crystal material is classified into a positive liquid crystal material with a positive dielectric anisotropy ($\Delta\varepsilon$) and a negative liquid crystal material with a negative dielectric anisotropy. Both of the materials can be used in one embodiment of the present invention, and an optimal liquid crystal material can be selected according to the employed mode and design.

In one embodiment of the present invention, a negative liquid crystal material is preferably used. The negative liquid crystal is less affected by a flexoelectric effect, which is attributed to the polarization of liquid crystal molecules, and thus the polarity of voltage applied to the liquid crystal layer makes little difference in transmittance. This prevents flickering from being recognized by the user of the display device. The flexoelectric effect is a phenomenon in which polarization is induced by the distortion of orientation, and mainly depends on the shape of a molecule. The negative liquid crystal material is less likely to experience the deformation such as spreading and bending.

Note that the liquid crystal element 40 is an element using an FFS mode here; however, one embodiment of the present invention is not limited thereto, and a liquid crystal element using any of a variety of modes can be used. For example, a liquid crystal element using a vertical alignment (VA) mode, a twisted nematic (TN) mode, an in-plane switching (IPS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, a VA-IPS mode, or a guest-host mode can be used.

Furthermore, the display device 100A may be a normally black liquid crystal display device, for example, a transmissive liquid crystal display device using a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element is an element that controls transmission and non-transmission of light by optical modulation action of the liquid crystal. The optical modulation action of a liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer 113 in order to improve the temperature range. The liquid crystal composition that includes a liquid crystal exhibiting a blue phase and a chiral material has a short response time and exhibits optical isotropy, which makes the alignment process unnecessary. In addition, the liquid crystal composition that includes a liquid crystal exhibiting a blue phase and a chiral material has little viewing angle dependence. In addition, since an alignment film does not need to be provided and rubbing treatment is unnecessary, electrostatic discharge damage caused by the rubbing treatment can be prevented and defects or damage of the liquid crystal display device in the manufacturing process can be reduced.

As the display device 100A is a transmissive liquid crystal display device, a visible-light-transmitting conductive material is used for both the pixel electrode 111 and the common electrode 112. A visible-light-transmitting conductive material is used for one or more conductive layers included in the transistor 206. Thus, at least part of the transistor 206 can be provided in the display region 68. A case in which a visible-light-transmitting conductive material is used for the conductive layer 222c is illustrated as an example in FIG. 6.

For example, a material containing one or more of indium (In), zinc (Zn), and tin (Sn) is preferably used for the visible-light-transmitting conductive material. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium are given, for example. Note that a film including graphene can be used as well. The film including graphene can be formed, for example, by reducing a film containing graphene oxide.

Preferably, at least one or more of the conductive layer 222c, the pixel electrode 111, and the common electrode 112 include an oxide conductive layer. The oxide conductive layer preferably includes one or more metal elements that are included in the semiconductor layer of the transistor 206. For example, the conductive layer 222c preferably contains indium and is further preferably an In-M-Zn oxide (M is Al, Ti, Ga, Ge, Y, Zr, La, Ce, Nd, Sn, or Hf) film. Similarly, each of the pixel electrode 111 and the common electrode 112 preferably contains indium and is further preferably an In-M-Zn oxide film.

At least one or more of the conductive layer 222c, the pixel electrode 111, and the common electrode 112 may be formed with an oxide semiconductor. When two or more layers constituting the display device are formed using oxide semiconductors containing the same metal element, the same manufacturing equipment (e.g., film-formation equipment or processing equipment) can be used in two or more steps; manufacturing cost can thus be reduced.

An oxide semiconductor is a semiconductor material whose resistance can be controlled by oxygen vacancies in the film of the semiconductor material and/or the concentration of impurities such as hydrogen or water in the film of the semiconductor material. Thus, the resistivity of the oxide conductive layer can be controlled by selecting between treatment for increasing oxygen vacancies and/or impurity concentration on the oxide semiconductor layer, or treatment for reducing oxygen vacancies and/or impurity concentration on the oxide semiconductor layer.

Note that such an oxide conductive layer formed using an oxide semiconductor layer can be referred to as an oxide semiconductor layer having a high carrier density and a low resistance, an oxide semiconductor layer having conductivity, or an oxide semiconductor layer having high conductivity.

In addition, the manufacturing cost can be reduced by forming the oxide semiconductor layer and the oxide conductive layer using the same metal element. For example, the manufacturing cost can be reduced by using a metal oxide target with the same metal composition. By using the metal oxide target with the same metal composition, an etching gas or an etchant used in the processing of the oxide semiconductor layer can also be used for processing of the oxide conductive layer. Note that even when the oxide semiconductor layer and the oxide conductive layer have the same metal elements, the compositions of the metal elements are different in some cases. For example, metal elements in the film can desorb during the fabrication process of the display device, which results in a different metal composition.

For example, when a silicon nitride film containing hydrogen is used for the insulating layer 216, and an oxide semiconductor is used for the conductive layer 222c, the conductivity of the oxide semiconductor can be increased by the hydrogen that is supplied from the insulating layer 216.

Similarly, when a silicon nitride film containing hydrogen is used for the insulating layer 220, and an oxide semiconductor is used for the pixel electrode 111, for example, the conductivity of the oxide semiconductor can be increased by the hydrogen that is supplied from the insulating layer 220.

The transistor 206 is provided in the non-display region 66.

The transistor 206 includes the gate 221, the gate 223, an insulating layer 211, an insulating layer 213, and a semiconductor layer (the channel region 231a and a pair of low-resistance regions 231b). The resistivity of the low-resistance region 231b is lower than that of the channel region 231a. In this embodiment, the case in which an oxide semiconductor layer is used as the semiconductor layer is described as an example. The oxide semiconductor layer preferably includes indium and is further preferably an In-M-Zn oxide (M is Al, Ti, Ga, Ge, Y, Zr, La, Ce, Nd, Sn, or Hf) film. The details of the oxide semiconductor layer is described later.

The gate 221 and the channel region 231a overlap with the insulating layer 213 positioned therebetween. The gate 223 and the channel region 231a overlap with the insulating layer 211 positioned therebetween. The insulating layers 211 and 213 serve as gate insulating layers. Through openings provided in the insulating layers 212 and 214, the conductive layer 222a is connected to one of the low-resistance regions 231b and the conductive layer 222c is connected to the other of the low-resistance regions 231b.

The transistor 206 illustrated in FIG. 6 is a transistor including gates above and below the channel.

In a contact area Q1 illustrated in FIG. 5B, the gates 221 and 223 are electrically connected. A transistor that has two gates that are electrically connected to each other can have a higher field-effect mobility and thus have higher on-state current than the other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display device in which the number of wirings is increased because of an increase in size or definition. In addition, the use of such a configuration allows the fabrication of a highly reliable transistor.

In a contact area Q2 illustrated in FIG. 5B, the conductive layer 222c is connected to the pixel electrode 111. As described above, the conductive layer 222c is formed using a visible-light-transmitting material. Accordingly, the contact area Q2 can be provided in the display region 68. Thus, the aperture ratio of the subpixel can be increased. Moreover, power consumption of the display device can be reduced.

In other words, in FIGS. 5A and 5B, one conductive layer serves as a scan line 228 and the gate 223. One of the gates 221 and 223 that has the lower resistance of the two is preferably the conductive layer that also serves as the scan line. The resistance of the conductive layer serving as the scan line 228 is preferably sufficiently low. Accordingly, the conductive layer serving as the scan line 228 is preferably formed using a metal, an alloy, or the like. For the conductive layer serving as the scan line 228, a material that has a function of blocking visible light may be used.

In FIGS. 5A and 5B, one conductive layer can be considered to serve as both the signal line 229 and the conductive layer 222a. The resistance of the conductive layer serving as the signal line 229 is preferably sufficiently low. Accordingly, the conductive layer serving as the signal line 229 is preferably formed using a metal, an alloy, or the like. For the conductive layer serving as the signal line 229, a material that has a function of blocking visible light may be used. That is, in one embodiment of the present invention, a feature of the transistor 206 is that the conductive layers 222a and 222c are formed using different materials.

Specifically, the resistivity of the visible-light-transmitting conductive material that can be used for the conductive layer 222c is higher than that of a visible-light-blocking conductive material such as copper or aluminum. Accordingly, bus lines such as the scan line and the signal line are preferably formed using a visible-light-blocking conductive material (metal material) having low resistivity in order to prevent signal delay. Note that depending on the size of the pixel, the width of the bus lines, the thickness of the bus lines, and the like, a visible-light-transmitting conductive material can be used to form the bus lines.

The gates 221 and 223 can each include a single layer of one of a metal material and an oxide conductor, or stacked layers of both a metal material and an oxide conductor. For example, one of the gates 221 and 223 may include an oxide conductor, and the other of the gates 221 and 223 may include a metal material.

The transistor 206 can be formed to include the oxide semiconductor layer as a semiconductor layer, and include the oxide conductive layer as at least one of the gates 221 and 223. In this case, the oxide semiconductor layer and the oxide conductive layer are preferably formed using an oxide semiconductor.

When a visible-light-blocking conductive layer is used for the gate 223, the channel region 231a can be prevented from being irradiated with light from the backlight. When the channel region 231a overlaps with the visible-light-blocking conductive layer as described above, variation in the characteristics of the transistor due to light can be suppressed. Thus, the transistor can have higher reliability.

The light-blocking layer 132 is provided on the substrate 61 side of the channel region 231a, and the visible-light-blocking gate 223 is provided on the substrate 51 side of the channel region 231a, whereby the channel region 231a can be prevented from being irradiated with external light and light from the backlight.

In one embodiment of the present invention, the visible-light-blocking conductive layer may overlap with part of the semiconductor layer and does not necessarily overlap with another part of the semiconductor layer. For example, the visible-light-blocking conductive layer may overlap with at least the channel region 231a. Specifically, as illustrated in FIG. 6 and the like, the low-resistance region 231b adjacent to the channel region 231a includes a region which does not overlap with the gate 223. Note that the low-resistance region 231b may be replaced with the oxide conductor (OC) described above. Since the oxide conductor (OC) transmits visible light as described above, light can pass through the low-resistance region 231b and be extracted.

In the case where silicon, typically, amorphous silicon or low temperature polysilicon (LTPS), is used for the semiconductor layer of the transistor, a region corresponding to the low-resistance region can also be referred to as a region including an impurity such as phosphorus or boron in silicon. Note that silicon has a band gap of approximately 1.1 eV. When an impurity such as phosphorus or boron is included in silicon, the band gap becomes smaller in some cases. Accordingly, in the case of using silicon for the semiconductor layer of the transistor, the low-resistance region formed in silicon has a low visible-light-transmitting property; and therefore, it is sometimes difficult for the low-resistance region to transmit light for extraction of the light. However, since the oxide semiconductor (OS) and the oxide conductor (OC) transmit visible light in one embodiment of the present invention, the aperture ratio of the pixel or the subpixel can be improved.

The transistor 206 is covered by the insulating layers 212 and 214 and insulating layers 215 and 216. Note that the insulating layers 212, 214, and 216 can be considered as the component of the transistor 206. The transistor is preferably covered by an insulating layer that reduces the diffusion of an impurity to the semiconductor constituting the transistor. The insulating layer 215 serves as a planarization layer.

Each of the insulating layers 211 and 213 preferably includes an excess oxygen region. When the gate insulating layer includes the excess oxygen region, excess oxygen can be supplied into the channel region 231a. A highly reliable transistor can be provided since oxygen vacancies that are potentially formed in the channel region 231a can be filled with excess oxygen.

The insulating layer 212 preferably includes nitrogen or hydrogen. When the insulating layer 212 and the low-resistance region 231b are in contact with each other, nitrogen or hydrogen in the insulating layer 212 is added into the low-resistance region 231b. The carrier density of the low-resistance region 231b becomes high when nitrogen or hydrogen is added. Alternatively, when the insulating layer 214 includes nitrogen or hydrogen and the insulating layer 212 transmits the nitrogen or hydrogen, the nitrogen or hydrogen can be added into the low-resistance region 231b.

In the display device 100A, the coloring layer 131 and the light-blocking layer 132 are provided on the substrate 61 side of the liquid crystal layer 113. The coloring layer 131 is positioned in a region that at least overlaps with the display region 68 of a subpixel. In the non-display region 66 of a pixel (subpixel), the light-blocking layer 132 is provided. The light-blocking layer 132 overlaps with at least a part of the transistor 206.

The overcoat 121 is preferably provided between the coloring layer 131 or the light-blocking layer 132, and the liquid crystal layer 113. The overcoat 121 can reduce the diffusion of an impurity contained in the coloring layer 131, the light-blocking layer 132, and the like into the liquid crystal layer 113.

The substrates 51 and 61 are bonded to each other by the adhesive layer 141. The liquid crystal layer 113 is encapsulated in a region that is surrounded by the substrates 51 and 61, and the adhesive layer 141.

When the display device 100A functions as a transmissive liquid crystal display device, two polarizers are positioned in a way that the display portion 62 is sandwiched between the two polarizers. FIG. 6 illustrates the polarizer 130 on the substrate 61 side. Light 45 from a backlight provided on the outside of the polarizer on the substrate 51 side enters the display device 100A through the polarizer. In this case, the optical modulation of the light can be controlled by controlling the alignment of the liquid crystal layer 113 with a voltage supplied between the pixel electrode 111 and the common electrode 112. That is, the intensity of light that is ejected through the polarizer 130 can be controlled. Furthermore, the coloring layer 131 absorbs light of wavelengths other than a specific wavelength range from the incident light. As a result, the ejected light exhibits red, blue, or green colors, for example.

In addition to the polarizer, a circular polarizer can be used, for example. An example of a circular polarizer include a polarizer which is formed by stacking a linear polarizer and a quarter-wave retardation film. The circular polarizer can reduce the viewing angle dependence of the display quality of the display device.

The liquid crystal element 40 is preferably driven in a guest-host liquid crystal mode. In the case of using a guest-host liquid crystal mode, a polarizing plate does not need to be used. Light absorption by the polarizing plate can be reduced, so that the light extraction efficiency can be increased, and an image displayed by the display device can be made bright.

The driver circuit portion 64 includes the transistor 201. The transistor 201 includes the gate 221, the gate 223, the insulating layer 211, the insulating layer 213, the semiconductor layer (the channel region 231a and a pair of low-resistance regions 231b), the conductive layer 222a, and the conductive layer 222b. One of the conductive layers 222a and 222b serves as a source, and the other serves as a drain. The conductive layer 222a is electrically connected to one of the low-resistance regions 231b and the conductive layer 222b is electrically connected to the other of the low-resistance regions 231b.

The transistor provided in the driver circuit portion 64 does not necessarily have a function of transmitting visible light. Accordingly, the conductive layer 222a can be formed in the same step and using the same material as the conductive layer 222b.

In the connection portion 204, the wiring 65 and a conductive layer 251 are connected to each other, and the conductive layer 251 and a connector 242 are connected to each other. That is, in the connection portion 204, the wiring 65 is electrically connected to the FPC 72 through the conductive layer 251 and the connector 242. By employing this configuration, signals and power can be supplied from the FPC 72 to the wiring 65.

The wiring 65 can be formed with the same material and the same fabrication step as those used in the conductive layers 222a and 222b that is included in the transistor 201 the conductive layer 222a that is included in the transistor 206. The conductive layer 251 can be formed with the same material and the same fabrication step as those used in the pixel electrode 111 that is included in the liquid crystal element 40. Fabricating the conductive layers constituting the connection portion 204 in such a manner, i.e., using the same materials and the same fabrication processes as those used in the conductive layers composing the display portion 62 and the driver circuit portion 64, is preferable because the number of process steps is not increased.

The transistors 201 and 206 may or may not have the same structure. That is, the transistors included in the driver circuit portion 64 and the transistors included in the display portion 62 may or may not have the same structure. In addition, the driver circuit portion 64 may have a plurality of transistors with different structures, and the display portion 62 may have a plurality of transistors with different structures. For example, a transistor including two gates that are electrically connected to each other is preferably used for one or more of a shift register circuit, a buffer circuit, and a protection circuit included in a scan line driver circuit.

FIG. 7 shows a cross-sectional view of a display device 100B. Note that the perspective view of the display device 100B is similar to that of the display device 100A illustrated in FIG. 4; thus, the description thereof is omitted.

The display device 100A shows an example where the transistor includes two gates; in the display device 100B, the transistors 201 and 206 each include only the gate 221. In addition, the display device 100B includes a spacer 117. Components of the display device 100B that are similar to those of the display device 100A are not described in detail.

The transistors 201 and 206 are provided over the insulating layer 211. The insulating layer 211 serves as a base film. The transistor 206 includes the gate 221, the insulating layer 213, and the semiconductor layer (the channel region 231a and a pair of low-resistance regions 231b). Through openings provided in the insulating layers 212 and 214, the conductive layer 222a is connected to one of the low-resistance regions 231b and the conductive layer 222b or 222c is connected to the other of the low-resistance regions 231b. The insulating layer 215 serves as a planarization layer.

The conductive layer 222b that is included in the transistor 201 can be formed with the same material and the same step as the conductive layer 222a. The conductive layer 222c that is included in the transistor 201 is formed using a visible-light-transmitting material.

The spacer 117 has a function of keeping the distance between the substrate 51 and the substrate 61 greater than or equal to a certain distance.

In the example shown in FIG. 7, the bottom surface of the spacer 117 is in contact with the overcoat 121; however, one embodiment of the present invention is not limited thereto. The spacer 117 may be provided on the substrate 51 side, or the substrate 61 side.

In the example shown in FIG. 7, the alignment films 133a and 133b are not in contact with each other in a region where the alignment films 133a and 133b overlap with the spacer 117; however, the alignment films 133a and 133b may be in contact with each other. Furthermore, the spacer 117 provided over one substrate may be, but is not necessarily, in contact with a structure provided over the other substrate. For example, the liquid crystal layer 113 may be positioned between the spacer 117 and the structure.

A particulate spacer may be used as the spacer 117. As the particulate spacer, materials such as silica can be used. Spacer is preferably made of a material with elasticity, such as a resin or rubber. In this case, the particulate spacer may take a shape that is vertically crushed.

Next, the details of the materials that can be used for components of the display device of this embodiment and the like are described. Note that description on the components already described is omitted in some cases. The materials described below can be used as appropriate in the display device, the touch panel, and the components thereof described later.

<<Substrates 51 and 61>>

There are no large limitations on the material of the substrate used in the display device of one embodiment of the present invention; a variety of substrates can be used. For example, a glass substrate, a quartz substrate, a sapphire substrate, a semiconductor substrate, a ceramic substrate, a metal substrate, or a plastic substrate can be used.

The weight and thickness of the display device can be reduced by using a thin substrate. Furthermore, a flexible display device can be obtained by using a substrate that is thin enough to have flexibility.

The display device of one embodiment of the present invention is fabricated by forming a transistor and the like over the fabrication substrate, then transferring the transistor and the like on another substrate. The use of the fabrication substrate enables the following: a formation of a transistor with favorable characteristics; a formation of a transistor with low power consumption; a manufacturing of a durable display device; an addition of heat resistance to the display device; a manufacturing of a more lightweight display device; or a manufacturing of a thinner display device. Examples of a substrate to which a transistor is transferred include, in addition to the substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, a rubber substrate, and the like.

<<Transistors 201 and 206>>

A transistor included in the display device of one embodiment of the present invention may have a top-gate structure or a bottom-gate structure. Gate electrodes may be provided above and below a channel. A semiconductor material used in the transistor is not particularly limited, and an oxide semiconductor, silicon, or germanium can be used, for example.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. The use of a semiconductor having crystallinity is preferable as the degradation of a transistor's characteristics can be reduced.

For example, a Group 14 element, a compound semiconductor, or an oxide semiconductor can be used for the semiconductor layer. Typically, a semiconductor including silicon, a semiconductor including gallium arsenide, or an oxide semiconductor including indium can be used for the semiconductor layer.

An oxide semiconductor is preferably used for the semiconductor in which the channel of a transistor is formed. In particular, using an oxide semiconductor with a larger bandgap than that of silicon is preferable. The use of a semiconductor material with a larger bandgap than that of silicon and a small carrier density is preferable because the current during the off state (off-state current) of the transistor can be reduced.

The above description, the description in Embodiment 5, and the like can be referred to for the oxide semiconductor.

The use of such an oxide semiconductor for the semiconductor layer makes it possible to provide a highly reliable transistor in which a change in the electrical characteristics is reduced.

Charge accumulated in a capacitor through the transistor can be retained for a long time because of low off-state current of the transistor. The use of such a transistor in pixels allows a driver circuit to stop while the gray level of a displayed image is maintained. As a result, a display device with extremely low power consumption is obtained.

The transistors 201 and 206 preferably include an oxide semiconductor layer that is highly purified to reduce the formation of oxygen vacancies. This makes the off-state current of the transistor low. Accordingly, an electrical signal such as an image signal can be held for a long period, and a writing interval can be set long in an on state. Thus, the frequency of refresh operation can be reduced, which leads to an effect of reducing power consumption.

In the transistors 201 and 206, a relatively high field-effect mobility can be obtained, whereby high-speed operation is possible. The use of such transistors that are capable of high-speed operation in the display device enables the fabrication of the transistor in the display portion and the transistors in the driver circuit portion over the same substrate. This means that a semiconductor device separately formed with a silicon wafer or the like does not need to be used as the driver circuit, which enables a reduction in the number of components in the display device. In addition, using the transistor that can operate at high speed in the display portion also can enable the provision of a high-quality image.

<<Insulatinglayer>>

An organic insulating material or an inorganic insulating material can be used as an insulating material that can be used for the insulating layer, the overcoat, the spacer, or the like included in the display device. Examples of an organic insulating material include an acrylic resin, an epoxy resin, a polyimide resin, a polyamide resin, a polyamide-imide resin, a siloxane resin, a benzocyclobutene-based resin, and a phenol resin. Examples of an inorganic insulating film include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

<<Conductive Layer>>

For the conductive layer such as the gate, the source, and the drain of a transistor and the wiring, the electrode, and the like of the display device, a single-layer structure or a layered structure using any of metals such as aluminum, titanium, chromium, nickel, copper, yttrium, zirconium, molybdenum, silver, tantalum, and tungsten, or an alloy containing any of these metals as its main component can be used. For example, a two-layer structure in which a titanium film is stacked over an aluminum film; a two-layer structure in which a titanium film is stacked over a tungsten film; a two-layer structure in which a copper film is stacked over a molybdenum film; a two-layer structure in which a copper film is stacked over an alloy film containing molybdenum and tungsten; a two-layer structure in which a copper film is stacked over an alloy film containing copper, magnesium, and aluminum; a three-layer structure in which titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; or the like can be employed. For example, in the case where the conductive layer has a three-layer structure, it is preferable that each of the first and third layers be a film formed of titanium, titanium nitride, molybdenum, tungsten, an alloy containing molybdenum and tungsten, an alloy containing molybdenum and zirconium, or molybdenum nitride, and that the second layer be a film formed of a low-resistance material such as copper, aluminum, gold, silver, or an alloy containing copper and manganese. Note that light-transmitting conductive materials such as ITO, indium oxide containing tungsten oxide, indium zinc oxide containing tungsten oxide, indium oxide containing titanium oxide, indium tin oxide containing titanium oxide, indium zinc oxide, or ITSO may be used.

An oxide conductive layer may be formed by controlling the resistivity of the oxide semiconductor.

<<Adhesive Layer 141>>

A curable resin such as a heat-curable resin, a photocurable resin, or a two-component type curable resin can be used for the adhesive layer 141. For example, an acrylic resin, a urethane resin, an epoxy resin, or a siloxane resin can be used.

<<Connector 242>>

As the connector 242, for example, an anisotropic conductive film (ACF) or an anisotropic conductive paste (ACP) can be used.

<<Coloring Layer 131>>

The coloring layer 131 is a colored layer that transmits light in a specific wavelength range. Examples of materials that can be used for the coloring layer 131 include a metal material, a resin material, and a resin material containing a pigment or dye.

<<Light-Blocking Layer 132>>

The light-blocking layer 132 is provided, for example, between adjacent coloring layers 131 for different colors. A black matrix formed with, for example, a metal material or a resin material containing a pigment or dye can be used as the light-blocking layer 132. Note that it is preferable to provide the light-blocking layer 132 also in a region other than the display portion 62, such as the driver circuit portion 64, in which case leakage of guided light or the like can be inhibited.

The thin films constituting the display device (i.e., the insulating film, the semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, and the like. As examples of the CVD method, a plasma-enhanced CVD (PECVD) method or a thermal CVD method can be given. As an example of the thermal CVD method, a metal organic CVD (MOCVD) method can be given.

Alternatively, the thin films constituting the display device (i.e., the insulating film, the semiconductor film, the conductive film, and the like) can be formed by a method such as spin coating, dipping, spray coating, inkjet printing, dispensing, screen printing, or offset printing, or with a doctor knife, a slit coater, a roll coater, a curtain coater, or a knife coater.

The thin films constituting the display device can be processed using a photolithography method or the like. Alternatively, island-shaped thin films may be formed by a film formation method using a blocking mask. Alternatively, the thin films may be processed by a nano-imprinting method, a sandblasting method, a lift-off method, or the like. Examples of the photolithography method include a method in which a resist mask is formed over a thin film to be processed, the thin film is processed by etching or the like, and the resist mask is removed, and a method in which a photosensitive thin film is formed, and the photosensitive thin film is exposed to light and developed to be processed in a desired shape.

As light used in exposure in a photolithography method, light with an i-line (with a wavelength of 365 nm), light with a g-line (with a wavelength of 436 nm), light with an h-line (with a wavelength of 405 nm), and light in which the i-line, the g-line, and the h-line are mixed can be given. Alternatively, ultraviolet light, KrF laser light, ArF laser light, or the like can be used. Exposure may be performed by liquid immersion exposure technique. As light used in exposure, extreme ultra-violet light (EUV), X-rays, or the like can be given. An electron beam can be used instead of a light used in exposure. It is preferable to use extreme ultra-violet light, X-rays, or an electron beam because extremely minute processing can be performed. Note that when exposure is performed by scanning of a beam such as an electron beam, a photomask is not needed.

For etching of the thin film, dry etching, wet etching, a sandblast method, or the like can be used.

<3. Structure Example 3 of Display Device>

Figure 8:
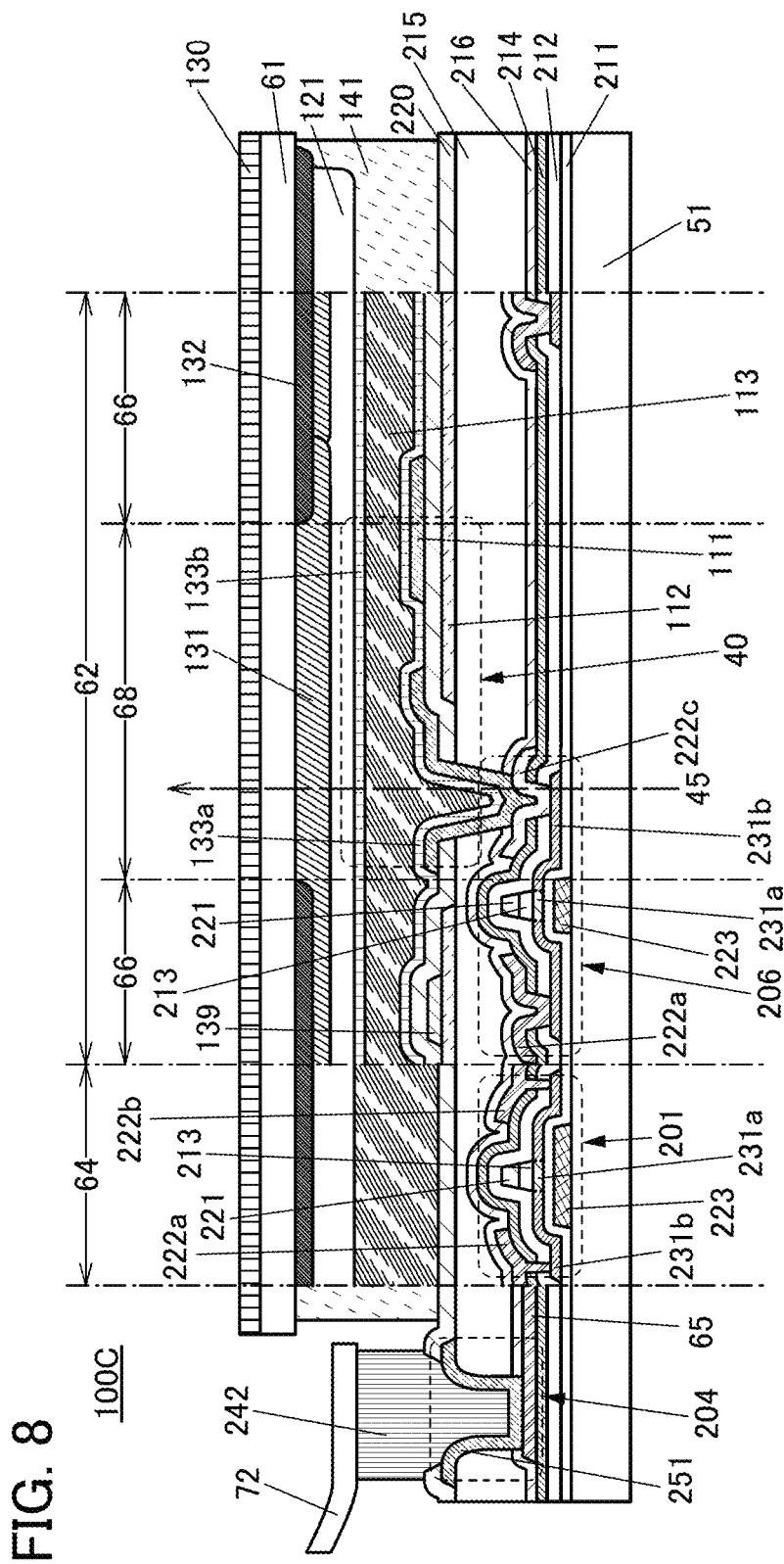
FIG. 8 is a cross-sectional view illustrating an example of a display device.
Figure 10A:
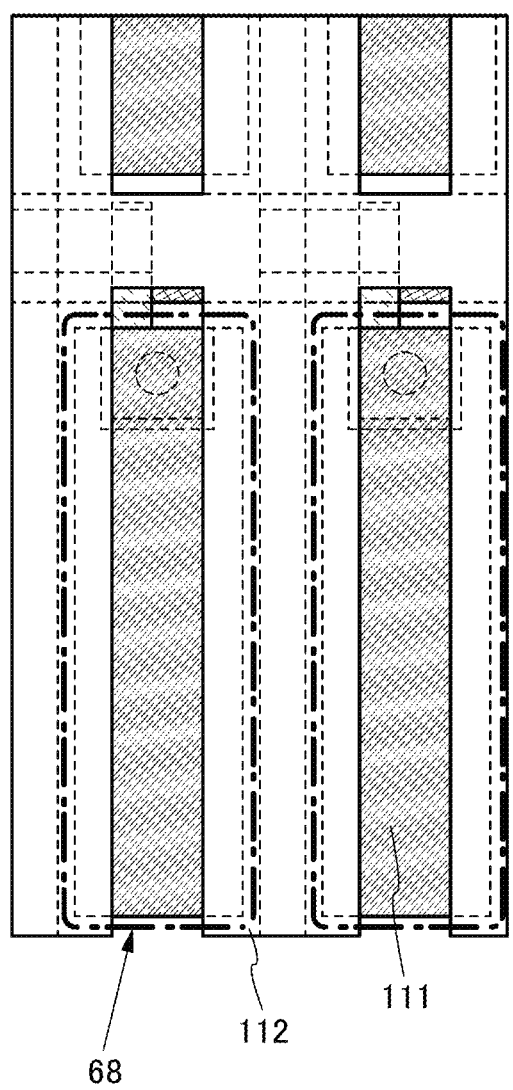
FIGS. 10A and 10B are top views illustrating an example of a subpixel.
Figure 10B:
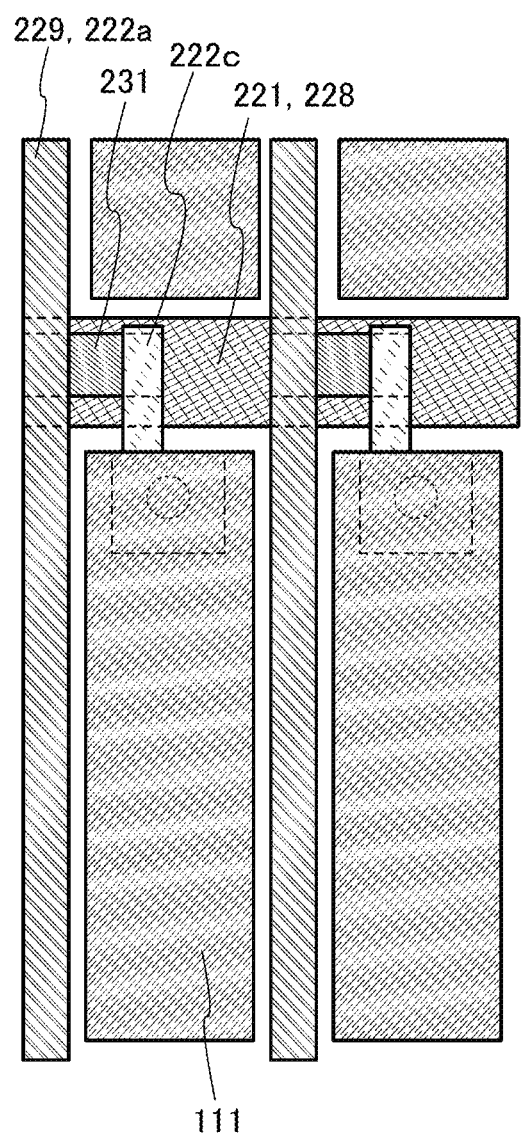
Figure 11:
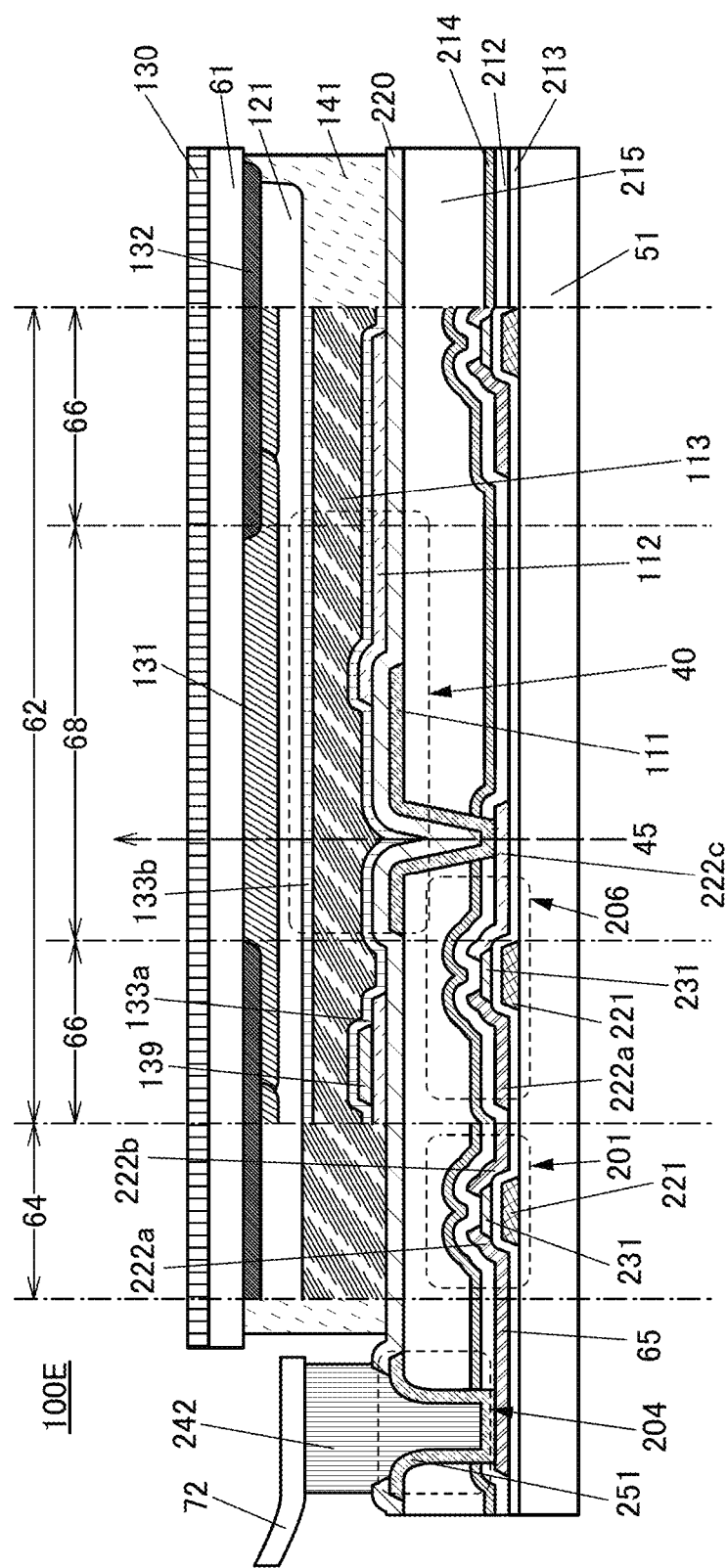
FIG. 11 is a cross-sectional view illustrating an example of a display device.
Figure 12:
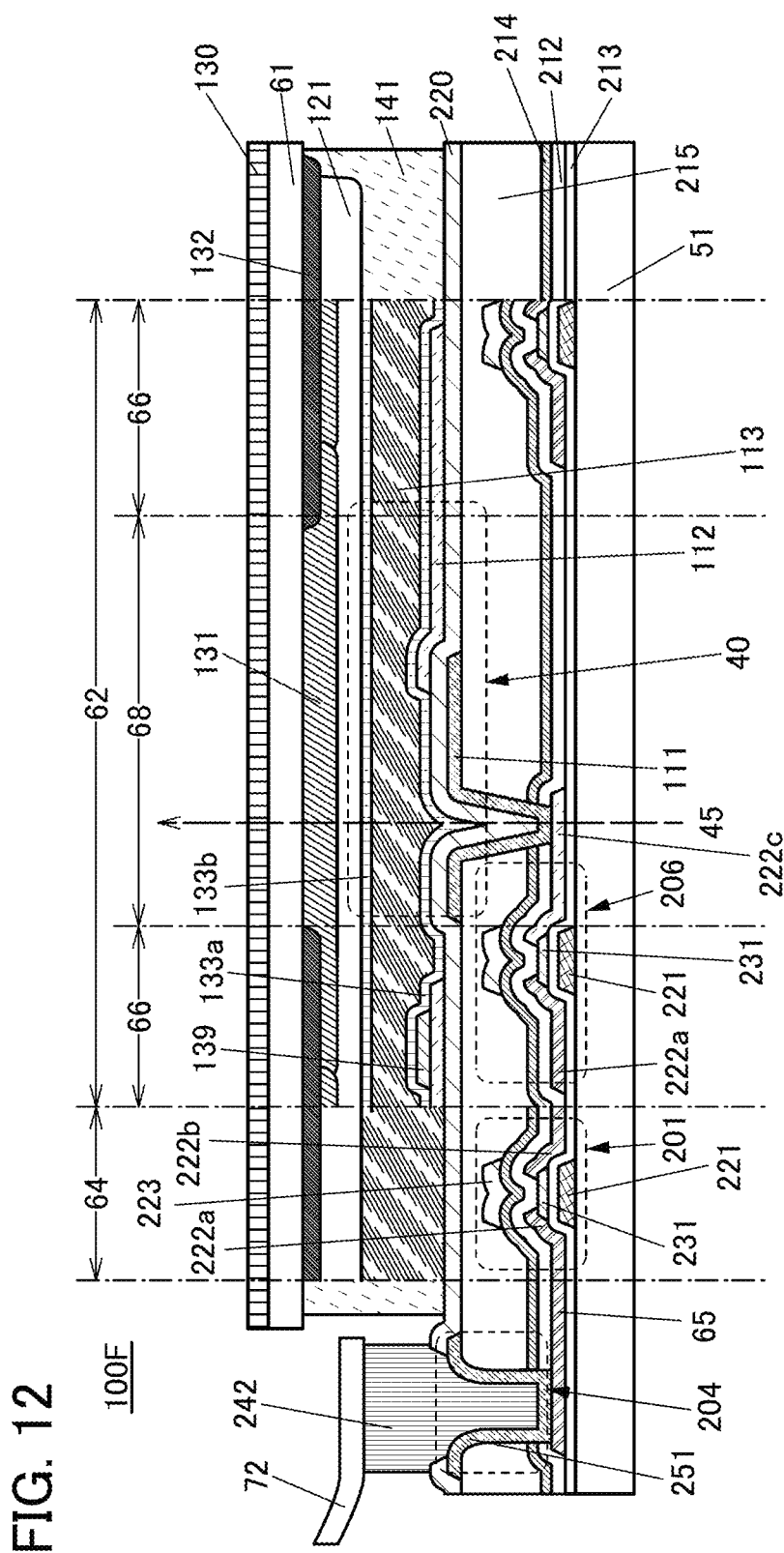
FIG. 12 is a cross-sectional view illustrating an example of a display device.

FIG. 8, FIGS. 9A to 9D, FIGS. 10A and 10B, FIG. 11, and FIG. 12 illustrate examples of a display device. FIG. 8 is a cross-sectional view illustrating a display device 100C. FIG. 9A is a cross-sectional view illustrating a display device 100D. FIGS. 10A and 10B are top views each illustrating subpixels included in the display device. FIG. 11 is a cross-sectional view illustrating a display device 100E. FIG. 12 is a cross-sectional view illustrating a display device 100F. Note that the perspective views of the display devices 100C, 100D, 100E, and 100F are not drawn here, as they are similar to the perspective view of the display device 100A, which is illustrated in FIG. 4.

The display device 100C illustrated in FIG. 8 is different from the above-described display device 100A in the positions of the pixel electrode 111 and the common electrode 112.

In the display device 100A illustrated in FIG. 6, the alignment film 133a is in contact with the first common electrode 112. In contrast, in the display device 100C illustrated in FIG. 8, the alignment film 133a is in contact with the pixel electrode 111.

The display device 100D illustrated in FIGS. 9A to 9D is different from the display device 100A in the shapes of the pixel electrode 111 and the common electrode 112.

Both of the pixel electrode 111 and the common electrode 112 may have a top-surface shape (also referred to as a planar shape) that has a comb-like shape or a top-surface shape that is provided with a slit.

In the display device 100D illustrated in FIGS. 9A to 9D, the pixel electrode 111 and the common electrode 112 are provided on the same plane.

Alternatively, the electrodes may have a shape in which an edge of a slit in one electrode is aligned with an edge of a slit in the other electrode. The cross-sectional view of this case is shown in FIG. 9B.

Alternatively, the pixel electrode 111 and the common electrode 112 may have a portion overlapping with each other, when seen from above. The cross-sectional view of this case is shown in FIG. 9C.

Alternatively, the display portion 62 may have a portion where neither the pixel electrode 111 nor the common electrode 112 is provided, when seen from above. The cross-sectional view of this case is shown in FIG. 9D.

FIGS. 10A and 10B are top views illustrating a subpixel in which a bottom-gate top-contact (BGTC) transistor is used as a transistor electrically connected to the liquid crystal element. FIG. 10A illustrates the transistor, the pixel electrode 111, and the common electrode 112. The BGTC transistor includes the gate 221, the semiconductor layer 231, and the conductive layers 222a and 222c serving as the source and drain electrodes. FIG. 10B is a top view in which the common electrode 112 is omitted from the stacked structure illustrated in FIG. 10A.

In FIGS. 10A and 10B, one conductive layer can be considered to serve as both the scan line 228 and the gate 221. Also in FIGS. 10A and 10B, one conductive layer can be considered to serve as both the signal line 229 and the conductive layer 222a.

The conductive layer 222c is formed using a visible-light-transmitting material. Thus, a connection portion between the pixel electrode 111 and the transistor can be provided in the display region 68. Accordingly, the aperture ratio of the subpixel can be increased. Moreover, power consumption of the display device can be reduced.

The display device 100E illustrated in FIG. 11 and the display device 100F illustrated in FIG. 12 each are different from the display device 100A in the shapes of the transistors.

The transistors 201 and 206 illustrated in FIG. 11 each include the gate 221, the insulating layer 213, the conductive layer 222a, and the semiconductor layer 231. The transistor 201 further includes the conductive layer 222b. The transistor 206 further includes the conductive layer 222c.

The gate 221 and the semiconductor layer 231 overlap with the insulating layer 213 positioned therebetween. The insulating layer 213 serves as a gate insulating layer. Each of the conductive layers 222a, 222b, and 222c has a portion connected to the semiconductor layer 231. One of the conductive layer 222a and the conductive layer 222b or 222c serves as a source electrode and the other serves as a drain electrode. The transistors 201 and 206 are covered by the insulating layers 212 and 214.

The transistors 201 and 206 illustrated in FIG. 12 each include the gate 221, the gate 223, the insulating layers 212 to 214, the conductive layer 222a, and the semiconductor layer 231. The transistor 201 further includes the conductive layer 222b. The transistor 206 further includes the conductive layer 222c.

The gate 221 and the semiconductor layer 231 overlap with the insulating layer 213 positioned therebetween. The gate 223 and the semiconductor layer 231 overlap with the insulating layers 212 and 214 positioned therebetween. Each of the insulating layers 212 to 214 serves as a gate insulating layer. Each of the conductive layers 222a, 222b, and 222c has a portion connected to the semiconductor layer 231. One of the conductive layer 222a and the conductive layer 222b or 222c serves as a source electrode and the other serves as a drain electrode. The transistors 201 and 206 are covered by the insulating layer 215.

In each of FIG. 11 and FIG. 12, the pixel electrode 111 is electrically connected to the conductive layer 222c.

The conductive layer 222c is formed using a visible-light-transmitting material. Thus, a connection portion between the pixel electrode 111 and the transistor can be provided in the display region 68. Accordingly, the aperture ratio of the subpixel can be increased. Moreover, power consumption of the display device can be reduced.

As described above, the display device of one embodiment of the present invention can include transistors and liquid crystal elements with various shapes.

<4. Structure Example 4 of Display Device>

FIGS. 13A and 13B, FIGS. 14A and 14B, FIGS. 15A and 15B, FIGS. 16A and 16B, FIGS. 17A and 17B, and FIGS. 18A and 18B are top views illustrating subpixels different from the subpixels illustrated in FIGS. 5A and 5B.

FIGS. 5A and 5B are top views illustrating the subpixels including an FFS mode liquid crystal element. FIGS. 5A and 5B illustrate an example in which the pixel electrode 111 and the common electrode 112 are provided in this order from the transistor side.

Like FIGS. 5A and 5B, FIGS. 13A and 13B and FIGS. 14A and 14B are top views illustrating the subpixels including an FFS mode liquid crystal element. Also in the examples of FIGS. 13A and 13B and FIGS. 14A and 14B, the pixel electrode 111 and the common electrode 112 are provided in this order from the transistor side.

Figure 13A:
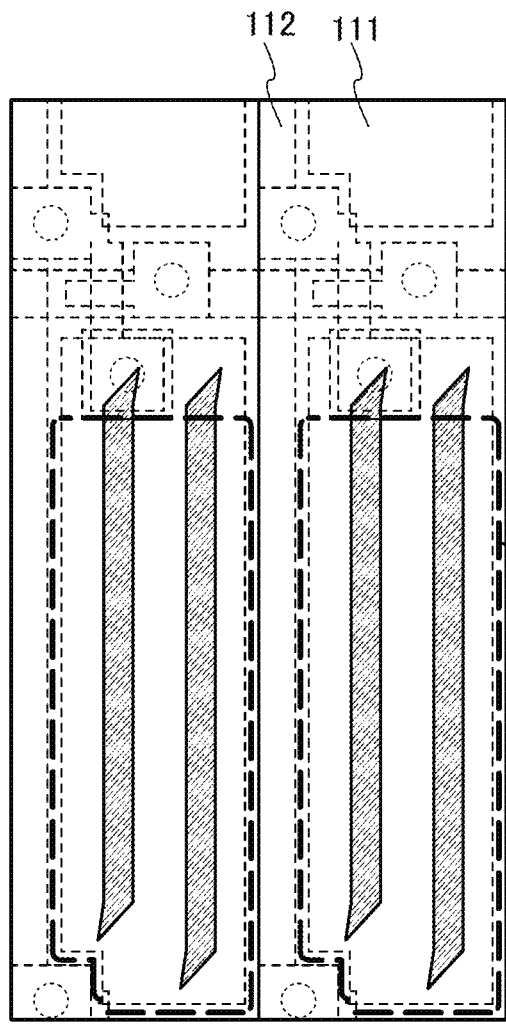
FIGS. 13A and 13B are top views illustrating an example of a subpixel.
Figure 13B:
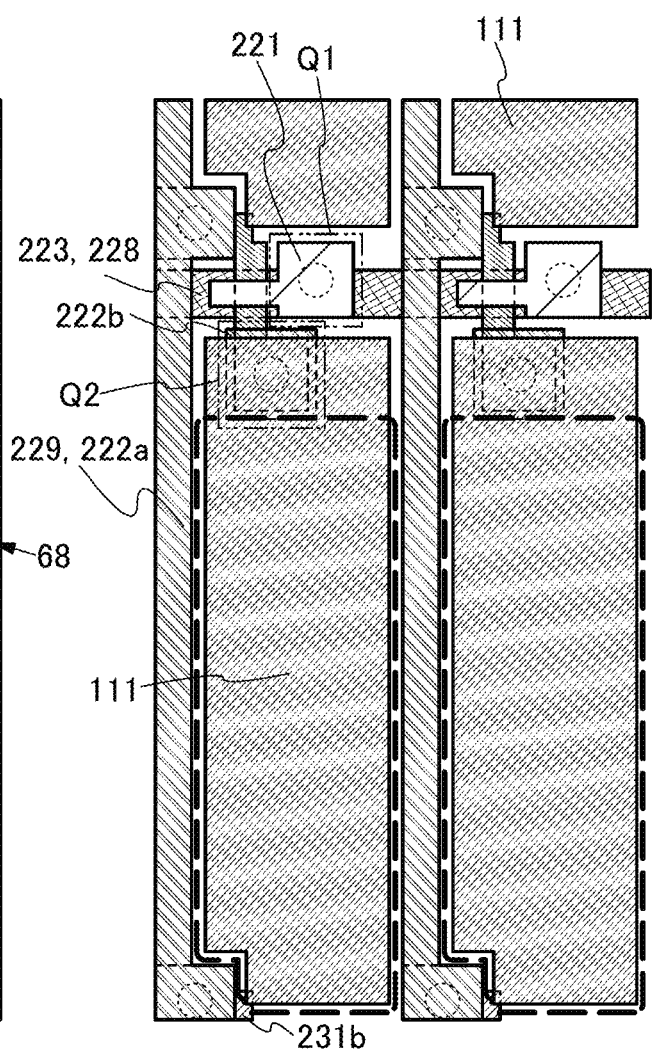
Figure 14A:
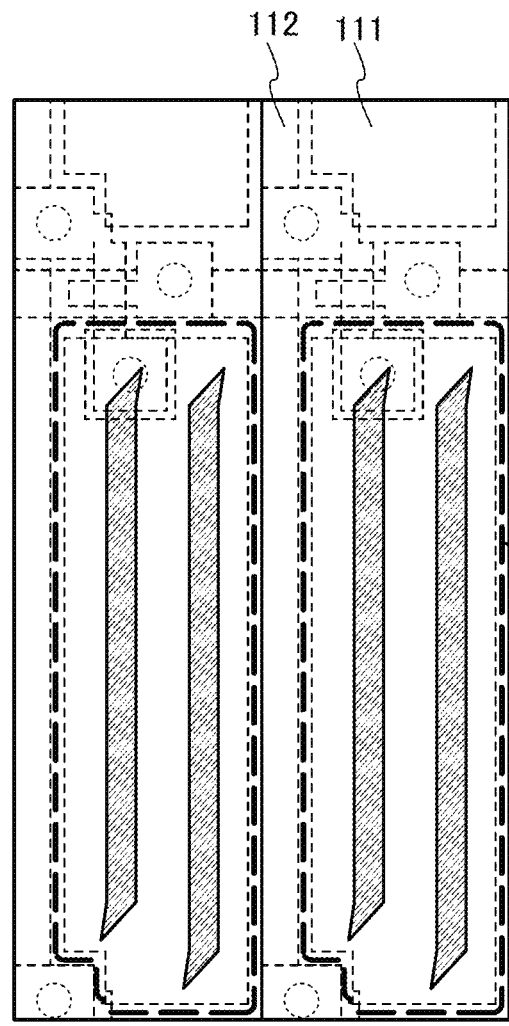
FIGS. 14A and 14B are top views illustrating an example of a subpixel.

Each of FIG. 13A and FIG. 14A is a top view seen from the common electrode 112 side illustrating a stacked structure from the gate 223 to the common electrode 112 of the subpixels. In each of FIG. 13A and FIG. 14A, the display regions 68 in the subpixels are outlined in a bold dotted line. Each of FIG. 13B and FIG. 14B is a top view in which the common electrode 112 is omitted from the stacked structure illustrated in each of FIG. 13A and FIG. 14A.

As illustrated in each of FIG. 13A and FIG. 14A, the display region 68 of one subpixel can be provided with two or more openings in the common electrode 112.

Figure 14B:
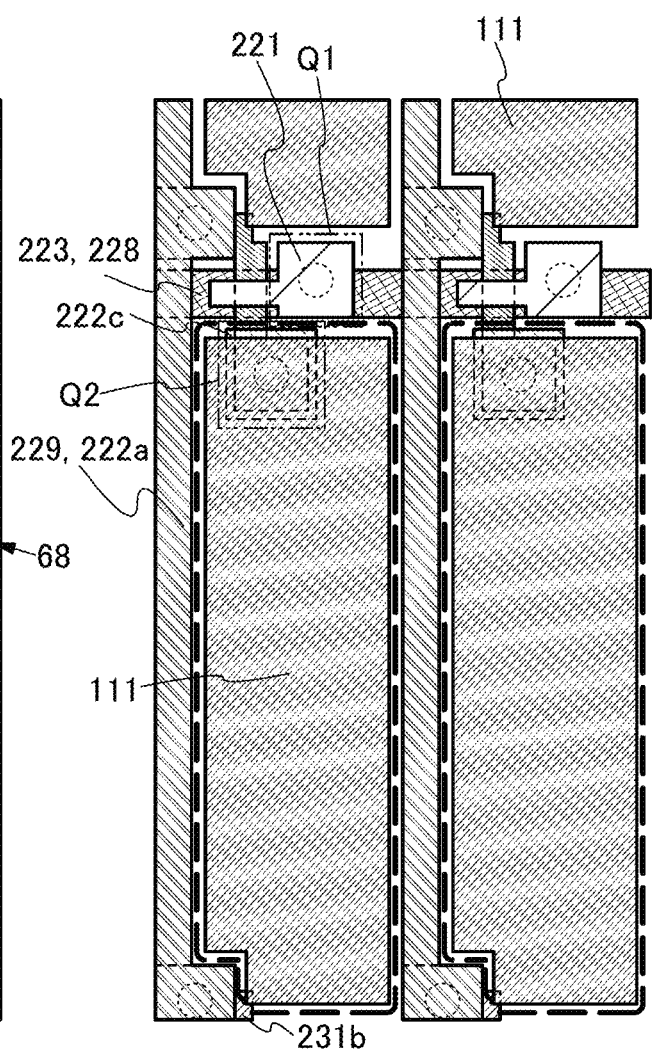

In the contact area Q1 illustrated in FIG. 13B and FIG. 14B, the gates 221 and 223 are electrically connected.

In a contact area Q2 illustrated in FIG. 13B, the conductive layer 222b is connected to the pixel electrode 111. In a contact area Q2 illustrated in FIG. 14B, the conductive layer 222c is connected to the pixel electrode 111.

In the structure illustrated in FIGS. 14A and 14B, the conductive layer 222c transmits visible light. Accordingly, the contact area Q2 can be provided in the display region 68. In contrast, the conductive layer 222b illustrated in FIGS. 13A and 13B blocks visible light. Thus, the aperture ratio of the subpixel in the structure illustrated in FIGS. 14A and 14B can be higher than that in the structure illustrated in FIGS. 13A and 13B. Moreover, the power consumption of the display device can be reduced.

In one embodiment of the present invention, the contact area of the pixel electrode and the transistor is provided in the display regions 68, whereby the aperture ratio can be improved by higher than or equal to 10%, preferably higher than or equal to 20%. Thus, the power consumption of the backlight can be reduced by higher than or equal to 10%, preferably higher than or equal to 20%.

In the structure illustrated in FIGS. 13A and 13B, the conductive layers 222a and 222b can be formed using the same material and in the same step, and thus the manufacturing process can be simplified, leading to a reduction in cost.

FIGS. 15A and 15B and FIGS. 16A and 16B are top views illustrating the subpixels each including a liquid crystal element using a vertical electric field mode such as a TN mode or a VA mode.

Each of FIG. 15A and FIG. 16A is a top view seen from the pixel electrode 111 side illustrating a stacked structure from the gate 223 to the pixel electrode 111 of the subpixels. In each of FIG. 15A and FIG. 16A, the display regions 68 in the subpixels are outlined in a bold dotted line. Each of FIG. 15B and FIG. 16B is a top view in which the pixel electrode 111 is omitted from the stacked structure illustrated in FIG. 15A or FIG. 16A.

In the case of using a horizontal electric field mode liquid crystal element, capacitance can be formed between the pixel electrode 111 and the common electrode 112. In contrast, in the case of using a vertical electric field mode liquid crystal element, a capacitor is separately formed.

In each of FIGS. 15A and 15B and FIGS. 16A and 16B, a capacitor line 244 is provided in the subpixel. The capacitor line 244 is electrically connected to a conductive layer formed using the same material and in the same step as the conductive layer (e.g., the gate 221) included in the transistor. In FIGS. 15A and 15B, the visible-light-blocking conductive layer 222b is provided to overlap with the capacitor line 244. In FIGS. 16A and 16B, the visible-light-transmitting conductive layer 222c is provided to overlap with the capacitor line 244. In FIGS. 15A and 15B, the conductive layer 222b is connected to the pixel electrode 111. In FIGS. 16A and 16B, the conductive layer 222c is connected to the pixel electrode 111.

In the structure illustrated in FIGS. 16A and 16B, the conductive layer 222c transmits visible light. Accordingly, at least part of the capacitor and the contact area of the conductive layer 222c and the pixel electrode 111 can be provided in the display region 68. The conductive layer 222b illustrated in FIGS. 15A and 15B blocks visible light. Thus, the aperture ratio of the subpixels in the structure illustrated in FIGS. 16A and 16B can be higher than that in the structure illustrated in FIGS. 15A and 15B. Moreover, the power consumption of the display device can be reduced.

In the structure illustrated in FIGS. 15A and 15B, the conductive layers 222a and 222b can be formed using the same material and in the same step, and thus the manufacturing process can be simplified, leading to a reduction in cost.

FIGS. 17A and 17B and FIGS. 18A and 18B are top views illustrating subpixels each including a vertical electric field mode liquid crystal element.

Figure 17A:
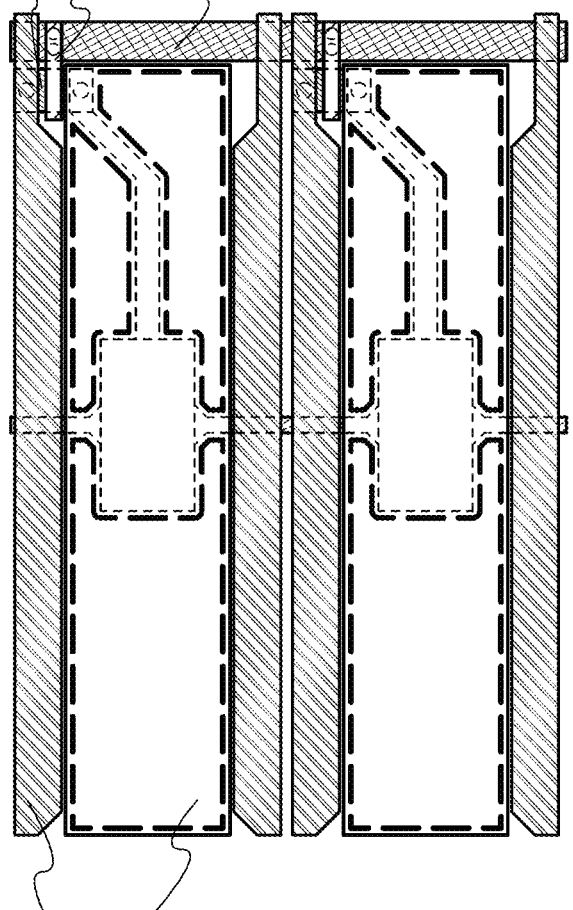
FIGS. 17A and 17B are top views illustrating an example of a subpixel.
Figure 17B:
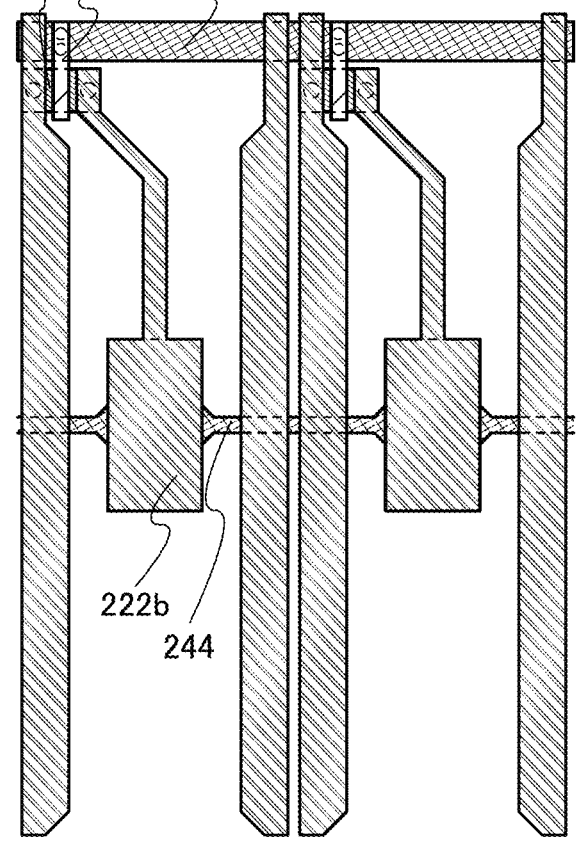
Figure 18A:
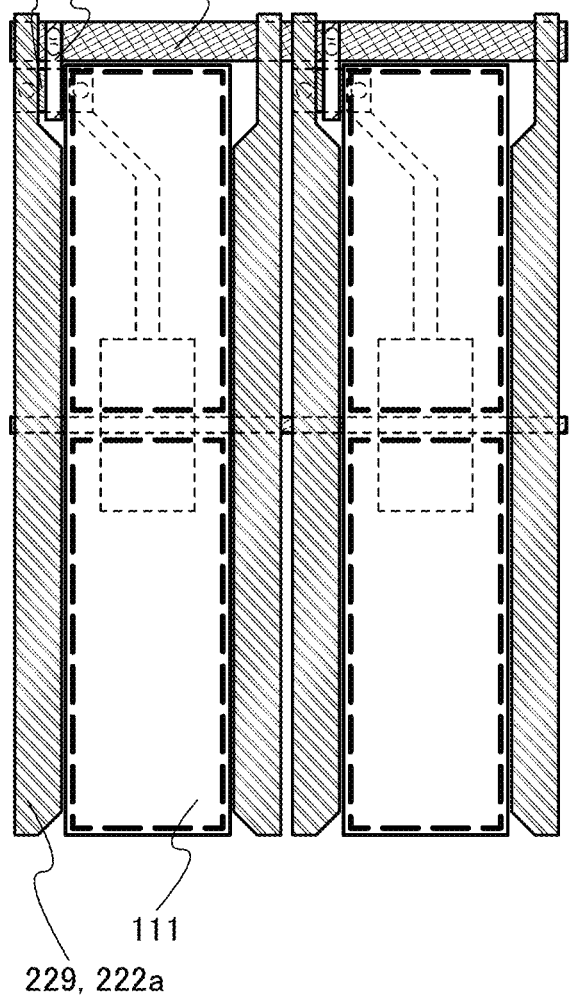
FIGS. 18A and 18B are top views illustrating an example of a subpixel.

Each of FIG. 17A and FIG. 18A is a top view seen from the pixel electrode 111 side illustrating a stacked structure from the gate 223 to the pixel electrode 111 in the subpixels. In each of FIG. 17A and FIG. 18A, the display regions 68 in the subpixels are outlined in a bold dotted line. Each of FIG. 17B and FIG. 18B is a top view in which the pixel electrode 111 is omitted from the stacked structure illustrated in FIG. 17A and FIG. 18A.

Figure 18B:
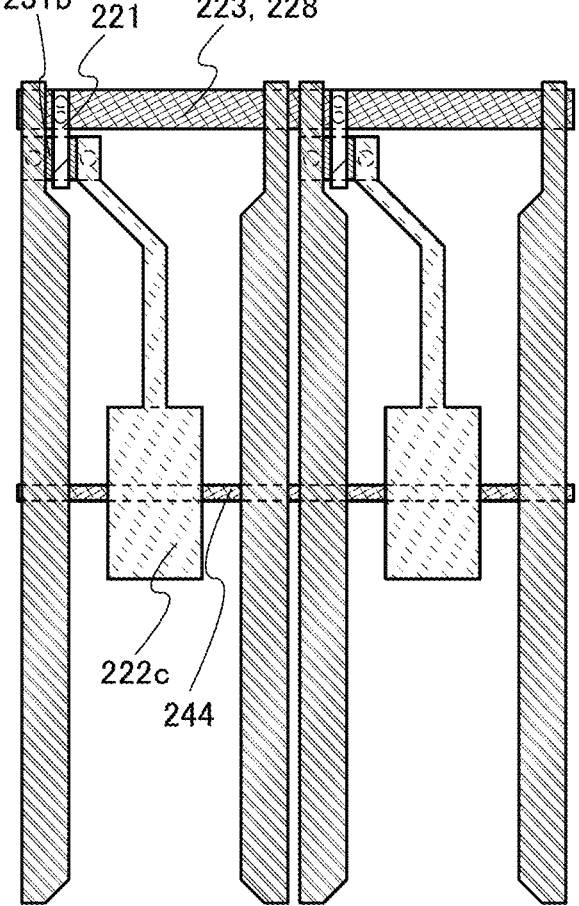

In each of FIGS. 17A and 17B and FIGS. 18A and 18B, a capacitor line 244 is provided in the subpixel. The capacitor line 244 is electrically connected to a conductive layer formed using the same material and in the same step as the conductive layer (e.g., the gate 221) included in the transistor. In FIGS. 17A and 17B, the visible-light-blocking conductive layer 222b is provided to overlap with the capacitor line 244. In FIGS. 18A and 18B, the visible-light-transmitting conductive layer 222c is provided to overlap with the capacitor line 244. In FIGS. 17A and 17B, the conductive layer 222b is connected to the pixel electrode 111. In FIGS. 18A and 18B, the conductive layer 222c is connected to the pixel electrode 111.

In the structure illustrated in FIGS. 18A and 18B, at least part of the capacitor and the contact area of the conductive layer 222c and the pixel electrode 111 can be provided in the display region 68. Thus, the aperture ratio of the subpixels in the structure illustrated in FIGS. 18A and 18B can be higher than that in the structure illustrated in FIGS. 17A and 17B. Moreover, the power consumption of the display device can be reduced.

In the structure illustrated in FIGS. 17A and 17B, the conductive layers 222a and 222b can be formed using the same material and the same step, and thus the manufacturing process can be simplified, leading to a reduction in the cost.

<5. Pixel Arrangement Example>

Figure 19A:
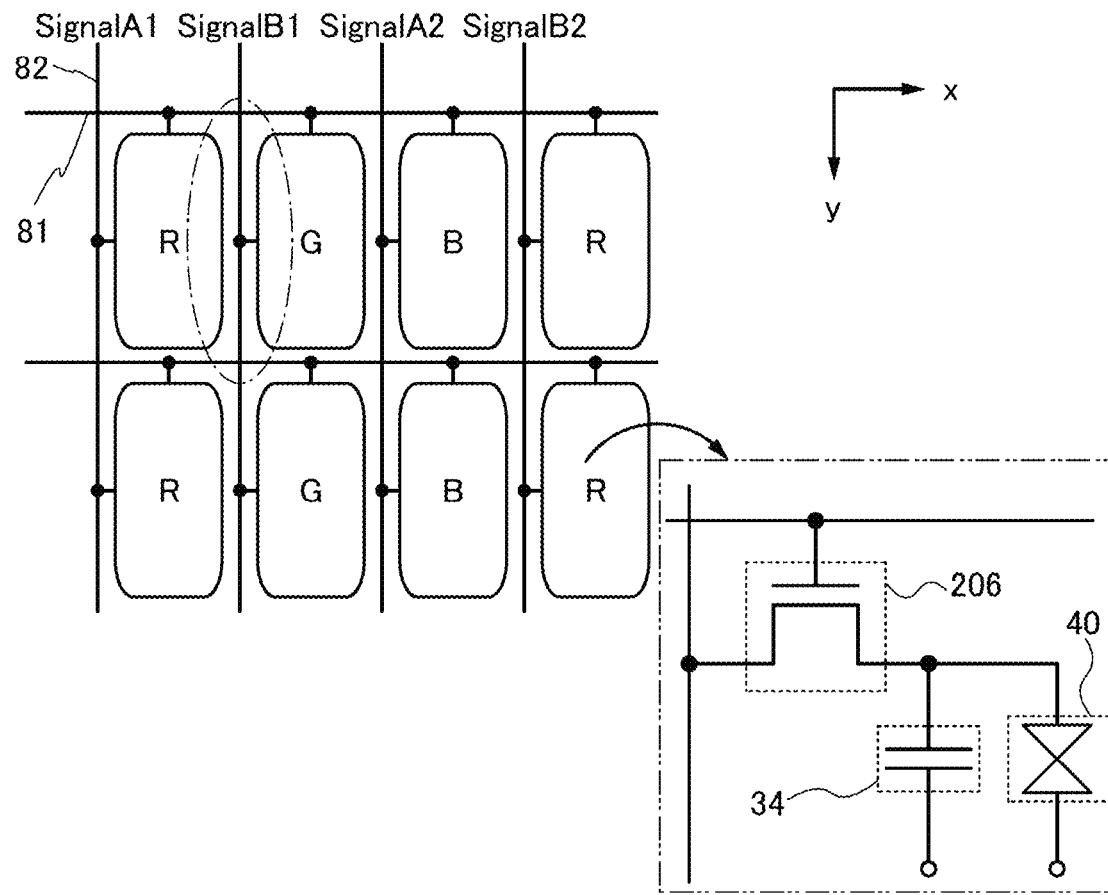
FIGS. 19A and 19B are diagrams illustrating arrangement and structure examples of pixels.
Figure 19B:
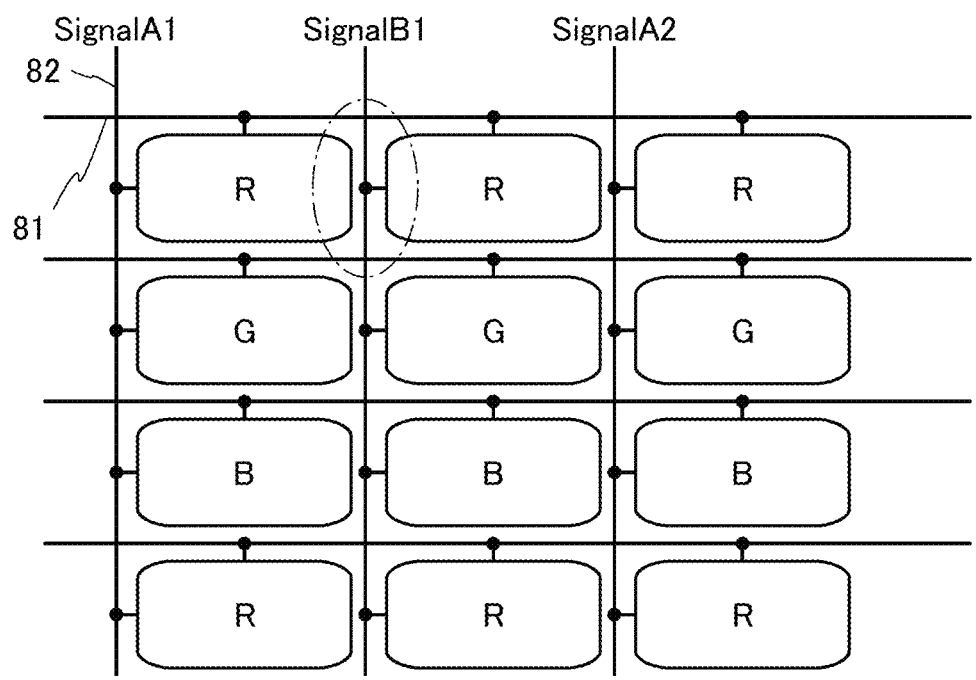

The pixel arrangement examples are shown in FIGS. 19A and 19B. Each of FIGS. 19A and 19B illustrates an example in which a red subpixel R, a green subpixel G, and a blue subpixel B form one pixel. In FIGS. 19A and 19B, a plurality of scan lines 81 extend in an x direction, and a plurality of signal lines 82 extend in a y direction. The scan lines 81 and the signal lines 82 intersect with each other.

As shown by the dashed two dotted line in FIG. 19A, a subpixel includes the transistor 206, a capacitor 34, and the liquid crystal element 40. The gate of the transistor 206 is electrically connected to the scan line 81. One of the source and the drain of the transistor 206 is electrically connected to the signal line 82, and the other is electrically connected to one electrode of the capacitor 34 and one electrode of the liquid crystal element 40. The other electrode of the capacitor 34 and the other electrode of the liquid crystal element 40 are each supplied with a constant potential.

FIGS. 19A and 19B show examples where the source-line inversion driving is adopted. Signals A1 and A2 are signals with the same polarity. Signals B1 and B2 are signals with the same polarity. Signals A1 and B1 are signals with different polarities. Signals A2 and B2 are signals with different polarities.

As the definition of the display device become higher, the distance between the subpixels become shorter. Thus, as shown in the frame outlined in a dashed-dotted line in FIG. 19A, in the subpixel where the signal A1 is input, the liquid crystal is easily affected by potentials in both the signal A1 and the signal B1, in the vicinities of the signal line 82 where the signal B1 is input. This can make the liquid crystal more prone to alignment defects.

In FIG. 19A, the direction in which a plurality of subpixels exhibiting the same color are aligned is the y direction, and is substantially parallel to the direction that the signal lines 82 extend in. As shown in the frame outlined by a dashed-dotted line in FIG. 19A, subpixels exhibiting different colors are adjacent to each other, with the longer sides of the subpixels facing each other.

In FIG. 19B, the direction in which the plurality of subpixels exhibiting the same color are aligned is the x direction, and intersects with the direction that the signal lines 82 extend in. As shown in the frame outlined in a dashed-dotted line in FIG. 19B, subpixels exhibiting the same color are adjacent to each other, with the shorter sides of the subpixels facing each other.

When the side of the subpixel that is substantially parallel to the direction in which the signal lines 82 extend is the shorter sides of the subpixel as illustrated in FIG. 19B, the region where the liquid crystal is more prone to alignment defects can be made narrower, compared with the case (illustrated in FIG. 19A) where the side of the subpixel that is substantially parallel to the direction in which the signal lines 82 extend is the longer sides of the subpixel. When the region where the liquid crystal is more prone to alignment defects is positioned between subpixels exhibiting the same color as illustrated in FIG. 19B, display defects are less easily recognized by a user of the display device when compared with the case (see FIG. 19A) where the region is positioned between subpixels exhibiting different colors. In one embodiment of the present invention, a direction in which the subpixels exhibiting the same color are arranged preferably intersects with the direction in which the signal line 82 extends.

<6. Structure Example 5 of Display Device>

One embodiment of the present invention can be applied to a display device in which a touch sensor is implemented; such a display device is also referred to as an input/output device or a touch panel. Any of the structures of the display device described above can be applied to the touch panel. In this embodiment, the description focuses on an example in which the touch sensor is implemented in the display device 100A.

There is no limitation on the sensing element (also referred to as a sensor element) included in the touch panel of one embodiment of the present invention. A variety of sensors capable of sensing an approach or a contact of an object such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive touch sensor element include a surface capacitive touch sensor element and a projected capacitive touch sensor element. Examples of the projected capacitive sensor element include a self-capacitive sensor element and a mutual capacitive sensor element. The use of a mutual capacitive sensor element is preferable because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 20A:
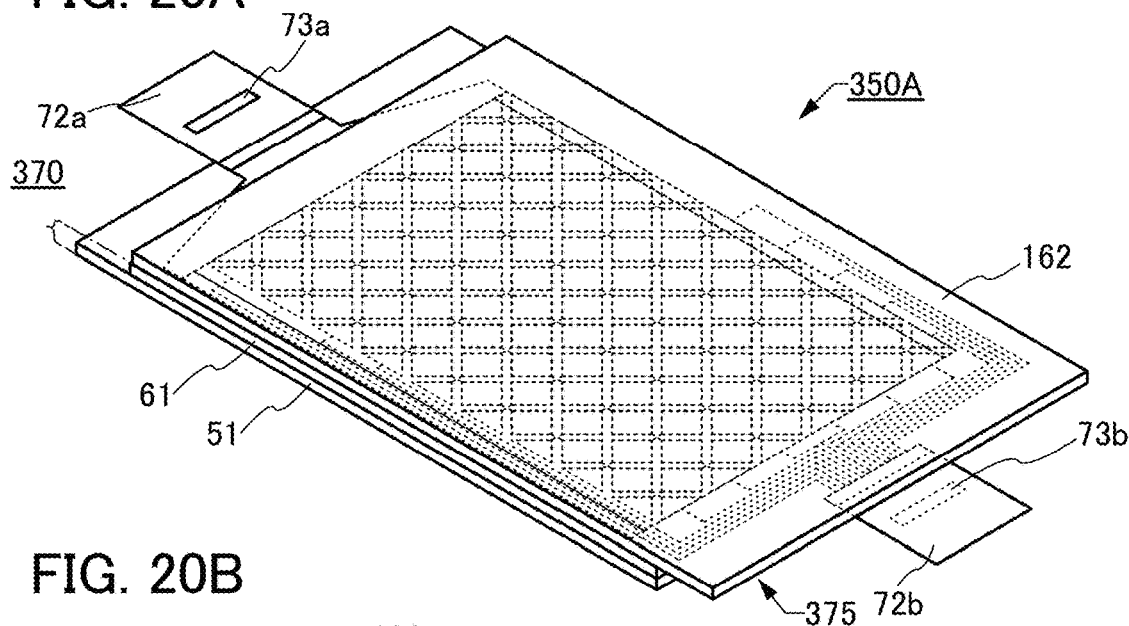
FIGS. 20A and 20B are perspective views illustrating an example of a display device.
Figure 20B:
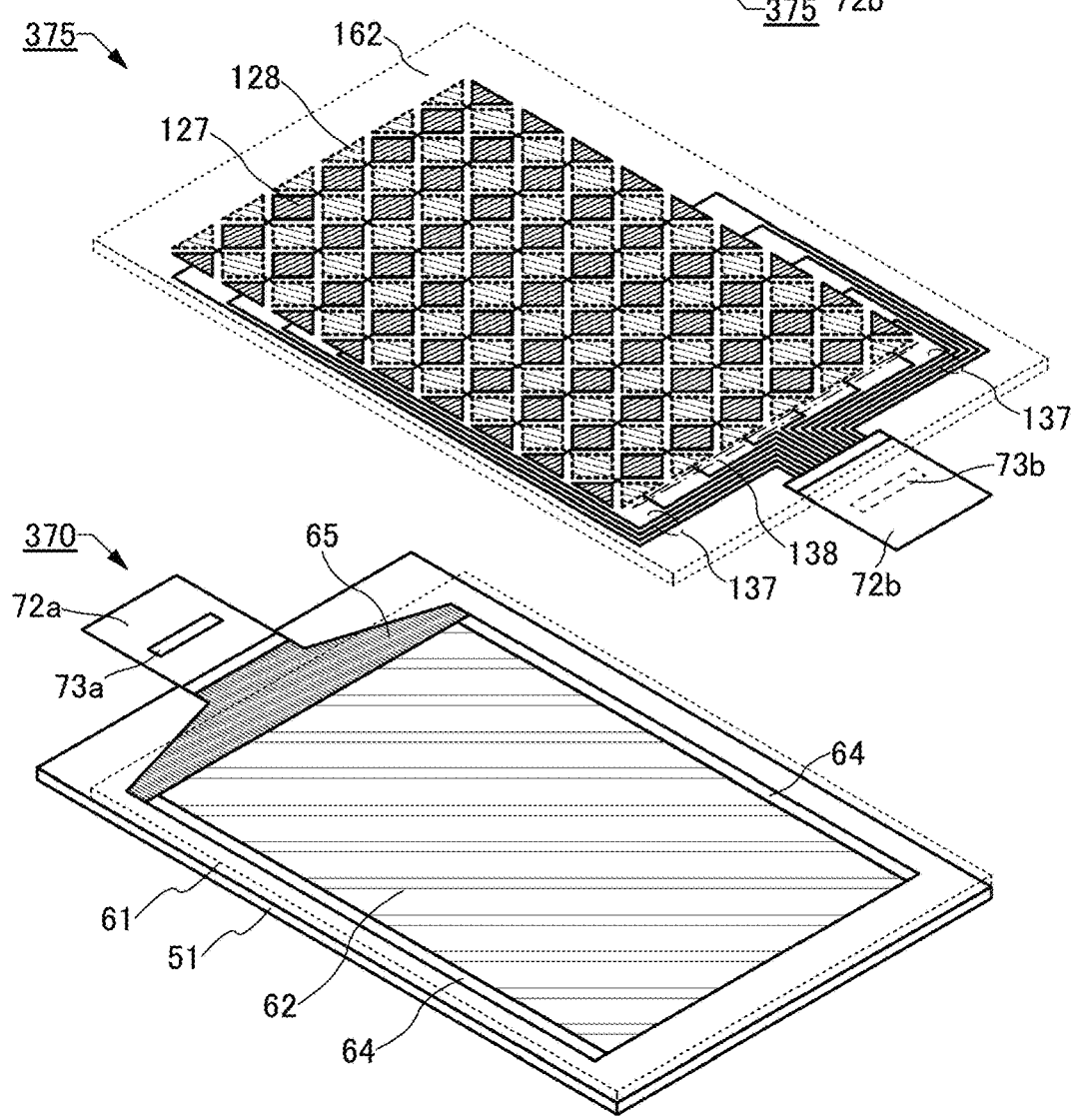
Figure 21:
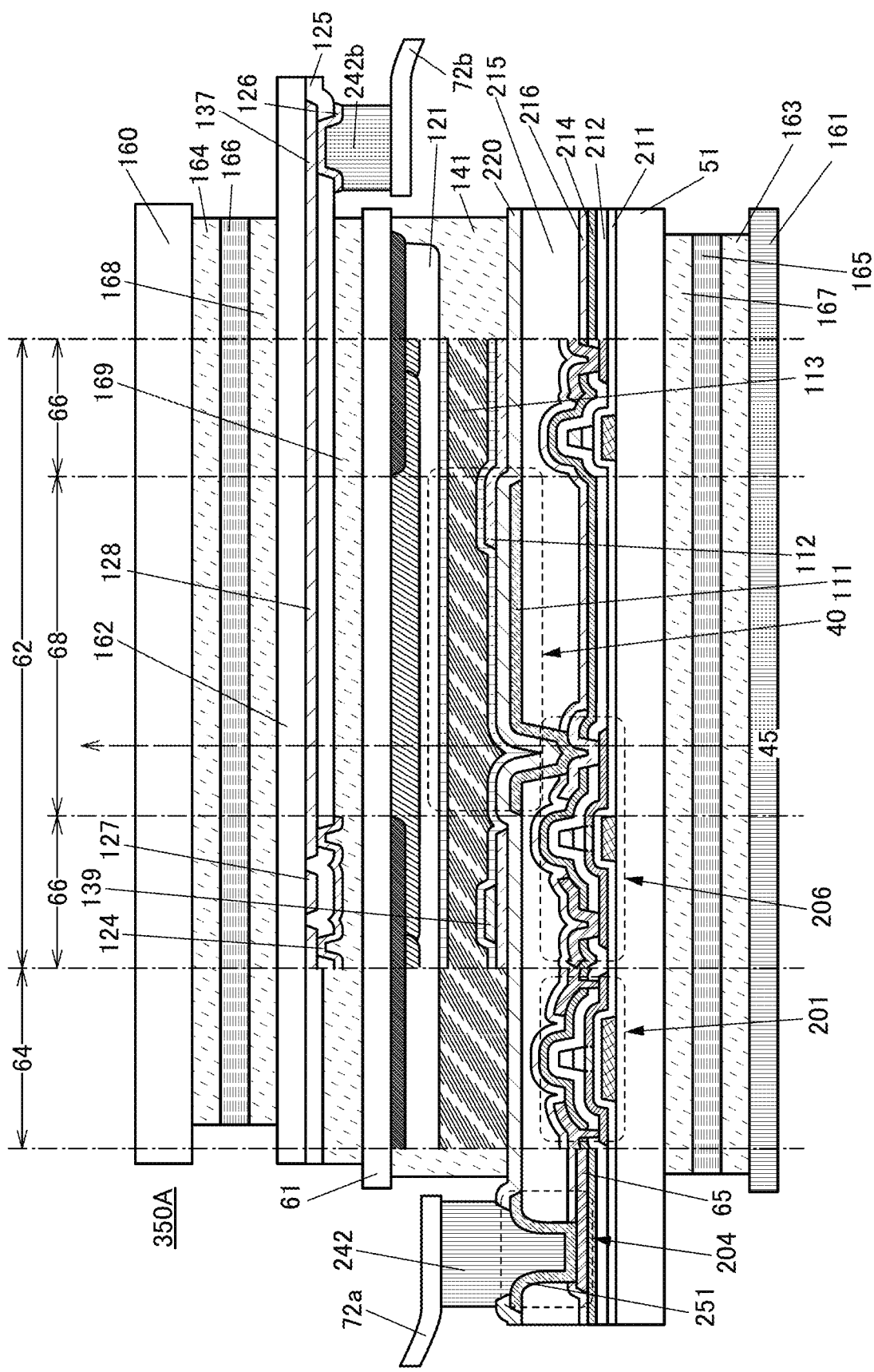
FIG. 21 is a cross-sectional view illustrating an example of a display device.

FIGS. 20A and 20B and FIG. 21 each illustrate an example of the touch panel. FIG. 20A is a perspective view of a touch panel 350A. FIG. 20B is a developed view of the schematic perspective view of FIG. 20A. Note that for simplicity, FIGS. 20A and 20B illustrate only the major components. In FIG. 20B, the outlines of the substrate 61 and a substrate 162 are illustrated only in dashed lines. FIG. 21 is a cross-sectional view of the touch panel 350A.

The touch panel 350A has a structure in which a display device and a sensor element that are fabricated separately are bonded together.

The touch panel 350A includes an input device 375 and a display device 370 that are provided to overlap with each other.

The input device 375 includes the substrate 162, an electrode 127, an electrode 128, a plurality of wirings 138, and a plurality of wirings 139. An FPC 72*b* is electrically connected to each of the plurality of wirings 137 and the plurality of wirings 138. An IC 73*b* includes the FPC 72*b*.

The display device 370 includes the substrate 51 and the substrate 61 which are provided to face each other. The display device 370 includes the display area 62 and the driver circuit portion 64. The wiring 65 and the like are provided over the substrate 51. An FPC 72*a* is electrically connected with the wiring 65. An IC 73*a* is provided on the FPC 72*a*.

The wiring 65 supplies signals and power to the display area 62 and the driver circuit portion 64. The signals and power are input to the wiring 65 from the outside or the IC 73*a*, through the FPC 72*a*.

FIG. 21 is a cross-sectional view of the display area 62, the driver circuit portion 64, a region that includes the FPC 72*a*, a region that includes the FPC 72*b*, and the like.

The substrates 51 and 61 are bonded to each other by the adhesive layer 141. The substrates 61 and 162 are bonded to each other by an adhesive layer 169. Here, the layers from the substrate 51 to the substrate 61 correspond to the display device 370. The layers from the substrate 162 to an electrode 124 correspond to the input device 375. That is, the adhesive layer 169 bonds the display device 370 and the input device 375 together.

The structure of the display device 370 illustrated in FIG. 21 is a structure similar to the display device 100A illustrated in FIG. 6; detailed description is omitted here.

A polarizer 165 is bonded to the substrate 51 with an adhesive layer 167. A backlight 161 is bonded to the polarizer 165 with an adhesive layer 163.

Examples of a type of backlight that can be used as the backlight 161 include a direct-below backlight, an edge-light backlight and the like. The use of the direct-below backlight with light-emitting diodes (LEDs) is preferable as it enables complex local dimming and increase in contrast. The edge-light type backlight is preferably used because the thickness of a module including the backlight can be reduced.

A polarizer 166 is bonded to the substrate 162 by an adhesive layer 168. A protection substrate 160 is bonded to the polarizer 166 by an adhesive layer 164. The protection substrate 160 may be used as the substrate that objects such as a finger or a stylus directly contact, when the touch panel 350A is incorporated into an electronic device. A substrate that can be used as the substrates 51 and 61 or the like can be used as the protection substrate 160. A structure where a protective layer is formed on the surface of the substrate that can be used as the substrates 51 and 61 or the like is preferably used for the protection substrate 160. Alternatively, a reinforced glass or the like is preferably used as the protection substrate 160. The protective layer can be formed with a ceramic coating. The protective layer can be formed using an inorganic insulating material such as silicon oxide, aluminum oxide, yttrium oxide, or yttria-stabilized zirconia (YSZ).

The polarizer 166 may be provided between the input device 375 and the display device 370. In that case, the protection substrate 160, the adhesive layer 164, and the adhesive layer 168 that are illustrated in FIG. 21 are not necessarily provided. In other words, the substrate 162 can be positioned on the outermost surface of the touch panel 350A. The above-described material that can be used for the protection substrate 160 is preferably used for the substrate 162.

The electrodes 127 and 128 are provided over the substrate 162, on the substrate 61 side. The electrodes 127 and 128 are formed on the same plane. An insulating layer 125 is provided to cover the electrodes 127 and 128. The electrode 124 is electrically connected to two of the electrodes 128 that are provided on both sides of the electrode 127, through an opening provided in the insulating layer 125.

In the conductive layers included in the input device 375, the conductive layers (e.g., the electrodes 127 and 128) that overlap with the display region 68 are formed using a visible-light-transmitting material.

The wiring 137 that is obtained by processing the same conductive layer as the electrodes 127 and 128 is connected to a conductive layer 126 that is obtained by processing the same conductive layer as the electrode 124. The conductive layer 126 is electrically connected to the FPC 72*b* through a connector 242*b*.

<7. Structure Example 6 of Display Device>

Figure 23:
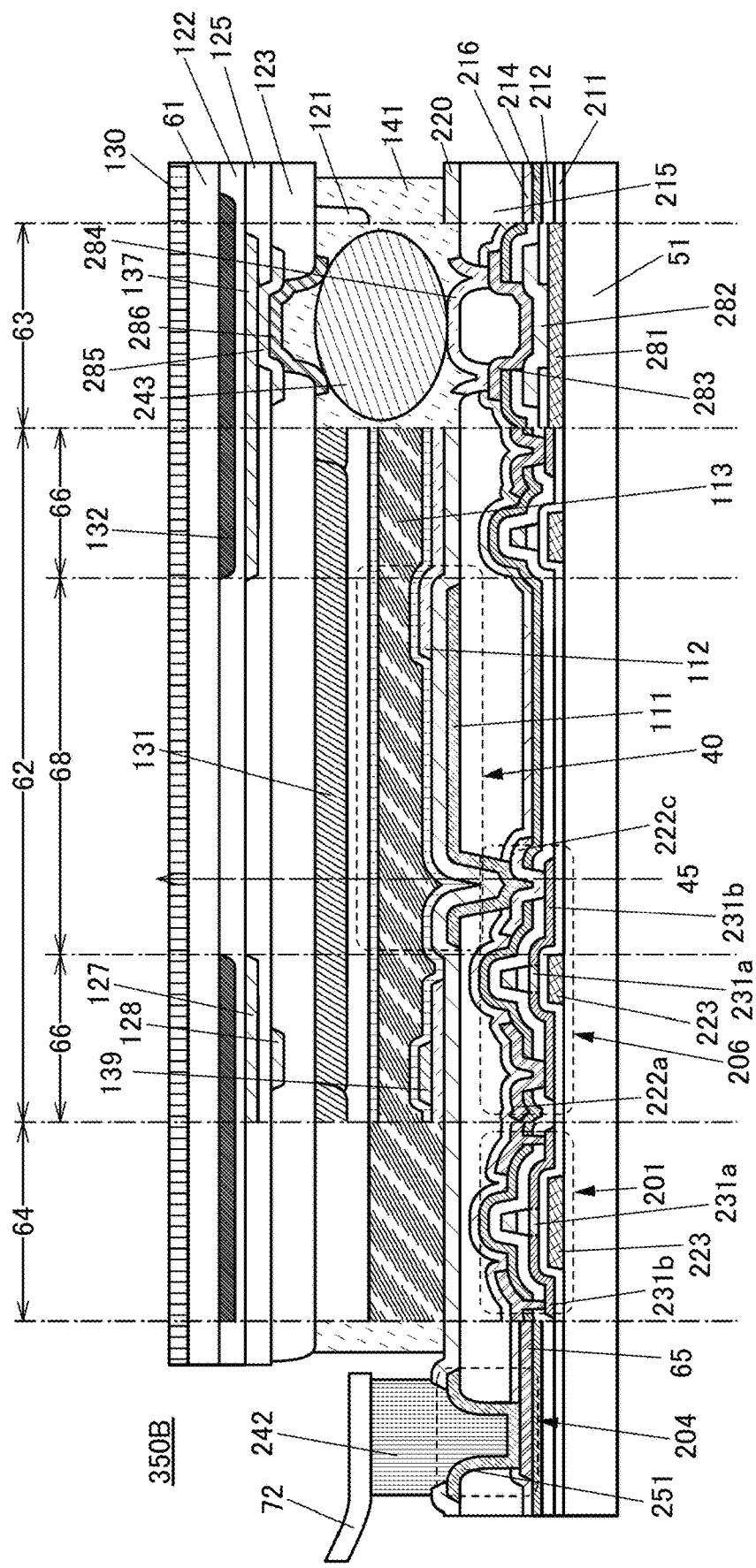
FIG. 23 is a cross-sectional view illustrating an example of a display device.
Figure 24:
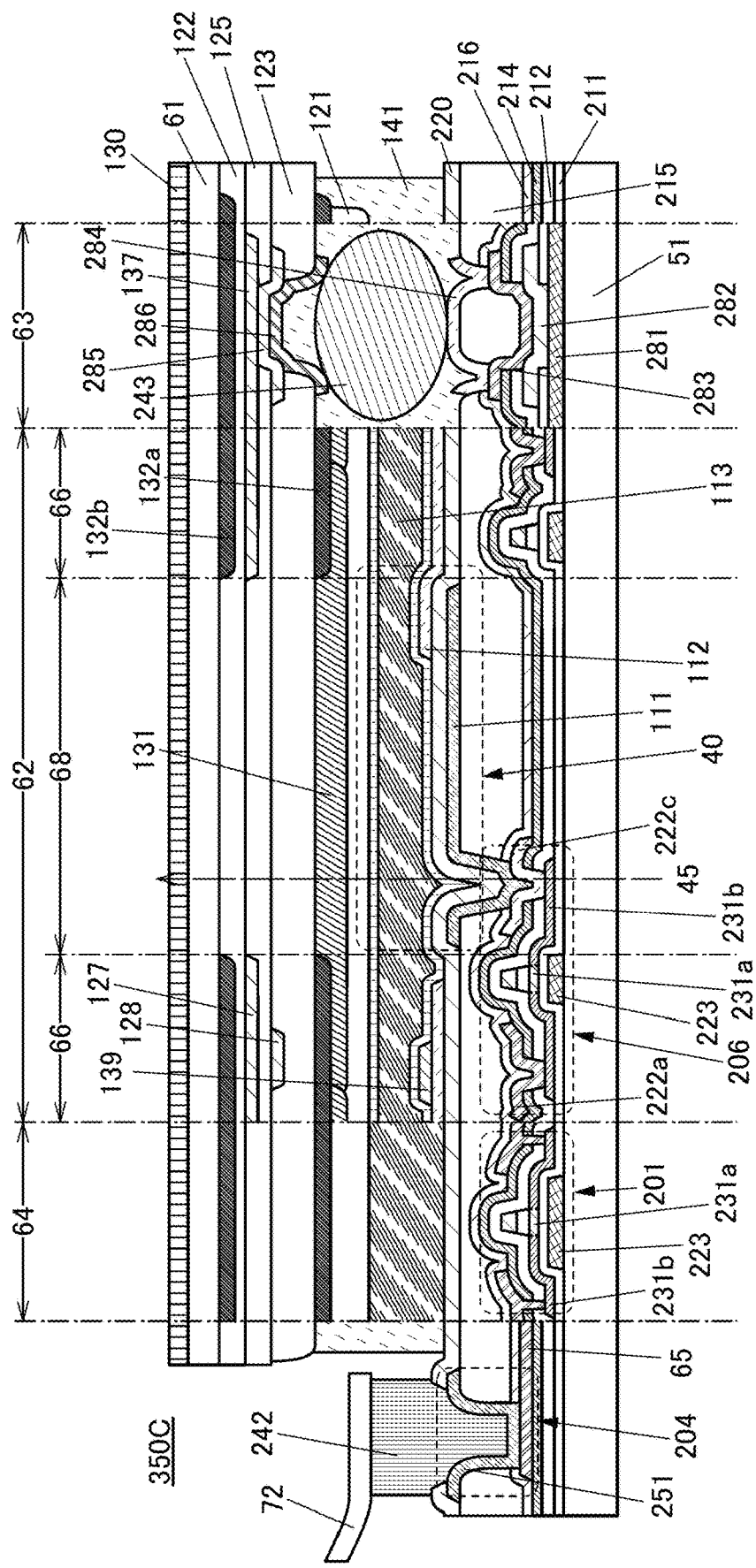
FIG. 24 is a cross-sectional view illustrating an example of a display device.

FIGS. 22A and 22B and FIG. 23 illustrate an example of a touch panel. FIG. 22A is a perspective view of a touch panel 350B. FIG. 22B is a schematic perspective developed view of FIG. 22A. Note that for simplicity, FIGS. 22A and 22B illustrate only the major components.

In FIG. 22B, the outlines of the substrate 61 are illustrated only in dashed lines. FIG. 23 is a cross-sectional view of the touch panel 350B.

The touch panel 350B is an in-cell touch panel that has a function of displaying an image and serves as a touch sensor.

The touch panel 350B has a structure in which electrodes constituting a sensor element and the like are provided only on the counter substrate. Such a structure can make the touch panel thinner and more lightweight or reduce the number of components within the touch panel, compared with a structure in which the display device and the sensor element are fabricated separately and then are bonded together.

In FIGS. 22A and 22B, an input device 376 is provided on the substrate 61. The wirings 137 and 138 and the like of the input device 376 are electrically connected to the FPC 72 included in a display device 379.

With the above structure, the FPCs connected to the touch panel 350B can be provided only on one substrate side (on the substrate 51 side in this embodiment). Although two or more FPCs may be attached to the touch panel 350B, it is preferable that the touch panel 350B be provided with one FPC 72 which has a function of supplying signals to both the display device 379 and the input device 376 as illustrated in FIGS. 22A and 22B, for the simplicity of the structure.

The IC 73 may include a function of driving the input device 376. Another IC that drives the input device 376 may be provided over the FPC 72. Alternatively, an IC that drives the input device 376 may be mounted on the substrate 51.

FIG. 23 is a cross-sectional view including a region that includes the FPC 72, a connection portion 63, the driver circuit portion 64, and the display portion 62, each of which is illustrated in FIG. 22A.

In the connection portion 63, one of the wiring 137 (or the wiring 138) and one of the conductive layers provided on the substrate 51 side are electrically connected through the connector 243.

As the connector 243, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used as the connector 243. As illustrated in FIG. 23 and the like, the conductive particle has a shape that is vertically crushed in some cases. With the crushed shape, the contact area of the connector 243 and a conductive layer electrically connected to the connector 243 can be increased, thereby reducing contact resistance and reducing issues such as disconnection.

The connector 243 is preferably provided so as to be covered with the adhesive layer 141. For example, the connector 243 may be dispersed within the adhesive layer 141 before the curing thereof.

The light-blocking layer 132 is provided in contact with the substrate 61. Accordingly, a conductive layer used for the touch sensor can be prevented from being recognized by a user. The light-blocking layer 132 is covered by an insulating layer 122. The electrode 127 is provided between the insulating layer 122 and the insulating layer 125. The electrode 128 is provided between the insulating layer 125 and the insulating layer 123. The electrodes 127 and 128 can be formed using a metal or an alloy. The coloring layer 131 is provided in contact with the insulating layer 123. Note that as in a touch panel 350C illustrated in FIG. 24, a light-blocking layer 132*a* may be provided in contact with the insulating layer 123 in addition to a light-blocking layer 132*b* that is in contact with the substrate 61.

The wiring 137 that is obtained by processing the same conductive layer as the electrode 127 is connected to a conductive layer 285 that is obtained by processing the same conductive layer as the electrode 128. The conductive layer 285 is connected to a conductive layer 286. The conductive layer 286 is electrically connected to the conductive layer 284 through the connector 243. Note that the conductive layer 285 and the connector 243 may be connected to each other without provision of the conductive layer 286.

The touch panel 350B is supplied with a signal for driving a pixel and a signal for driving a sensor element from one FPC. Thus, the touch panel 350B can easily be incorporated into an electronic device and allows a reduction in the number of components.

<8. Structure Example 7 of Display Device>

Figure 25:
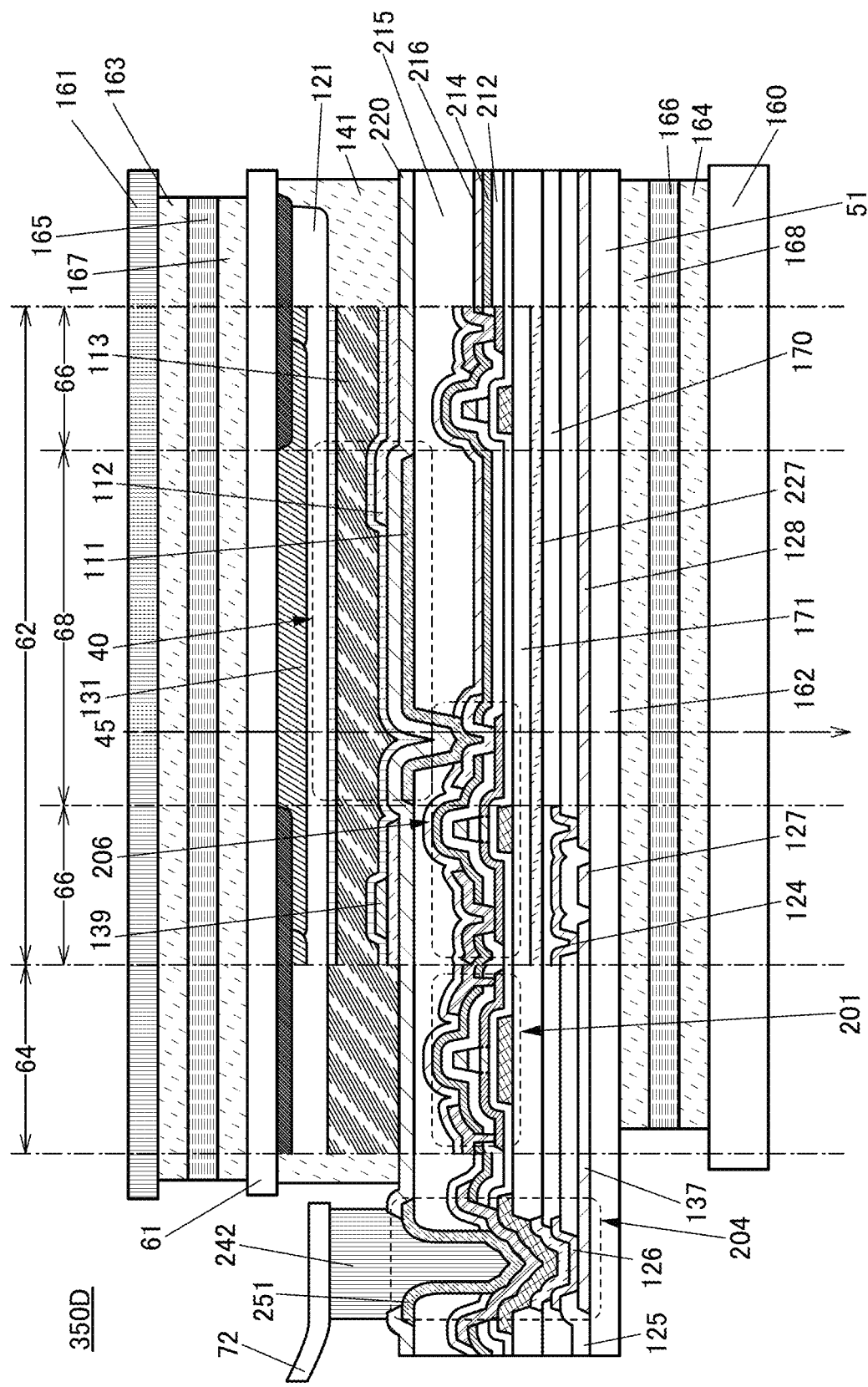
FIG. 25 is a cross-sectional view illustrating an example of a display device.

FIG. 25 is a cross-sectional view illustrating a touch panel 350D. In the touch panel 350D, an input device is provided over the substrate 51.

The touch panel 350D has a structure in which electrodes constituting a sensor element and the like are provided only on a substrate over which a transistor and the like are formed. Such a structure can make the touch panel thinner and more lightweight or reduce the number of components within the touch panel, compared with a structure in which the display device and the sensor element are fabricated separately and then are bonded together. In addition, the number of components on the substrate 61 side can be reduced.

Both a signal for driving the liquid crystal element 40 and a signal for driving the sensor element can be supplied by one or more FPCs connected on the substrate 51 side.

First, each component formed over the substrate 51 is described.

The electrode 127, the electrode 128, and the wiring 137 are provided over the substrate 51. The insulating layer 125 is provided over the electrode 127, the electrode 128, and the wiring 137. The electrode 124 and the conductive layer 126 are provided over the insulating layer 125. The electrode 124 is electrically connected to two of the electrodes 128 that are provided on both sides of the electrode 127, through an opening provided in the insulating layer 125. The conductive layer 126 is electrically connected to the wiring 137 through the opening in the insulating layer 125. An insulating layer 170 is provided over the electrode 124 and the conductive layer 126. A conductive layer 227 is provided over the insulating layer 170. The conductive layer 227 is preferably provided in the entire display portion 62. A constant potential is supplied to the conductive layer 227. The conductive layer 227 can serve as a shield for blocking noise. Thus, the transistor or the sensor element can be operated stably. An insulating layer 171 is provided over the conductive layer 227.

In the conductive layers included in the input device, the conductive layers (e.g., the electrodes 127 and 128) that overlap with the display region 68 are formed using a visible-light-transmitting material. Note that as in each of FIG. 23, FIG. 24, and the like, the conductive layers included in the input device may be provided only in the non-display region 66. When the conductive layers included in the input device do not overlap with the display region 68, the visible-light-transmitting property of a material for the conductive layers included in the input device is not limited. A material having low resistivity, such as a metal, can be used for the conductive layers included in the input device. For example, a metal mesh is preferably used for the wiring and the electrode of the touch sensor. Thus, the resistance of the wiring and the electrode of the touch sensor can be reduced, which is preferable for a touch sensor of a large-sized display device. Note that although a metal is generally a material having a high reflectivity, a metal can be darkened by being subjected to oxidation treatment or the like. Thus, even when the touch panel is seen from the display surface side, a decrease in the visibility due to the reflection of external light can be suppressed.

The wiring and the electrode may be formed to have a stacked layer including a metal layer and a layer having low reflectivity (also referred to as a dark-colored layer). Alternatively, the dark-colored layer may be formed with a metal particle such as an Ag particle, an Ag fiber, or a Cu particle, a carbon nanoparticle such as a carbon nanotube (CNT) or graphene, or a conductive high molecule such as PEDOT, polyaniline, or polypyrrole, for example.

The conductive layer 126 is electrically connected to the FPC 72b through a plurality of conductive layers and the connector 242b. As examples of the plurality of conductive layers, the conductive layer formed using the same material and the same step as the conductive layer 227, the conductive layer formed using the same material and the same step as the conductive layer included in the transistor, the conductive layer 251, and the like can be given.

The components provided over the insulating layer 171 are similar to those provided over the substrate 51 in the display device 100A illustrated in FIG. 6.

An example of a method for manufacturing the touch panel 350D is described. The method for manufacturing the touch panel 350D includes a step of forming a touch sensor over the substrate 51; a step of forming the transistor 206, a first conductive layer, a second conductive layer, and the like over the touch sensor; and a step of forming the liquid crystal element 40 electrically connected to the transistor 206.

The touch sensor is formed in such a manner that the electrodes 127 and 128 and the wiring 137 are formed over the substrate 51 first; the insulating layer 125 is formed over the electrodes 127 and 128 and the wiring 137; an opening reaching the electrode 128 and an opening reaching the wiring 137 are formed in the insulating layer 125; and the electrode 124 in contact with the electrode 128 through the opening provided in the insulating layer 125 and the conductive layer 126 in contact with the wiring 137 through the opening provided in the insulating layer 125 are formed. The first conductive layer is formed to be electrically connected to the touch sensor. Specifically, the first conductive layer is electrically connected to the electrode 127 or 128 through the wiring 137 and the conductive layer 126. The second conductive layer is formed to be electrically connected to the transistor 206. Each of the first conductive layer and the second conductive layer is formed using the same step and the same material as one or more conductive layers included in the transistor 206.

The polarizing plate 165 is bonded to the substrate 61 with the adhesive layer 167. The backlight 161 is bonded to the polarizing plate 165 with the adhesive layer 163.

A polarizer 166 is bonded to the substrate 51 by an adhesive layer 168. A protection substrate 160 is bonded to the polarizer 166 by an adhesive layer 164.

Light from the backlight 161 passes through the substrate 61, the coloring layer 131, and the liquid crystal element 40 and then enters the contact area of the transistor and the pixel electrode. Since the contact area of the transistor and the pixel electrode transmits visible light in one embodiment of the present invention, the contact area can be provided in the display region 68. The light which has passed through the contact area is emitted through the substrate 51 and the like to the outside of the touch panel 350D.

<9. Structure Example of Touch Sensor>

A structure example of the input device (touch sensor) is described below. The input device can be used in each touch panel exemplified in this embodiment.

Figure 26A:
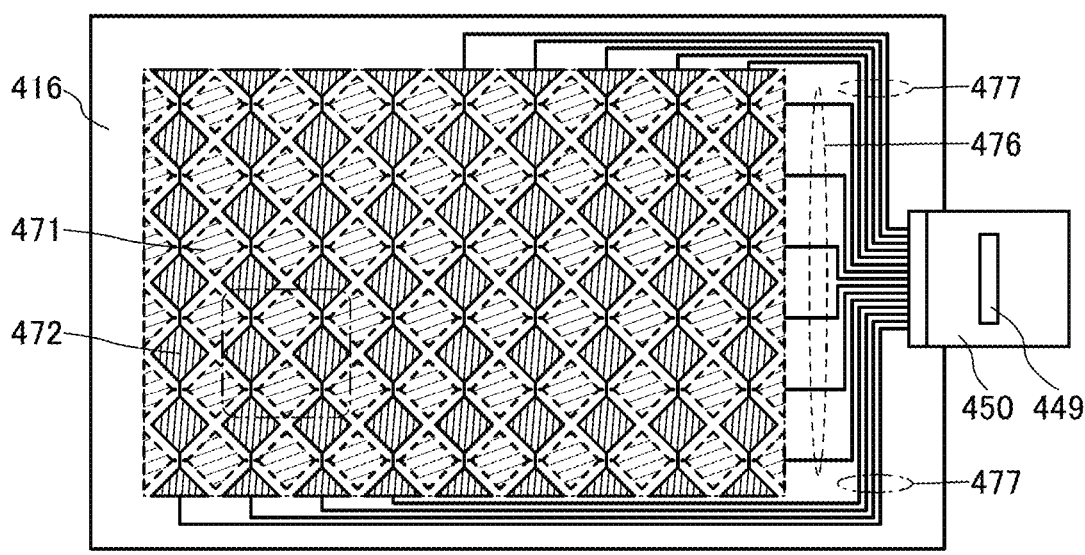
FIGS. 26A to 26D are top views illustrating examples of an input device.

FIG. 26A is a top view of an input device 415. The input device 415 includes a plurality of electrodes 471, a plurality of electrodes 472, a plurality of wirings 476, and a plurality of wirings 477 over a substrate 416. The substrate 416 is provided with an FPC 450 that is electrically connected to each of a plurality of wirings 476 and a plurality of wirings 477. FIG. 26A illustrates an example in which an IC 449 is provided on the FPC 450.

Figure 26B:
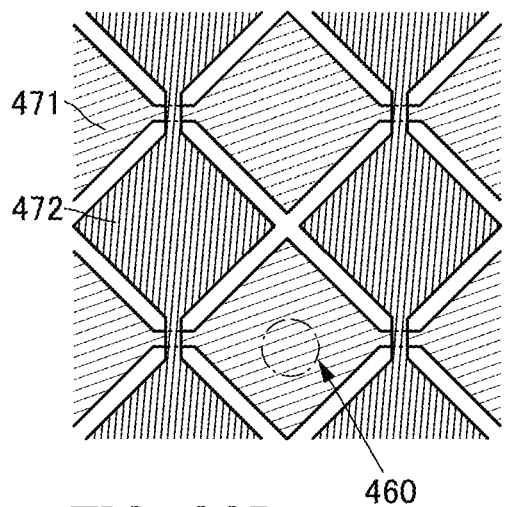

FIG. 26B is an enlarged view of a region surrounded by a dashed-dotted line in FIG. 26A. The electrodes 471 are in the form of a row of rhombic electrode patterns arranged in a lateral direction. The row of rhombic electrode patterns are electrically connected to each other. The electrodes 472 are also in the form of a row of rhombic electrode patterns arranged in a longitudinal direction, and the row of rhombic electrode patterns are electrically connected. Part of the electrodes 471 and part of the electrodes 472 overlap and intersect with each other. At this intersection portion, an insulator is sandwiched between the electrodes 471 and the electrodes 472 in order to avoid an electrical short-circuit therebetween.

Figure 26C:
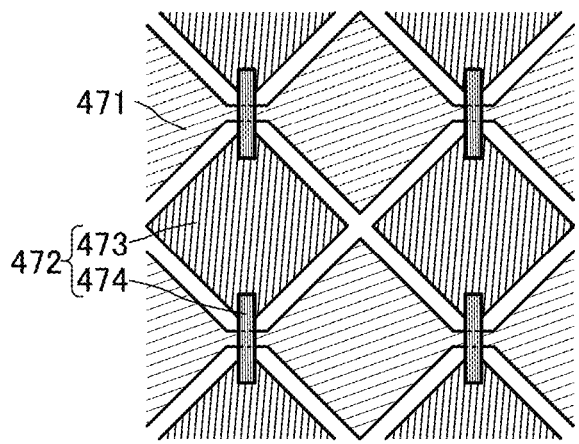

As illustrated in FIG. 26C, the electrodes 472 may include a plurality of island-shaped rhombic electrodes 473 and bridge electrodes 474. The island-shaped rhombic electrodes 473 are arranged in the longitudinal direction, and two adjacent electrodes 473 are electrically connected to each other by the bridge electrode 474. With such a structure, the electrodes 473 and the electrodes 471 can be formed at the same time by processing the same conductive film. This can prevent variations in the thickness of these electrodes, and can prevent the resistance and the light transmittance of each electrode from varying from place to place. Note that although the electrodes 472 include the bridge electrodes 474 here, the electrodes 471 may have such a structure.

Figure 26D:
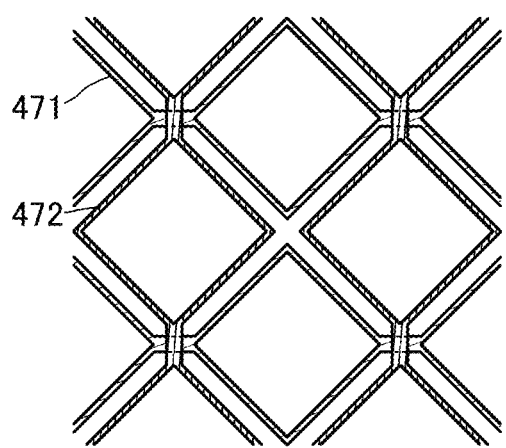

As illustrated in FIG. 26D, a design in which rhombic electrode patterns of the electrodes 471 and 472 illustrated in FIG. 26B are hollowed out and only edge portions are left may be used. In that case, when the electrodes 471 and 472 are narrow enough to be invisible to the users, the electrodes 471 and 472 can be formed using a light-blocking material such as a metal or an alloy, as will be described later. In addition, either the electrodes 471 or the electrodes 472 illustrated in FIG. 26D may include the above bridge electrodes 474.

One of the electrodes 471 is electrically connected to one of the wirings 476. One of the electrodes 472 is electrically connected to one of the wirings 477. Here, either one of the electrodes 471 and 472 corresponds to a row wiring, and the other corresponds to a column wiring.

The IC 449 has a function of driving the touch sensor. A signal output from the IC 449 is supplied to either of the electrodes 471 and 472 through the wirings 476 or 477. A current (or a potential) flowing to either of the electrodes 471 and 472 is input to the IC 449 through the wirings 476 or 477. The IC 449 is mounted on the FPC 450 in this example; alternatively, the IC 449 may be mounted on the substrate 416.

When the input device 415 overlaps with a display screen of the display panel, a light-transmitting conductive material is preferably used for the electrodes 471 and 472. In the case where a light-transmitting conductive material is used for the electrodes 471 and 472 and light from the display panel is extracted through the electrodes 471 or 472, it is preferable that a conductive film containing the same conductive material be arranged between the electrodes 471 and 472 as a dummy pattern. Part of a space between the electrodes 471 and 472 is filled with the dummy pattern, which can reduce variations in light transmittance. As a result, unevenness in luminance of light which passes through the input device 415 can be reduced.

As the light-transmitting conductive material, a conductive oxide such as indium oxide, indium tin oxide, indium zinc oxide, zinc oxide, or gallium zinc oxide can be used. Note that a film containing graphene may be used as well.

Alternatively, a metal film or an alloy film that is thin enough to have a light-transmitting property can be used. For example, a metal such as gold, silver, platinum, magnesium, nickel, tungsten, chromium, molybdenum, iron, cobalt, copper, palladium, or titanium, or an alloy containing any of these metals can be used. Alternatively, a nitride of the metal or the alloy (e.g., titanium nitride) or the like may be used. Alternatively, a layered film in which two or more of conductive films containing the above materials are stacked may be used.

For the electrodes 471 and 472, a conductive film that is processed to be thin enough to be invisible to the users may be used. Such a conductive film is processed into a lattice shape (a mesh shape), for example, which makes it possible to achieve both high conductivity and high visibility of the display device. It is preferable that the conductive film have a portion with a width greater than or equal to 30 nm and less than or equal to 100 µm, preferably greater than or equal to 50 nm and less than or equal to 50 µm, and further preferably greater than or equal to 50 nm and less than or equal to 20 µm. In particular, the conductive film preferably has a pattern width of 10 µm or less, which is hardly visible to the users.

As examples, enlarged schematic views of a region 460 in FIG. 26B are illustrated in FIGS. 27A to 27D.

Figure 27A:
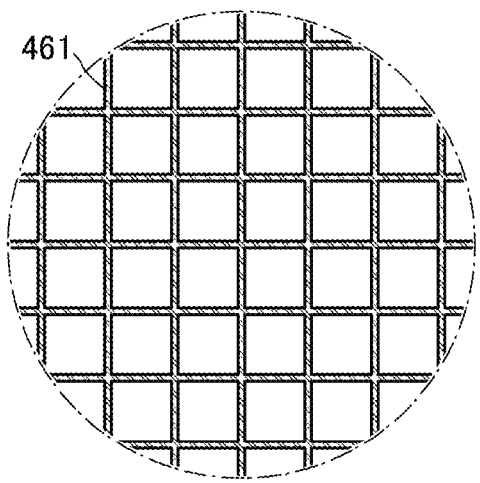
FIGS. 27A to 27E are top views illustrating examples of an input device.

FIG. 27A illustrates an example where a lattice-shape conductive film 461 is used. The conductive film 461 is preferably placed so as not to overlap with the display element included in the display device because light from the display element is not blocked. In that case, it is preferable that the direction of the lattice be the same as the direction of the display element arrangement and that the pitch of the lattice be an integer multiple of the pitch of the display element arrangement.

Figure 27B:
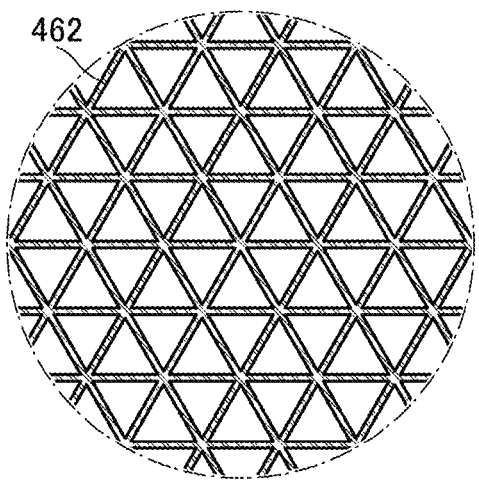

FIG. 27B illustrates an example of a lattice-shape conductive film 462, which is processed so as to be provided with triangle openings. Such a structure makes it possible to further reduce the resistance compared with the structure illustrated in FIG. 27A.

Figure 27C:
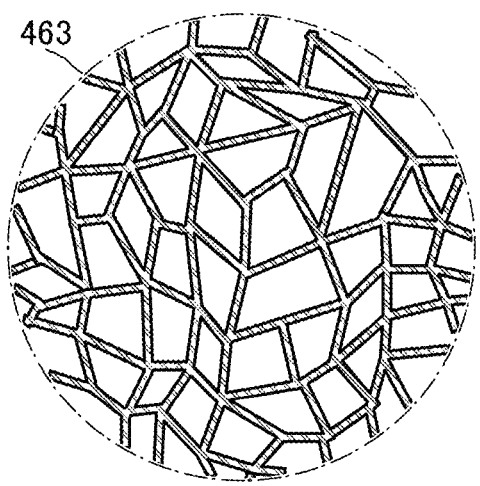

Alternatively, a conductive film 463, which has an irregular pattern shape, may be used as illustrated in FIG. 27C. Such a structure can prevent generation of moire when overlapping with the display portion of the display device.

Figure 27D:
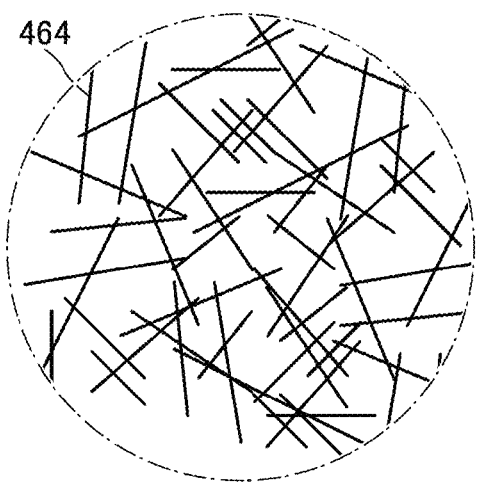

Conductive nanowires may be used for the electrodes 471 and 472. FIG. 27D illustrates an example of using nanowires 464. The nanowires 464 are dispersed at appropriate density so as to be in contact with the adjacent nanowires, which can form a two-dimensional network; the nanowires 464 can function as a conductive film with extremely high light-transmitting property. For example, nanowires that have a mean diameter of greater than or equal to 1 nm and less than or equal to 100 nm, preferably greater than or equal to 5 nm and less than or equal to 50 nm, and further preferably greater than or equal to 5 nm and less than or equal to 25 nm, can be used. As the nanowire 464, a metal nanowire such as an Ag nanowire, a Cu nanowire, or an Al nanowire, a carbon nanotube, or the like can be used. In the case of using an Ag nanowire, a light transmittance of 89% or more and a sheet resistance of 40 ohms per square or more and 100 ohms per square or less can be achieved.

Figure 27E:
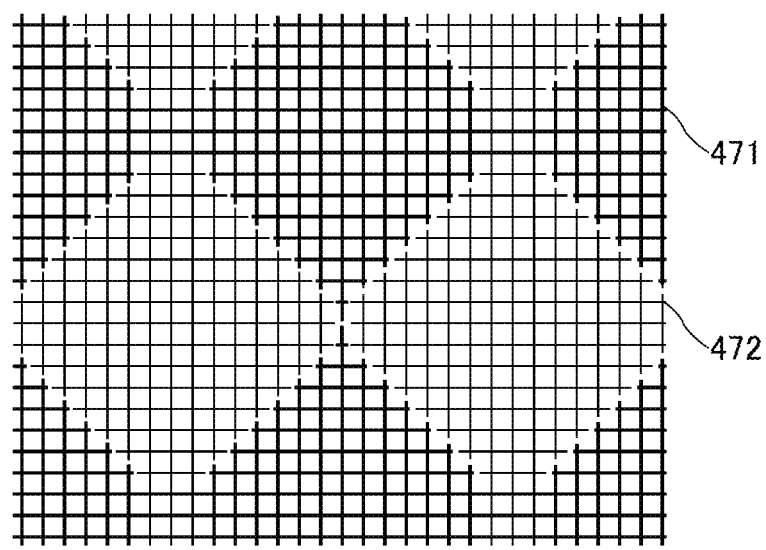

FIG. 27E illustrates a more specific structure example of the electrodes 471 and 472 in FIG. 26B. FIG. 27E shows an example in which a lattice-shape conductive film is used for each of the electrodes 471 and 472.

Although examples in which a plurality of rhombuses are aligned in one direction are shown in FIG. 26A and the like as top surface shapes of the electrodes 471 and 472, the shapes of the electrodes 471 and 472 are not limited thereto and can have various top surface shapes such as a belt shape (a rectangular shape), a belt shape having a curve, and a zigzag shape. In addition, although the above shows the electrodes 471 and 472 are arranged to be perpendicular to each other, they are not necessarily arranged to be perpendicular and the angle formed by two of the electrodes may be less than 90°.

<10. Structure Example 8 of Display Device>

Figure 28:
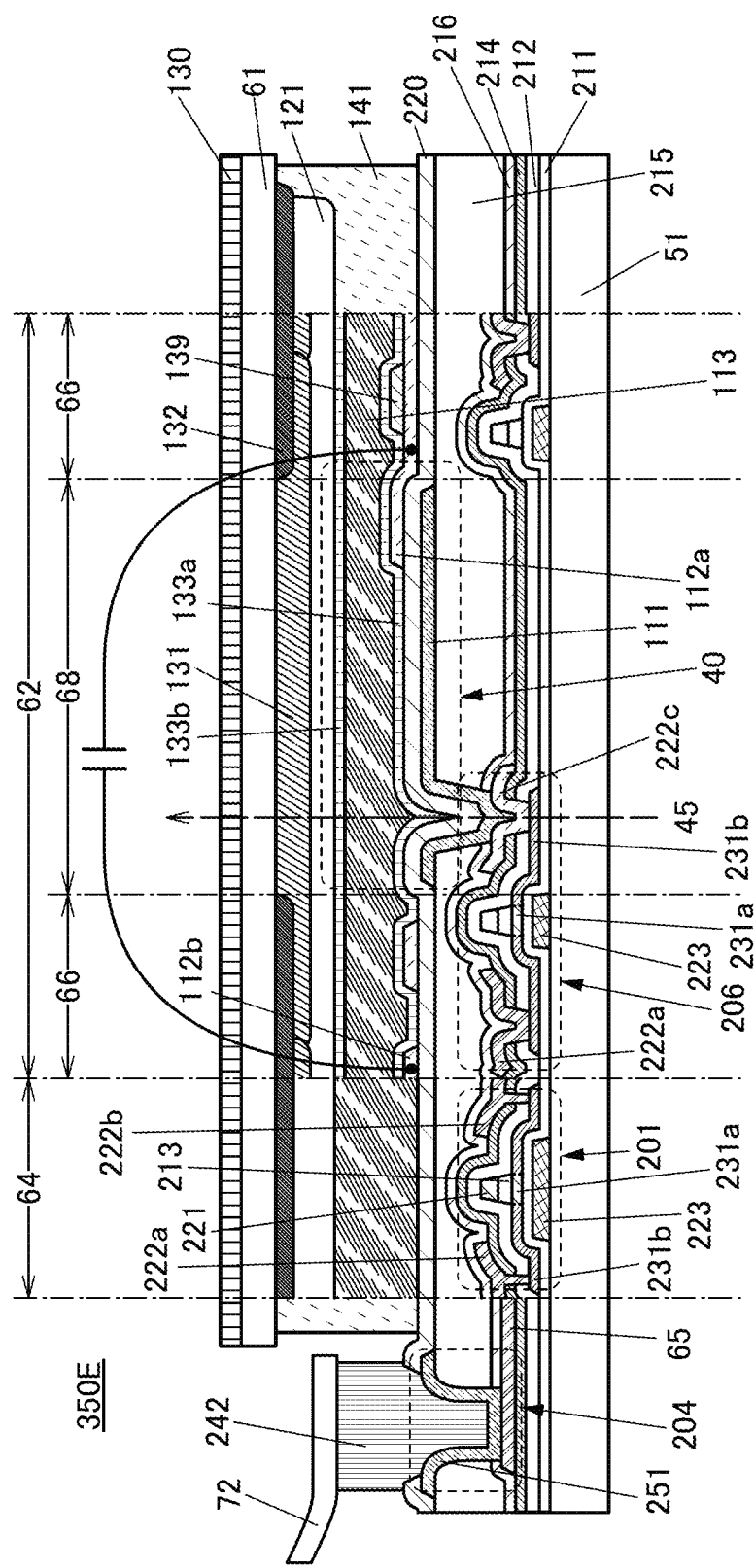
FIG. 28 is a cross-sectional view illustrating an example of a display device.

An example of the touch panel is illustrated in FIG. 28. FIG. 28 is a cross-sectional view of a touch panel 350E.

The touch panel 350E is an in-cell touch panel that has a function of displaying an image and serves as a touch sensor.

The touch panel 350E has a structure in which electrodes constituting a sensor element and the like are provided only on a substrate that supports a display element. Such a structure can make the touch panel thinner and more lightweight or reduce the number of components within the touch panel, compared with a structure in which the display device and the sensor element are fabricated separately and then are bonded together or a structure in which the sensor element is fabricated on the counter substrate side.

The touch panel 350E illustrated in FIG. 28 is different from the display device 100A described above in the layout of the common electrode and the auxiliary wiring 139.

A plurality of auxiliary wirings 139 are electrically connected to the first common electrode 112a or the first common electrode 112b.

The touch panel 350E illustrated in FIG. 28 is capable of sensing an approach or a contact or the like of an object utilizing the capacitance formed between the first common electrode 112a and the first common electrode 112b. That is, in the touch panel 350E, the first common electrodes 112a and 112b serve as both the common electrode of the liquid crystal element and the electrode of the sensor element.

As described above, an electrode of the liquid crystal element also serves as an electrode of the sensor element in the touch panel of one embodiment of the present invention; thus, the manufacturing process can be simplified and the manufacturing cost can be reduced. Furthermore, the touch panel can be made thin and lightweight.

The common electrode is electrically connected to the auxiliary wiring 139. By providing the auxiliary wiring 139, the resistance of the electrodes of the sensor element can be reduced. As the resistance of the electrodes of the sensor element is reduced, the time constant of the electrode of the sensor element can be made small. When the time constant of the electrode of the sensor element is smaller, the detection sensitivity can be increased, which enables an increase in detection accuracy.

For example, the time constant of the electrode of the sensor element is greater than 0 seconds and less than or equal to $1 \times 10^{-4}$ seconds, preferably greater than 0 seconds and less than or equal to $5 \times 10^{-5}$ seconds, further preferably greater than 0 seconds and less than or equal to $5 \times 10^{-6}$ seconds, further preferably greater than 0 seconds and less than or equal to $5 \times 10^{-7}$ seconds, and further preferably greater than 0 seconds and less than or equal to $2 \times 10^{-7}$ seconds. In particular, when the time constant is smaller than or equal to $1 \times 10^{-6}$ seconds, high detection sensitivity can be achieved while the influence of noise is reduced.

The signal for driving a pixel and the signal for driving a sensor element are supplied to the touch panel 350E by one FPC. Thus, the touch panel 350D can easily be incorporated into an electronic device and allows a reduction in the number of components.

An example of the operation method of the touch panel 350E and the like will be described below.

Figure 29A:
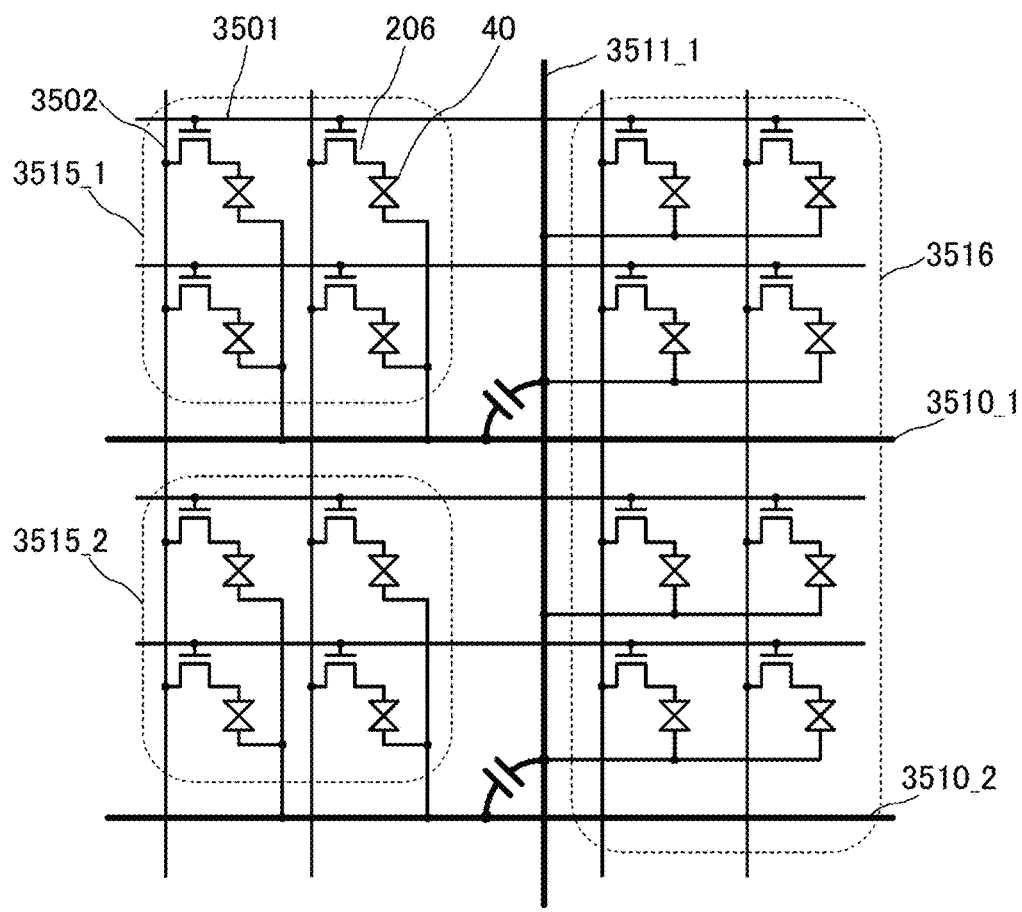
FIGS. 29A and 29B are diagrams illustrating an example of a sensing element and pixels.

FIG. 29A is an equivalent circuit diagram of part of a pixel circuit provided in the display portion 62 of the touch panel 350E.

Each pixel (subpixel) includes at least the transistor 206 and the liquid crystal element 40. The gate of the transistor 206 is electrically connected to a wiring 3501. One of the source and the drain of the transistor 206 is electrically connected to a wiring 3502.

The pixel circuit includes a plurality of wirings extending in the X direction (e.g., a wiring 3510_1 and a wiring 3510_2) and a plurality of wirings extending in the Y direction (e.g., a wiring 3511_1). They are provided to intersect with each other, and capacitance is formed therebetween.

Among the pixels provided in the pixel circuit, electrodes of the liquid crystal elements of some pixels adjacent to each other are electrically connected to each other to form one block. The block is classified into two types: an island-shaped block (e.g., a block 3515_1 or a block 3515_2), and a linear block extending in the X direction or the Y direction (e.g., a block 3516 extending in the Y direction). Note that only part of the pixel circuit is illustrated in FIG. 29A, and in reality, these two types of blocks are repeatedly arranged in the X direction and the Y direction. An electrode on one side of the liquid crystal element is, for example, a common electrode. An electrode on the other side of the liquid crystal element is, for example, a pixel electrode.

The wiring 3510_1 (or the wiring 3510_2) extending in the X direction is electrically connected to the island-shaped block 3515_1 (or the block 3515_2). Although not illustrated, the wiring 3510_1 extending in the X direction is electrically connected to a plurality of island-shaped blocks 3515_1 which are provided discontinuously along the X direction with the linear blocks therebetween. Furthermore, the wiring 3511_1 extending in the Y direction is electrically connected to the linear block 3516.

Figure 29B:
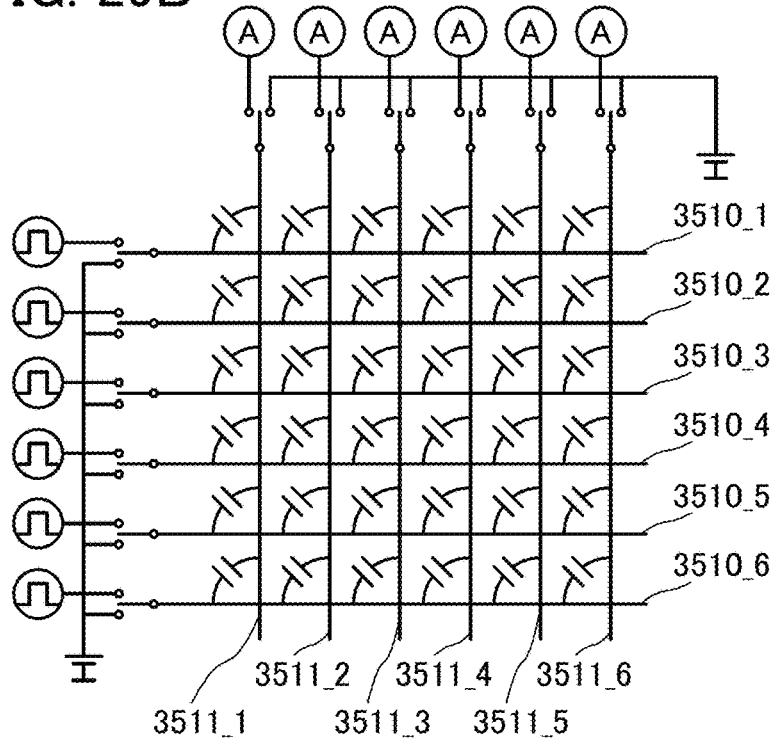

FIG. 29B is an equivalent circuit diagram illustrating the connection relation between a plurality of wirings extending in the X direction (the wirings 3510_1 to 3510_6, which are collectively called a wiring 3510 in some cases) and a plurality of wirings extending in the Y direction (wirings 3511_1 to 3511_6, which are collectively called a wiring 3511 in some cases). A common potential can be input to each of the wirings 3510 extending in the X direction and each of the wirings 3511 extending in the Y direction. A pulse voltage can be input to each of the wirings 3510 extending in the X direction from a pulse voltage output circuit. Furthermore, each of the wirings 3511 extending in the Y direction can be electrically connected to the sensing circuit. Note that the wiring 3510 and the wiring 3511 can be interchanged with each other.

An example of an operation method of the touch panel 350E is described with reference to FIGS. 30A and 30B.

Here, one frame period is divided into a writing period and a sensing period. The writing period is a period in which image data is written to a pixel, and the wirings 3501 (also referred to as gate lines or scan lines) are sequentially selected. The sensing period is a period in which sensing is performed by the sensor element.

Figure 30A:
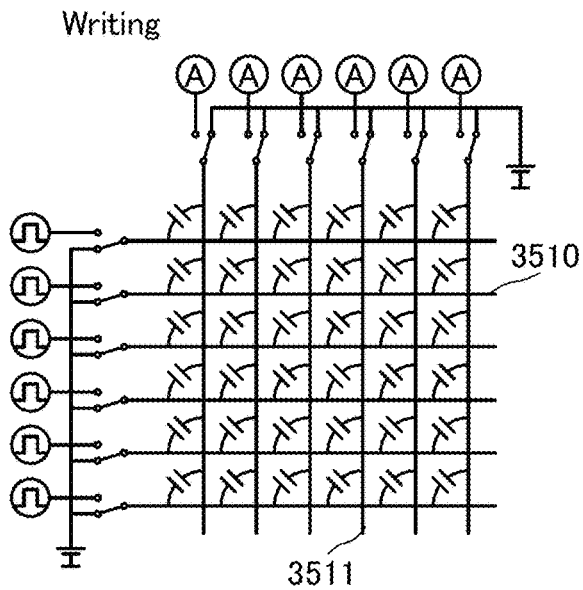
FIGS. 30A to 30E illustrate an example of an operation of a sensing element and pixels.

FIG. 30A is an equivalent circuit diagram in the writing period. In the writing period, a common potential is input to both the wiring 3510 extending in the X direction and the wiring 3511 extending in the Y direction.

Figure 30B:
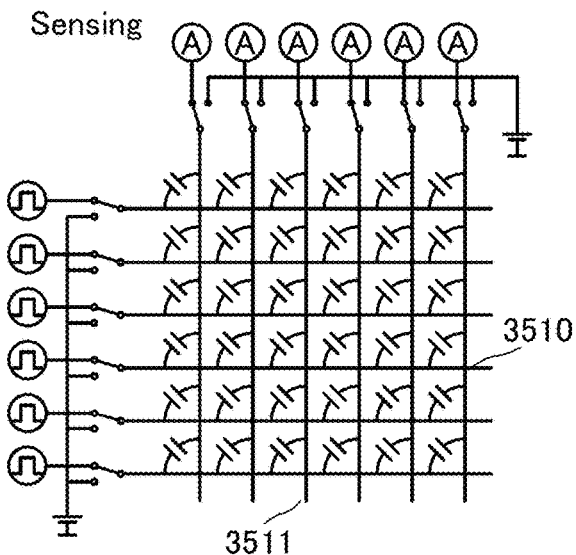

FIG. 30B is an equivalent circuit diagram in the sensing period. In the sensing period, each of the wirings 3511 extending in the Y direction is electrically connected to the detection circuit. Furthermore, a pulse voltage is input to the wirings 3510 extending in the X direction from a pulse voltage output circuit.

Figure 30C:
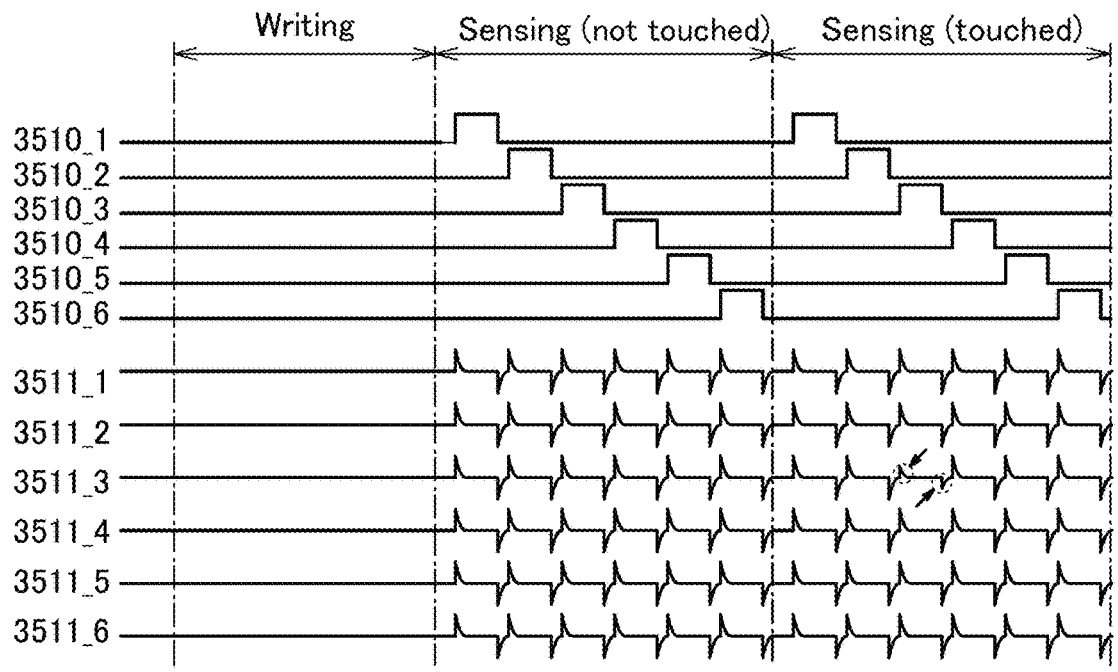

FIG. 30C illustrates an example of a timing chart of the input and output waveforms of a mutual capacitive sensor element.

In FIG. 30C, sensing of an object is performed in all rows and columns in one frame period. FIG. 30C shows two cases in the sensing period: a case in which an object is not sensed (not touched) and a case in which an object is sensed (touched).

A pulse voltage is supplied to the wirings 3510_1 to 3510_6 from the pulse voltage output circuit. When the pulse voltage is applied to the wirings 3510_1 to 3510_6, an electric field is generated between a pair of electrodes forming a capacitor, and current flows in the capacitor. The electric field generated between the electrodes is changed by being blocked by the touch of a finger or a stylus, for example. That is, the capacitance value of the capacitor is changed by touch or the like. By utilizing this, an approach or contact of an object can be sensed.

The wirings 3511_1 to 3511_6 are connected to the detection circuit for detecting the change in current in the wirings 3511_1 to 3511_6 caused by the change in capacitance value of the capacitor. The current value detected in the wirings 3511_1 to 3511_6 is not changed when there is no approach or contact of an object, and is decreased when the capacitance value is decreased because of the approach or contact of an object. In order to detect a change in current, the total amount of current may be detected. In that case, an integrator circuit or the like may be used to detect the total amount of current. Alternatively, the peak current value may be detected. In that case, current may be converted into voltage, and the peak voltage value may be detected.

Note that in FIG. 30C, the waveforms of the wirings 3511_1 to 3511_6 show voltage values corresponding to the detected current values. As illustrated in FIG. 30C, the timing of the display operation is preferably in synchronization with the timing of the sensing operation.

The waveforms of the wirings 3511_1 to 3511_6 change in accordance with pulse voltages applied to the wirings 3510_1 to 3510_6. When there is no approach or contact of an object, the waveforms of the wirings 3511_1 to 3511_6 uniformly change in accordance with changes in the voltages of the wirings 3510_1 to 3510_6. On the other hand, the current value decreases at the point of approach or contact of an object and accordingly the waveform of the voltage value changes.

By detecting a change in capacitance in this manner, the approach or contact of an object can be detected. Even when an object such as a finger or a stylus does not touch but only approaches a touch panel, a signal may be detected in some cases.

Note that FIG. 30C illustrates an example in which a common potential supplied in the writing period is equal to a low potential supplied in the sensing period in the wiring 3510; however, one embodiment of the present invention is not limited thereto. The common potential may be different from the low potential.

It is preferable that, as an example, the pulse voltage output circuit and the detection circuit be formed in one IC. For example, the IC is preferably mounted on a touch panel or a substrate in a housing of an electronic device. In the case where the touch panel has flexibility, parasitic capacitance can potentially be increased in a bent portion of the touch panel, and the influence of noise can potentially be increased. In view of this, an IC with a driving method less influenced by noise is preferably used. For example, it is preferable to use an IC to which a driving method capable of increasing a signal-noise ratio (S/N ratio) is applied.

It is preferable that a period in which an image is written and a period in which sensing is performed by a sensor element be separately provided as described above. Thus, a decrease in sensitivity of the sensor element caused by noise generated when data is written to a pixel can be prevented.

Figure 30D:
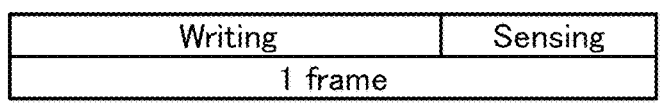
Figure 30E:
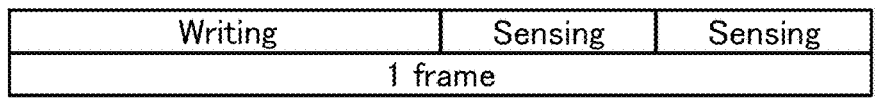

In one embodiment of the present invention, as illustrated in FIG. 30D, one frame period includes one writing period and one sensing period. Alternatively, as shown in FIG. 30E, two sensing periods may be included in one frame period. When a plurality of detection periods are included in one frame period, the detection sensitivity can be further increased. For example, two to four sensing periods may be included in one frame period.

Next, a structure example of the top surface of the sensor element included in the touch panel 350E will be described with reference to FIGS. 31A to 31C.

Figure 31A:
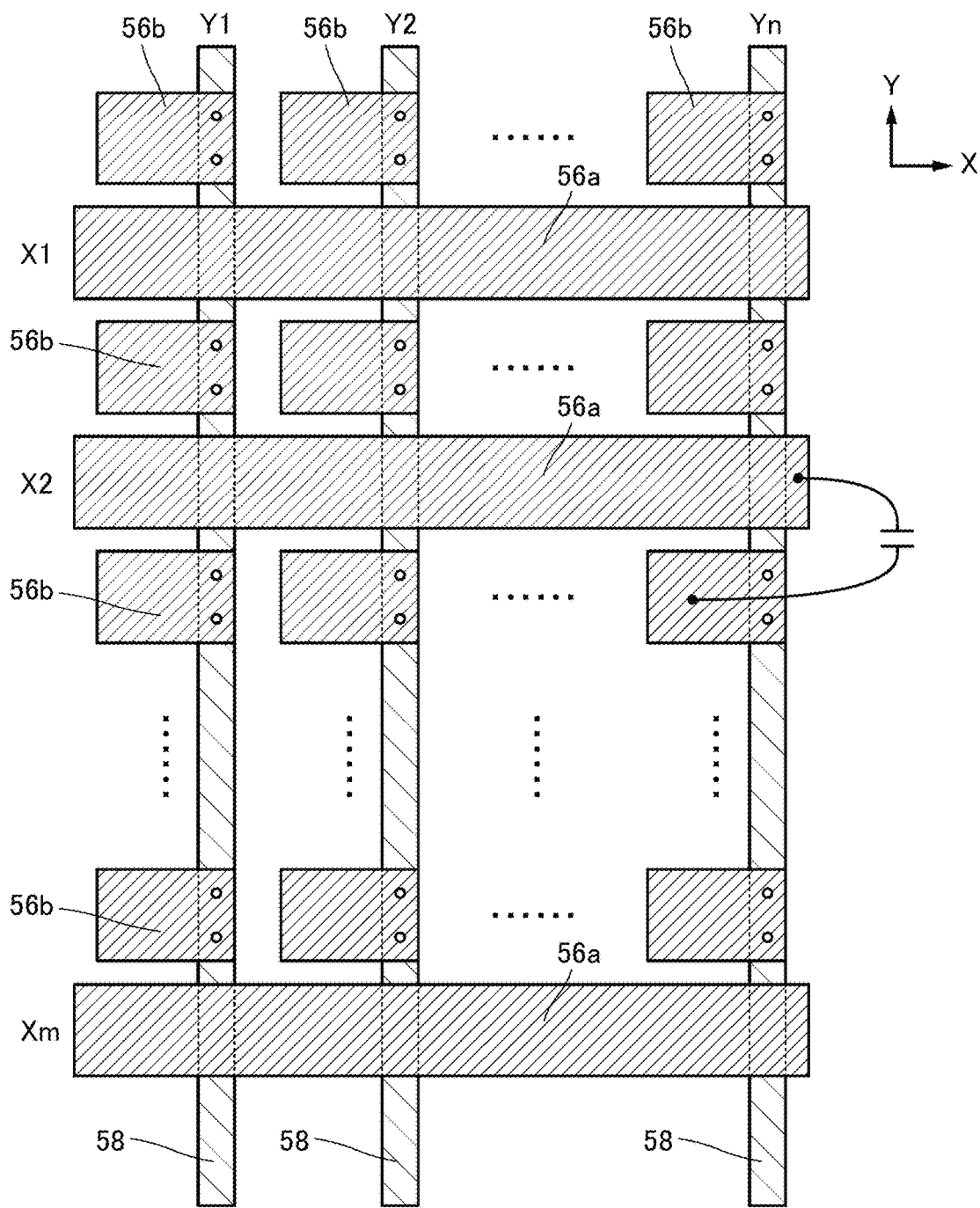
FIGS. 31A to 31C are top views illustrating an example of a sensing element and pixels.

FIG. 31A shows a top view of the sensor element. The sensor element includes a conductive layer 56a and a conductive layer 56b. The conductive layer 56a serves as one electrode of the sensor element, and the conductive layer 56b serves as the other electrode of the sensor element. The sensor element can sense an approach or contact or the like of an object utilizing the capacitance that is formed between the conductive layers 56a and 56b. Although not illustrated, the conductive layers 56a and 56b may have a top-surface shape that has a comb-like shape or that is provided with a slit.

In one embodiment of the present invention, the conductive layers 56a and 56b also serve as the common electrode of the liquid crystal element.

A plurality of conductive layers 56a are provided in the Y direction and extend in the X direction. A plurality of conductive layers 56b provided in the Y direction are electrically connected to each other via a conductive layer 58 extending in the Y direction. FIG. 31A illustrates an example in which m conductive layers 56a and n conductive layers 58 are provided.

Note that the plurality of conductive layers 56a may be provided in the X direction and in that case, may extend in the Y direction. The plurality of conductive layers 56b provided in the X direction may be electrically connected to each other via the conductive layer 58 extending in the X direction.

Figure 31B:
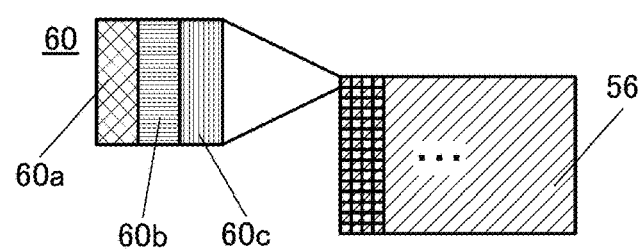
Figure 31C:
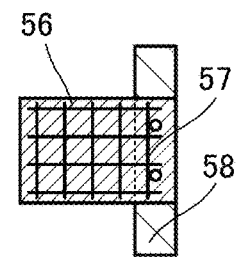

As illustrated in FIG. 31B, a conductive layer 56 serving as an electrode of the sensor element is provided over a plurality of pixels 60. The conductive layer 56 corresponds to each of the conductive layers 56a and 56b in FIG. 31A. The pixel 60 is formed of a plurality of subpixels exhibiting different colors. FIG. 31B shows an example in which the pixel 60 is formed of three subpixels, subpixels 60a, 60b, and 60c.

A pair of electrodes of the sensor element is preferably electrically connected to respective auxiliary wirings. The conductive layer 56 may be electrically connected to an auxiliary wiring 57, as illustrated in FIG. 31C. Note that FIG. 31C illustrates an example in which the auxiliary wirings are stacked over the conductive layers; however, the conductive layers may be stacked over the auxiliary wirings. The plurality of conductive layers 56 provided in the X direction may be electrically connected to the conductive layer 58 through the auxiliary wiring 57.

The resistivity of the conductive layer that transmits visible light is relatively high in some cases. Thus, the resistance of the pair of electrodes of the sensor element is preferably lowered by electrically connecting the pair of electrodes of the sensor element to the auxiliary wiring.

When the resistance of the pair of electrodes of the sensor element is lowered, the time constant of the pair of electrodes can be small. Accordingly, the detection sensitivity of the sensor element can be increased; furthermore, the detection accuracy of the sensor element can be increased.

<11. Structure Example 9 of Display Device>

Figure 32:
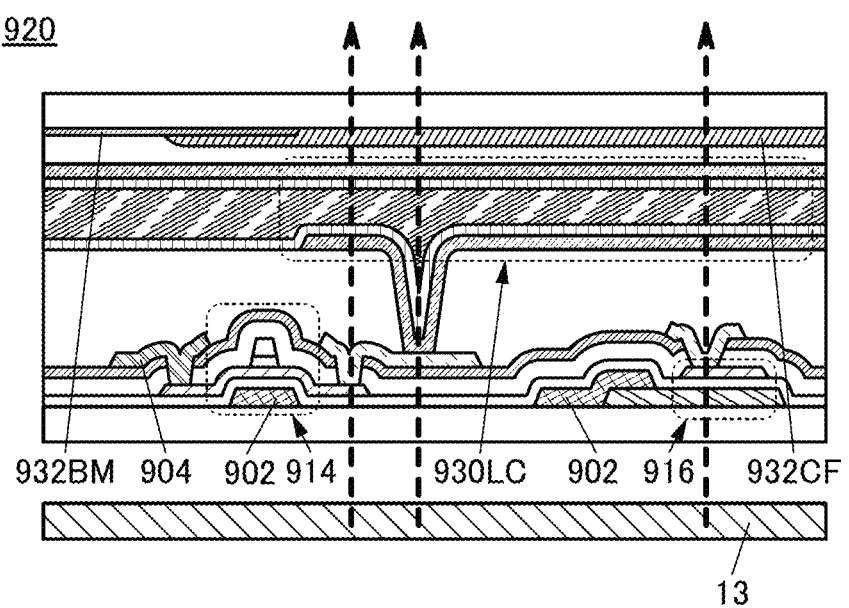
FIG. 32 is a cross-sectional view illustrating an example of a display device.

FIG. 32 is a cross-sectional view illustrating an example of the pixel included in the display device in this embodiment.

FIG. 32 illustrates an example of a transmissive liquid crystal display device. As illustrated in FIG. 32, light from the backlight unit 13 is emitted in a direction of a dashed arrow.

In FIG. 32, light from the backlight unit 13 is extracted to the outside through the contact area of the transistor 914 and the liquid crystal element 930LC, the transistor 914, a capacitor portion 916, and the like.

FIG. 32 illustrates an example in which a semiconductor layer of the transistor 914 and one of a source electrode and a drain electrode of the transistor 914 have a visible-light-transmitting property. The one of the source electrode and the drain electrode is electrically connected to the liquid crystal element 930LC.

In FIG. 32, the wiring 904 serves as the other of the source electrode and the drain electrode of the transistor 914. The wiring 902 serves as the gate of the transistor 914. The wirings are preferably formed using a conductive material having low resistivity. The wirings 902 and 904 may have a light-blocking property. The transistor 914 in FIG. 32 includes a back gate. The light-transmitting property of the back gate is not particularly limited.

In the capacitor portion 916 in FIG. 32, an insulating layer is sandwiched between two visible-light-transmitting conductive layers. The first conductive layer which is one of the two conductive layers is connected to the wiring 902. The second conductive layer which is the other of the two conductive layers is formed using the same step and the same material as the semiconductor layer and connected to a third conductive layer having a visible-light-transmitting property. The third conductive layer is formed using the same step and the same material as the one of the source electrode and the drain electrode.

As the area of light-transmitting regions of the transistor 914, the capacitor portion 916, and the like is larger, light from the backlight unit 13 can be used more efficiently.

Since the transistor in the display device in this embodiment includes a visible-light-transmitting region, the aperture ratio of the pixel can be increased. Thus, the power consumption of the display device can be reduced. Moreover, the display device can have higher definition.

This embodiment can be combined with any of other embodiments as appropriate. In the case where a plurality of structure examples are described in one embodiment in this specification, some of the structure examples can be combined as appropriate.

Embodiment 2

In this embodiment, display devices each of which is one embodiment of the present invention are described with reference to FIGS. 33A and 33B to FIG. 50.

<1. Structure Example 1 of Display Device>

First, display devices in this embodiment are described with reference to FIGS. 33A and 33B to FIGS. 35A1 to 35C.

Each of the display devices in this embodiment includes a liquid crystal element, a first insulating layer, and a transistor. The liquid crystal element includes a pixel electrode, a liquid crystal layer, and a common electrode. The first insulating layer is positioned between the pixel electrode and the transistor. The first insulating layer includes an opening. The transistor is electrically connected to the pixel electrode.

The transistor includes a first region. The transistor includes a first portion in contact with the pixel electrode and a second portion in contact with a side surface of the opening in the first insulating layer. The pixel electrode, the common electrode, and the first region have a function of transmitting visible light. Visible light passes through the first region and the liquid crystal element and emitted to the outside of the display device. The first region included in the transistor may be a region connected to the pixel electrode.

In each of the display devices in this embodiment, the transistor includes a visible-light-transmitting region. For example, a contact area of the transistor and the pixel electrode transmits visible light, and thus the contact area can be provided in the display region. Thus, the aperture ratio of the pixel can be increased and the power consumption of the display device can be reduced. Moreover, the display device can have higher definition.

In each of the display devices in this embodiment, an electrode of the liquid crystal element is provided flat. Specifically, not the pixel electrode but the components of the transistor are provided to fill the opening provided in an insulating layer between the transistor and the pixel electrode. Accordingly, in the contact area of the transistor and the pixel electrode, the pixel electrode can be prevented from being uneven. Forming the electrode of the liquid crystal element flat can reduce variation of cell gaps in the liquid crystal element. In addition, variation of the initial alignment of the liquid crystal can be reduced, thereby reducing the display defects in the display device. Furthermore, reduction of the aperture ratio due to the alignment defect of the liquid crystal can be reduced.

The display device in this embodiment further includes a scan line and a signal line. Each of the scan line and the signal line is electrically connected to the transistor. Each of the scan line and the signal line includes a metal layer. When a metal layer is used for each of the scan line and the signal line, the resistances of the scan line and the signal line can be reduced.

The scan line preferably includes a portion overlapping with a channel region of the transistor. The characteristics of the transistor might vary by light irradiation depending on a material of the channel region of the transistor. When the scan line includes the portion overlapping with the channel region of the transistor, the channel region can be prevented from being irradiated with external light, light of a backlight, or the like. Thus, the reliability of the transistor can be increased.

Figure 33A:
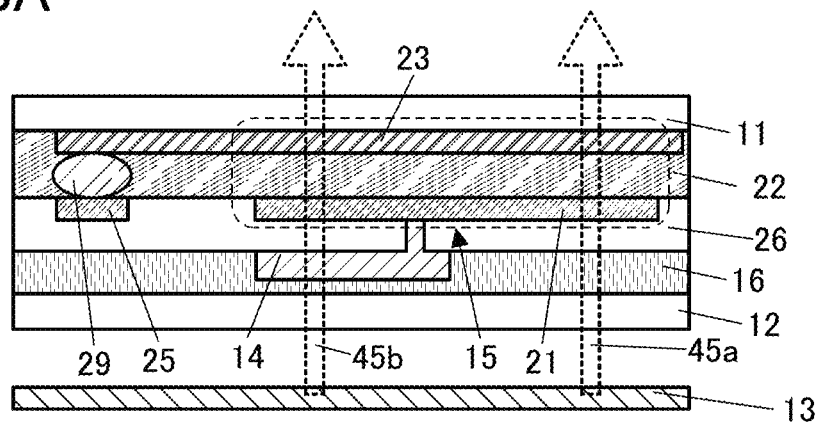
FIGS. 33A and 33B are cross-sectional views each illustrating an example of a display device.

A display device 20A illustrated in FIG. 33A includes the substrate 11, the substrate 12, an adhesive layer 16, a transistor 14, a liquid crystal element 15, and the like. The backlight unit 13 is provided on the substrate 12 side of the display device 20A.

The liquid crystal element 15 includes the pixel electrode 21, the liquid crystal layer 22, and the common electrode 23. The transistor 14 includes a portion in contact with the pixel electrode 21 and a portion in contact with a side surface of the opening in the insulating layer 26. Thus, the pixel electrode 21 and the transistor 14 are electrically connected to each other through the opening provided in the insulating layer 26. The conductive layer 25 is electrically connected to the common electrode 23 through the connector 29. The conductive layer 25 can be formed using the same step and the same material as the pixel electrode 21.

The light 45a from the backlight unit 13 is emitted to the outside of the display device 20A through the substrate 12, the adhesive layer 16, the insulating layer 26, the pixel electrode 21, the liquid crystal layer 22, the common electrode 23, and the substrate 11. As materials of these layers that transmit the light 45a, visible-light-transmitting materials are used.

The light 45b from the backlight unit 13 is emitted to the outside of the display device 20A through the substrate 12, the adhesive layer 16, the transistor 14, the insulating layer 26, the pixel electrode 21, the liquid crystal layer 22, the common electrode 23, and the substrate 11. In this embodiment, the transistor 14 electrically connected to the liquid crystal element 15 has a structure having a visible-light-transmitting region. Accordingly, a region provided with the transistor 14 can also be used as a display region. Thus, the aperture ratio of the pixel can be increased. As the aperture ratio becomes higher, the light extraction efficiency can be increased. Therefore, the power consumption of the display device can be reduced. Moreover, the display device can have high definition.

In the fabrication method of the display device in one embodiment of the present invention, the transistor is formed after an electrode of the liquid crystal element is formed over a first substrate. Next, the first substrate and a second substrate are bonded to each other. Then, the electrode of the liquid crystal element and the transistor are transferred from the first substrate to the second substrate by separating the first substrate and the second substrate. When the electrode of the liquid crystal element is formed before formation of the transistor, the electrode of the liquid crystal element can be formed flat without an adverse effect of unevenness due to the transistor itself and the contact area of the pixel electrode and the transistor. When the electrode of the liquid crystal element is formed flat, variation of cell gaps in the liquid crystal element can be reduced. Forming the electrode of the liquid crystal element flat can reduce the variation of cell gaps in the liquid crystal element. In addition, variation of the initial alignment of the liquid crystal can be reduced, thereby reducing the display defects in the display device. Furthermore, reduction of the aperture ratio due to the alignment defect of the liquid crystal can be reduced.

In the fabrication method of the display device in one embodiment of the present invention, the first substrate used in forming the transistor is separated during the fabrication process. That is, the fabrication condition of the transistor is not limited by the material of the substrate that is included in the component of the display device. For example, by fabricating the transistor over the first substrate using a high temperature, the transistor can be made more reliable. By using a substrate that is thinner and more lightweight and flexible than the first substrate as each of the second substrate to which the transistor and the like are transferred, and the counter substrate that encapsulates the liquid crystal layer together with the second substrate, the display device can be made lightweight, thin, and flexible.

Figure 33B:
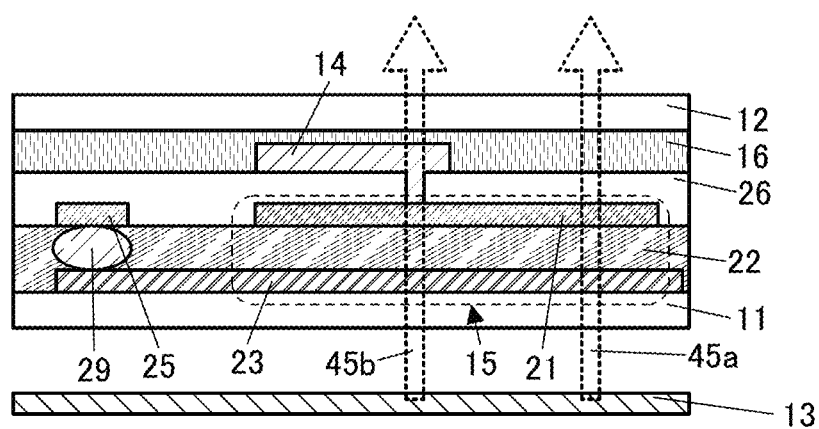

A display device 20B illustrated in FIG. 33B differs from the display device 20A in that the backlight unit 13 is provided on the substrate 11 side. The other structures are similar to those of the display device 20A, and therefore, a description thereof is omitted.

In the display device 20A, the light 45b first enters the visible-light-transmitting region of the transistor 14. Then, the light 45b which has passed through the visible-light-transmitting region enters the liquid crystal element 15. In contrast, in the display device 20B, the light 45b first enters the liquid crystal element 15. Then, the light 45b which has passed through the liquid crystal element 15 enters the visible-light-transmitting region of the transistor 14. As described above, the light from the backlight unit 13 may first enter either the transistor 14 or the liquid crystal element 15.

In the display device 20B, a portion of the transistor 14 that is connected to the pixel electrode 21 transmits visible light. The light 45b passes through the contact area of the transistor 14 and the pixel electrode 21. That is, the contact area of the transistor 14 and the pixel electrode 21 can be used as a display region. Thus, the aperture ratio of the pixel can be increased. Moreover, the power consumption of the display device can be reduced.

The display device of one embodiment of the present invention can be applied to a display device in which a touch sensor is implemented; such a display device is also referred to as an input/output device or a touch panel. The touch sensor is positioned on a display surface side of the liquid crystal element and the transistor.

Figure 34A:
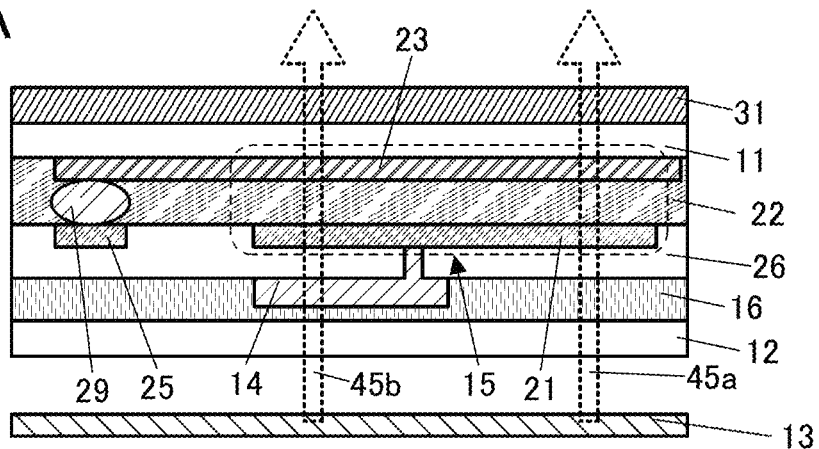
FIGS. 34A to 34C are cross-sectional views each illustrating an example of a display device.

A display device 35A illustrated in FIG. 34A has a structure in which the touch sensor unit 31 is provided on the substrate 11 side of the display device 20A.

Figure 34B:
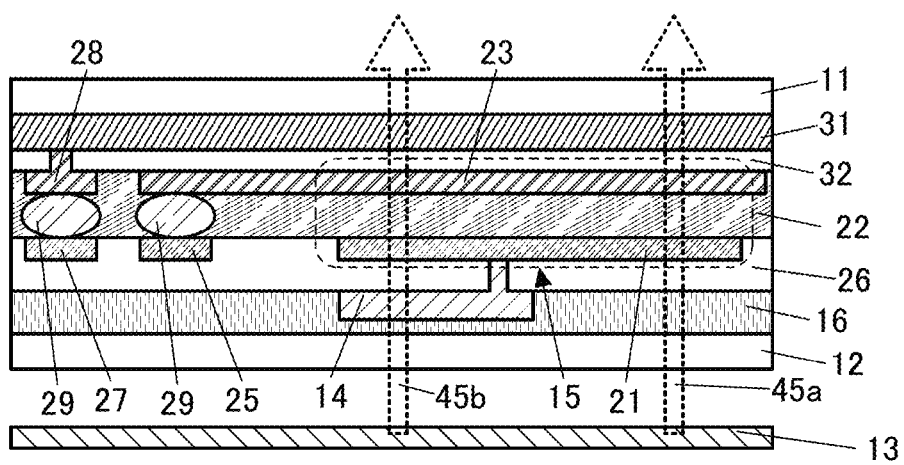

A display device 35B illustrated in FIG. 34B has a structure in which the touch sensor unit 31 and the insulating layer 32 are provided between the substrate 11 and the common electrode 23 of the display device 20A. In addition, the display device 35B includes the conductive layer 27 and the conductive layer 28.

The conductive layer 28 is electrically connected to the touch sensor unit 31. The conductive layer 28 is electrically connected to the conductive layer 27 through the connector 29. Thus, even when an FPC is provided only on one substrate side, both the signal for driving the liquid crystal element 15 and the signal for driving the touch sensor unit 31 can be supplied to the display device 35B. Alternatively, an FPC that supplies the signal for driving the liquid crystal element 15 and an FPC that supplies the signal for driving the touch sensor unit 31 can be connected on the same surface. FPCs and the like do not need to be connected to the pair of substrates, and thus the structure of the display device can be simplified. The display device is incorporated into an electronic device easily as compared with a display device in which FPCs are connected to both of the substrates 11 and 12 sides, and the number of components can be reduced. Note that one or more FPCs can be connected to the display device of one embodiment of the present invention. The conductive layer 27 can be formed using the same step and the same material as the pixel electrode 21. The conductive layer 28 can be formed using the same step and the same material as the common electrode 23.

In the display device 35B, the touch sensor unit 31 can be provided between a pair of substrates, so that the number of substrates can be reduced, and the display device can be reduced in weight and thickness.

Figure 34C:
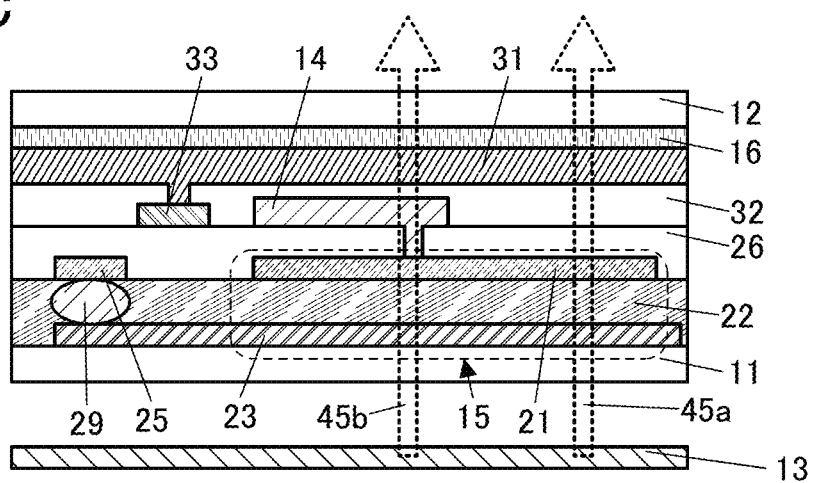

A display device 35C illustrated in FIG. 34C has a structure in which the touch sensor unit 31 and the insulating layer 32 are provided between the substrate 12 and the transistor 14 of the display device 20B. In addition, the display device 35C includes the conductive layer 33.

The conductive layer 33 formed using the same process and the same material as one or more conductive layers included in the transistor 14 is provided in contact with the insulating layer 26. The conductive layer 33 is electrically connected to the touch sensor unit 31. Even when an FPC is provided only on one substrate side in the display device 35C, both the signal for driving the liquid crystal element 15 and the signal for driving the touch sensor unit 31 can be supplied to the display device 35C. Alternatively, an FPC that supplies the signal for driving the liquid crystal element 15 and an FPC that supplies the signal for driving the touch sensor unit 31 can be connected on the same surface. Thus, the display device is incorporated into an electronic device easily, and the number of components can be reduced.

In the display device 35C, the touch sensor unit 31 can be provided between a pair of substrates, so that the number of substrates can be reduced, and the display device can be reduced in weight and thickness.

[Pixel]

Next, a pixel included in each of the display devices in this embodiment is described with reference to FIGS. 35A1 to 35C. Note that the description in Embodiment 1 with reference to FIGS. 3A1 to 3C can also be referred to.

FIG. 35A1 is a schematic top view illustrating the pixel 900. The pixel 900 illustrated in FIG. 35A1 includes four subpixels. The pixel 900 illustrated in FIG. 35A1 is an example of a pixel including two-by-two subpixels. In each of the subpixels, a light-transmitting liquid crystal element 930LC (not illustrated in FIGS. 35A1 and 35A2), the transistor 914, and the like are provided. In the pixel 900 in FIG. 35A1, the two wirings 902 and the two wirings 904 are provided. FIG. 35A1 illustrates the display regions (the display regions 918R, 918G, 918B, and 918W) of liquid crystal elements included in the subpixels.

The pixel 900 includes the wirings 902 and 904, and the like. The wirings 902 function as scan lines, for example. The wirings 904 function as signal lines, for example. The wirings 902 and 904 intersect with each other at a portion.

The transistor 914 functions as a selection transistor. The gate of the transistor 914 is electrically connected to the wiring 902. The one of the source and the drain of the transistor 914 is electrically connected to the wiring 904, and the other of the source and the drain of the transistor 914 is electrically connected to the liquid crystal element 930LC.

Here, the wirings 902 and 904 have a light-blocking property. It is preferable to use a light-transmitting film for each layer other than the wirings 902 and 904, i.e., the transistor 914 and each layer forming a wiring, a contact area, a capacitor, and the like, which are connected to the transistor 914. FIG. 35A2 distinctively illustrates the visible-light-transmitting region 900t and the visible-light-blocking region 900s included in the pixel 900 in FIG. 35A1. When the transistor is formed using a light-transmitting film as described above, a portion other than the portion provided with the wirings 902 and 904 can be the transmissive region 900t. The transmissive region of the liquid crystal element can overlap with the transistor, the wirings connected to the transistor, the contact area, the capacitor, and the like, so that the aperture ratio of the pixel can be increased.

FIGS. 35B and 35C are each a cross-sectional view taken along dashed-dotted line A-B in FIG. 35A2. Note that cross sections of the liquid crystal element 930LC, the coloring film 932CF, the light-blocking film 932BM, the capacitor 915, the driver circuit portion 901, and the like, which are not illustrated in the top views, are also illustrated in FIGS. 35B and 35C. As the driver circuit portion 901, a scan line driver circuit portion or a signal line driver circuit portion can be used. The driver circuit portion 901 includes the transistor 911.

As illustrated in each of FIGS. 35B and 35C, light from the backlight unit 13 is emitted in a direction shown by an arrow of a broken line. The light from the backlight unit 13 is extracted to the outside through the contact area of the transistor 914 and the liquid crystal element 930LC, the transistor 914, the capacitor 915, and the like. Accordingly, films forming the transistor 914 and the capacitor 915, and the like also preferably have a light-transmitting property. As the area of the light-transmitting region included in the transistor 914, the capacitor 915, and the like becomes larger, light from the backlight unit 13 can be used more efficiently.

As illustrated in each of FIGS. 35B and 35C, the light from the backlight unit 13 may be extracted to the outside through the coloring film 932CF. When the light is extracted through the coloring film 932CF, light having a desired color can be obtained.

In FIG. 35B, the light from the backlight unit 13 first enters the coloring film 932CF. Then, the light which has passed through the coloring film 932CF enters the liquid crystal element 930LC. After that, the light which has passed through the liquid crystal element 930LC is extracted to the outside through the transistor 914, the capacitor 915, and the like.

In FIG. 35C, the light from the backlight unit 13 first enters the transistor 914, the capacitor 915, and the like. Then, the light which has passed through the transistor 914, the capacitor 915, and the like enters the liquid crystal element 930LC. After that, the light which has passed through the liquid crystal element 930LC is extracted to the outside through the coloring film 932CF.

The transistors, the wirings, the capacitors, and the like illustrated in FIGS. 35A1 to 35C can be formed using the materials exemplified in Embodiment 1.

The structure of the pixel in the display device described in this embodiment enables efficient use of light emitted from the backlight unit. Thus, the excellent display device with reduced power consumption can be provided.

<2. Structure Example 2 of Display Device>

Figure 36A:
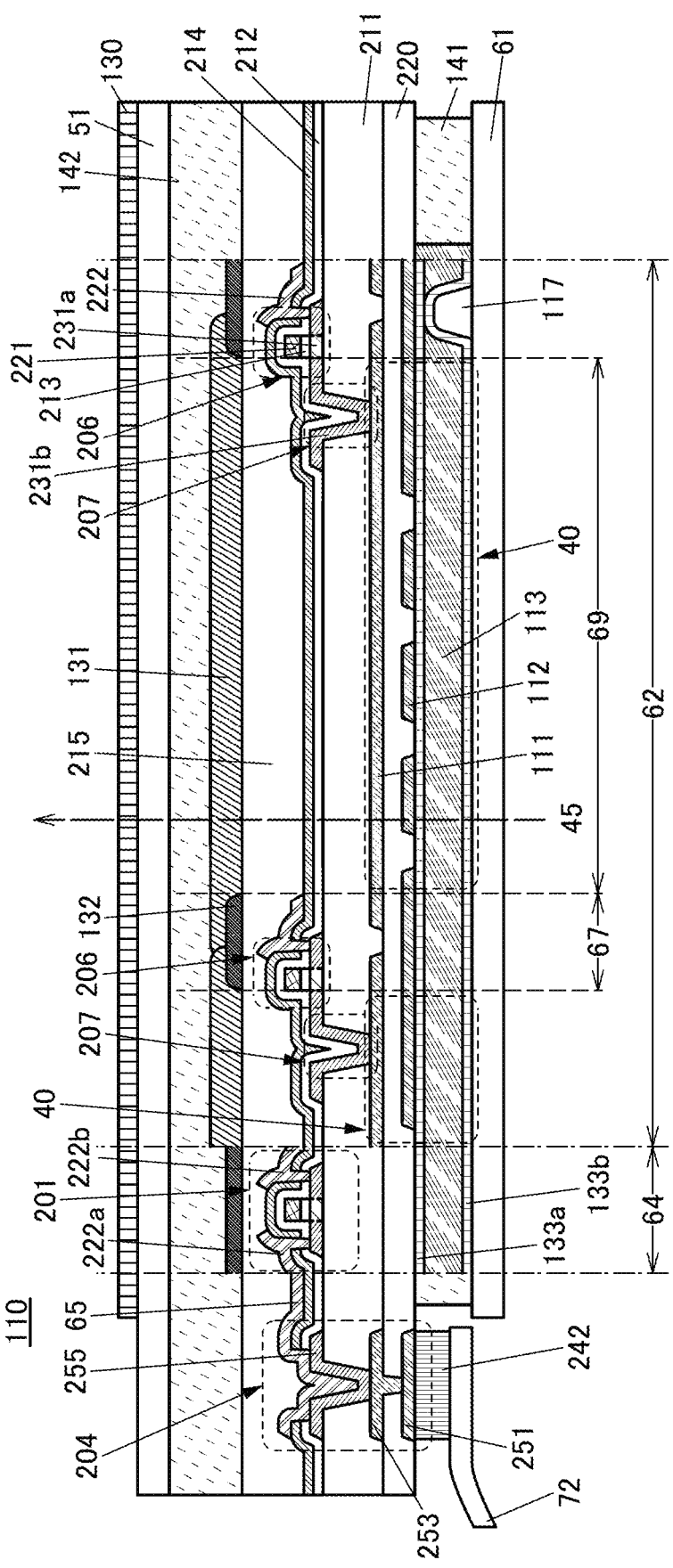
FIGS. 36A to 36C are cross-sectional views illustrating examples of a display device.

Next, display devices of this embodiment are described with reference to FIGS. 36A to 36C and FIG. 37. FIG. 36A is a cross-sectional view illustrating a display device 110. A perspective view of the display device 110 is similar to that of the display device 100A, and thus FIG. 4 and description of Embodiment 1 can be referred to. FIG. 37 is a cross-sectional view illustrating a touch panel 355.

The display device 110 is an example of a transmissive liquid crystal display device that includes a liquid crystal element with a horizontal electric field mode.

As illustrated in FIG. 36A, the display device 110 includes the substrate 51, the adhesive layer 142, the transistor 201, the transistor 206, the liquid crystal element 40, the alignment film 133a, the alignment film 133b, the connection portion 204, the adhesive layer 141, the spacer 117, the coloring layer 131, the light-blocking layer 132, the substrate 61, the polarizer 130, and the like.

The display area 62 includes the transistor 206 and the liquid crystal element 40.

The transistor 206 includes the gate 221, the gate insulating layer 213, and a semiconductor layer (the channel region 231a and the low-resistance region 231b). The insulating layer 213 serves as a gate insulating layer. The resistivity of the low-resistance region 231b is lower than that of the channel region 231a. The semiconductor layer can transmit visible light. In this embodiment, the case in which an oxide semiconductor layer is used as the semiconductor layer is described as an example. The oxide semiconductor layer preferably includes indium and is further preferably an In-M-Zn oxide (M is Al, Ti, Ga, Ge, Y, Zr, La, Ce, Nd, Sn, or Hf) film. The details of the oxide semiconductor layer is described later.

The conductive layer 222 is connected with the low-resistance region 231b through an opening formed in the insulating layers 212 and 214.

The transistor 206 is covered with the insulating layers 212 and 214. Note that the insulating layers 212 and 214 can be considered as the component of the transistor 206. The transistor is preferably covered by an insulating layer that reduces the diffusion of an impurity to the semiconductor constituting the transistor.

The insulating layer 213 preferably includes an excess oxygen region. When the insulating layer 213 includes the excess oxygen region, excess oxygen can be supplied into the channel region 231a. A highly reliable transistor can be provided since oxygen vacancies that are potentially formed in the channel region 231a can be filled with excess oxygen.

The insulating layer 212 preferably includes nitrogen or hydrogen. When the insulating layer 212 and the low-resistance region 231b are in contact with each other, nitrogen or hydrogen in the insulating layer 212 is added into the low-resistance region 231b. The carrier density of the low-resistance region 231b becomes high when nitrogen or hydrogen is added.

The liquid crystal element 40 is a liquid crystal element with FFS mode. The liquid crystal element 40 includes a pixel electrode 111, a common electrode 112, and a liquid crystal layer 113. The alignment of the liquid crystal layer 113 can be controlled with the electrical field generated between the pixel electrode 111 and the common electrode 112. The liquid crystal layer 113 is positioned between the alignment films 133a and 133b.

The pixel electrode 111 is electrically connected to the low-resistance region 231b of the semiconductor layer of the transistor 206.

In a connection portion 207, the low-resistance region 231b of the semiconductor layer is connected to the pixel electrode 111. The low-resistance region 231b of the semiconductor layer includes a portion that is in contact with side surfaces of an opening in an insulating layer 211. The low-resistance region 231b of the semiconductor layer is in contact with the side surfaces of the opening in the insulating layer 211, while at the same time being connected to the pixel electrode 111. This enables the pixel electrode 111 to be placed flat.

By using a material that transmits visible light in the semiconductor layer, the connection portion 207 can be provided in an opening 69 of a pixel. This opening can also be referred to as an opening of a subpixel or a display region.

The connection portion 207 does not include an uneven surface on the substrate 61 side. Note that the surfaces of the pixel electrode 111, the insulating layer 220, the common electrode 112 and the alignment film 133a that are described above each overlap with the connection portion 207 and are positioned on the substrate 61 side of the connection portion 207. Therefore, portions of the liquid crystal layer 113 that overlap with the connection portion 207 can be used to display images, similarly to other areas. That is, the region where the connection portion 207 is provided can be used as an opening of the pixel. Thus, the aperture ratio of the subpixel can be increased. Moreover, power consumption of the display device can be reduced.

Note that the low-resistance region 231b and the pixel electrode 111 may be electrically connected to each other using a conductive layer between the insulating layer 212 and the substrate 51. In that case, two connection portions, that is, a connection portion between the conductive layer and the low-resistance region 231b and a connection portion between the conductive layer and the pixel electrode 111, need to be provided. In contrast, the structure illustrated in FIG. 36A and the like can reduce such connection portions. Therefore, this structure can achieve a smaller pixel size without changing design rules, which enables a display device with high definition. When the low-resistance region 231b of the semiconductor layer is directly connected to the pixel electrode 111 as described above, the possibilities in the layout of the pixel can be increased.

The common electrode 112 illustrated in FIG. 36A has a top-surface shape that has a comb-like shape, or that is provided with a slit. The insulating layer 220 is provided between the pixel electrode 111 and the common electrode 112. The pixel electrode 111 includes a portion that overlaps the common electrode 112 with the insulating layer 220 provided therebetween. Furthermore, the common electrode 112 is not placed above the pixel electrode 111 in some areas of a region where the pixel electrode 111 and the coloring layer 131 overlap.

An alignment film is preferably provided in contact with the liquid crystal layer 113. The alignment film can control the alignment of the liquid crystal layer 113. In the display device 110, the alignment film 133a is positioned between the common electrode 112 (or the insulating layer 220) and the liquid crystal layer 113, and the alignment film 133b is positioned between the overcoat 121 and the liquid crystal layer 113.

The pixel electrode 111 is embedded into the insulating layer 211. The surface of the pixel electrode 111 on the liquid crystal layer 113 side can form the same surface (or the same plane) with the surface of the insulating layer 211 on the liquid crystal layer 113 side. That is, the surface of the pixel electrode 111 on the liquid crystal layer 113 side and the surface of the insulating layer 211 on the liquid crystal layer 113 side are positioned on the same plane, are in contact with the same plane, have no step differences in their boundaries, or have the same height, for example.

In the display device 110, the thicknesses of the insulating layers 211, 212, and 214 do not directly affect the characteristics of the transistors 201 and 206. Thus, the insulating layers 211, 212, and 214 can be made thick. This can reduce the parasitic capacitances between the pixel electrode 111 and the gate 221, between the pixel electrode 111 and the conductive layer 222, and between the pixel electrode 111 and the semiconductor layer, or the like.

Figure 36B:
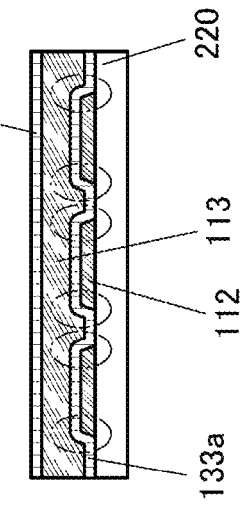
Figure 37:
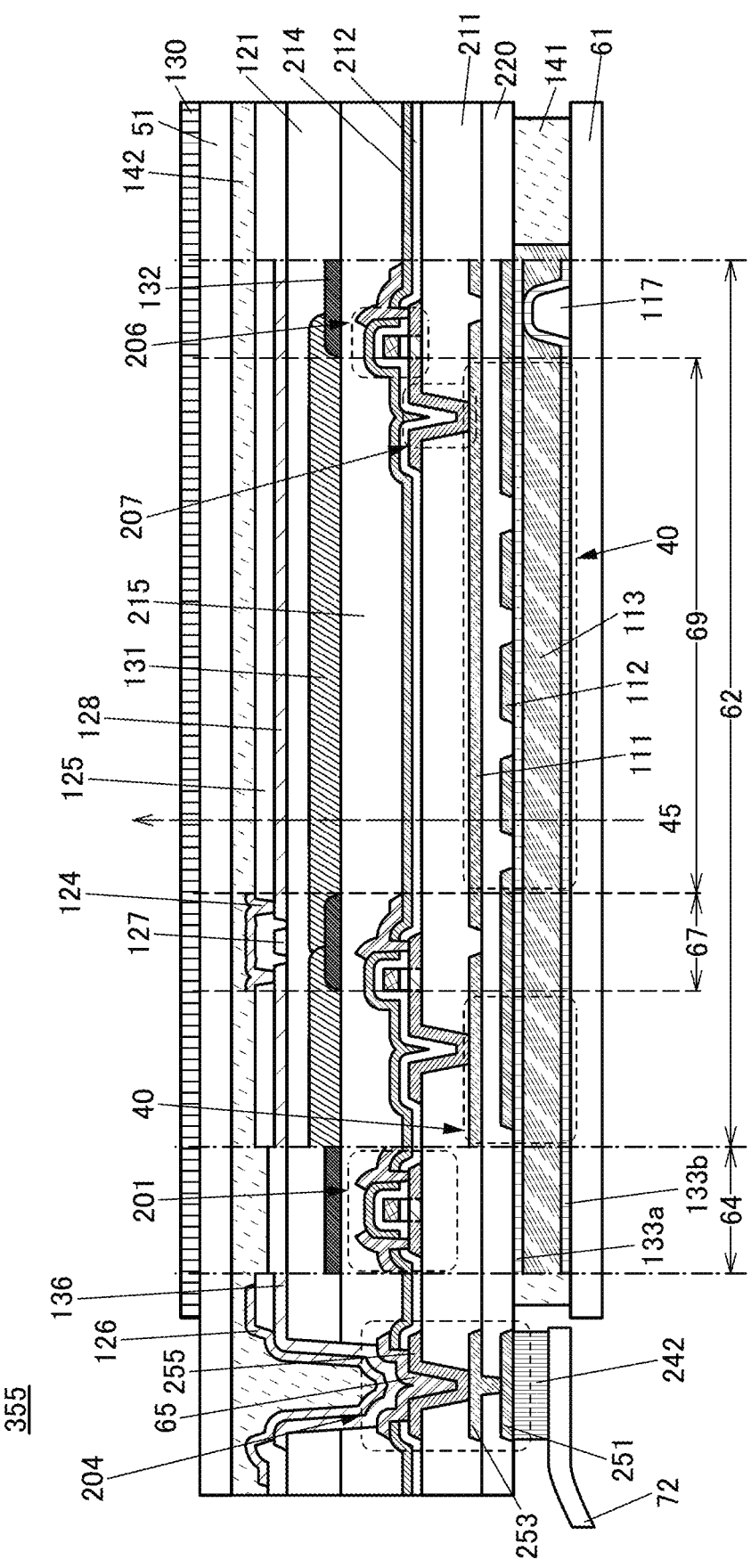
FIG. 37 is a cross-sectional view illustrating an example of a display device.

A cross-sectional view of the liquid crystal layer 113 and its surroundings in the opening 69 of the pixel in the display device 110 is shown in FIG. 36B. As illustrated in FIG. 36B, the common electrode 112 is embedded into the insulating layer 220. The surface of the common electrode 112 on the liquid crystal layer 113 side can form the same surface (or the same plane) with the surface of the insulating layer 220 on the liquid crystal layer 113 side. That is, the surface of the common electrode 112 on the liquid crystal layer 113 side and the surface of the insulating layer 220 on the liquid crystal layer 113 side are positioned on the same plane, are in contact with the same plane, have no substantial step differences in their boundaries, or have the same height, for example. Furthermore, the alignment film 133a is provided flat.

Figure 36C:
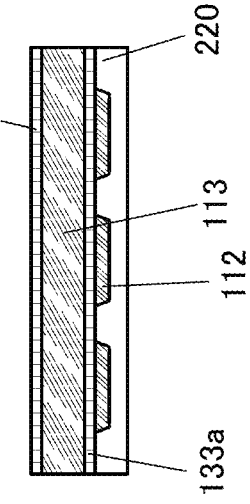

In FIG. 36C, the common electrode 112 is provided above the surface of the insulating layer 220 on the liquid crystal layer 113 side. The alignment film 133a has an uneven surface (see the frames in the dashed-dotted lines) that reflects the thickness of the common electrode 112. This can lead to variation in the thickness (also referred to as a cell gap) of the liquid crystal layer 113 in the opening 69 of the pixel, which inhibits favorable display of images.

Furthermore, near the edge of the common electrode 112, the initial alignment of the liquid crystal layer 113 is more prone to variation due to the uneven surface of the alignment film 133a in some cases. The contrast of the display device 110 degrades in some cases, when regions of the liquid crystal layer 113 that are more prone to initial alignment variation are used for the display of images. Furthermore, in the case where the region more prone to initial alignment variation exist between two adjacent subpixels, the degradation in contrast can be reduced by covering the region with the light-blocking layer 132 and the like. However, this can reduce the aperture ratio.

As illustrated in FIGS. 36A and 36B, when the surface of the common electrode 112 on the liquid crystal layer 113 side and the surface of the insulating layer 220 on the liquid crystal layer 113 side form the same surface, the spacing between the alignment films 133a and 133b can be made uniform within the opening 69 of the pixel. That is, the thickness of the common electrode 112 does not affect the thickness of the liquid crystal layer 113. The thickness of the liquid crystal layer 113 becomes constant within the opening 69 of the pixel. From the above, the display device 110 can display high-quality images with high color reproducibility.

Furthermore, by providing the alignment film 133a flatly, the initial alignment can be made uniform more easily, even near the edge of the common electrode 112. Providing the alignment film 133a flatly can reduce the generation of the region prone to the initial alignment variation of the liquid crystal layer 113 between two adjacent subpixels. Thus, the aperture ratio can be increased, and the display device can easily achieve a high definition. In addition, the power consumption of the display device can be reduced.

As described above, the display device according to one embodiment of the present invention can reduce the step difference generated near the edge of the common electrode 112, leading to less alignment defects due to the step difference.

As the display device 110 is a transmissive liquid crystal display device, a visible-light-transmitting conductive material is used for both the pixel electrode 111 and the common electrode 112. Preferably, at least one of the pixel electrode 111 and the common electrode 112 includes an oxide conductive layer. At least one of the pixel electrode 111 and the common electrode 112 may be formed with an oxide semiconductor. When two or more layers constituting the display device are formed using oxide semiconductors containing the same metal element, the same manufacturing equipment (e.g., film-formation equipment or processing equipment) can be used in two or more steps; manufacturing cost can thus be reduced.

Oxides are preferably used in both the pixel electrode 111 and the semiconductor layer. For example, when a non-oxide material (e.g., a metal) is used for one of the components above and an oxide is used for the other component, a contact resistance between the pixel electrode 111 and the semiconductor layer may increase due to the oxidation of the non-oxide material. By using an oxide for both the pixel electrode 111 and the semiconductor layer, the contact resistance is reduced, and the display device 110 can be made more reliable.

When the pixel electrode 111 and the semiconductor layer include an oxide semiconductor with a common metal element, the adhesion between the pixel electrode 111 and the low-resistance region 231b of the semiconductor layer can be reinforced in some cases.

For example, when a silicon nitride film containing hydrogen is used for the insulating layer 211, and an oxide semiconductor is used for the pixel electrode 111, the conductivity of the oxide semiconductor can be increased by the hydrogen that is supplied from the insulating layer 211.

For example, when a silicon nitride film containing hydrogen is used for the insulating layer 220, and an oxide semiconductor is used for the common electrode 112, the conductivity of the oxide semiconductor can be increased by the hydrogen that is supplied from the insulating layer 220.

The transistor 201 and the transistor 206 are covered with the insulating layer 215, and the coloring layer 131 and the light-blocking layer 132 are provided over the insulating layer 215. The coloring layer 131 is positioned in an region that at least overlaps with the opening 69 of the pixel. This opening can also be referred to as an opening of a subpixel. In a light-blocking region 67 of a pixel (subpixel), the light-blocking layer 132 is provided. The light-blocking layer 132 overlaps with at least a part of the transistor 206. The substrate 51 is boned to the coloring layer 131 and the light-blocking layer 132 with the adhesive layer 142 interposed therebetween.

The spacer 117 has a function of preventing the distance between the substrate 51 and the substrate 61 from being shorter than or equal to a certain distance. FIG. 36A illustrates an example in which a bottom surface of the spacer 117 is in contact with the substrate 61. Moreover, in FIG. 36A, the alignment films 133a and 133b are in contact with each other in a portion overlapping with the spacer 117.

The substrates 51 and 61 are bonded to each other by the adhesive layer 141. The liquid crystal layer 113 is encapsulated in a region that is surrounded by the substrates 51 and 61, and the adhesive layer 141.

When the display device 110 functions as a transmissive liquid crystal display device, two polarizers are positioned in a way that the display area 62 is sandwiched between the two polarizers. FIG. 36A illustrates the polarizer 130 on the substrate 51 side. Light 45 from a backlight provided on the outside of the polarizer on the substrate 61 side enters the display device 110 through the polarizer. In this case, the optical modulation of the light can be controlled by controlling the alignment of the liquid crystal layer 113 with a voltage supplied between the pixel electrode 111 and the common electrode 112. That is, the intensity of light that is ejected through the polarizer 130 can be controlled. Furthermore, the coloring layer 131 absorbs light of wavelengths other than a specific wavelength range from the incident light. As a result, the ejected light is light that exhibits red, blue, or green colors, for example.

The driver circuit portion 64 includes the transistor 201.

The transistor 201 includes the gate 221, the gate insulating layer 213, the semiconductor layer (the channel region 231a and the low-resistance region 231b), a conductive layer 222a, and a conductive layer 222b. One of the conductive layers 222a and 222b functions as a source, and the other functions as a drain. Each of the conductive layers 222a and 222b are electrically connected to the low-resistance region 231b.

In the connection portion 204, the wiring 65 and a conductive layer 255 are connected to each other, the conductive layer 255 and a conductive layer 253 are connected to each other, and the conductive layer 253 and a conductive layer 251 are connected to each other. The conductive layer 251 and a connector 242 are connected to each other. That is, the connection portion 204 is electrically connected to the FPC 72 through the connector 242. By employing this configuration, signals and power can be supplied from the FPC 72 to the wiring 65.

The wiring 65 can be formed with the same material and the same fabrication step as those used in the conductive layer 222 that is included in the transistor 206. The conductive layer 255 can be formed with the same material and the same fabrication step as those used in the low-resistance region 231b that is included in the semiconductor layer. The conductive layer 253 can be formed with the same material and the same fabrication step as those used in the pixel electrode 111 that is included in the liquid crystal element 40. The conductive layer 251 can be formed with the same material and the same fabrication step as those used in the common electrode 112 that is included in the liquid crystal element 40. Fabricating the conductive layers constituting the connection portion 204 in such a manner, i.e., using the same materials and the same fabrication processes as those used in the conductive layers composing the display area 62 and the driver circuit portion 64, is preferable because this can reduce the number of process steps.

A touch panel 355 illustrated in FIG. 37 includes the following components in addition to the components of the display device 110 in FIG. 36A. The descriptions of the same components as those of the display device 110 are omitted.

The touch panel 355 includes the overcoat 121 and a touch sensor between the coloring layer 131 and the adhesive layer 142.

The overcoat 121 is preferably provided over the coloring layer 131 and the light-blocking layer 132. The overcoat 121 can prevent the diffusion of an impurity contained in the coloring layer 131 and the light-blocking layer 132 and the like into the touch sensor.

The electrodes 127 and 128 and a wiring 136 are provided over the overcoat 121. The insulating layer 125 is provided over the electrodes 127 and 128 and the wiring 136. The electrode 124 and the conductive layer 126 are provided over the insulating layer 125. The electrode 124 is electrically connected to two of the electrodes 128 that are provided on both sides of the electrode 127, through an opening provided in the insulating layer 125. The conductive layer 126 is electrically connected to the wiring 136 through the opening provided in the insulating layer 125. The substrate 51 is bonded to the electrode 124 and the conductive layer 126 with the adhesive layer 142 interposed therebetween.

In one embodiment of the present invention, the electrode of the liquid crystal element, the transistor, the coloring layer, the touch sensor, and the like can be formed over the same substrate. Accordingly, the number of components on the substrate 61 side can be reduced.

Furthermore, the coloring layer is provided between the transistor and the touch sensor, whereby the distance between the transistor and the touch sensor can be made long. Thus, noise in driving the transistor can be prevented from being transmitted to the touch sensor. In this manner, the touch sensor can be operated stably. Note that a layer serving as a shield for blocking noise may be provided between the transistor and the touch sensor. For example, a conductive layer through which a constant potential is supplied may be provided.

Among the conductive layers included in the input device, the conductive layers (e.g., the electrodes 127 and 128) that overlap with the opening 69 are formed using a visible-light-transmitting material.

Note that the conductive layers included in the input device may be provided only in the light-blocking region 67. When the conductive layers included in the input device do not overlap with the opening 69, the visible-light-transmitting property of a material for the conductive layers included in the input device is not limited. A material having low resistivity, such as a metal, can be used for the conductive layers included in the input device. For example, a metal mesh is preferably used for the wiring and the electrode of the touch sensor. Thus, the resistance of the wiring and the electrode of the touch sensor can be reduced, which is preferable for a touch sensor of a large-sized display device. Note that although a metal is generally a material having a high reflectivity, a metal can be darkened by being subjected to oxidation treatment or the like. Thus, even when the touch panel is seen from the display surface side, a decrease in the visibility due to the reflection of external light can be suppressed.

The wiring and the electrode may be formed to have a stacked layer including a metal layer and a layer having low reflectivity (also referred to as a dark-colored layer). Alternatively, the dark-colored layer may be formed with a metal particle such as an Ag particle, an Ag fiber, or a Cu particle, a carbon nanoparticle such as a carbon nanotube (CNT) or graphene, or a conductive high molecule such as PEDOT, polyaniline, or polypyrrole, for example.

The conductive layer 126 is electrically connected to the FPC 72 through the wiring 65, the conductive layer 255, the conductive layer 253, the conductive layer 251, and the connector 242. Thus, even when an FPC is provided only on one substrate side, both the signal for driving the liquid crystal element 40 and the signal for driving the touch sensor can be supplied. Alternatively, an FPC that supplies the signal for driving the liquid crystal element 40 and an FPC that supplies the signal for driving the touch sensor can be connected on the same surface. An FPC and the like do not need to be connected to each of the pair of substrates, and thus the structure of the display device can be simplified. The display device is incorporated into an electronic device easily as compared with a display device in which FPCs are connected to both of the substrates 51 and 61 sides, and the number of components can be reduced. Note that one or more FPCs can be connected to the display device.

Light from the backlight passes through the substrate 61 and the liquid crystal element 40 and then enters a contact area of the transistor and the pixel electrode 111. Since the contact area of the transistor and the pixel electrode 111 transmits visible light in one embodiment of the present invention, the contact area can be provided in the opening 69. The light which has passed through the contact area is emitted to the outside of the touch panel 355 through the coloring layer 131, the touch sensor, the substrate 51, and the like.

Embodiment 1 can be referred to for the details of a material and the like that can be used for each component included in the display device and the touch panel in this embodiment.

<3. Structure Example 3 of Display Device>

Figure 38:
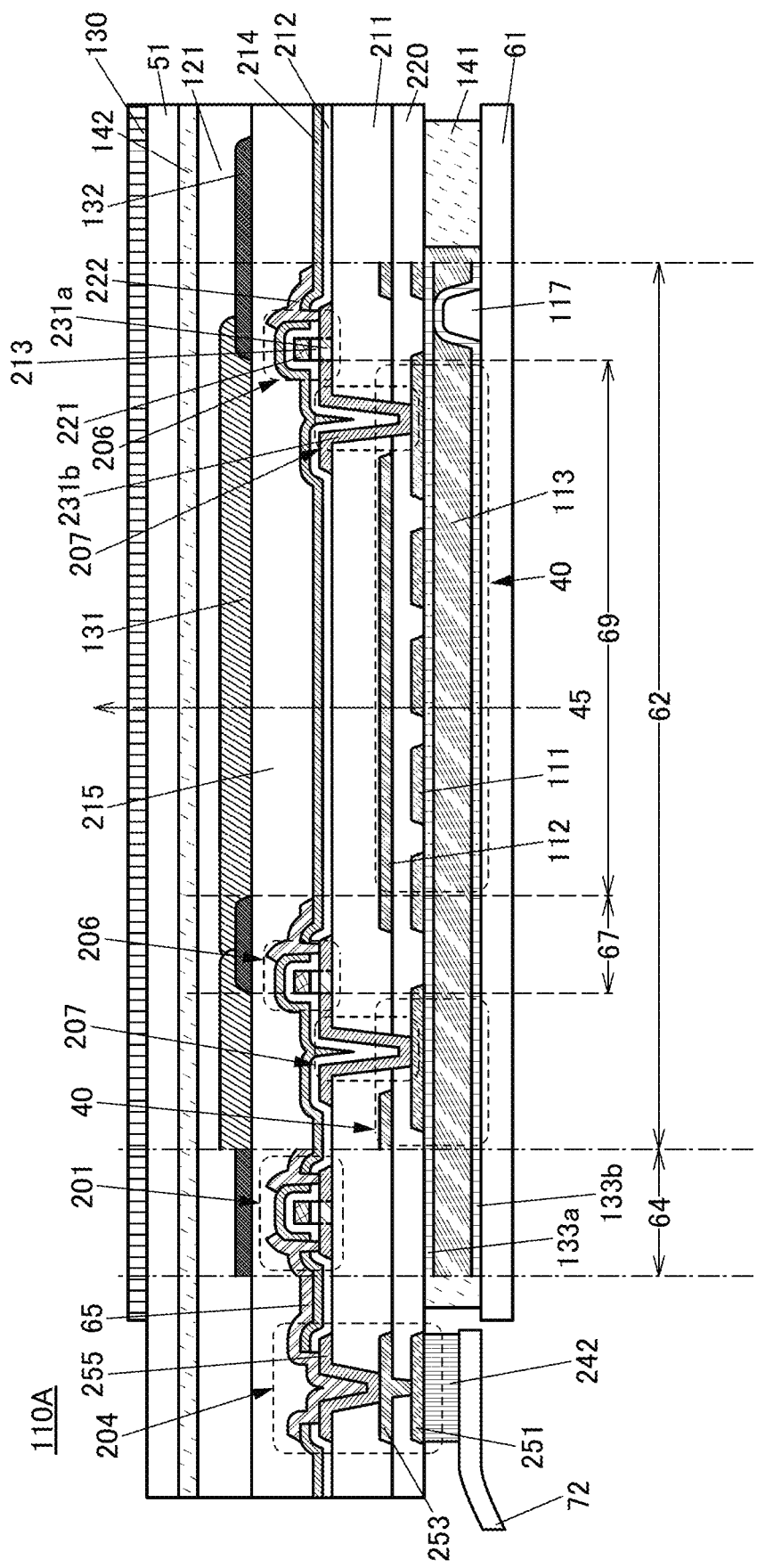
FIG. 38 is a cross-sectional view illustrating an example of a display device.
Figure 40:
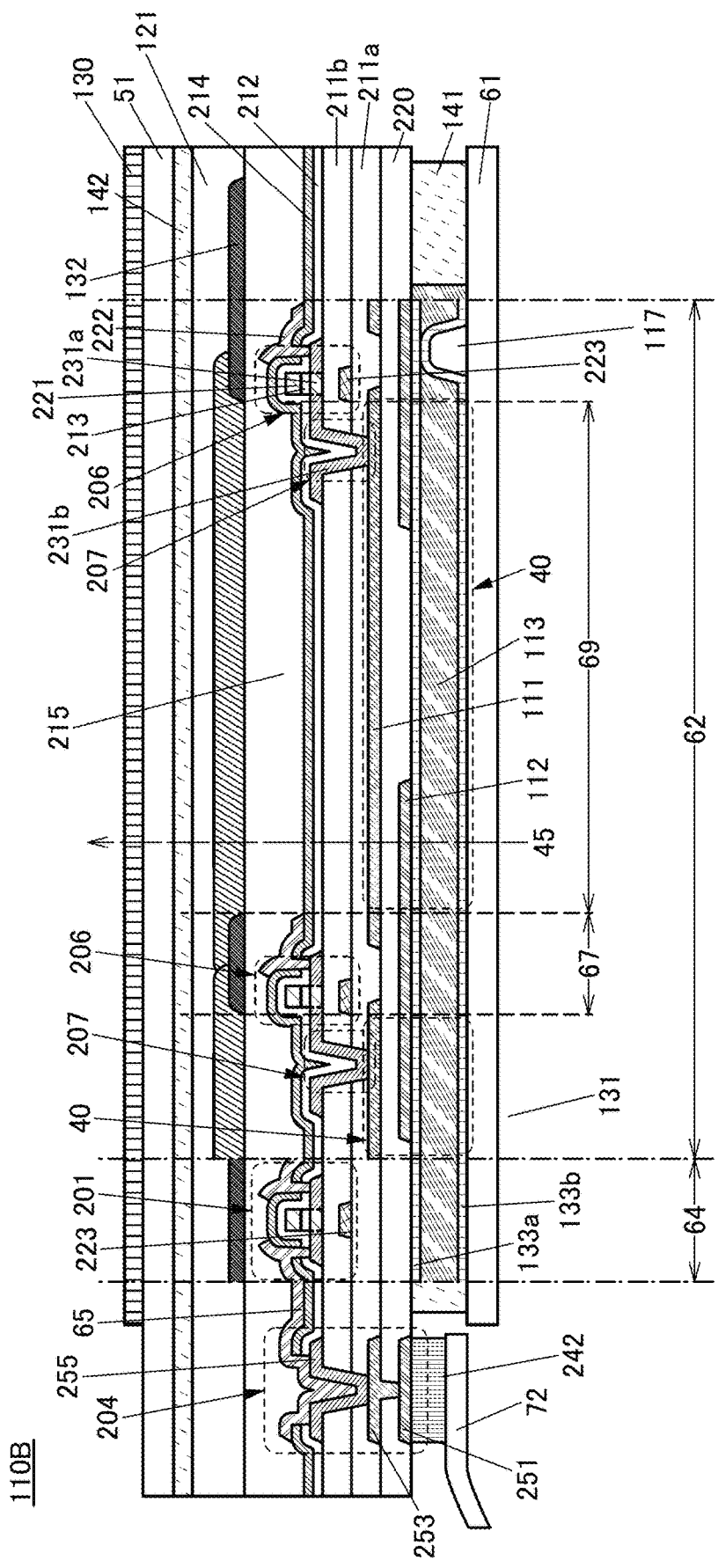
FIG. 40 is a cross-sectional view illustrating an example of a display device.
Figure 41:
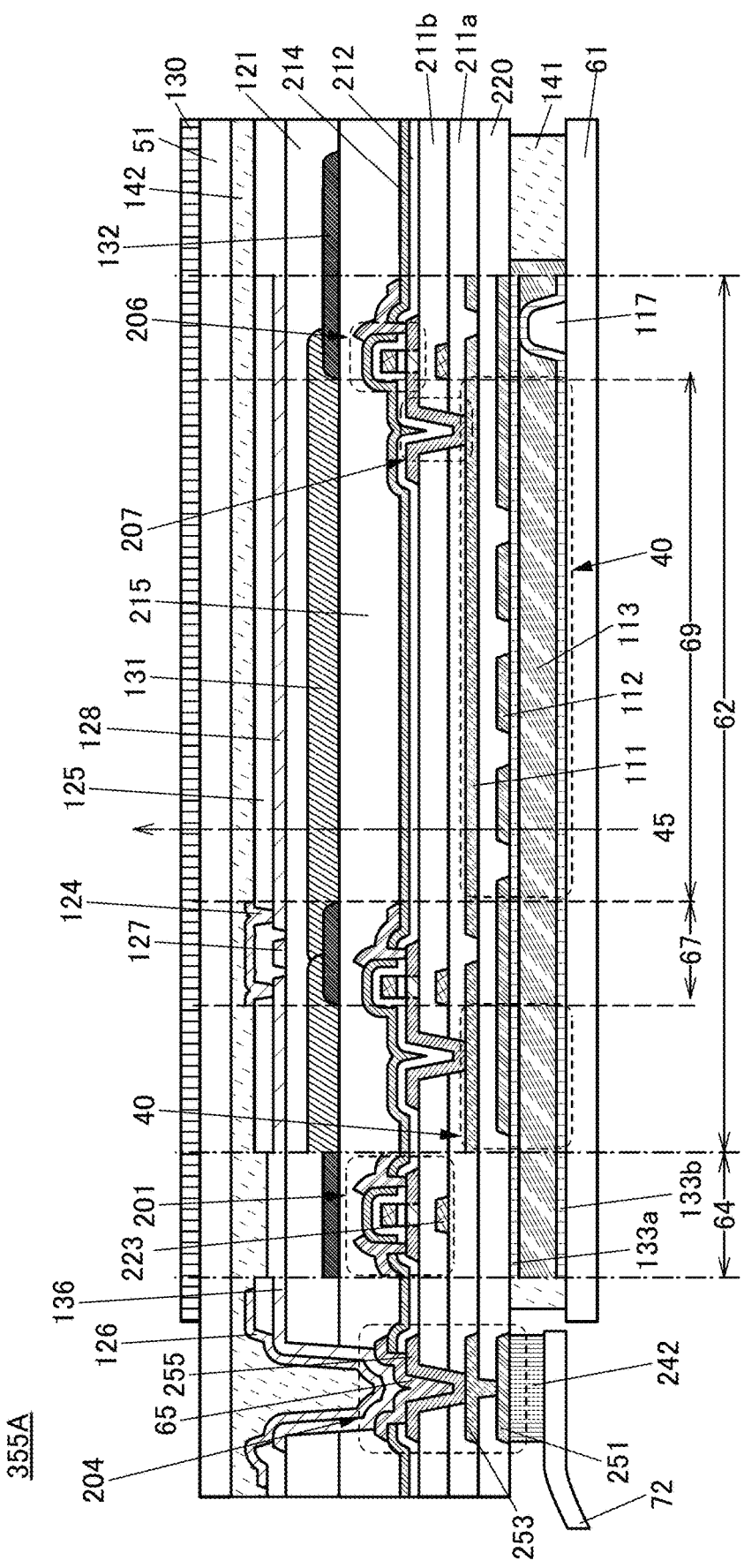
FIG. 41 is a cross-sectional view illustrating an example of a display device.

FIG. 38, FIGS. 39A and 39B, FIG. 40, and FIG. 41 each illustrate an example of the display device. FIG. 38 is a cross-sectional view of a display device 110A, FIGS. 39A and 39B are top views of the subpixel included in the display device of one embodiment of the present invention, FIG. 40 is a cross-sectional view of a display device 110B, and FIG. 41 is a cross-sectional view of a touch panel 355A. Note that each of perspective views of the display device 110A, the display device 110B, and the touch panel 355A is similar to that of the display device 100A illustrated in FIG. 4; therefore, the description thereof is omitted here.

The display device 110A illustrated in FIG. 38 is different from the display device 110 described above in the positional relationship between the pixel electrode 111 and the common electrode 112.

In the display device 110 illustrated in FIG. 36A, the alignment film 133a is in contact with the common electrode 112. In contrast, in the display device 110A illustrated in FIG. 38, the alignment film 133a is in contact with the pixel electrode 111.

As illustrated in FIG. 38, in the display device 110A, the low-resistance region 231b of the semiconductor layer is in contact with the side surfaces of the openings in the insulating layers 211 and 220, and connects with the pixel electrode 111. This enables the pixel electrode 111 to be placed flat.

In the display device 110A, the common electrode 112 is embedded into the insulating layer 211. The surface of the common electrode 112 on the liquid crystal layer 113 side can form the same surface with the surface of the insulating layer 211 on the liquid crystal layer 113 side.

The pixel electrode 111 is embedded into the insulating layer 220. The surface of the pixel electrode 111 on the liquid crystal layer 113 side can form the same surface with the surface of the insulating layer 220 on the liquid crystal layer 113 side. Furthermore, the alignment film 133a is provided flat.

As shown in FIG. 38, when the surface of the pixel electrode 111 on the liquid crystal layer 113 side and the surface of the insulating layer 220 on the liquid crystal layer 113 side form the same surface, the spacing between the alignment films 133a and 133b can be made uniform within the opening 69 of the pixel. That is, the thickness of the pixel electrode 111 does not affect the thickness of the liquid crystal layer 113. The thickness of the liquid crystal layer 113 becomes constant within the opening 69 of the pixel. From the above, the display device 110A can display high-quality images with high color reproducibility.

Furthermore, by providing the alignment film 133a flatly, the initial alignment can be made uniform more easily, even near the edge of the pixel electrode 111. Providing the alignment film 133a flatly can reduce the generation of the region prone to the initial alignment variation of the liquid crystal layer 113 between two adjacent subpixels. Thus, the aperture ratio can be increased, and the display device can easily achieve a high definition.

Top views of subpixels included in the display device of one embodiment of the present invention are shown in FIGS. 39A and 39B. FIG. 39A is a top view in which a stacked structure (e.g., refer to FIG. 40) from the common electrode 112 to the conductive layer 222 of subpixels is shown from the common electrode 112 side. FIG. 39A illustrates the opening 69 of the subpixel in a frame outlined by a dashed-dotted line. FIG. 39B is a top view in which the common electrode 112 is omitted from the stacked structure illustrated in FIG. 39A.

A cross-sectional view of the display device 110B is shown in FIG. 40. The display device 110B shown in FIG. 40 includes an insulating layer 211b and a gate 223, in addition to the structure of the display device 110 described earlier.

In a display device of one embodiment of the present invention, a transistor with gate electrodes provided above and below a channel may be used.

In the contact area Q1 illustrated in FIGS. 39A and 39B, the gates 221 and 223 are electrically connected.

In the contact area Q2 illustrated in FIGS. 39A and 39B, the low-resistance region 231b of the semiconductor layer is connected to the pixel electrode 111. The use of a material that transmits visible light in the semiconductor layer allows the contact area Q2 to be provided in the opening 69 of the subpixel. This can increase the aperture ratio of the subpixel. Moreover, the power consumption of the display device can be reduced.

In FIGS. 39A and 39B, one conductive layer functions as the scan line 228 and the gate 223, and another part of the conductive layer functions as the gate 223. In other words, in FIGS. 39A and 39B, one conductive layer functions as the scan line 229 and the conductive layer 222.

The gates 221 and 223 can each include a single layer of one of a metal material and an oxide conductor (OC), or a stacked layers of both a metal material and an oxide conductor. For example, one of the gates 221 and 223 may include an oxide conductor, and the other of the gates 221 and 223 may include a metal material.

The transistor 206 can be formed to include the oxide semiconductor layer as a semiconductor layer, and include the oxide conductive layer as at least one of the gates 221 and 223. In this case, the oxide semiconductor layer and the oxide conductive layer are preferably formed using an oxide semiconductor.

When a visible-light-blocking conductive layer is used for the gate 223, the channel region 231a can be prevented from being irradiated with light from the backlight. When the channel region 231a overlaps with the visible-light-blocking conductive layer as described above, variation in the characteristics of the transistor due to light can be suppressed. Thus, the transistor can have higher reliability.

The light-blocking layer 132 is provided on the substrate 51 side of the channel region 231a, and the visible-light-blocking gate 223 is provided on the substrate 61 side of the channel region 231a, whereby the channel region 231a can be prevented from being irradiated with external light and light from the backlight.

FIG. 39A and FIG. 40 illustrate an example where one opening is provided in the common electrode 112 as the opening 69 of one subpixel.

<4. Example of Method for Manufacturing Display Device>

An example of a method for manufacturing the touch panel 355A illustrated in FIG. 41 is described with reference to FIGS. 42A to 42C to FIG. 47. Note that in the example of this manufacturing method, a structure of a transistor or a liquid crystal element to be formed is changed, whereby the other display devices and the other touch panels in this embodiment can also be manufactured.

A functional element can be formed over a fabrication substrate, separated from the fabrication substrate, and then transferred to another substrate. With this method, for example, a functional element that is formed over a fabrication substrate having high heat resistance can be transferred to a substrate having low heat resistance. Therefore, the manufacturing temperature of the functional element is not limited by the substrate having low heat resistance. Moreover, the functional element can be transferred to a substrate or the like which is more lightweight, flexible and thinner than the fabrication substrate, whereby a variety of devices such as a semiconductor device, a display device, and the like can be made lightweight, flexible, and thin.

Specifically, the functional element formed over the first substrate can be transferred to the second substrate by forming a separation layer over the first substrate, forming the functional element over the separation layer, bonding the first and second substrates using an adhesive layer, and separating the first and second substrates using the separation layer.

Examples of materials that can be used for the separation layer include an inorganic material and an organic material.

Examples of the inorganic material include a metal, an alloy, a compound, and the like that contain any of the following elements: tungsten, molybdenum, titanium, tantalum, niobium, nickel, cobalt, zirconium, zinc, ruthenium, rhodium, palladium, osmium, iridium, and silicon.

Examples of the organic material include polyimide, polyester, polyolefin, polyamide, polycarbonate, an acrylic resin, and the like.

The separation layer may have a single-layer structure, a stacked-layer structure, or the like. For example, a stacked-layer structure including a layer containing tungsten and a layer containing an oxide of tungsten can be employed. Alternatively, a stacked-layer structure including a metal oxide layer and a resin layer can be employed.

A separation interface varies depending on a material of the separation layer. Specifically, separation occurs at an interface between the first substrate and the separation layer, occurs in the separation layer, or occurs at an interface between the separation layer and a layer to be separated, which is provided in contact with the separation layer.

In this embodiment, an example in which the separation layer has a stacked-layer structure including a metal oxide layer and a resin layer and separation is performed at an interface between the metal oxide layer and the resin layer (also referred to as "in the separation layer") is described.

Figure 42A:
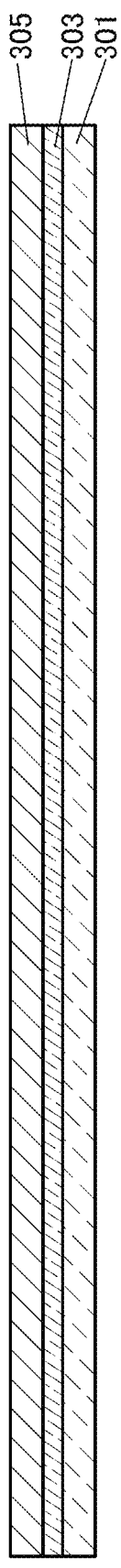
FIGS. 42A to 42C are cross-sectional views illustrating an example of a method for manufacturing a display device.

First, as illustrated in FIG. 42A, a metal oxide layer 303 is formed over a fabrication substrate 301, and a resin layer 305 is formed over the metal oxide layer 303.

The fabrication substrate 301 has stiffness high enough for easy transfer and has resistance to heat applied in the manufacturing process. Examples of a material that can be used for the fabrication substrate 301 include glass, quartz, ceramics, sapphire, a resin, a semiconductor, a metal, and an alloy. Examples of the glass include alkali-free glass, barium borosilicate glass, and aluminoborosilicate glass.

The thickness of the fabrication substrate 301 is, for example, greater than or equal to 0.5 mm and less than or equal to 1 mm, specifically, 0.5 mm or 0.7 mm.

The metal oxide layer 303 can be formed using an oxide of any of a variety of metals. As examples of the metal oxide, titanium oxide ($TiO_x$), molybdenum oxide, aluminum oxide, tungsten oxide, indium tin oxide containing silicon (ITSO), indium zinc oxide, an In—Ga—Zn oxide, and the like can be given.

As other examples of the metal oxide, indium oxide, indium oxide containing titanium, indium oxide containing tungsten, indium tin oxide (ITO), ITO containing titanium, indium zinc oxide containing tungsten, zinc oxide (ZnO), ZnO containing gallium, hafnium oxide, yttrium oxide, zirconium oxide, gallium oxide, tantalum oxide, magnesium oxide, lanthanum oxide, cerium oxide, neodymium oxide, tin oxide, bismuth oxide, titanate, tantalate, niobate, and the like can be given.

There is no particular limitation on a method for forming the metal oxide layer 303. For example, the metal oxide layer 303 can be formed by a sputtering method, a plasma-enhanced CVD method, an evaporation method, a sol-gel method, an electrophoretic method, a spray method, or the like.

The metal oxide layer 303 can be formed in such a manner that a metal layer is formed and then oxygen is introduced into the metal layer. At this time, only a surface of the metal layer or the entire metal layer is oxidized. In the former case, the introduction of oxygen into the metal layer forms a structure in which the metal layer and the metal oxide layer 303 are stacked. The separation layer may have a stacked-layer structure including the metal layer, the metal oxide layer 303, and the resin layer 305.

The oxidation of the metal layer can be performed, for example, by heating the metal layer in an oxygen-containing atmosphere. It is preferable that the metal layer be heated while an oxygen-containing gas is supplied. The temperature at which the metal layer is heated is preferably higher than or equal to 100° C. and lower than or equal to 500° C., further preferably higher than or equal to 100° C. and lower than or equal to 450° C., still further preferably higher than or equal to 100° C. and lower than or equal to 400° C., yet still further preferably higher than or equal to 100° C. and lower than or equal to 350° C.

The temperature at which the metal layer is heated is preferably set to lower than or equal to the maximum temperature in manufacturing the transistor. In that case, the maximum temperature in manufacturing the display device can be prevented from increasing. When the temperature at which the metal layer is heated is set to lower than or equal to the maximum temperature in manufacturing the transistor, a manufacturing apparatus for the manufacturing process of the transistor, for example, can also be utilized for the manufacturing method of the display device of this embodiment, which reduces additional capital investment and the like. As a result, the display device can be manufactured at reduced costs. When the manufacturing temperature of the transistor is lower than or equal to 350° C., for example, the temperature of the heat treatment is preferably lower than or equal to 350° C.

Alternatively, the metal layer can be oxidized by performing radical treatment on the surface of the metal layer. In the radical treatment, the surface of the metal layer is preferably exposed to an atmosphere containing an oxygen radical and/or a hydroxyl radical. For example, plasma treatment is preferably performed in an atmosphere containing oxygen and/or water vapor ($H_2O$).

Hydrogen, oxygen, a hydrogen radical (H*), an oxygen radical (O*), a hydroxyl radical (OH*), or the like is made to be present on a surface of the metal oxide layer 303 or to be contained in the metal oxide layer 303, whereby the force required for the separation between the metal oxide layer 303 and the resin layer 305 can be reduced. Accordingly, again, it is preferable that the metal oxide layer 303 be formed by performing radical treatment or plasma treatment.

Performing such radical treatment or plasma treatment on the surface of the metal layer to oxidize the metal layer eliminates the need for a step of heating the metal layer at high temperatures. Accordingly, the maximum temperature in manufacturing the display device can be prevented from increasing.

Alternatively, the metal oxide layer 303 can be formed in an oxygen atmosphere. For example, a metal oxide film is formed by a sputtering method while an oxygen-containing gas is supplied, whereby the metal oxide layer 303 can be formed. Also in this case, the surface of the metal oxide layer 303 is preferably subjected to radical treatment. In the radical treatment, the surface of the metal oxide layer 303 is preferably exposed to an atmosphere containing at least one of an oxygen radical, a hydrogen radical, and a hydroxyl radical. For example, plasma treatment is preferably performed in an atmosphere containing one or more of oxygen, hydrogen, and water vapor ($H_2O$).

The radical treatment can be performed with a plasma generation apparatus or an ozone generation apparatus.

For example, oxygen plasma treatment, hydrogen plasma treatment, water plasma treatment, ozone treatment, or the like can be performed. Oxygen plasma treatment can be performed by generating plasma in an oxygen-containing atmosphere. Hydrogen plasma treatment can be performed by generating plasma in a hydrogen-containing atmosphere. Water plasma treatment can be performed by generating plasma in an atmosphere containing water vapor ($H_2O$). Water plasma treatment is particularly preferable because it makes a large amount of moisture present on the surface of the metal oxide layer 303 or in the metal oxide layer 303.

Plasma treatment may be performed in an atmosphere containing two or more of oxygen, hydrogen, water (water vapor), and an inert gas (typically, argon). Examples of the plasma treatment include plasma treatment in an atmosphere containing oxygen and hydrogen, plasma treatment in an atmosphere containing oxygen and water, plasma treatment in an atmosphere containing water and argon, plasma treatment in an atmosphere containing oxygen and argon, and plasma treatment in an atmosphere containing oxygen, water, and argon. The use of an argon gas for the plasma treatment is favorable because the metal layer or the metal oxide layer 303 is damaged during the plasma treatment.

Two or more kinds of plasma treatment may be performed sequentially without exposure to the air. For example, argon plasma treatment may be followed by water plasma treatment.

Alternatively, oxygen, hydrogen, water, or the like can be introduced by an ion implantation method, an ion doping method, a plasma immersion ion implantation method, or the like.

The metal oxide layer 303 preferably has a thickness of, for example, greater than or equal to 1 nm and less than or equal to 200 nm, further preferably greater than or equal to 5 nm and less than or equal to 100 nm, still further preferably greater than or equal to 5 nm and less than or equal to 50 nm. In the case where the metal oxide layer 303 is formed using the metal layer, the completed metal oxide layer 303 is sometimes thicker than the initially formed metal layer.

Titanium oxide, tungsten oxide, or the like is suitable for the metal oxide layer 303. Titanium oxide is preferably used because the costs can be lower than that when tungsten oxide is used.

The resin layer 305 can be formed using any of a variety of resin materials (including resin precursors).

The resin layer 305 is preferably formed using a thermosetting material.

The resin layer 305 may be formed using a material with photosensitivity or a material without photosensitivity (also called a non-photosensitive material).

When a material with photosensitivity is used, the resin layer 305 having a desired shape can be formed by a photolithography method. Specifically, heat treatment (also referred to as pre-baking treatment) for removing a solvent is performed after deposition of a film to be the resin layer 305, and then light exposure is performed using a photomask. Next, development is performed, whereby an unnecessary portion can be removed.

The resin layer 305 with a desired shape can be formed in such a manner that a mask such as a resist mask or a hard mask is formed over the layer to be the resin layer 305 or the resin layer 305 and etching is performed. This method is particularly suitable for the case of using a non-photosensitive material.

For example, an inorganic film is formed over the resin layer 305, and a resist mask is formed over the inorganic film. After the inorganic film is etched with the use of the resist mask, the resin layer 305 can be etched using the inorganic film as a hard mask.

As examples of an inorganic film that can be used as the hard mask, a variety of inorganic insulating films, metal films and alloy films that can be used for a conductive layer, and the like can be given.

It is preferable to form the mask with an extremely small thickness and remove the mask concurrently with the etching, in which case a step of removing the mask can be eliminated.

The resin layer 305 is preferably formed using a material containing a polyimide resin or a polyimide resin precursor. The resin layer 305 can be formed using a material including a polyimide resin and a solvent, a material including polyamic acid and a solvent, or the like. A polyimide is a material suitable for a planarization film or the like of a display device; therefore, the film formation apparatus and the material can be shared. Thus, there is no need to prepare another apparatus and another material to obtain the structure of one embodiment of the present invention.

Examples of resin materials which can be used to form the resin layer 305 include an acrylic resin, an epoxy resin, a polyamide resin, a polyamide-imide resin, a siloxane resin, a benzocyclobutene-based resin, a phenol resin, and precursors of these resins.

The resin layer 305 is preferably formed with a spin coater. By a spin coating method, a thin film can be uniformly formed over a large-sized substrate.

The resin layer 305 is preferably formed using a solution having a viscosity of greater than or equal to 5 cP and less than 500 cP, further preferably greater than or equal to 5 cP and less than 100 cP, and still further preferably greater than or equal to 10 cP and less than or equal to 50 cP. The lower the viscosity of the solution is, the easier the coating is. Furthermore, the lower the viscosity of the solution is, the more the entry of bubbles can be prevented, leading to a film with good quality.

Alternatively, the resin layer 305 can be formed by dipping, spray coating, ink-jet printing, dispensing, screen printing, or offset printing, or with a doctor knife, a slit coater, a roll coater, a curtain coater, or a knife coater, for example.

The heat treatment can be performed while a gas containing one or more of oxygen, nitrogen, and a rare gas (e.g., argon) is supplied into a chamber of a heating apparatus, for example. Alternatively, the heat treatment can be performed in an air atmosphere with the use of a chamber of a heating apparatus, a hot plate, or the like.

When heating is performed in an air atmosphere or performed while a gas containing oxygen is supplied, the resin layer 305 is sometimes colored by oxidation to have decreased visible-light transmitting property.

For that reason, heating is preferably performed while a nitrogen gas is supplied. Thus, the visible-light transmitting property of the resin layer 305 can be increased.

By the heat treatment, released gas components (e.g., hydrogen or water) in the resin layer 305 can be reduced. In particular, the heat treatment is preferably performed at a temperature higher than or equal to the fabricating temperature of each layer formed over the resin layer 305. Thus, a gas released from the resin layer 305 in the manufacturing process of the transistor can be significantly reduced.

For example, in the case where the manufacturing temperature of the transistor is lower than or equal to 350° C., a film to be the resin layer 305 is preferably heated at a temperature higher than or equal to 350° C. and lower than or equal to 450° C., further preferably lower than or equal to 400° C., still further preferably lower than or equal to 375° C. Thus, a gas released from the resin layer 305 in the manufacturing process of the transistor can be significantly reduced.

The temperature of the heat treatment is preferably set to lower than or equal to the maximum temperature in manufacturing the transistor. When the temperature of the heat treatment is set to lower than or equal to the maximum temperature in manufacturing the transistor, a manufacturing apparatus for the manufacturing process of the transistor, for example, can also be utilized for the manufacturing method of the display device of this embodiment, which reduces additional capital investment and the like. As a result, the display device can be manufactured at reduced costs. When the manufacturing temperature of the transistor is lower than or equal to 350° C., for example, the temperature of the heat treatment is preferably lower than or equal to 350° C.

The maximum temperature in manufacturing the transistor is preferably equal to the temperature of the heat treatment, in which case it is possible to prevent the heat treatment from increasing the maximum temperature in manufacturing the display device and it is also possible to reduce the released gas components in the resin layer 305.

Even when the heating temperature is relatively low, increasing treatment time enables separability as high as the separability that is obtained at higher heating temperatures in some cases. It is thus preferable that the treatment time be set long when the heating temperature cannot be set high owing to the structure of the heating apparatus.

The duration of the heat treatment is preferably longer than or equal to five minutes and shorter than or equal to 24 hours, further preferably longer than or equal to 30 minutes and shorter than or equal to 12 hours, still further preferably longer than or equal to one hour and shorter than or equal to six hours, for example. Note that the duration of the heat treatment is not particularly limited to these examples. For example, the duration of the heat treatment that is performed by a rapid thermal annealing (RTA) method may be shorter than five minutes.

As the heating apparatus, it is possible to use, for example, an electric furnace or any apparatus for heating an object by heat conduction or heat radiation from a heating element such as a resistance heating element. For example, an RTA apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. With such an RTA apparatus, the treatment time can be shortened and thus the RTA apparatus is preferred for mass production. Alternatively, an in-line heating apparatus may be used in the heat treatment.

Before the heat treatment, heat treatment (also referred to as prebaking treatment) for removing the solvent contained in the film to be the resin layer 305 may be performed. The temperature of the prebaking treatment can be set as appropriate according to the material that is used. For example, the temperature of the prebaking treatment can be higher than or equal to 50° C. and lower than or equal to 180° C., higher than or equal to 80° C. and lower than or equal to 150° C., or higher than or equal to 90° C. and lower than or equal to 120° C. The heat treatment may also serve as the pre-baking treatment; that is, the solvent contained in the film to be the resin layer 305 may be removed by the heat treatment.

The resin layer 305 has flexibility. The fabrication substrate 301 has lower flexibility than the resin layer 305.

The resin layer 305 preferably has a thickness of greater than or equal to 0.01 μm and less than 10 μm, further preferably greater than or equal to 0.1 μm and less than or equal to 5 μm, still further preferably greater than or equal to 0.5 μm and less than or equal to 3 μm. By forming the resin layer thin, the display device can be manufactured at low costs. The display device can be lightweight and thin. The display device can have higher flexibility. The use of a solution having low viscosity facilitates the formation of the resin layer 305 having a small thickness. One embodiment of the present invention is not limited to the above examples, and the thickness of the resin layer 305 may be greater than or equal to 10 μm. For example, the resin layer 305 may have a thickness of greater than or equal to 10 μm and less than or equal to 200 μm. The resin layer 305 preferably has a thickness of greater than or equal to 10 μm because the rigidity of the display device can be increased.

The resin layer 305 preferably has a thermal expansion coefficient of greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. The lower the thermal expansion coefficient of the resin layer 305 is, the more the generation of a crack in a layer included in a transistor or the like and breakage of a transistor or the like which are caused owing to the heating can be prevented.

Next, the common electrode 112 and the conductive layer 251 are formed over the resin layer 305. Note that an insulating layer (nitride insulating layer, oxide insulating layer or the like) may be formed over the resin layer 305, before the common electrode 112 is formed.

In one embodiment of the present invention, the common electrode 112 is formed before the transistor is formed; thus, the common electrode 112 can be formed on a flat surface.

Figure 42B:
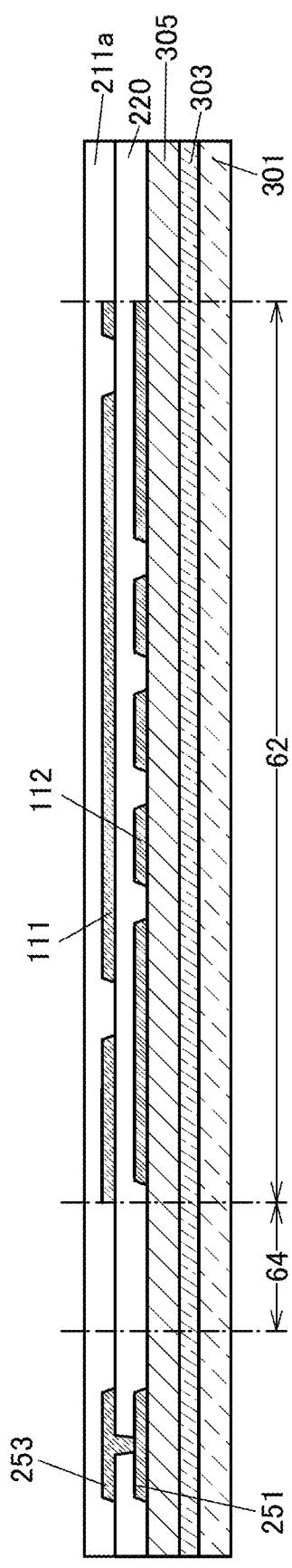

Next, the insulating layer 220 that covers the common electrode 112 and the conductive layer 251 is formed. Next, the pixel electrode 111 and the conductive layer 253 are formed over the insulating layer 220. Next, the insulating layer 211a that covers the pixel electrode 111 and the conductive layer 253 is formed (FIG. 42B).

Figure 42C:
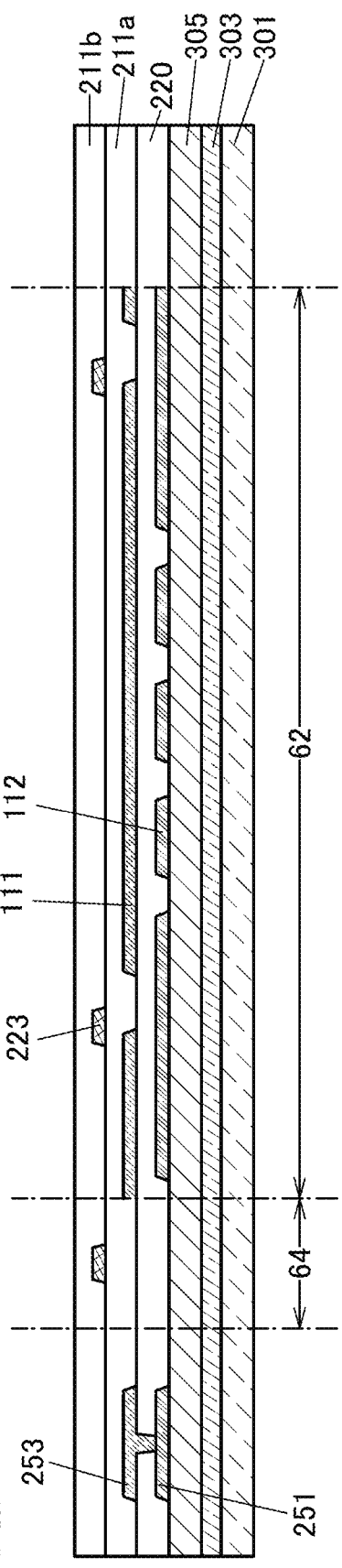

Next, the gate 223 is formed over the insulating layer 211a, and the insulating layer 211b that covers the gate 223 is formed (FIG. 42C).

Next, an opening that reaches the pixel electrode 111 and an opening that reaches the conductive layer 253 are formed by partly etching the insulating layers 211a and 211b (FIG. 43A). An example in which the insulating layers 211a and 211b are etched together is shown as an example, but one embodiment of the present invention is not limited to this example.

Next, an island-shaped semiconductor layer 231 is formed to cover the openings provided in the insulating layers (FIG. 43B).

Next, an insulating layer 213_0 that covers the semiconductor layer 231 is formed, and a conductive layer 221_0 is formed over the insulating layer 213_0 (FIG. 44A).

Next, the island-shaped gate insulating layer 213 and the island-shaped gate 221 are formed by processing the insulating layer 213_0 and the conductive layer 221_0. Then, the insulating layer 212 that covers the gate insulating layer 213 and the gate 221 is formed (FIG. 44B).

Forming the insulating layer 212 that contains nitrogen or hydrogen and then performing a heat treatment on the insulating layer 212 supplies nitrogen or hydrogen to portions of the semiconductor layer that do not overlap with the gate 221 and the gate insulating layer 213, thereby forming the low-resistance region 231b.

The low-resistance region 231b may be formed by adding impurities to the semiconductor layer 231 after forming the island-shaped insulating layer 213 and the island-shaped gate 221, and before forming the insulating layer 212. The low-resistance region 231b may be formed by adding impurities to the semiconductor layer 231 after forming the insulating layer 212. The impurities may be added to the semiconductor layer 231 after forming at least one of the insulating layers 214 and 215, which will be described later.

The supply of impurities to the portion of the semiconductor layer that overlaps with the gate 221 and the insulating layer 213 is reduced compared with the supply of impurities to the portion that do not overlap; thus, the decrease in resistivity is inhibited, and the portion that overlaps with the gate 221 and the insulating layer 213 can function as the channel region 231a.

Next, the insulating layer 214 is formed. An opening that reaches the low-resistance region 231b and an opening that reaches the conductive layer 255 are formed by partly etching the insulating layers 212 and 214. Note that the plurality of insulating layers may be processed in different process steps, or two layers or more can be processed in the same process step at a time. Next, the conductive layer 222 and the wiring 65 are formed by forming a conductive layer over the low-resistance region 231b so that the conductive layer covers the opening provided in the insulating layer, and then processing the conductive layer into a desired shape (FIG. 45A).

Next, as illustrated in FIG. 45B, the insulating layer 215 is formed, and the coloring layer 131 and the light-blocking layer 132 are formed over the insulating film 215.

The insulating layer 215 may have a planarizing function.

The coloring layer 131 is formed using a photosensitive material, in which case the processing into an island shape can be performed by a photolithography method or the like. The light-blocking layer 132 can be formed using metal, a resin, or the like.

Next, the overcoat 121 covering the coloring layer 131 and the light-blocking layer 132 is formed. An opening reaching the wiring 65 is provided in the overcoat 121 and the insulating layer 215.

Next, a sensing element is formed over the overcoat 121. Specifically, the electrode 127, the electrode 128, and the wiring 136 are formed over the overcoat 121. The wiring 136 is formed to cover the opening provided in the overcoat 121 and the insulating layer 215 and electrically connected to the wiring 65. Next, the insulating layer 125 covering the electrode 127, the electrode 128, and the wiring 136 is formed. An opening reaching the electrode 128 and an opening reaching the wiring 136 are provided in the insulating layer 125. Next, the electrode 124 and the conductive layer 126 are provided over the insulating layer 125. The electrode 124 is formed to cover the opening provided in the insulating layer 125 and electrically connected to the electrode 128. The conductive layer 126 is formed to cover the opening provided in the insulating layer 125 and electrically connected to the wiring 136.

After that, the fabrication substrate 301 and the substrate 51 are bonded to each other using the adhesive layer 142 (FIG. 45B).

Figure 46:
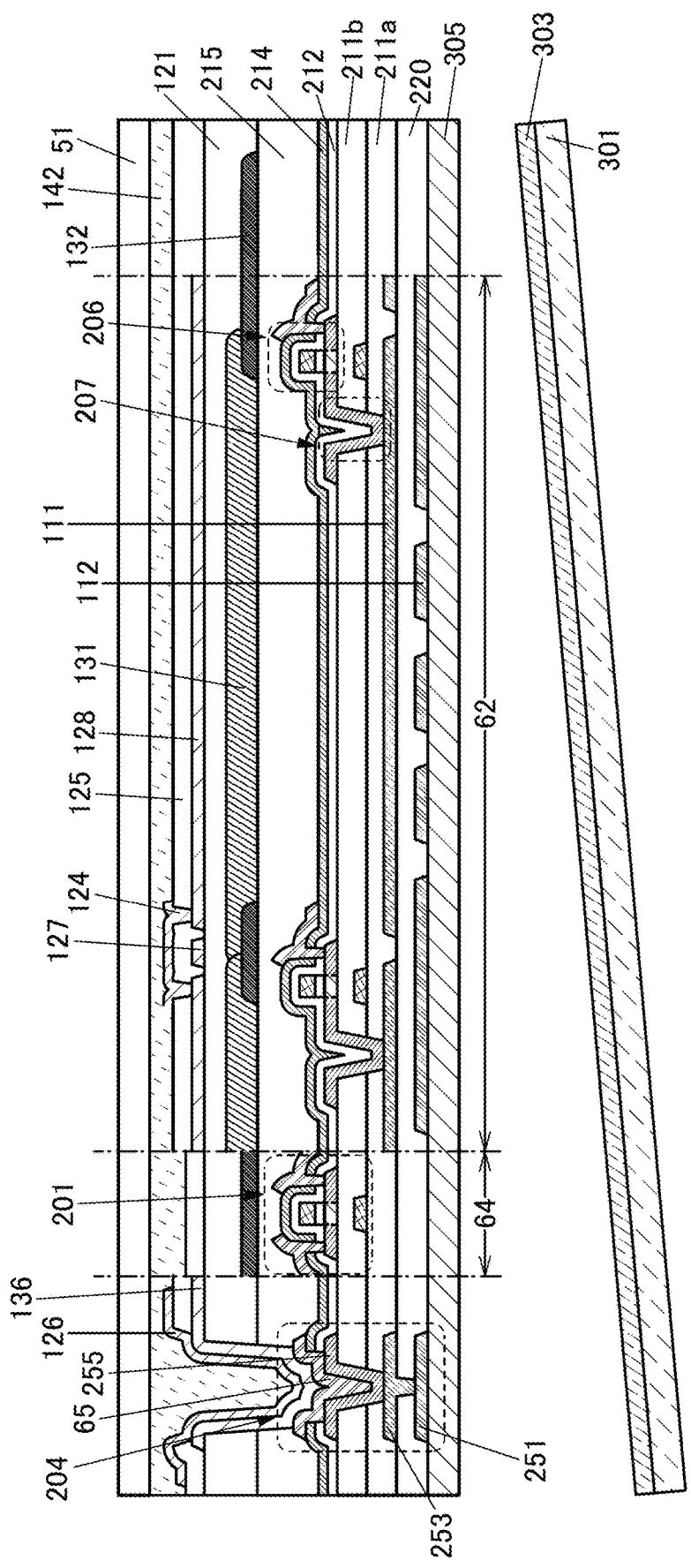
FIG. 46 is a cross-sectional view illustrating an example of a method for manufacturing a display device.

Next, as illustrated in FIG. 46, the metal oxide layer 303 and the resin layer 305 are separated.

In this embodiment, the metal oxide layer 303 and the resin layer 305 are separated by light irradiation. Note that the separation may be performed by heat treatment or the like.

In the step of the light irradiation, an interface between the metal oxide layer 303 and the resin layer 305 or the vicinity thereof is preferably irradiated with laser light through the fabrication substrate 301. The inside of the metal oxide layer 303 may be irradiated with the laser light or the inside of the resin layer 305 may be irradiated with the laser light.

The metal oxide layer 303 absorbs the laser light. The resin layer 305 may absorb the laser light.

The absorptance of the laser light 55 of the stack including the fabrication substrate 301 and the metal oxide layer 303 is preferably higher than or equal to 50% and lower than or equal to 100%, further preferably higher than or equal to 75% and lower than or equal to 100%, still further preferably higher than or equal to 80% and lower than or equal to 100%. Most of the laser light is absorbed by the stack, so that the separation can be surely performed at the interface between the metal oxide layer 303 and the resin layer 305. Furthermore, light-induced damage to the resin layer 305 can be reduced.

The irradiation with the laser light reduces adhesion or adhesiveness between the metal oxide layer 303 and the resin layer 305. The resin layer 305 is embrittled by the irradiation with the laser light in some cases.

As the laser light, light having a wavelength by which at least part of the laser light is transmitted through the fabrication substrate 301 and absorbed by the metal oxide layer 303 is selected. The laser light is preferably light in a wavelength range from visible light to ultraviolet light. For example, light in a wavelength of greater than or equal to 180 nm and less than or equal to 450 nm, preferably greater than or equal to 200 nm and less than or equal to 400 nm, further preferably greater than or equal to 250 nm and less than or equal to 350 nm, can be used.

The laser light preferably has energy that is higher than the energy gap of the metal oxide layer 303. For example, the energy gap of titanium oxide is approximately 3.2 eV. In the case where titanium oxide is used for the metal oxide layer 303, light having energy higher than 3.2 eV is preferably used.

In particular, an excimer laser with a wavelength of 308 nm is preferably used because the productivity is increased. The excimer laser is preferable because the excimer laser can be used also for laser crystallization of LTPS, so that the existing LTPS manufacturing line device can be used and new capital investment is not necessary. The energy of the light with a wavelength of 308 nm is approximately 4.0 eV. That is, in the case where titanium oxide is used for the metal oxide layer 303, an excimer laser with a wavelength of 308 nm is preferably used. Alternatively, a solid-state UV laser (also referred to as a semiconductor UV laser), such as a UV laser having a wavelength of 355 nm which is the third harmonic of an Nd:YAG laser, may be used. A solid-state laser is preferable because the solid-state laser does not use a gas and thus the running costs can be reduced compared with that of an excimer laser. A pulsed laser such as a picosecond laser may be used.

In the case where linear laser light is used as the laser light, scanning is performed with the laser light and a region to be separated is entirely irradiated with the laser light by relatively moving the fabrication substrate 301 and a light source.

Here, if the separation is performed in such a manner that a water-containing liquid such as water or an aqueous solution is added to the separation interface and the liquid penetrates into the separation interface, the ease of the separation can be enhanced. Furthermore, an adverse effect of static electricity caused at the separation on the functional element such as a transistor (e.g., damage to a semiconductor element from static electricity) can be suppressed.

The liquid to be fed can be water (preferably pure water), a neutral, alkaline, or acidic aqueous solution, an aqueous solution in which a salt is dissolved, or the like. Other examples of the liquid include ethanol and acetone. Any of a variety of organic solvents may also be used.

Before the separation of the fabrication substrate 301 and the resin layer 305, a starting point of separation is preferably formed using laser light, a sharp knife, or the like. A starting point for separation can be formed by cracking (or breaking) a part of the resin layer 305. For example, laser light irradiation enables part of the resin layer 305 to be melted, evaporated, or thermally broken.

Next, the resin layer 305 and the fabrication substrate 301 are separated from the formed starting point of separation by physical force (e.g., a separation process with a human hand or a jig, or a separation process by rotation of a roller adhered to the substrate). In a lower portion in FIG. 46, the metal oxide layer 303 and the fabrication substrate 301 which have been separated from the resin layer 305 are illustrated.

Figure 47:
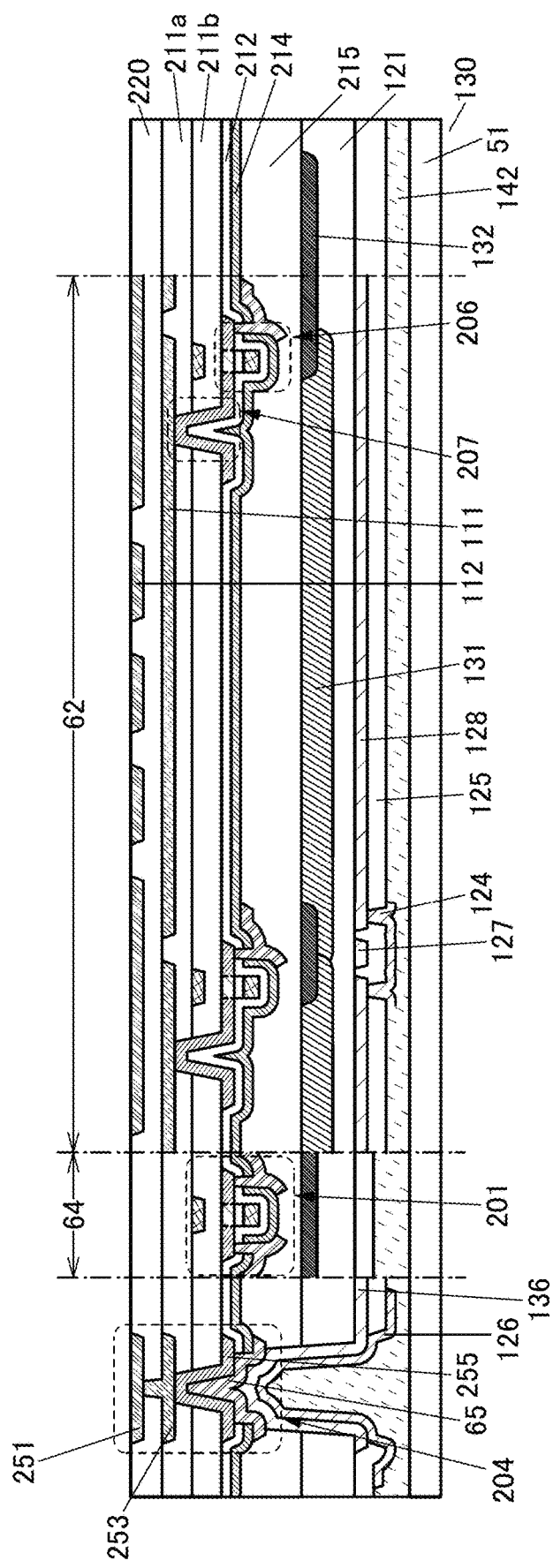
FIG. 47 is a cross-sectional view illustrating an example of a method for manufacturing a display device.
Figure 48:
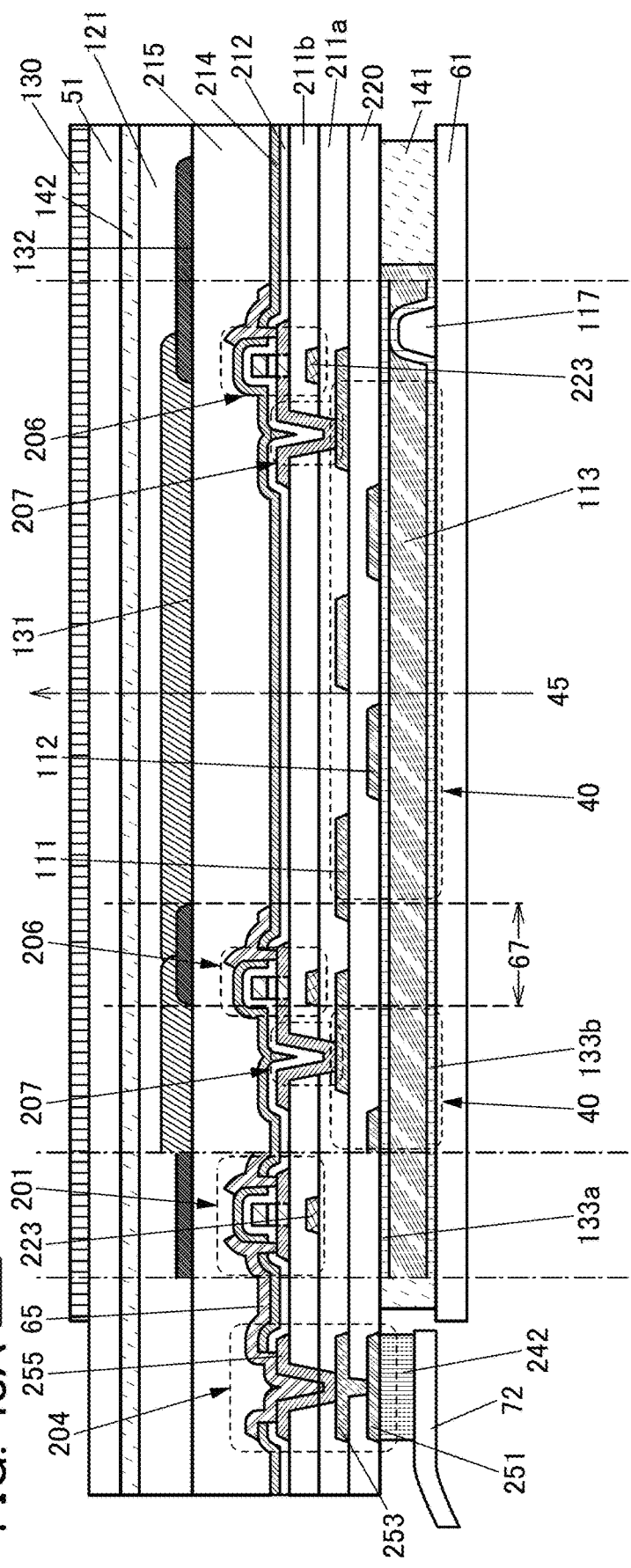
FIGS. 48A to 48E are cross-sectional views illustrating examples of a display device.

Next, all or part of the resin layer 305 may be removed. The resin layer 305 can be removed with a wet etching apparatus, a dry etching apparatus, an ashing apparatus, or the like. In particular, the resin layer 305 is preferably removed by ashing using oxygen plasma. The thickness of the resin layer 305 is preferably small because time taken for the step of removing the resin layer 305 can be shortened. Removal of the resin layer 305 allows the exposure of the common electrode 112 and the conductive layer 251 (FIG. 47). In addition, the resin layer 305 may be partly removed so that the conductive layer 251 is exposed. Note that the resin layer 305 may be used as the alignment film 133a.

Next, the alignment film 133a is formed over the common electrode 112.

Subsequently, a liquid crystal layer 113 is encapsulated between the substrate 51 and the substrate 61 over which the alignment film 133b is formed, using the adhesive layer 141. In this manner, the touch panel 355A (FIG. 41) can be formed.

As described above, in one embodiment of the present invention, functional elements constituting the display device, such as a transistor and a liquid crystal element, are formed over the fabrication substrate. Thus, there is almost no limitation on the heat that is applied during the formation processes of the functional elements. Highly reliable functional elements that are fabricated in a high-temperature process can be transferred on a substrate constituting the display device, with high yield. This enables the fabrication of a highly reliable display device.

In one embodiment of the present invention, an electrode of the liquid crystal element can be formed on a flat surface because the electrode of the liquid crystal element is formed before a transistor is formed. Thus, variation of the cell gap and variation in the initial alignment of the liquid crystal can be reduced. This allows the increase of aperture ratio and the fabrication of a display device with high definition.

<5. Structure Example 4 of Display Device>

FIG. 48A illustrates an example of a display device. FIG. 48A is a cross-sectional view of a display device 110C. Note that the perspective view of the display device 110C is not drawn here, as it is similar to the perspective view of the display device 100A illustrated in FIG. 4.

The display device 110C illustrated in FIG. 48A is different from the display device 110B in terms of the shapes of the pixel electrode 111 and the common electrode 112.

Both of the pixel electrode 111 and the common electrode 112 may have a top-surface shape that has a comb-like shape or a top-surface shape that is provided with a slit.

The display area 62 of the display device 110C illustrated in FIG. 48A has a portion where neither the pixel electrode 111 and the common electrode 112 are provided, when seen from above.

Alternatively, the electrodes may have a shape in which an edge of a slit in one electrode overlaps an edge of a slit in the other electrode. The cross-sectional view of this case is shown in FIG. 48B.

Alternatively, the pixel electrode 111 and the common electrode 112 may have a portion overlapping with each other, when seen from above. The cross-sectional view of this case is shown in FIG. 48C.

Alternatively, one edge of one electrode may overlap with the other electrode, while the other edge of the one electrode does not overlap with the other electrode, when seen from above. The cross-sectional view of this case is shown in FIG. 48D.

Alternatively, as illustrated in FIG. 48E, the pixel electrode 111 and the common electrode 112 may be provided on the same plane.

<6. Structure Example 5 of Display Device>

Figure 49:
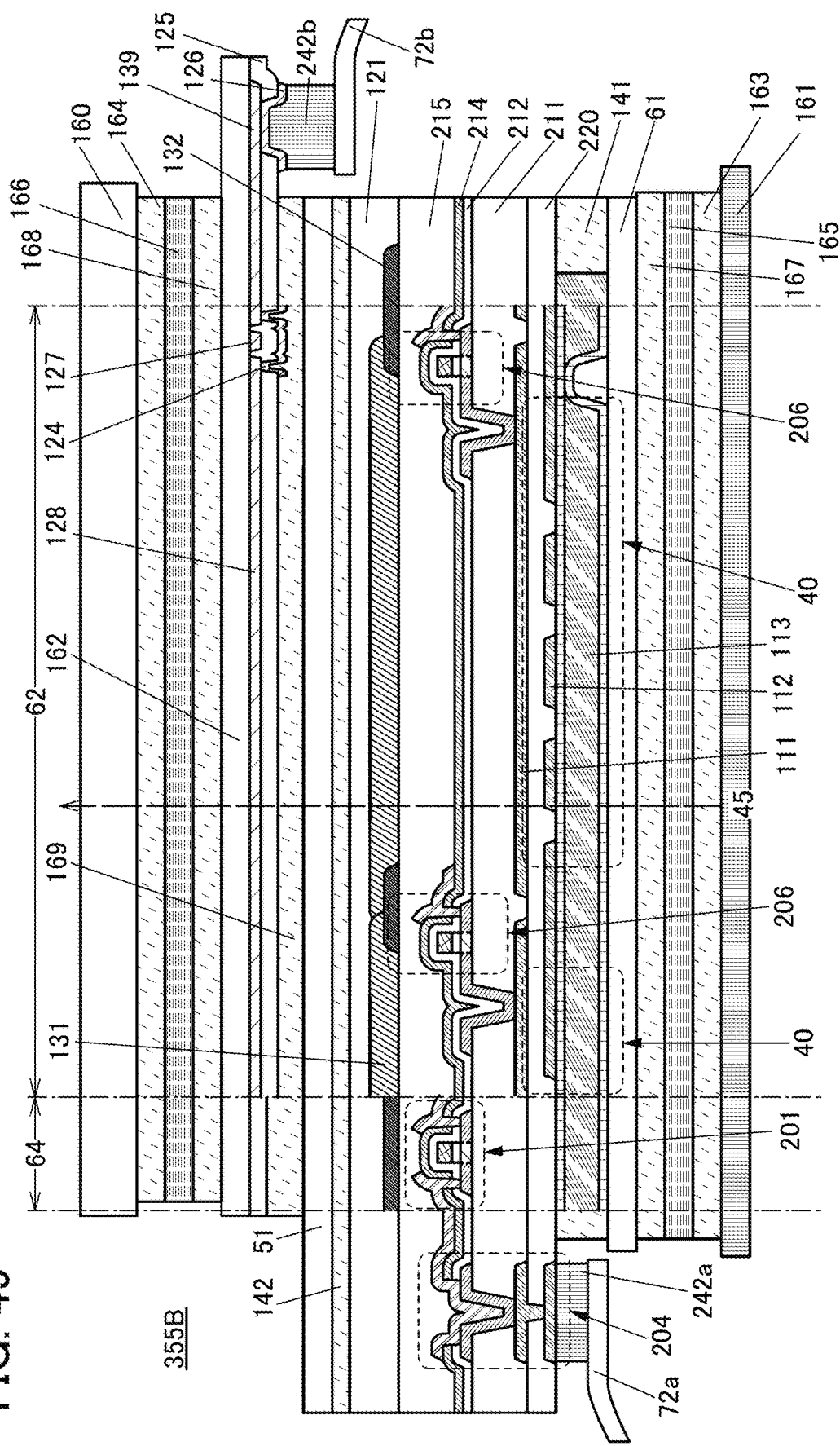
FIG. 49 is a cross-sectional view illustrating an example of a display device.

FIG. 49 is a cross-sectional view of a touch panel 355B. A perspective view of the touch panel 355B is similar to that of the touch panel 350A illustrated in each of FIGS. 20A to 20C; therefore, Embodiment 1 can be referred to.

The touch panel 355B has a structure in which a display device and a sensor element that are fabricated separately are bonded together.

The touch panel 355B includes an input device 375 and a display device 370 that are provided to overlap with each other.

FIG. 49 is a cross-sectional view of the display area 62, the driver circuit portion 64, a region that includes the FPC 72a, a region that includes the FPC 72b, and the like.

The substrates 51 and 61 are bonded to each other by the adhesive layer 141. The substrates 61 and 162 are bonded to each other by an adhesive layer 169. Here, the layers from the substrate 51 to the substrate 61 correspond to the display device 370. The layers from the substrate 162 to an electrode 124 correspond to the input device 375. That is, the adhesive layer 169 bonds the display device 370 and the input device 375 together.

The structure of the display device 370 illustrated in FIG. 49 is a structure similar to the display device 110A illustrated in FIG. 38; detailed description is omitted here.

A polarizer 165 is bonded to the substrate 51 with an adhesive layer 167. A backlight 161 is bonded to the polarizer 165 with an adhesive layer 163.

A polarizer 166 is bonded to the substrate 162 by an adhesive layer 168. A protection substrate 160 is bonded to the polarizer 166 by an adhesive layer 164.

The polarizer 166 may be provided between the input device 375 and the display device 370. In that case, the protection substrate 160, the adhesive layer 164, and the adhesive layer 168 that are illustrated in FIG. 49 are not necessarily provided. In other words, the substrate 162 can be positioned on the outermost surface of the touch panel 355B.

The electrodes 127 and 128 are provided over the substrate 162, on the substrate 61 side. The electrodes 127 and 128 are formed on the same plane. An insulating layer 125 is provided to cover the electrodes 127 and 128. The electrode 124 is electrically connected to two of the electrodes 128 that are provided on both sides of the electrode 127, through an opening provided in the insulating layer 125.

In the conductive layers included in the input device 375, the conductive layers (e.g., the electrodes 127 and 128) that overlap with an opening of a pixel are formed using a material that transmits visible light.

The wiring 136 that is obtained by processing the same conductive layer as the electrodes 127 and 128 is connected to a conductive layer 126 that is obtained by processing the same conductive layer as the electrode 124. The conductive layer 126 is electrically connected to the FPC 72b through a connector 242b.

<7. Structure Example 6 of Display Device>

Figure 50:
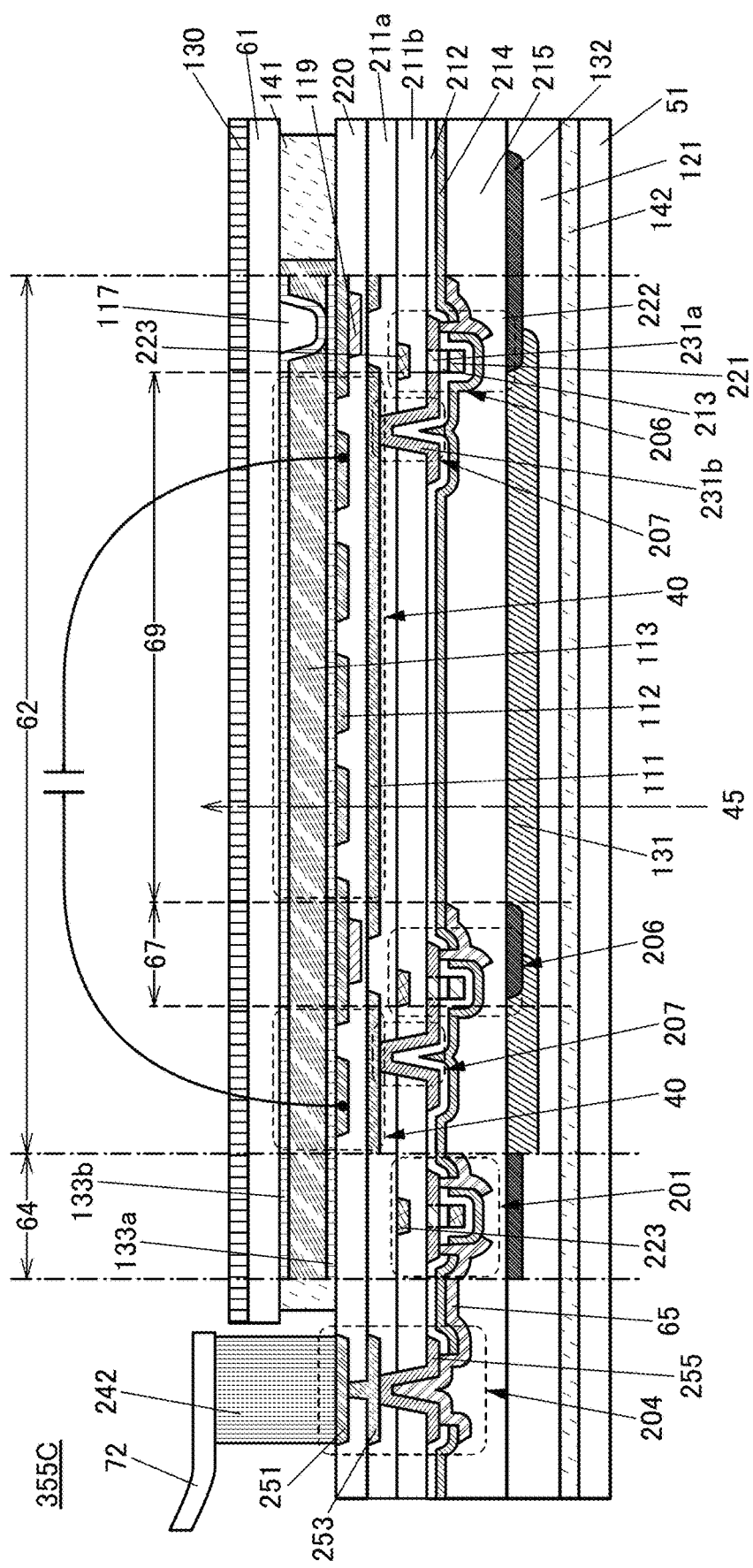
FIG. 50 is a cross-sectional view illustrating an example of a display device.

FIG. 50 illustrates an example of a touch panel. FIG. 50 is a cross-sectional view of a touch panel 355C.

The touch panel 355C is an in-cell touch panel that has a function of displaying an image and serves as a touch sensor.

The touch panel 355C has a structure in which electrodes constituting a sensor element and the like are provided only on a substrate which supports a display element. Such a structure can make the touch panel thinner and more lightweight or reduce the number of components within the touch panel, compared with a structure in which the display device and the sensor element are fabricated separately and then are bonded together or a structure in which the sensor element is fabricated on a counter substrate side.

The touch panel 355C illustrated in FIG. 50 includes an auxiliary wiring 119, in addition to the structure of the display device 110B described above.

The auxiliary wiring 119 is electrically connected to the common electrode 112. By providing an auxiliary wiring that is electrically connected to the common electrode, a drop in voltage due to the resistance of the common electrode can be inhibited. In addition, when a stacked structure of a conductive layer including a metal oxide and a conductive layer including a metal is used, these conductive layers are formed preferably by a patterning technique using a half tone mask, thereby simplifying the fabrication process.

The auxiliary wiring 119 is provided in a position that overlaps with the light-blocking layer 132 and the like, so that the auxiliary wiring 119 is not seen by the user of the display device.

FIG. 50 is a cross-sectional view that includes two adjacent subpixels. The two subpixels illustrated in FIG. 50 are subpixels included in different pixels.

The touch panel 355C illustrated in FIG. 50 is capable of sensing an approach or a contact or the like of an object utilizing the capacitance formed between the common electrode 112 included in the left subpixel and the common electrode 112 included in the right subpixel. That is, in the touch panel 355C, the common electrode 112 serves as both the common electrode of the liquid crystal element and the electrode of the sensor element.

As described above, an electrode constituting a part of the liquid crystal element also serves as an electrode constituting a part of the sensor element in the touch panel of one embodiment of the present invention; thus, the manufacturing process can be simplified and the manufacturing cost can be reduced. Furthermore, the touch panel can be made thin and lightweight.

The common electrode 112 is electrically connected to the auxiliary wiring 119. By providing the auxiliary wiring 119, a resistance of the electrodes of the sensor element can be reduced. As the resistance of the electrodes of the sensor element is reduced, the time constant of the electrode of the sensor element can be made small. When the time constant of the electrode of the sensor element is smaller, the detection sensitivity can be increased, which enables an increase in detection accuracy.

The signal for driving a pixel and the signal for driving a sensor element may be supplied to the touch panel 355C by one FPC. Thus, the touch panel 355C can easily be incorporated into an electronic device and allows a reduction in the number of components.

The operation method of the touch panel 350E in Embodiment 1 (see FIGS. 29A and 29B to FIGS. 31A and 31B) can be applied to the touch panel 355C, for example.

Since the transistor in the display device in this embodiment includes a visible-light-transmitting region, the aperture ratio of the pixel can be increased. Thus, the power consumption of the display device can be reduced. Moreover, the display device can have higher definition.

In each of the display devices in this embodiment, an electrode of the liquid crystal element is provided flat. The display defects in the display device can be reduced.

Furthermore, reduction of the aperture ratio due to the alignment defect of the liquid crystal can be reduced.

This embodiment can be combined with any of other embodiments as appropriate.

Embodiment 3

In this embodiment, an operation mode which can be employed in the display device of one embodiment of the present invention is described with reference to FIGS. 51A to 51C.

A normal driving mode (Normal mode) with a normal frame frequency (typically, higher than or equal to 60 Hz and lower than or equal to 240 Hz) and an idling stop (IDS) driving mode with a low frame frequency are described below.

Note that the IDS driving mode refers to a driving method in which after image data is written, rewriting of image data is stopped. This increases the interval between writing of image data and subsequent writing of image data, thereby reducing the power that would be consumed by writing of image data in that interval. The IDS driving mode can be performed at a frame frequency which is 1/100 to 1/10 of the normal driving mode, for example. A still image is displayed by the same video signals in consecutive frames. Thus, the IDS driving mode is particularly effective when displaying a still image. When an image is displayed using IDS driving, power consumption is reduced, image flickering (flicker) is suppressed, and eyestrain can be reduced.

Figure 51A:
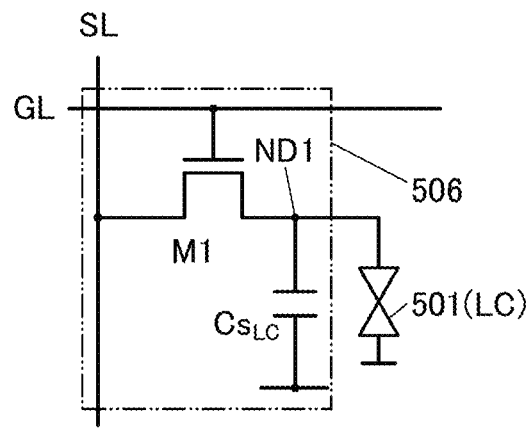
FIGS. 51A to 51C illustrate examples of an operation mode.
Figure 51B:
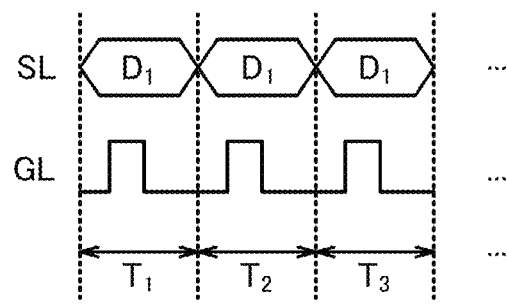
Figure 51C:
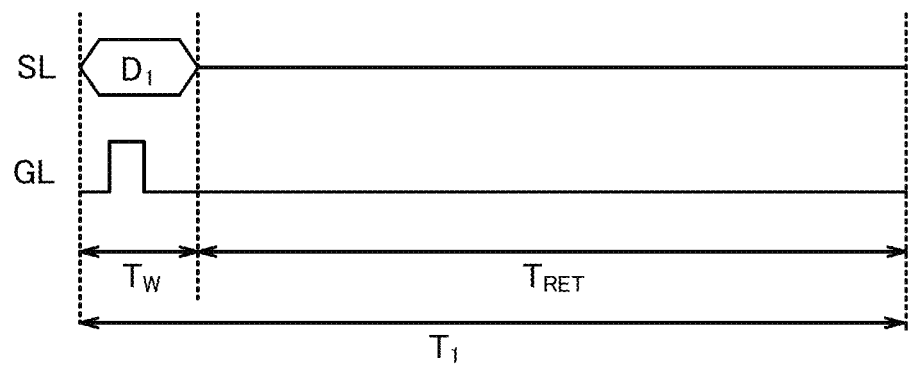

FIG. 51A is a pixel circuit diagram, FIGS. 51B and 51C are timing charts showing a normal driving mode and an IDS driving mode. Note that in FIG. 51A, the first display element 501 (here, a reflective liquid crystal element) and a pixel circuit 506 electrically connected to the first display element 501 are illustrated. In the pixel circuit 506 illustrated in FIG. 51A, a signal line SL, a gate line GL, a transistor M1 connected to the signal line SL and the gate line GL, and a capacitor $Cs_{LC}$ connected to the transistor M1 are illustrated.

The transistor M1 may become a leakage path of data $D_1$. Accordingly, the off-state current of the transistor M1 is preferably as low as possible. A transistor including a metal oxide in a semiconductor layer in which a channel is formed is preferably used as the transistor M1. A metal oxide having at least one of an amplification function, a rectification function, and a switching function can be referred to as a metal oxide semiconductor or an oxide semiconductor (abbreviated to an OS). As a typical example of a transistor, a transistor including an oxide semiconductor in a semiconductor layer in which a channel is formed (OS transistor) is described. The OS transistor has a feature of extremely low leakage current (off-state current) in an off state compared with a transistor including polycrystalline silicon or the like. When the OS transistor is used as the transistor M1, electric charges supplied to a node ND1 can be held for a long period.

In the circuit diagram illustrated in FIG. 51A, the liquid crystal element LC becomes a leakage path of data $D_1$. Therefore, to perform IDS driving appropriately, the resistivity of the liquid crystal element LC is preferably higher than or equal to $1.0 \times 10^{14}$ Ω·cm.

Note that for example, an In—Ga—Zn oxide, an In—Zn oxide, or the like can be suitably used for a channel region of the above OS transistor. The In—Ga—Zn oxide can typically have an atomic ratio of In:Ga:Zn=4:2:4.1 or a neighborhood thereof.

FIG. 51B is a timing chart showing the waveforms of signals supplied to the signal line SL and the gate line GL in the normal driving mode. In the normal driving mode, a normal frame frequency (e.g., 60 Hz) is used for operation. FIG. 51B shows periods $T_1$ to $T_3$. A scanning signal is supplied to the gate line GL in each frame period and data $D_1$ is written from the signal line SL to the node ND1. This operation is performed both to write the same data $D_1$ in the periods $T_1$ to $T_3$ and to write different data in the periods $T_1$ to $T_3$.

FIG. 51C is a timing chart showing the waveforms of signals supplied to the signal line SL and the gate line GL in the IDS driving mode. In the IDS driving, a low frame frequency (e.g., 1 Hz) is used for operation. One frame period is denoted by a period $T_1$ and includes a data writing period Tw and a data retention period $T_{RET}$. In the IDS driving mode, a scanning signal is supplied to the gate line GL and the data $D_1$ of the signal line SL is written in the period Tw, the gate line GL is fixed to a low-level voltage in the period $T_{RET}$, and the transistor M1 is turned off so that the written data $D_1$ is retained. Note that the low frame frequency may be higher than or equal to 0.1 Hz and lower than 60 Hz, for example.

This embodiment can be combined with any of other embodiments as appropriate.

Embodiment 4

Figure 52A:
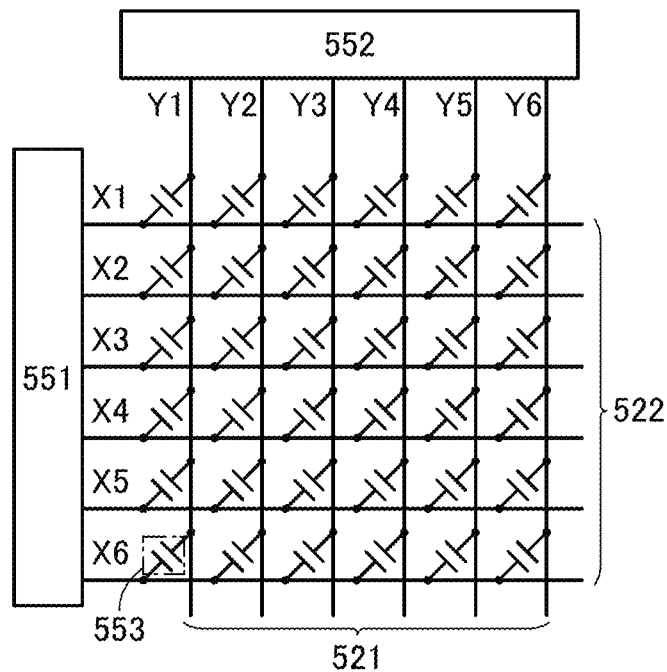
FIG. 52A is a block diagram illustrating a touch sensor and FIG. 52B is a timing chart.

In this embodiment, a driving method of a touch sensor is described with reference to drawings.
<Example of Sensing Method of Sensor>
FIG. 52A is a block diagram illustrating the structure of a mutual capacitive touch sensor. FIG. 52A illustrates a pulse voltage output circuit 551 and a current sensing circuit 552. Note that in FIG. 52A, six wirings X1 to X6 represent electrodes 521 to which a pulse voltage is applied, and six wirings Y1 to Y6 represent electrodes 522 that sense changes in current. FIG. 52A also illustrates a capacitor 553 that is formed where the electrodes 521 and 522 overlap with each other. Note that functional replacement between the electrodes 521 and 522 is possible.

The pulse voltage output circuit 551 is a circuit for sequentially applying a pulse voltage to the wirings X1 to X6. By application of a pulse voltage to the wirings X1 to X6, an electric field is generated between the electrodes 521 and 522 of the capacitors 553. When the electric field between the electrodes is shielded, for example, a change occurs in the capacitor 553 (mutual capacitance). The approach or contact of a sensing target can be sensed by utilizing this change.

The current sensing circuit 552 is a circuit for detecting changes in current flowing through the wirings Y1 to Y6 that are caused by the change in mutual capacitance in the capacitor 553. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current.

Note that one or both of the pulse voltage output circuit 551 and the current sensing circuit 552 may be formed over the substrate 51 or the substrate 61 that is shown in FIG. 4 or the like. For example, it is preferable to form the display portion 62, the driver circuit portion 64, and the like at the same time because the process can be simplified and the number of components used for driving the touch sensor can be reduced. One or both of the pulse voltage output circuit 551 and the current sensing circuit 552 may be mounted on the IC 73.

In particular, in the case of using crystalline silicon such as polycrystalline silicon or single crystal silicon for the semiconductor layer where a channel is formed in the transistor over the substrate 51, driving characteristics of the pulse voltage output circuit 551, the current sensing circuit 552, or the like are increased and sensitivity of the touch sensor can be thus increased.

Figure 52B:
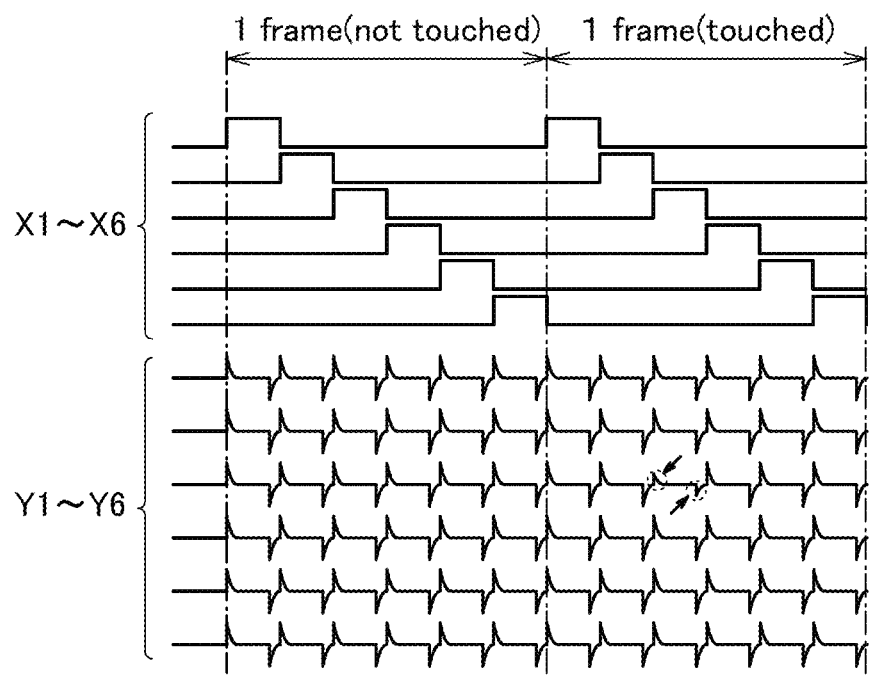

FIG. 52B is a timing chart showing input and output waveforms in the mutual capacitive touch sensor illustrated in FIG. 52A. In FIG. 52B, sensing of a sensing target is performed in all the rows and columns in one frame period. FIG. 52B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change uniformly in accordance with changes in the voltages of the wirings X1 to X6. The current value is decreased at the point of approach or contact of a sensing target and accordingly the waveform of the voltage value changes.

Figure 53A:
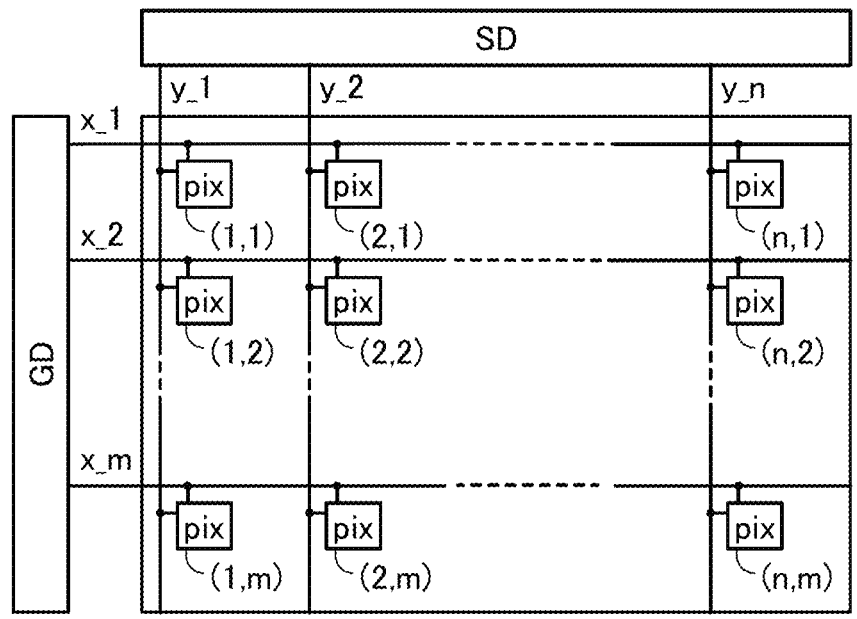
FIG. 53A is a block diagram illustrating a display device and FIG. 53B is a timing chart.

By sensing a change in mutual capacitance in this manner, the approach or contact of a sensing target can be sensed.
<Example of Driving Method of Display Device>
FIG. 53A is a block diagram illustrating a configuration example of a display device. FIG. 53A illustrates a gate driver circuit GD (a scan line driver circuit), a source driver circuit SD (a signal line driver circuit), and a display portion including a plurality of pixels pix. In FIG. 53A, gate lines x_1 to x_m (m is a natural number) electrically connected to the gate driver circuit GD and source lines y_1 to y_n (n is a natural number) electrically connected to the source driver circuit SD are shown. Corresponding to these lines, the pixels pix are denoted by (1, 1) to (n, m).

Figure 53B:
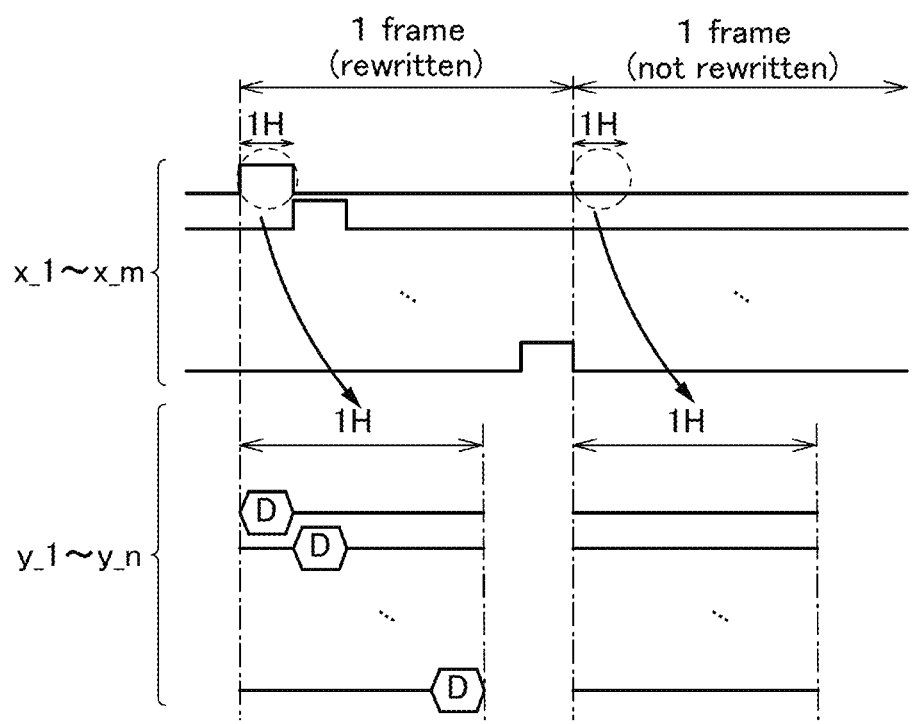

FIG. 53B is a timing chart of signals supplied to the gate lines and the source lines in the display device shown in FIG. 53A. The periods in FIG. 53B show the case where data signals are rewritten every frame period and the case where data signals are not rewritten. Note that periods such as a retrace period are not taken into consideration in FIG. 53B.

In the case where data signals are rewritten every frame period, scan signals are sequentially supplied to the gate lines x_1 to x_m. In a horizontal scanning period 1H, during which the scan signal is at an H level, data signals D are supplied to the source lines y_1 to y_n in the columns.

In the case where data signals are not rewritten every frame period, supply of scan signals to the gate lines x_1 to xm is stopped. In the horizontal scanning period 1H, supply of data signals to the source lines y_1 to y_n in the columns is stopped.

A driving method in which data signals are not rewritten every frame period is effective particularly when an oxide semiconductor is used for the semiconductor layer where a channel is formed in the transistor included in the pixel pix. A transistor including an oxide semiconductor can have much lower off-state current than a transistor including a semiconductor such as silicon. Thus, a data signal written in the previous period can be held without rewriting data signals every frame period, and grayscale of pixels can be held for 1 second or longer, preferably 5 seconds or longer, for example.

In the case where polycrystalline silicon or the like is used for a semiconductor layer where a channel of a transistor included in the pixel pix is formed, the storage capacitance of the pixel is preferably increased in advance. The larger the storage capacitance is, the longer the grayscale of the pixel can be held. The storage capacitance may be determined depending on leakage current of a transistor or a display element which is electrically connected to the storage capacitor. For example, the storage capacitance per pixel is set to 5 fF to 5 pF inclusive, preferably 10 fF to 5 pF inclusive, further preferably 20 fF to 1 pF inclusive, so that a data signal written in the previous period can be held without rewriting data signals every frame period. For example, grayscale of a pixel can be held for several frame periods or several tens of frame periods.

<Example of Driving Method of Display Portion and Touch Sensor>

Figure 54A:
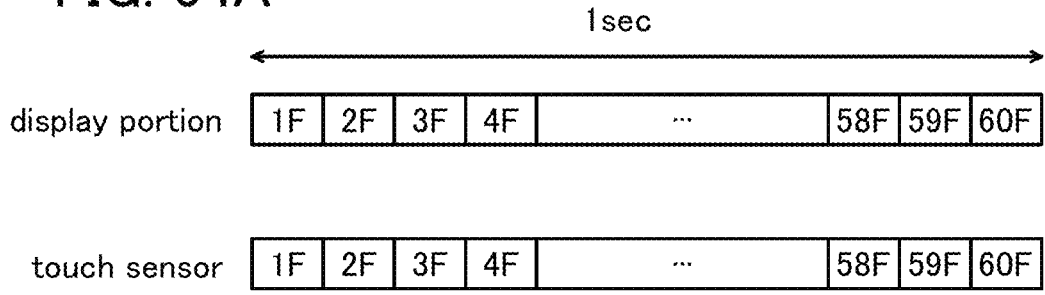
FIGS. 54A to 54D show operation of a display device and a touch sensor.

FIGS. 54A to 54D show examples of the operations in successive frame periods of the touch sensor described with reference to FIGS. 52A and 52B and the display portion described with reference to FIGS. 53A and 53B that are driven for 1 sec (one second). In FIG. 54A, one frame period for the display portion is 16.7 ms (frame frequency: 60 Hz), and one frame period for the touch sensor is 16.7 ms (frame frequency: 60 Hz).

Figure 54B:
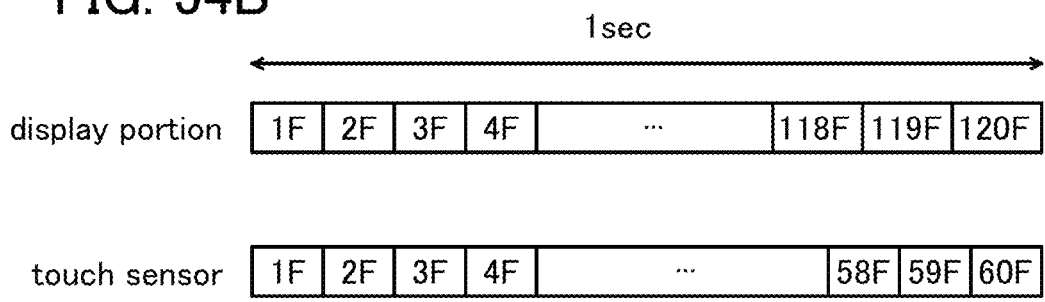

In the display device of one embodiment of the present invention, the display portion and the touch sensor operate independently of each other, and the display device can have a touch sensing period concurrent with a display period. That is why one frame period for the display portion and one frame period for the touch sensor can both be 16.7 ms (frame frequency: 60 Hz) as shown in FIG. 54A. The frame frequency for the touch sensor may differ from that of the display portion. For example, as shown in FIG. 54B, one frame period for the display portion may be 8.3 ms (frame frequency: 120 Hz) and one frame period for the touch sensor may be 16.7 ms (frame frequency: 60 Hz). The frame frequency for the display portion may be 33.3 ms (frame frequency: 30 Hz) (not shown).

The frame frequency for the display portion may be changeable, i.e., the frame frequency in displaying moving images may be increased (e.g., 60 Hz or more, or 120 Hz or more), whereas the frame frequency in displaying still images may be decreased (e.g., 60 Hz or less, 30 Hz or less, or 1 Hz or less). With this structure, power consumption of the display device can be reduced. The frame frequency for the touch sensor may be changeable, and the frame frequency in waiting may differ from the frame frequency in sensing a touch.

Moreover, in the display device of one embodiment of the present invention, the following operation is possible: data signals are not rewritten in the display portion and a data signal written in the previous period is held. In that case, one frame period of the display portion can be longer than 16.7 ms. Thus, as shown in FIG. 54C, the operation can be switched so that one frame period for the display portion is 1 sec (frame frequency: 1 Hz) and one frame period for the touch sensor is 16.7 ms (frame frequency: 60 Hz).

Note that for the operation in which data signals are not rewritten in the display portion and a data signal written in the previous period is held, the above-described IDS driving mode can be referred to. As the IDS driving mode, a partial IDS driving mode may be employed in which data signals are rewritten only in a specific region of the display portion. The partial IDS driving mode is a mode in which data signals are rewritten only in a specific region of the display portion and a data signal written in the previous period is held in the other region.

Figure 54C:
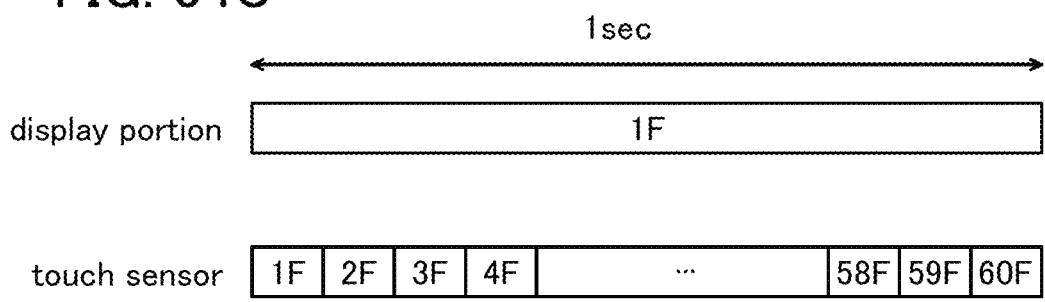
Figure 54D:
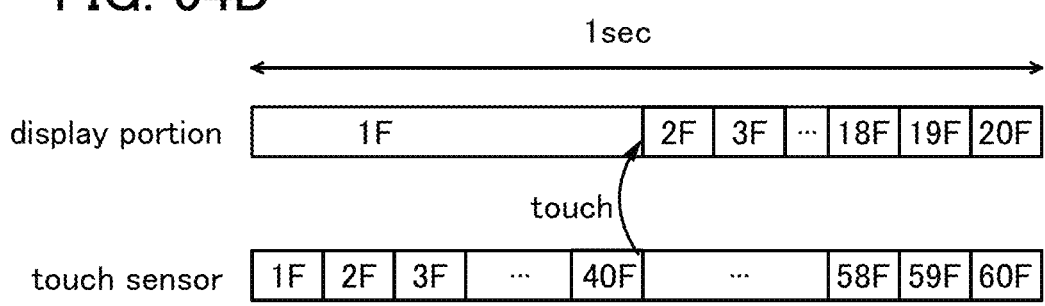

Furthermore, by the driving method of a touch sensor that is disclosed in this embodiment, the touch sensor can be continuously driven in the case of FIG. 54C. Thus, data signals in the display portion can also be rewritten when the approach or contact of a sensing target is sensed by the touch sensor, as shown in FIG. 54D.

If rewriting of data signals in a display portion is performed during a sensing period of a touch sensor, noise caused by rewriting of the data signals travels through the touch sensor and the sensitivity of the touch sensor might decrease. For this reason, rewriting of data signals in a display portion and sensing by a touch sensor are preferably performed in different periods.

Figure 55A:
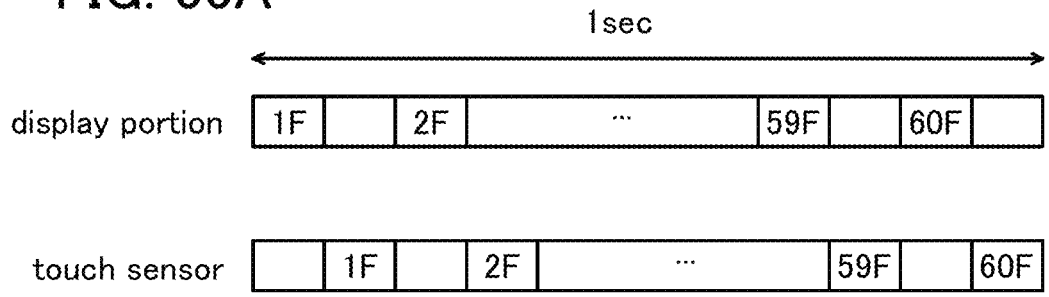
FIGS. 55A to 55D show operation of a display device and a touch sensor.
Figure 55B:
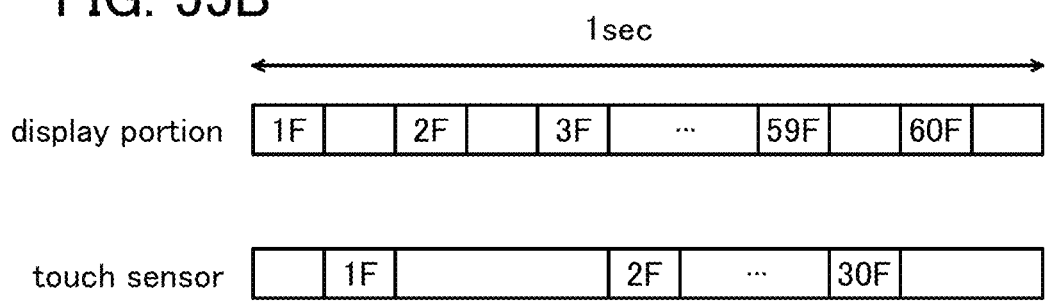

FIG. 55A shows an example in which rewriting of data signals in a display portion and sensing by a touch sensor are performed alternately. FIG. 55B shows an example in which sensing by a touch sensor is performed one time every two rewritings of data signals in a display portion. Note that sensing by a touch sensor may be performed once every three or more rewritings.

In the case where an oxide semiconductor is used in a semiconductor layer (where a channel is formed) of a transistor used in the pixel pix, the off-state current can be significantly reduced and the frequency of rewriting data signal can be sufficiently reduced. Specifically, a sufficiently long break period can be set between rewritings of data signals. The break period can be 0.5 seconds or longer, 1 second or longer, or 5 seconds or longer, for example. The upper limit of the break period depends on leakage current of a capacitor or a display element connected to a transistor; for example, 1 minute or shorter, 10 minutes or shorter, 1 hour or shorter, or 1 day or shorter.

Figure 55C:
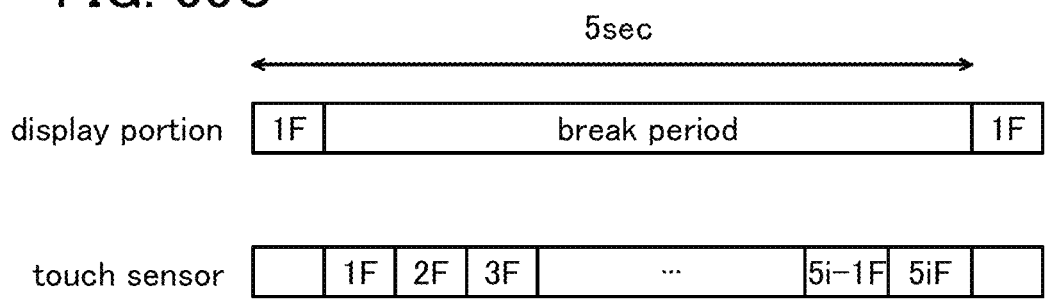
Figure 55D:
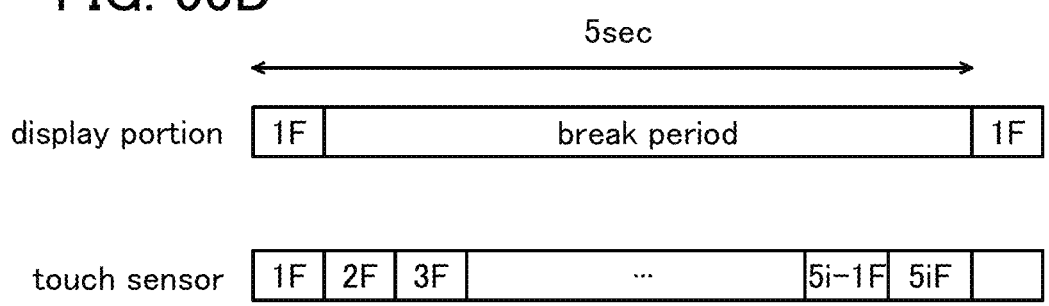

FIG. 55C shows an example in which rewriting of data signals in a display portion is performed once every 5 seconds. A break period for stopping the rewriting operation of a display portion is set in FIG. 55C between rewriting of data signals and next rewriting. In the break period, a touch sensor can be operated at a frame frequency of i Hz (i is more than or equal to the frame frequency of a display device; here, 0.2 Hz or more). Sensing by a touch sensor is performed in a break period and is not performed in a rewriting period of data signals in a display portion as shown in FIG. 55C, so that sensitivity of a touch sensor can be increased. When rewriting of data signals in a display portion and sensing by a touch sensor are performed at the same time as shown in FIG. 55D, operation signals can be simplified.

In a break period during which rewriting of data signals in a display portion is not performed, not only the supply of data signals to the display portion, but also the operation of one or both of the gate driver circuit GD and the source driver circuit SD may be stopped. The supply of power to one or both of the gate driver circuit GD and the source driver circuit SD may also be stopped. Thus, noise is further reduced, and the sensitivity of the touch sensor can be further increased. Moreover, the power consumption of the display device can be further reduced.

The display device of one embodiment of the present invention includes a display portion and a touch sensor between two substrates. With this structure, the distance between the display portion and the touch sensor can be reduced. At this time, noise is easily transmitted to the touch sensor in driving the display portion, which might reduce the sensitivity of the touch sensor. When the driving method in this embodiment is employed, a display device including a touch sensor, which has both reduced thickness and high sensitivity, can be obtained.

This embodiment can be combined with any of the other embodiments as appropriate.

Embodiment 5

Described in this embodiment is a metal oxide that can be used in a semiconductor layer of a transistor disclosed in one embodiment of the present invention. Note that in the case where a metal oxide is used in a semiconductor layer of a transistor, the metal oxide can be rephrased as an oxide semiconductor.

An oxide semiconductor is classified into a single crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

For the semiconductor layer of the transistor disclosed in one embodiment of the present invention, a cloud-aligned composite oxide semiconductor (CAC-OS) may be used.

The aforementioned non-single-crystal oxide semiconductor or CAC-OS can be suitably used in a semiconductor layer of a transistor disclosed in one embodiment of the present invention. As the non-single-crystal oxide semiconductor, an nc-OS or a CAAC-OS can be suitably used.

In one embodiment of the present invention, a CAC-OS is preferably used in a semiconductor layer of a transistor. The use of the CAC-OS allows the transistor to have high electrical characteristics or high reliability.

The CAC-OS will be described in detail below.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the aforementioned conducting function and the insulating regions have the aforementioned insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel formation region of a transistor, high current drive capability in the on state of the transistor, that is, high on-state current and high field-effect mobility, can be obtained.

In other words, the CAC-OS or the CAC-metal oxide can be referred to as a matrix composite or a metal matrix composite.

The CAC-OS has, for example, a composition in which elements included in a metal oxide are unevenly distributed. The unevenly distributed elements each have a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility (μ) can be achieved.

A semiconductor element including a CAC-OS has high reliability. Thus, the CAC-OS is suitably used in a variety of semiconductor devices typified by a display.

This embodiment can be combined with any of the other embodiments as appropriate.

Embodiment 6

In this embodiment, electronic devices of one embodiment of the present invention are described.

Examples of electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

Figure 56A:
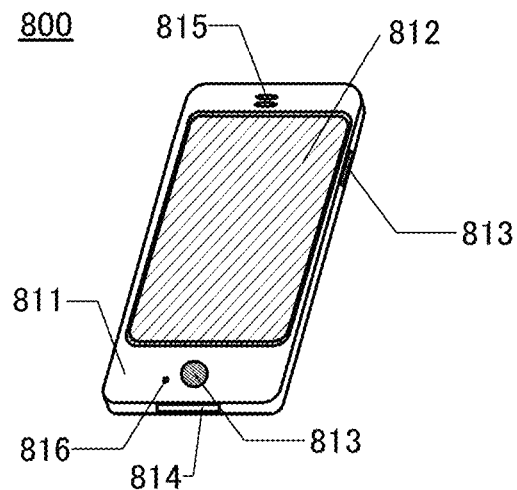
FIGS. 56A to 56C are diagrams each illustrating an example of an electronic device.
Figure 56B:
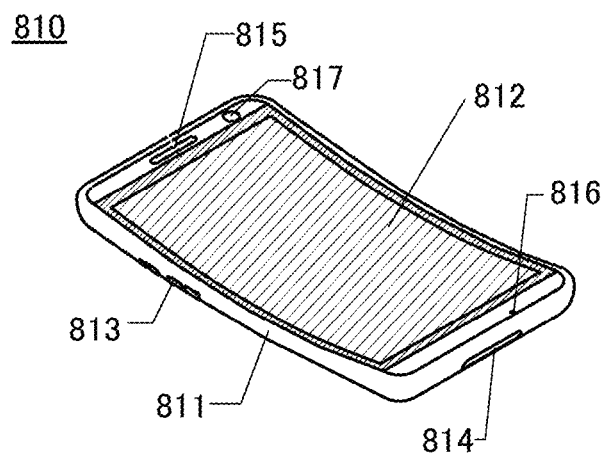
Figure 56C:
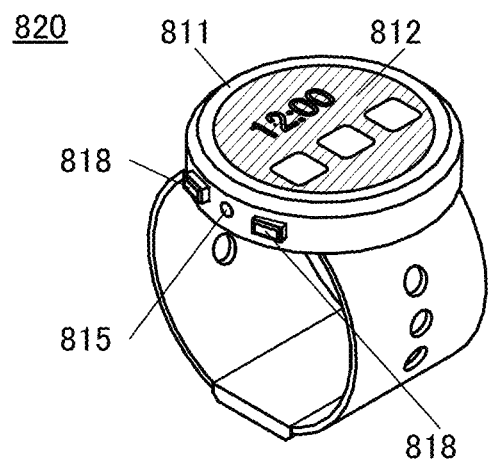

FIGS. 56A to 56C illustrate portable information terminals. Each of the portable information terminals in this embodiment functions as, for example, one or more of a telephone set, a notebook, and an information browsing system. Specifically, each of the portable information terminals in this embodiment can be used as a smartphone or a smart watch. Each of the portable information terminals in this embodiment is capable of executing a variety of applications such as mobile phone calls, e-mailing, text reading and editing, music replay, video replay, Internet communication, and a game, for example. Each of the portable information terminals illustrated in FIGS. 56A to 56C can have a variety of functions. The portable information terminals illustrated in FIGS. 56A to 56C can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that the functions of the portable information terminals illustrated in FIGS. 56A to 56C are not limited to the above, and the portable information terminals may have other functions.

Each of the portable information terminals illustrated in FIGS. 56A to 56C is capable of executing a variety of applications such as mobile phone calls, e-mailing, text reading and editing, music replay, Internet communication, and a computer game, for example. Each of the portable information terminals illustrated in FIGS. 56A to 56C can employ near field communication that is a communication method based on an existing communication standard. In that case, for example, mutual communication between the portable information terminal 820 illustrated in FIG. 56C and a headset capable of wireless communication can be performed, and thus hands-free calling is possible.

A portable information terminal 800 illustrated in FIG. 56A includes a housing 811, a display portion 812, operation buttons 813, an external connection port 814, a speaker 815, a microphone 816, and the like. The display portion 812 of the portable information terminal 800 has a flat surface.

A portable information terminal 810 illustrated in FIG. 56B includes the housing 811, the display portion 812, the operation buttons 813, the external connection port 814, the speaker 815, the microphone 816, a camera 817, and the like. The display portion 812 of the portable information terminal 810 has a curved surface.

FIG. 56C illustrates a wrist-watch-type portable information terminal 820. The wrist-watch-type portable information terminal 820 includes the housing 811, the display portion 812, the speaker 815, operation keys 818 (including a power switch or an operation switch), and the like. The external shape of the display portion 812 of the wrist-watch-type portable information terminal 820 is circular. The display portion 812 has a flat surface.

The display device of one embodiment of the present invention can be used for the display portion 812. Thus, the display portion of the portable information terminal can have a high aperture ratio.

Each of the portable information terminals in this embodiment includes a touch sensor in the display portion 812. Operations such as making a call and inputting a letter can be performed by touch on the display portion 812 with a finger, a stylus, or the like.

With the operation button 813, the power can be turned on or off. In addition, types of images displayed on the display portion 812 can be switched; for example, switching images from a mail creation screen to a main menu screen is performed with the operation button 813.

When a detection device such as a gyroscope sensor or an acceleration sensor is provided inside each of the portable information terminals, the direction of display on the screen of the display portion 812 can be automatically changed by determining the orientation of the portable information terminal (whether the portable information terminal is placed horizontally or vertically). Furthermore, the direction of display on the screen can be changed by touch on the display portion 812, operation with the operation button 813, sound input using the microphone 816, or the like.

Figure 57A:
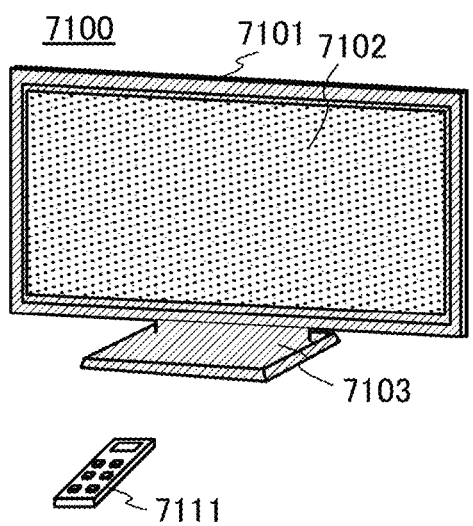
FIGS. 57A to 57C are diagrams each illustrating an example of an electronic device.

In a television device 7100 illustrated in FIG. 57A, a display portion 7102 is incorporated in a housing 7101. The display portion 7102 is capable of displaying images. The display device of one embodiment of the present invention can be used for the display portion 7102. Accordingly, a television device having a display portion with a high aperture ratio can be manufactured. In addition, here, the housing 7101 is supported by a stand 7103.

The television device 7100 can be operated with an operation switch provided in the housing 7101 or a separate remote controller 7111. With operation keys of the remote controller 7111, channels and volume can be controlled and images displayed on the display portion 7102 can be controlled. The remote controller 7111 may be provided with a display portion for displaying data output from the remote controller 7111.

Note that the television device 7100 is provided with a receiver, a modem, and the like. With the use of the receiver, general television broadcasts can be received. Moreover, when the television device is connected to a communication network with or without wires via the modem, one-way (from a sender to a receiver) or two-way (between a sender and a receiver or between receivers) information communication can be performed.

Figure 57B:
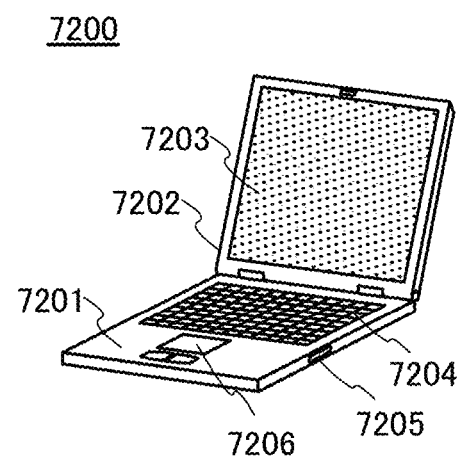

A computer 7200 illustrated in FIG. 57B includes a main body 7201, a housing 7202, a display portion 7203, a keyboard 7204, an external connecting port 7205, a pointing device 7206, and the like. Note that this computer is manufactured by using the display device of one embodiment of the present invention for the display portion 7203. Thus, the display portion of the computer can have a high aperture ratio.

Figure 57C:
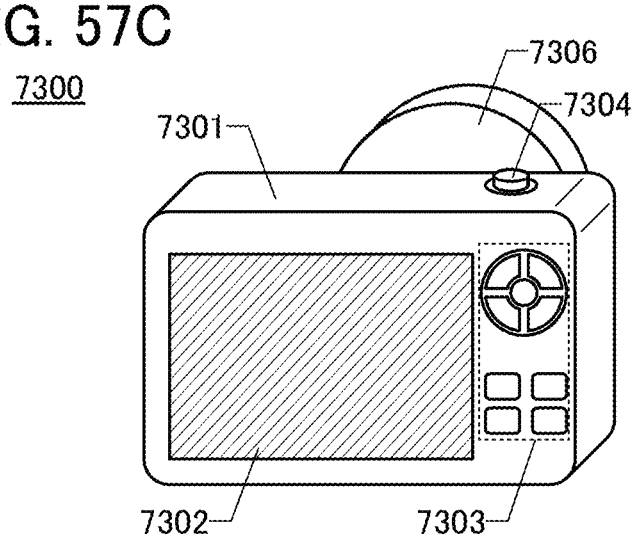

The camera 7300 illustrated in FIG. 57C includes a housing 7301, a display portion 7302, an operation button 7303, a shutter button 7304, and the like. Furthermore, an attachable lens 7306 is attached to the camera 7300.

The display device of one embodiment of the present invention can be used for the display portion 7302. Thus, the display portion of the camera can have a high aperture ratio.

Although the lens 7306 of the camera 7300 here is detachable from the housing 7301 for replacement, the lens 7306 may be included in the housing 7301.

Still images or moving images can be taken with the camera 7300 by pushing the shutter button 7304. In addition, images can be taken by a touch on the display portion 7302 that serves as a touch panel.

Note that a stroboscope, a viewfinder, or the like can be additionally attached to the camera 7300. Alternatively, they may be incorporated in the housing 7301.

This embodiment can be combined with any of other embodiments as appropriate.

REFERENCE NUMERALS

10A: display device, 10B: display device, 11: substrate, 12: substrate, 13: backlight unit, 14: transistor, 15: liquid crystal element, 15A: display device, 15B: display device, 15C: display device, 16: adhesive layer, 20A: display device, 20B: display device, 21: pixel electrode, 22: liquid crystal layer, 23: common electrode, 25: conductive layer, 26: insulating layer, 27: conductive layer, 28: conductive layer, 29: connector, 31: touch sensor unit, 32: insulating layer, 33: conductive layer, 34: capacitor, 35A: display device, 35B: display device, 35C: display device, 40: liquid crystal element, 45: light, 45*a*: light, 45*b*: light, 51: substrate, 56: conductive layer, 56*a*: conductive layer, 56*b*: conductive layer, 57: auxiliary wiring, 58: conductive layer, 60: pixel, 60*a*: subpixel, 60*b*: subpixel, 61: substrate, 62: display portion, 63: connection portion, 64: driver circuit portion, 65: wiring, 66: non-display region, 67: light-blocking region, 68: display region, 69: opening, 72: FPC, 72*a*: FPC, 72*b*: FPC, 73: IC, 73*a*: IC, 73*b*: IC, 81: scan line, 82: signal line, 100A: display device, 100B: display device, 100C: display device, 100D: display device, 100E: display device, 100F: display device, 110: display device, 110A: display device, 110B: display device, 110C: display device, 111: pixel electrode, 112: common electrode, 112*a*: common electrode, 112*b*: common electrode, 113: liquid crystal layer, 117: spacer, 119: auxiliary wiring, 121: overcoat, 122: insulating layer, 123: insulating layer, 124: electrode, 125: insulating layer, 126: conductive layer, 127: electrode, 128: electrode, 130: polarizer, 131: coloring layer, 132: light-blocking layer, 132*a*: light-blocking layer, 132*b*: light-blocking layer, 133*a*: alignment film, 133*b*: alignment film, 136: wiring, 137: wiring, 138: wiring, 139: auxiliary wiring, 141: adhesive layer, 142: adhesive layer, 201: transistor, 204: connection portion, 206: transistor, 207: connection portion, 211: insulating layer, 211*a*: insulating layer, 211*b*: insulating layer, 212: insulating layer, 213: insulating layer, 214: insulating layer, 215: insulating layer, 216: insulating layer, 220: insulating layer, 221: gate, 222: conductive layer, 222*a*: conductive layer, 222*b*: conductive layer, 222*c*: conductive layer, 223: gate, 227: conductive layer, 228: scan line, 229: signal line, 231: semiconductor layer, 231*a*: channel region, 231*b*: low-resistance region, 242: connector, 242*b*: connector, 243: connector, 244: capacitor line, 251: conductive layer, 253: conductive layer, 255: conductive layer, 284: conductive layer, 285: conductive layer, 286: conductive layer, 900: pixel, 900*s*: light-blocking region, 900*t*: transmissive region, 901: driver circuit portion, 902: wiring, 904: wiring, 911: transistor, 914: transistor, 915: capacitor, 916: capacitor portion, 918B: display region, 918G: display region, 918R: display region, 918 W: display region, 930LC: liquid crystal element, 932BM: light-blocking film, and 932CF: coloring film.

This application is based on Japanese Patent Application Serial No. 2016-219157 filed with Japan Patent Office on Nov. 9, 2016, and Japanese Patent Application Serial No. 2016-219160 filed with Japan Patent Office on Nov. 9, 2016, the entire contents of which are hereby incorporated by reference.

The invention claimed is:

1. A display device comprising:
a liquid crystal element;
a transistor;
a scan line;
a coloring layer;
a signal line; and
a touch sensor,
wherein the liquid crystal element comprises a pixel electrode, a liquid crystal layer, and a common electrode,
wherein each of the scan line and the signal line is electrically connected to the transistor,
wherein each of the scan line and the signal line comprises a metal layer,
wherein the transistor comprises a first region connected to the pixel electrode,
wherein the touch sensor comprises a second region which is configured to transmit visible light,
wherein the pixel electrode, the common electrode, and the first region are configured to transmit visible light,
wherein the visible light passes through the liquid crystal element, the first region, and the second region in this order and is emitted to the outside of the display device, and
wherein the visible light passes through the coloring layer, the liquid crystal element, the first region, and the second region in this order and is emitted to the outside of the display device.

2. The display device according to claim 1,
wherein a channel region of the transistor comprises a metal oxide, and
wherein the first region comprises a metal oxide.

3. The display device according to claim 2,
wherein the metal oxide in the first region comprises one or more kinds of metal elements in the metal oxide included in the channel region.

4. A display device comprising:
a liquid crystal element;
a first insulating layer;
a transistor;
a scan line; and
a signal line,
wherein the liquid crystal element comprises a pixel electrode, a liquid crystal layer, and a common electrode,
wherein the first insulating layer is positioned between the pixel electrode and the transistor,
wherein the first insulating layer comprises an opening,
wherein each of the scan line and the signal line is electrically connected to the transistor,
wherein each of the scan line and the signal line comprises a metal layer,
wherein the transistor comprises a first region connected to the pixel electrode,
wherein the first region comprises a first portion that is in contact with the pixel electrode and a second portion that is in contact with a side surface of the opening in the first insulating layer,
wherein the pixel electrode, the common electrode, and the first region are configured to transmit visible light, and wherein the visible light passes through the first region and the liquid crystal element and is emitted to the outside of the display device.

5. The display device according to claim 4, further comprising:
a coloring layer,
wherein the coloring layer is positioned on a side opposite to the first insulating layer with the transistor interposed therebetween.

6. The display device according to claim 4, further comprising:
a touch sensor,
wherein the touch sensor is positioned on a display surface side of the liquid crystal element and the transistor.

7. The display device according to claim 6,
wherein the touch sensor comprises a pair of electrodes,
wherein one or both of the pair of electrodes comprises a third region which is configured to transmit visible light, and
wherein the visible light which has passed through the first region and the liquid crystal element passes through the third region and is emitted to the outside of the display device.

8. The display device according to claim 4,
wherein a surface of the pixel electrode on the liquid crystal layer side and a surface of the first insulating layer on the liquid crystal layer side form the same surface.

9. The display device according to claim 4,
wherein a direction in which the scan line extends intersects with a direction in which the signal line extends, and
wherein a plurality of pixels exhibiting the same color are aligned in a direction intersecting with the direction in which the signal line extends.

10. A display device comprising:
a liquid crystal element;
a first insulating layer;
a transistor;
a scan line; and
a signal line,
wherein the liquid crystal element comprises a pixel electrode, a liquid crystal layer, and a common electrode,
wherein the first insulating layer is positioned between the pixel electrode and the transistor,
wherein the first insulating layer comprises an opening,
wherein each of the scan line and the signal line is electrically connected to the transistor,
wherein each of the scan line and the signal line comprises a metal layer,
wherein the transistor is electrically connected to the pixel electrode,
wherein the transistor comprises a metal oxide layer, a gate, and a gate insulating layer,
wherein the metal oxide layer comprises a first region and a second region,
wherein the first region comprises a first portion that is in contact with the pixel electrode and a second portion that is in contact with a side surface of the opening included in the first insulating layer,
wherein the second region overlaps with the gate with the gate insulating layer positioned therebetween,
wherein a resistivity of the first region is lower than a resistivity of the second region,
wherein the pixel electrode, the common electrode, and the first region are configured to transmit visible light, and
wherein the visible light passes through the first region and the liquid crystal element and is emitted to the outside of the display device.

11. The display device according to claim 10, further comprising:
a coloring layer,
wherein the coloring layer is positioned on a side opposite to the first insulating layer with the transistor interposed therebetween.

12. The display device according to claim 10, further comprising:
a touch sensor,
wherein the touch sensor is positioned on a display surface side of the liquid crystal element and the transistor.

13. The display device according to claim 12,
wherein the touch sensor comprises a pair of electrodes,
wherein one or both of the pair of electrodes comprises a third region which is configured to transmit visible light, and
wherein the visible light which has passed through the first region and the liquid crystal element passes through the third region and is emitted to the outside of the display device.

14. The display device according to claim 10,
wherein a surface of the pixel electrode on the liquid crystal layer side and a surface of the first insulating layer on the liquid crystal layer side form the same surface.

15. The display device according to claim 10,
wherein a direction in which the scan line extends intersects with a direction in which the signal line extends, and
wherein a plurality of pixels exhibiting the same color are aligned in a direction intersecting with the direction in which the signal line extends.

16. A display module comprising:
the display device according to claim 10; and
a circuit board.

17. An electronic device comprising:
the display module according to claim 16; and
at least any one of an antenna, a battery, a housing, a camera, a speaker, a microphone, and an operation button.

* * * * *